US009448477B2

(12) United States Patent
Kawabata et al.

(10) Patent No.: US 9,448,477 B2
(45) Date of Patent: *Sep. 20, 2016

(54) ACTINIC RAY-SENSITIVE OR RADIATION-SENSITIVE RESIN COMPOSITION, RESIST FILM, PATTERN FORMING METHOD, MANUFACTURING METHOD OF ELECTRONIC DEVICE USING THE SAME, AND ELECTRONIC DEVICE

(71) Applicant: FUJIFILM CORPORATION, Tokyo (JP)

(72) Inventors: Takeshi Kawabata, Shizuoka (JP); Hideaki Tsubaki, Shizuoka (JP); Hiroo Takizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/656,997

(22) Filed: Mar. 13, 2015

(65) Prior Publication Data

US 2015/0185612 A1 Jul. 2, 2015

Related U.S. Application Data

(63) Continuation of application No. PCT/JP2013/075392, filed on Sep. 13, 2013.

(30) Foreign Application Priority Data

Sep. 13, 2012 (JP) ................................ 2012-202082
May 14, 2013 (JP) ................................ 2013-102603
Aug. 19, 2013 (JP) ................................ 2013-169955

(51) Int. Cl.

*G03F 7/038* (2006.01)
*G03F 7/039* (2006.01)
*G03F 7/20* (2006.01)
*G03F 7/30* (2006.01)
*G03F 7/32* (2006.01)
*G03F 7/004* (2006.01)
*C08F 8/32* (2006.01)

(52) U.S. Cl.

CPC ............... *G03F 7/0388* (2013.01); *C08F 8/32* (2013.01); *G03F 7/0045* (2013.01); *G03F 7/0046* (2013.01); *G03F 7/0392* (2013.01); *G03F 7/0397* (2013.01); *G03F 7/2002* (2013.01); *G03F 7/2037* (2013.01); *G03F 7/2041* (2013.01); *G03F 7/30* (2013.01); *G03F 7/32* (2013.01); *G03F 7/325* (2013.01)

(58) Field of Classification Search

None

See application file for complete search history.

(56) References Cited

U.S. PATENT DOCUMENTS

| | | | |
|---|---|---|---|
| 5,783,354 A | 7/1998 | Schwalm et al. | |
| 2002/0132396 A1* | 9/2002 | Yamazaki | G02F 1/13458 438/149 |
| 2004/0053160 A1* | 3/2004 | Takahashi | G03F 7/0045 430/270.1 |
| 2010/0239984 A1* | 9/2010 | Tsubaki | 430/325 |
| 2011/0059400 A1 | 3/2011 | Kamabuchi et al. | |
| 2011/0165513 A1 | 7/2011 | Yamashita et al. | |
| 2011/0189609 A1* | 8/2011 | Kawabata | C07D 327/08 430/270.1 |
| 2014/0272692 A1* | 9/2014 | Yokokawa et al. | 430/18 |
| 2014/0363758 A1* | 12/2014 | Nihashi et al. | 430/18 |

FOREIGN PATENT DOCUMENTS

| | | | |
|---|---|---|---|
| JP | 9-127700 A | | 5/1997 |
| JP | 2003-207898 A | | 7/2003 |
| JP | 2004-310004 A | | 11/2004 |
| JP | 2010-61087 | * | 3/2010 |
| JP | 2011-150282 A | | 8/2011 |
| JP | 2011-158896 A | | 8/2011 |
| JP | 2012-48187 A | | 3/2012 |
| JP | 2013-92598 A | | 5/2013 |
| WO | WO 2013/081184 A1 | * | 6/2013 |
| WO | WO 2013/125733 A1 | * | 8/2013 |

OTHER PUBLICATIONS

Derwent English abstract for JP 2010-61087 (2010).*
Machine-assisted English translation for JP 2010-61087 (2010).*
Int. Search Report (ISR) dated Oct. 15, 2013 in International Application No. PCT/2013/075392 (PCT/ISA/210).
Written Opinion (WO) dated Oct. 15, 2013 in International Application No. PCT/2013/075392 (PCT/ISA/237).
Office Action dated Aug. 25, 2015, issued by the Japanese Patent Office in counterpart Japanese Patent Application No. 2013-169955.
Office Action issued Feb. 9, 2016, issued by the Japanese Patent Office in counterpart Japanese Patent Application No. 2013-169955.
Office Action issued Jun. 28, 2016 by the Japanese Patent Office in counterpart Japanese Patent No. 2013-169955.

* cited by examiner

*Primary Examiner* — Sin Lee
(74) *Attorney, Agent, or Firm* — Sughrue Mion, PLLC

(57) ABSTRACT

There is provided an actinic ray-sensitive or radiation-sensitive resin composition comprising: (A) a resin having a repeating unit represented by the specific formula and a group capable of decomposing by an action of an acid to produce a polar group; and an ionic compound represented by the specific formula, and a resist film comprising the actinic ray-sensitive or radiation-sensitive resin composition.

25 Claims, No Drawings

ACTINIC RAY-SENSITIVE OR RADIATION-SENSITIVE RESIN COMPOSITION, RESIST FILM, PATTERN FORMING METHOD, MANUFACTURING METHOD OF ELECTRONIC DEVICE USING THE SAME, AND ELECTRONIC DEVICE

CROSS REFERENCE TO RELATED APPLICATION

This is a continuation of International Application No. PCT/JP2013/075392 filed on Sep. 13, 2013, and claims priority from Japanese Patent Application No. 2012-202082 filed on Sep. 13, 2012, Japanese Patent Application No. 2013-102603 filed on May 14, 2013, Japanese Patent Application No. 2013-169955 filed on Aug. 19, 2013, the entire disclosures of which are incorporated therein by reference.

TECHNICAL FIELD

The present invention relates to an actinic ray-sensitive or radiation-sensitive resin composition, a resist film, a pattern forming method, each using a developer containing an organic solvent, which are suitably used for the ultramicrolithography process such as production of VLSI or high-capacity microchip or in other photofabrication processes, a manufacturing method of an electronic device using the same, and an electronic device. More specifically, the present invention relates to an actinic ray-sensitive or radiation-sensitive resin composition, a resist film, a pattern forming method, each using a developer containing an organic solvent, which are suitably usable for semiconductor microfabrication employing an electron beam or EUV light (wavelength: near 13 nm), a manufacturing method of an electronic device using the same, and an electronic device.

BACKGROUND ART

In the process of producing a semiconductor device such as IC and LSI, microfabrication by lithography using a photoresist composition has been conventionally performed. Recently, with the increase in integration degree of an integrated circuit, formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technology and a high-contrast, high-sensitivity and high-resolution resist composition is being demanded.

Particularly, in order to shorten the wafer processing time, elevation of sensitivity is very important, but when higher sensitivity is pursued, the pattern profile or the resolution indicated by the limiting resolution line width is deteriorated, and development of a resist composition simultaneously satisfying these properties is strongly demanded.

As one method to solve such a problem, a resist composition containing a specific basic compound is disclosed in for example, JP-A-2011-150282 (the term "JP-A" as used herein means an "unexamined published Japanese patent application"), JP-A-2012-48187 and JP-A-9-127700.

SUMMARY OF INVENTION

However, in the ultrafine region, it is required to simultaneously satisfy high sensitivity, high resolution, good pattern profile and scum reduction at a higher level, and the inventions disclosed in JP-A-2011-150282, JP-A-2012-48187 and JP-A-9-127700 have room for improvement in terms of these points.

An object of the present invention is to solve the technical problem of enhancing the performance in semiconductor device microfabrication using an electron beam or an extreme ultraviolet ray (EUV light) and provide a pattern forming method, an actinic ray-sensitive or radiation-sensitive resin composition, a resist film, each simultaneously satisfying high sensitivity, high resolution (such as high resolving power), good pattern profile and scum reduction at a high level, a manufacturing method of an electronic device using the same, and an electronic device.

That is, the present invention is as follows.

[1] An actinic ray-sensitive or radiation-sensitive resin composition comprising:

(A) a resin having a repeating unit represented by the following formula (1) and a group capable of decomposing by an action of an acid to produce a polar group, and an ionic compound represented by the following formula (2):

(1)

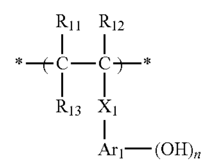

(2)

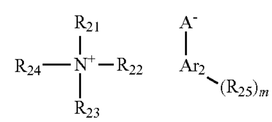

wherein in formula (1), each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may combine with $Ar_1$ to form a ring and in this case, $R_{13}$ represents an alkylene group, $X_1$ represents a single bond or a divalent linking group, $Ar_1$ represents an (n+1)-valent aromatic ring group and in the case of combining with $R_{13}$ to form a ring, represents an (n+2)-valent aromatic ring group, and n represents an integer of 1 to 4;

in formula (2), each of $R_{21}$, $R_{22}$, $R_{23}$ and $R_{24}$ independently represents a primary or secondary alkyl group or an aryl group, $A^-$ represents $COO^-$ or $O^-$, $Ar_2$ represents an (m+1)-valent aromatic ring group having no substituent other than $A^-$ and $R_{25}$, $R_{25}$ represents an alkyl group, a cycloalkyl group, a thioalkyl group, an aryl group, a halogen atom, a cyano group, a nitro group, an alkoxy group, a thioalkoxy group, a carbonyloxy group, a carbonylamino group, an alkoxycarbonyl group or an alkylaminocarbonyl group, and when m is 2 or more, each $R_{25}$ of a plurality of $R_{25}$ may be the same as or different from every other $R_{25}$ or may combine with another $R_{25}$ to form a ring, and m represents an integer of 0 or more.

[2] The actinic ray-sensitive or radiation-sensitive resin composition as described in [1], wherein the resin (A) has a repeating unit represented by the following formula (3):

(3)

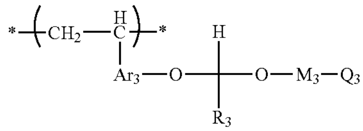

wherein $Ar_3$ represents an aromatic ring group, $R_3$ represents a hydrogen atom, an alkyl group, a cycloalkyl group, an aryl group, an aralkyl group, an alkoxy group, an acyl group or a heterocyclic group, $M_3$ represents a single bond or a divalent linking group, $Q_3$ represents an alkyl group, a cycloalkyl group, an aryl group or a heterocyclic group, and at least two members of $Q_3$, $M_3$ and $R_3$ may combine to form a ring.

[3] The actinic ray-sensitive or radiation-sensitive resin composition as described in [1], wherein the resin (A) has a repeating unit represented by the following formula (4):

(4)

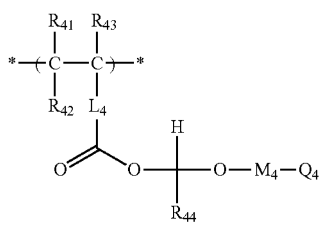

wherein each of $R_{41}$, $R_{42}$ and $R_{43}$ independently represents a hydrogen atom, an alkyl group, a cycloalkyl group, a halogen atom, a cyano group or an alkoxycarbonyl group, $R_{42}$ may combine with $L_4$ to form a ring and in this case, $R_{42}$ represents an alkylene group, $L_4$ represents a single bond or a divalent linking group and in the case of forming a ring together with $R_{42}$, represents a trivalent linking group, $R_{44}$ represents a hydrogen atom, an alkyl group, a cycloalkyl group, an aryl group, an aralkyl group, an alkoxy group, an acyl group or a heterocyclic group, $M_4$ represents a single bond or a divalent linking group, $Q_4$ represents an alkyl group, a cycloalkyl group, an aryl group or a heterocyclic group, and at least two members of $Q_4$, $M_4$ and $R_{44}$ may combine to form a ring.

[4] The actinic ray-sensitive or radiation-sensitive resin composition as described in any one of [1] to [3], wherein in formula (2), $A^{31}$ is $COO^{31}$ .

[5] The actinic ray-sensitive or radiation-sensitive resin composition as described in any one of [1] to [4], wherein in formula (2), $Ar_2$ represents an (m+1)-valent benzene ring.

[6] The actinic ray-sensitive or radiation-sensitive resin composition as described in any one of [1] to [5], further comprising a compound capable of generating an acid having a volume of 240 $Å^3$ or more upon irradiation with an actinic ray or radiation.

[7] A resist film comprising the actinic ray-sensitive or radiation-sensitive resin composition described in any one of [1] to [6].

[8] A pattern forming method comprising:

(i) a step of forming the resist film described in [7], (ii) a step of exposing the film, and (iii) a step of developing the exposed film by using a developer to form a pattern.

[9] The pattern forming method as described in [8], wherein the step (iii) is (iii') a step of developing the exposed film by using an organic solvent-containing developer to form a negative pattern.

[10] The pattern forming method as described in [8] or [9], wherein the exposure is performed using an X-ray, an electron beam or EUV light.

[11] A method for manufacturing an electronic device, comprising the pattern forming method described in any one of [8] to [10].

[12] An electronic device manufactured by the manufacturing method of an electronic device described in [11].

According to the present invention, a pattern forming method, an actinic ray-sensitive or radiation-sensitive resin composition, a resist film, each simultaneously satisfying high sensitivity, high resolution (such as high resolving power), good pattern profile and scum reduction at a high level, a manufacturing method of an electronic device using the same, and an electronic device, can be provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the "light" encompasses not only an extreme-ultraviolet ray (EUV light) but also an electron beam.

Furthermore, unless otherwise indicated, the "exposure" as used in the description of the present invention encompasses not only exposure to an extreme-ultraviolet ray (EUV light) but also lithography with an electron beam.

In the description of the present invention, the "actinic ray" or "radiation" means, for example, a bright line spectrum of a mercury lamp, a far ultraviolet ray typified by an excimer laser, an extreme-ultraviolet ray (EUV light), an X-ray or an electron beam. Also, in the present invention, the "light" means an actinic ray or radiation. Furthermore, unless otherwise indicated, the "exposure" as used in the description of the present invention encompasses not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention comprises (A) a resin having a repeating unit represented by the following formula (1) and a group capable of decomposing by an action of an acid to produce a polar group, and an ionic compound represented by the following formula (2):

(1)

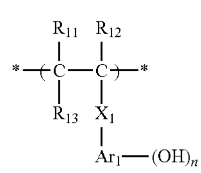

-continued

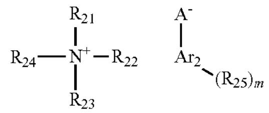

(2)

In formula (1), each of $R_{11}$, $R_{12}$ and $R_{13}$ independently represents a hydrogen atom, an alkyl group, a cycloalkyl group, a halogen atom, a cyano group or an alkoxycarbonyl group. $R_{13}$ may combine with $Ar_1$ to form a ring and in this case, $R_{13}$ represents an alkylene group.

$X_1$ represents a single bond or a divalent linking group.

$Ar_1$ represents an (n+1)-valent aromatic ring group and in the case of combining with $R_{13}$ to form a ring, represents an (n+2)-valent aromatic ring group.

n represents an integer of 1 to 4.

In formula (2), each of $R_{21}$, $R_{22}$, $R_{23}$ and $R_{24}$ independently represents a primary or secondary alkyl group or an aryl group.

$A^-$ represents COO or O.

$Ar_2$ represents an (m+1)-valent aromatic ring group having no substituent other than $A^-$ and $R_{25}$.

$R_{25}$ represents an alkyl group, a cycloalkyl group, a thioalkyl group, an aryl group, a halogen atom, a cyano group, a nitro group, an alkoxy group, a thioalkoxy group, a carbonyloxy group, a carbonylamino group, an alkoxycarbonyl group or an alkylaminocarbonyl group. When m is 2 or more, each $R_{25}$ of a plurality of $R_{25}$ may be the same as or different from every other $R_{25}$ or may combine with another $R_{25}$ to form a ring.

m represents an integer of 0 or more.

The reason why high sensitivity, high resolution, good pattern profile and scum reduction are realized at a high level by the actinic ray-sensitive or radiation-sensitive resin composition of the present invention is not clearly known but is presumed as follows.

The actinic ray-sensitive or radiation-sensitive resin composition according to the present invention contains an ionic compound represented by formula (2). The anion moiety in the ionic compound does not have an ionic group except for on the position of $A^-$ in formula (2). Thanks to this configuration, an excessive increase in the adherence to a substrate due to interaction therebetween is suppressed, as a result, the scum generation is considered to be reduced. In addition, the line width is prevented from thickening associated with scum generation, and the exposure dose necessary for obtaining a desired line width is reduced, which is considered to lead to enhancement of the sensitivity.

Also, in the ionic compound represented by formula (2), a primary or secondary alkyl group or an aryl group is substituted on the nitrogen atom in the cation moiety.

Thanks to this configuration, the interaction between the compound represented by formula (1) and the compound represented by formula (2), which are contained in the actinic ray-sensitive or radiation-sensitive resin composition according to the present invention, is strengthened, and the compound represented by formula (1) is uniformly distributed in the resist film, preventing the acid generated upon exposure from local and excessive diffusion, as a result, the pattern profile is considered to be improved. In addition, pattern collapse or line break is suppressed, whereby the resolution is considered to be enhanced.

First, the actinic ray-sensitive or radiation-sensitive resin composition for use in the present invention is described.

The actinic ray-sensitive or radiation-sensitive resin composition of the present invention is typically a resist composition and is preferably a negative resist composition (that is, a resist composition for organic solvent development), because particularly high effects can be obtained. Also, the composition according to the present invention is typically a chemical amplification resist composition.

The composition for use in the present invention contains (A) a resin capable of decomposing by the action of an acid to produce a polar group and a compound represented by formula (2). The resin (A) is described below.

[1] (A) Resin Capable of Decomposing by an Action of an Acid to Produce a Polar Group The actinic ray-sensitive or radiation-sensitive resin composition contains (A) a resin having a group capable of decomposing by the action of an acid to produce a polar group (hereinafter, sometimes referred to as "resin (A)"). The resin (A) contains an acid-decomposable repeating unit. The acid-decomposable repeating unit is, for example, a repeating unit having a group capable of decomposing by the action of an acid (hereinafter sometimes referred to as "acid-decomposable group"), on either one or both of the main chain and the side chain of the resin.

The chemical amplification resist composition of the present invention may be used as a positive resist composition or may be used as a negative resist composition.

In the case where the chemical amplification resist composition according to the present invention is used as a negative resist composition, the group produced by the decomposition is preferably a polar group, because the affinity for an organic solvent-containing developer is reduced and insolubilization or difficult solubilization (negative conversion) proceeds. Also, the polar group is preferably an acidic group. The definition of the polar group is the same as the definition described later in the paragraph of the repeating unit (c), but examples of the polar group that is produced by the decomposition of the acid-decomposable group include an alcoholic hydroxyl group, an amino group, and an acidic group.

The polar group produced by the decomposition of the acid-decomposable group is preferably an acidic group.

The acidic group is not particularly limited as long as it is a group insolubilized in an organic solvent-containing developer, but the acidic group is preferably a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group, more preferably a carboxylic acid group, a fluorinated alcohol group (preferably hexafluoroisopropanol), a phenolic hydroxyl group or an acidic group (a group capable of dissociating in an aqueous 2.38 mass % tetramethylammonium hydroxide solution that is conventionally used as the developer for resists) such as sulfonic acid group.

The group preferred as the acid-decomposable group is a group where a hydrogen atom of the group above is substituted for by a group capable of leaving by the action of an acid.

Examples of the group capable of leaving by the action of an acid include —$C(R_{36})(R_{37})(R_3)$, —$C(R_{36})(R_{37})(OR_{39})$, and —$C(R_{01})(R_{02})(OR_{39})$.

In the formulae, each of $R_{36}$ to $R_{39}$ independently represents an alkyl group, a cycloalkyl group, an aryl group, a group formed by combining an alkylene group and an aryl group, or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, a group formed by combining an alkylene group and an aryl group, or an alkenyl group.

The acid-decomposable group is preferably a cumyl ester group, an enol ester group, an acetal ester group, a tertiary alkyl ester group or the like.

(a) Repeating Unit Having an Acid-Decomposable Group

The resin (A) preferably contains, for example, (a) a repeating unit having an acid-decomposable group on either one or both of the main chain and the side chain of the resin.

The repeating unit (a) is preferably a repeating unit represented by the following formula (V):

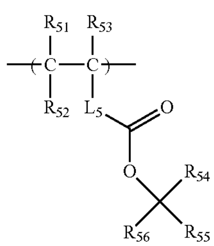

(V)

In formula (V), each of $R_{51}$, $R_{52}$ and $R_{53}$ independently represents a hydrogen atom, an alkyl group, a cycloalkyl group, a halogen atom, a cyano group or an alkoxycarbonyl group. $R_{52}$ may combine with $L_5$ to form a ring and in this case, $R_{52}$ represents an alkylene group.

$L_5$ represents a single bond or a divalent linking group and in the case of forming a ring together with $R_{52}$, represents a trivalent linking group.

$R_{54}$ represents an alkyl group, and each of $R_{55}$ and $R_{56}$ independently represents a hydrogen atom, an alkyl group, a cycloalkyl group, an aryl group or an aralkyl group. $R_{55}$ and $R_{56}$ may combine with each other to form a ring. However, it is excluded that $R_{55}$ and $R_{56}$ are a hydrogen atom at the same time.

Formula (V) is described in more detail.

The alkyl group of $R_{51}$ to $R_{53}$ in formula (V) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less, still more preferably an alkyl group having a carbon number of 3 or less.

As the alkyl group contained in the alkoxycarbonyl group, the same as the alkyl group in $R_{51}$ to $R_{53}$ is preferred.

The cycloalkyl group may be either monocyclic or polycyclic and is preferably a monocyclic cycloalkyl group having a carbon number of 3 to 10, such as cyclopropyl group, cyclopentyl group and cyclohexyl group, which may have a substituent.

The halogen atom includes fluorine atom, chlorine atom, bromine atom and iodine atom, with fluorine atom being preferred.

Preferred examples of the substituent on the groups above include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group.

The carbon number of the substituent is preferably 8 or less.

In the case where $R_{52}$ is an alkylene group and forms a ring together with $L_5$, the alkylene group is preferably an alkylene group having a carbon number of 1 to 8, such as methylene group, ethylene group, propylene group, butylene group, hexylene group and octylene group, more preferably an alkylene group having a carbon number of 1 to 4, still more preferably an alkylene group having a carbon number of 1 or 2. The ring formed by combining $R_{52}$ and $L_5$ is preferably a 5- or 6-membered ring.

In formula (V), each of $R_{51}$ and $R_{53}$ is preferably a hydrogen atom, an alkyl group or a halogen atom, more preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{52}$ is preferably a hydrogen atom, an alkyl group, a halogen atom or an alkylene group (forms a ring together with $L_5$), more preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forms a ring together with $L_5$) or an ethylene group (forms a ring together with $L_5$).

Examples of the divalent linking group represented by $L_5$ include an alkylene group, a divalent aromatic ring group, —COO-$L_1$-, —O-$L_1$-, and a group formed by combining two or more thereof. Here, $L_1$ represents an alkylene group, a cycloalkylene group, a divalent aromatic ring group or a group formed by combining an alkylene group and a divalent aromatic ring group.

$L_5$ is preferably a single bond, a group represented by —COO-$L_1$- or a divalent aromatic ring group. $L_1$ is preferably an alkylene group having a carbon number of 1 to 5, more preferably a methylene group or a propylene group. The divalent aromatic ring group is preferably a 1,4-phenylene group, a 1,3-phenylene group, 1,2-phenylene group or a 1,4-naphthylene group, more preferably a 1,4-phenylene group.

Preferred examples of the trivalent linking group represented by $L_5$ when $L_5$ combines with $R_{52}$ to form a ring include groups formed by removing one arbitrary hydrogen atom from specific examples recited above for the divalent linking group represented by $L_5$.

The alkyl group of $R_{54}$ to $R_{56}$ is preferably an alkyl group having a carbon number of 1 to 20, more preferably an alkyl group having a carbon number of 1 to 10, still more preferably an alkyl group having a carbon number of 1 to 4, such as methyl group, ethyl group, n-propyl group, isopropyl group, n-butyl group, isobutyl group and tert-butyl group.

The cycloalkyl group represented by $R_{55}$ and $R_{56}$ is preferably a cycloalkyl group having a carbon number of 3 to 20 and may be a monocyclic cycloalkyl group such as cyclopentyl group and cyclohexyl group or a polycyclic cycloalkyl group such as norbornyl group, adamantyl group, tetracyclodecanyl group and tetracyclododecanyl group.

The ring formed by combining $R_{55}$ and $R_{56}$ with each other is preferably a ring having a carbon number of 3 to 20 and may be a monocyclic ring such as cyclopentyl group and cyclohexyl group or a polycyclic ring such as norbornyl group, adamantyl group, tetracyclodecanyl group and tetracyclododecanyl group. In the case where $R_{55}$ and $R_{56}$ combine with each other to form a ring, $R_{54}$ is preferably an alkyl group having a carbon number of 1 to 3, more preferably a methyl group or an ethyl group.

The aryl group represented by $R_{55}$ and $R_{56}$ is preferably an aryl group having a carbon number of 6 to 20, and the aryl group may be monocyclic or polycyclic and may have a substituent. Examples of the aryl group include a phenyl group, a 1-naphthyl group, a 2-naphthyl group, a 4-methylphenyl group, and a 4-methoxyphenyl group. In the case where either one of $R_{55}$ and $R_{56}$ is a hydrogen atom, the other one is preferably an aryl group.

The aralkyl group represented by $R_{55}$ and $R_{56}$ may be monocyclic or polycyclic and may have a substituent. The aralkyl group is preferably an aralkyl group having a carbon number of 7 to 21, and examples thereof include a benzyl group and a 1-naphthylmethyl group.

As the method for synthesizing a monomer corresponding to the repeating unit represented by formula (V), a synthesis method for a general polymerizable group-containing ester may be applied, and the synthesis method is not particularly limited.

Specific examples of the repeating unit (a) represented by formula (V) are illustrated below, but the present invention is not limited thereto.

In specific examples, each of Rx and $Xa_1$ represents a hydrogen atom, $CH_3$, $CF_3$ or $CH_2OH$, and each of Rxa and Rxb independently represents an alkyl group having a carbon number of 1 to 4, an aryl group having a carbon number of 6 to 18, or an aralkyl group having a carbon number of 7 to 19. Z represents a substituent. p represents 0 or a positive integer and is preferably 0 to 2, more preferably 0 or 1. When a plurality of Z are present, each Z may be the same as or different from every other Z. From the standpoint of increasing the dissolution contrast for the organic solvent-containing developer between before and after the acid-induced decomposition, Z is preferably a group composed of only a hydrogen atom and a carbon atom and, for example, preferably a linear or branched alkyl group or a cycloalkyl group.

1

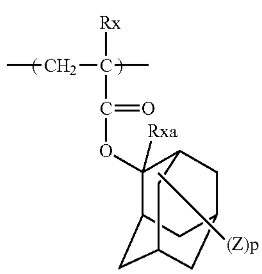

2

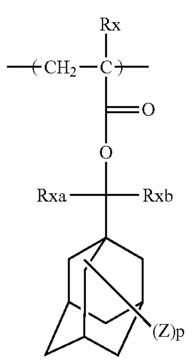

-continued

3

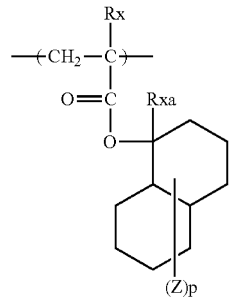

4

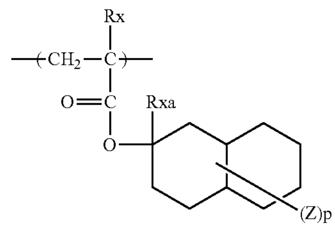

5

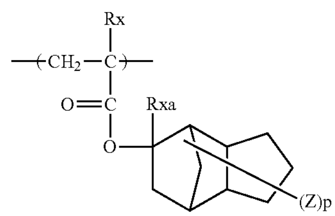

6

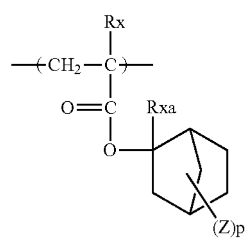

7

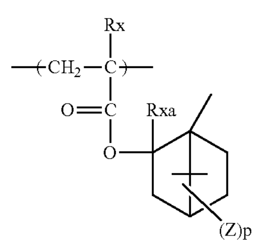

8

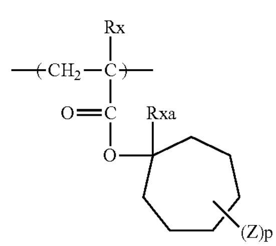

-continued
9
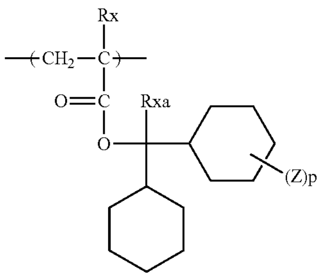
10
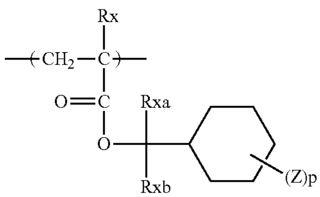
11
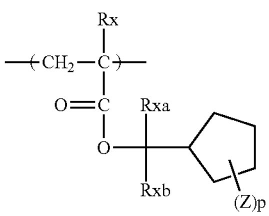
12
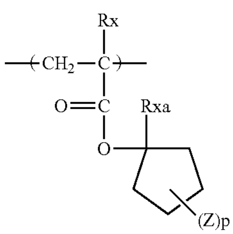
13
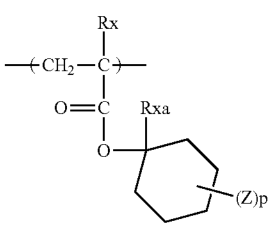
14
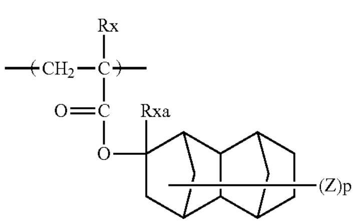
15
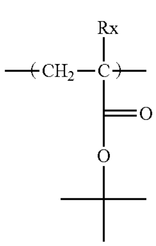
-continued
16
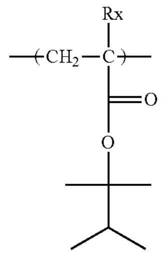
17
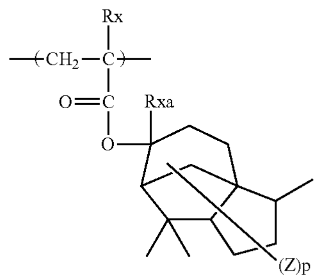
18
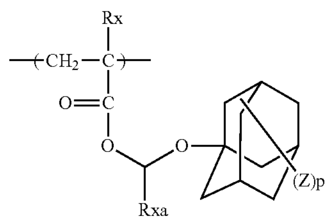
19
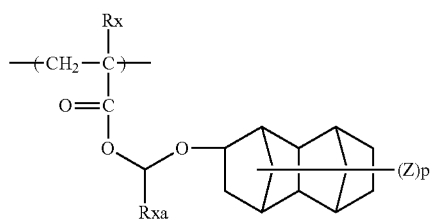
20
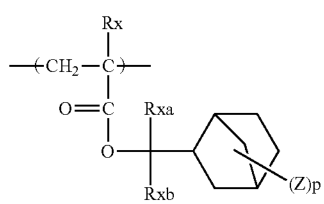
21
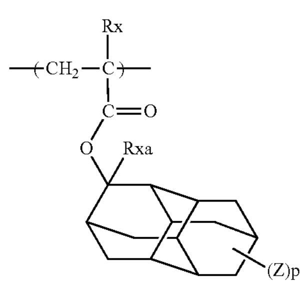

-continued
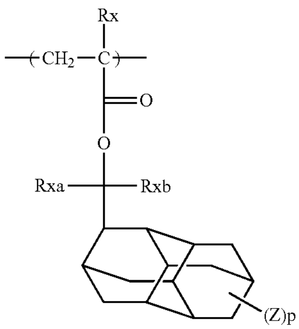
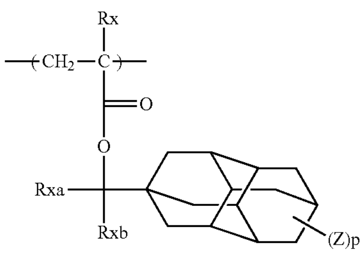
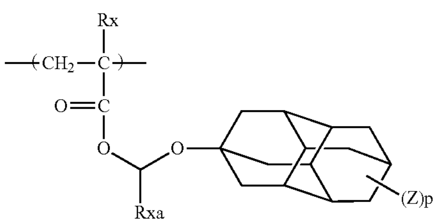
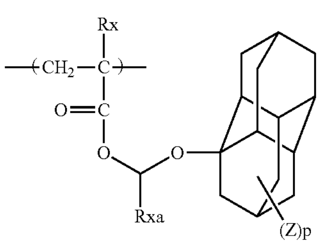
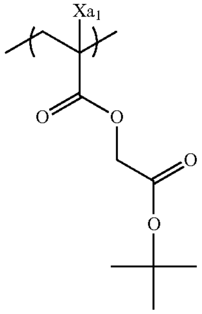
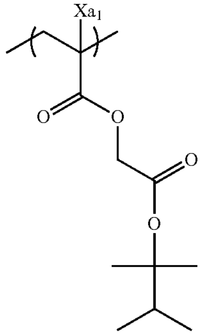
-continued
22
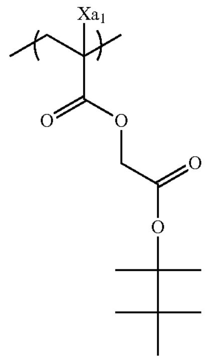
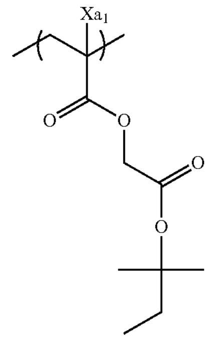
23
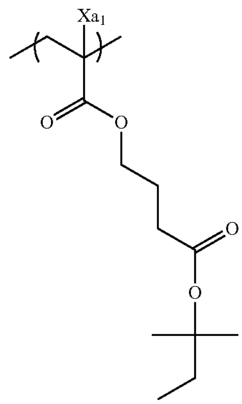
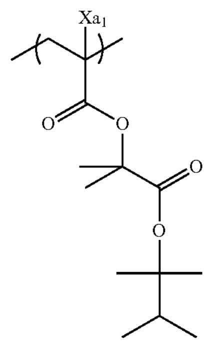
24
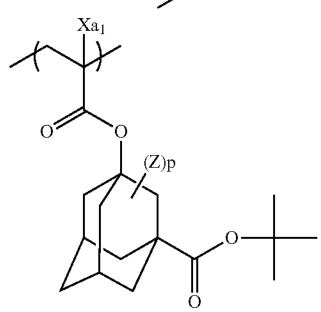
25
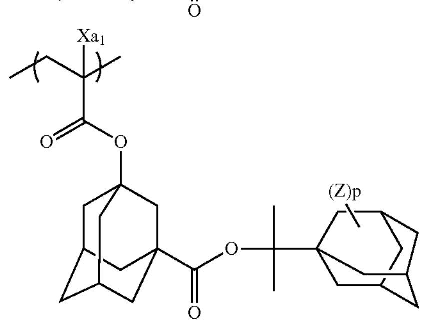
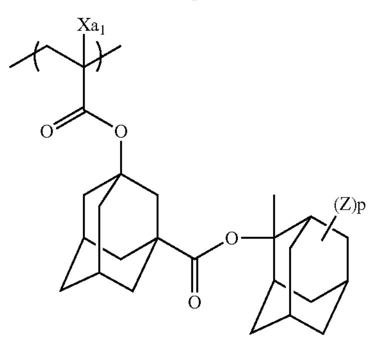

-continued
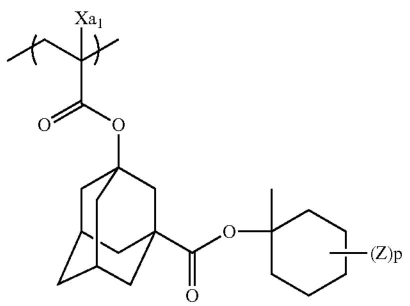
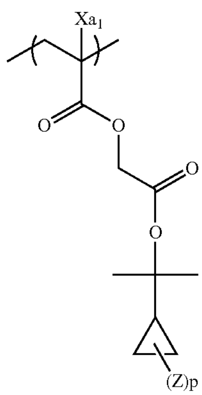
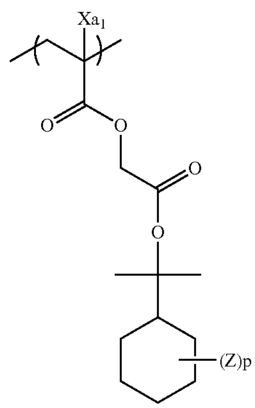
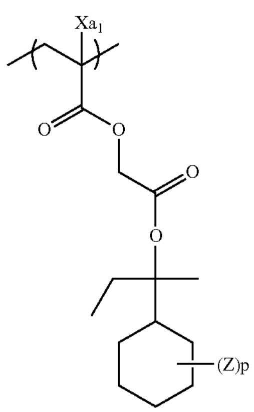
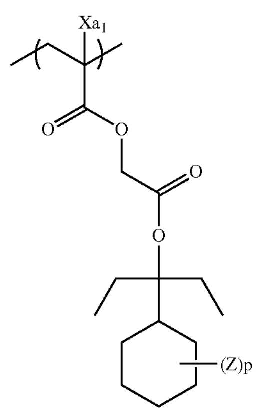
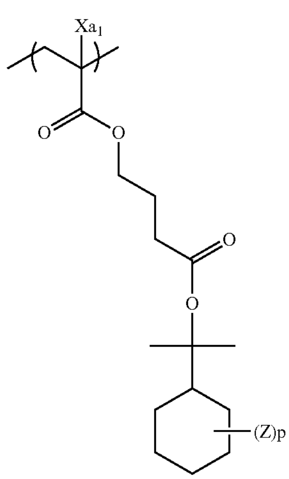
-continued
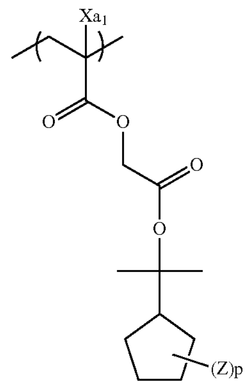
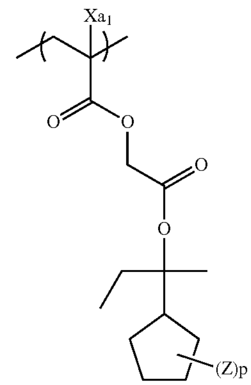
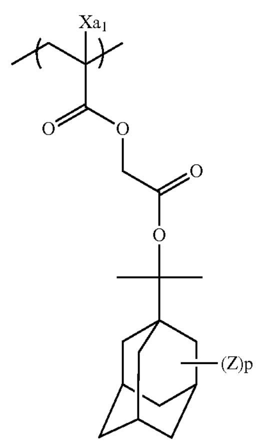
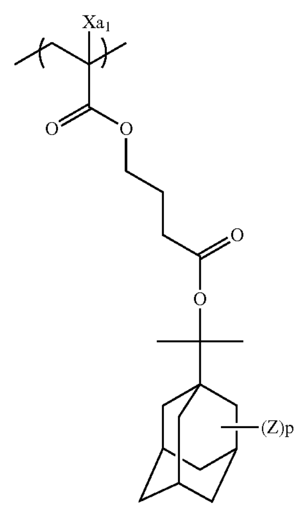
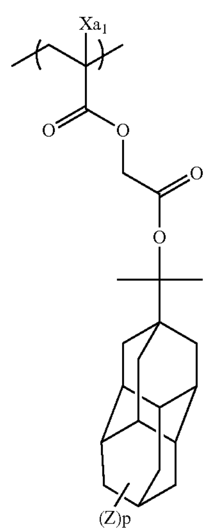
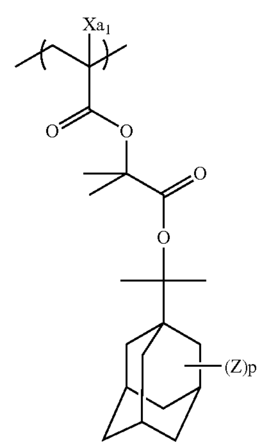

-continued
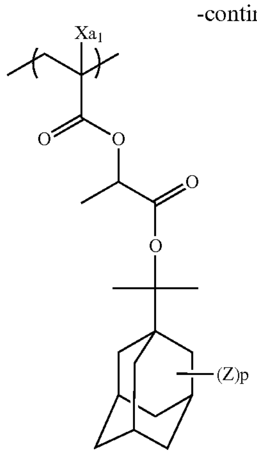
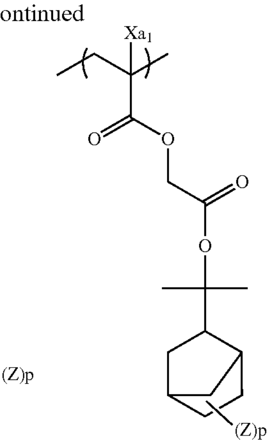
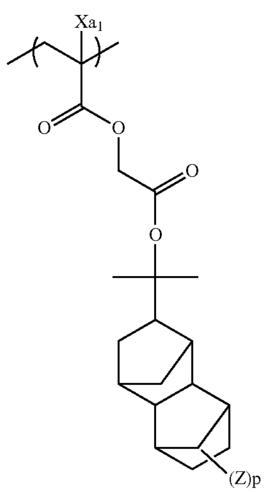
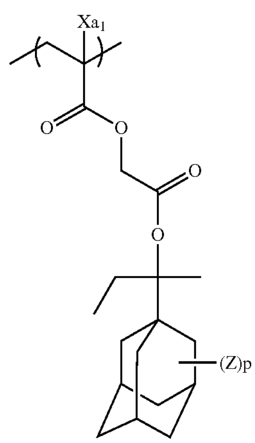
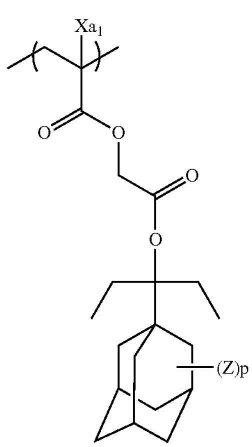
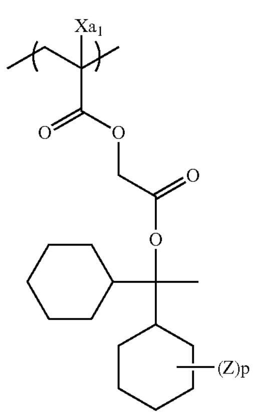
-continued
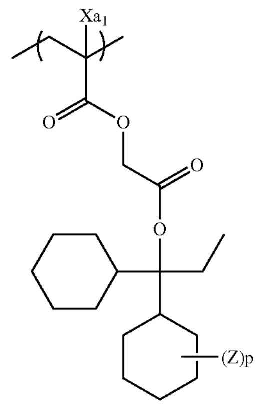
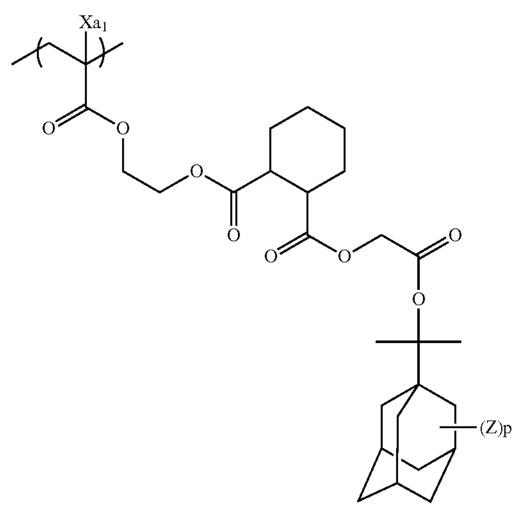
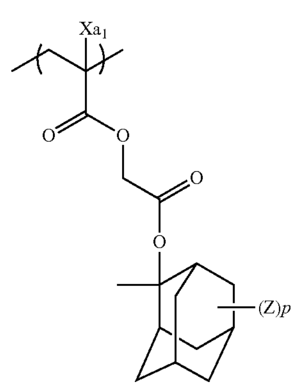

-continued
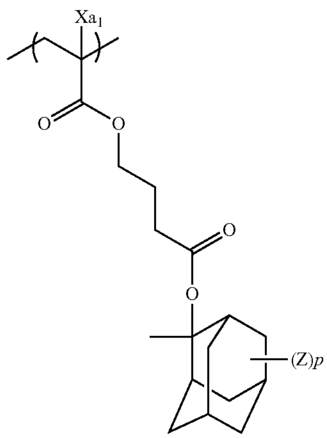
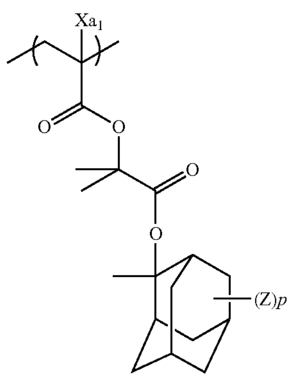
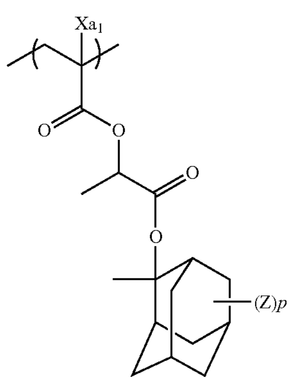
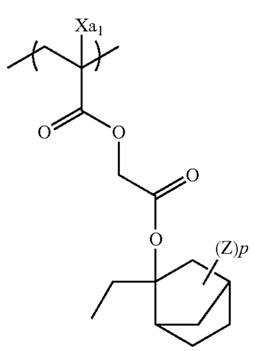
-continued
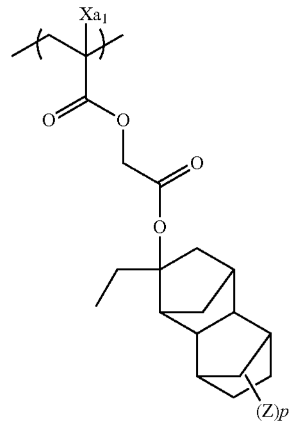
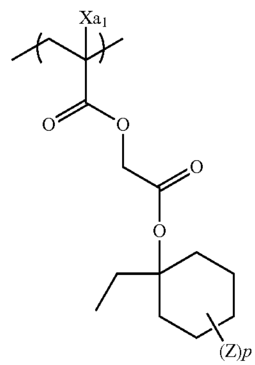
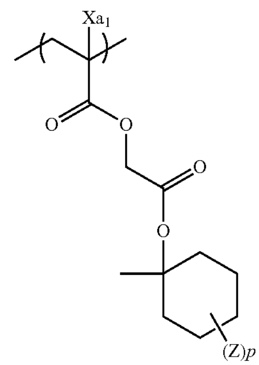
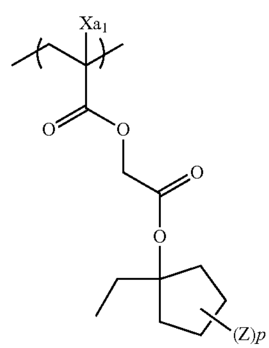
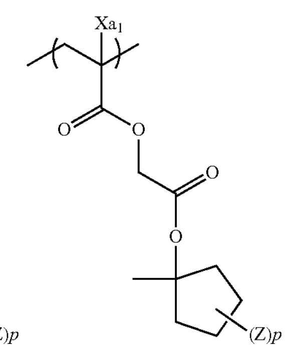
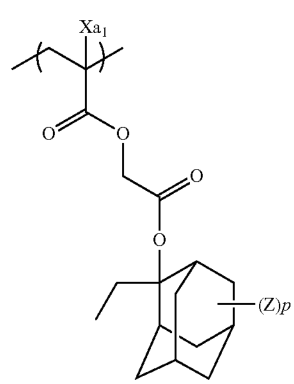

-continued
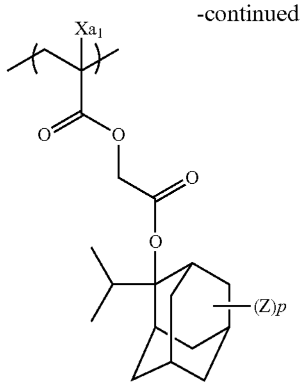
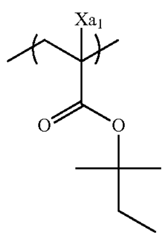
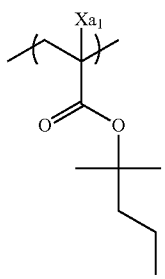
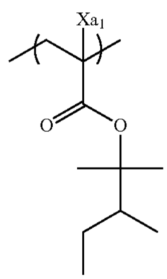
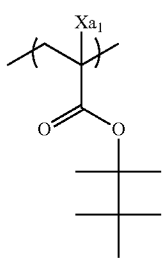
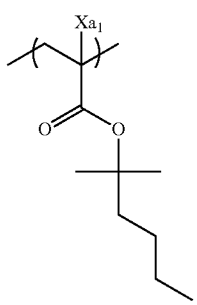
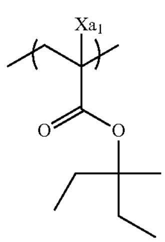
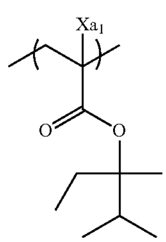
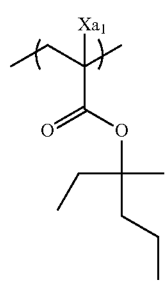
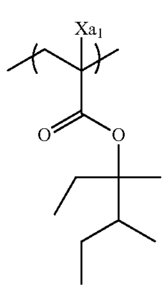
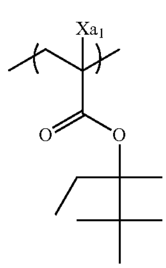
-continued
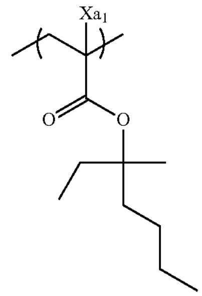
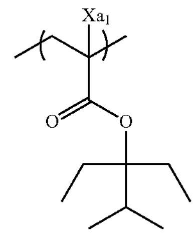
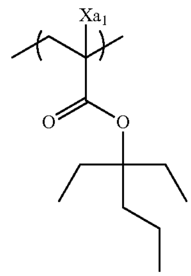
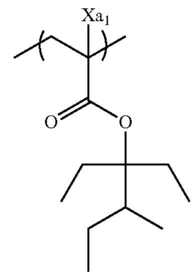
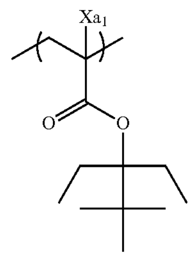
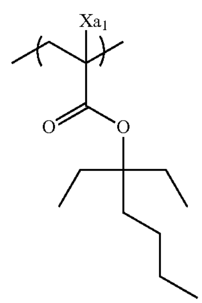
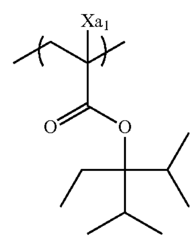
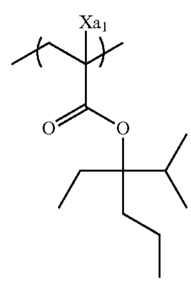
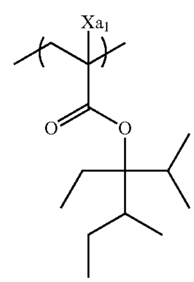
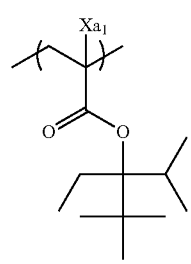
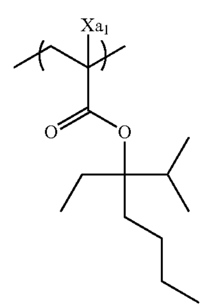

-continued
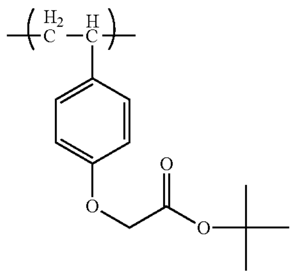
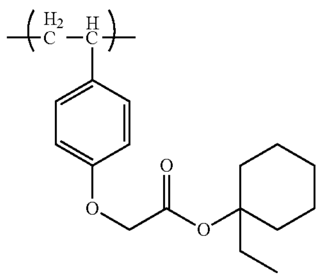
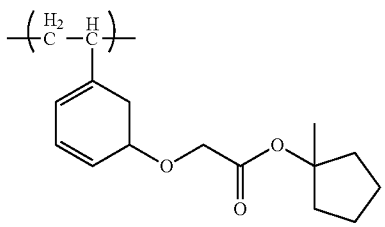
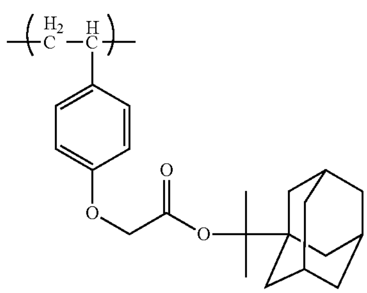
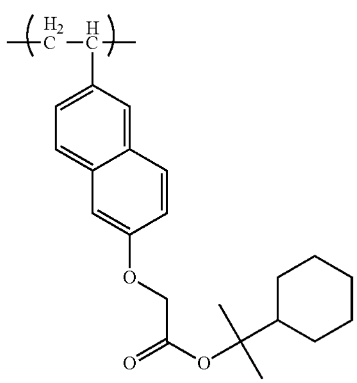
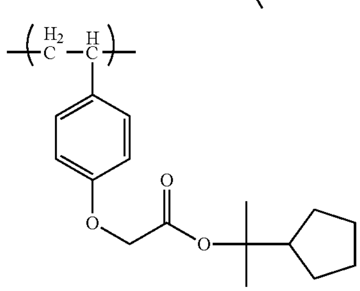
-continued
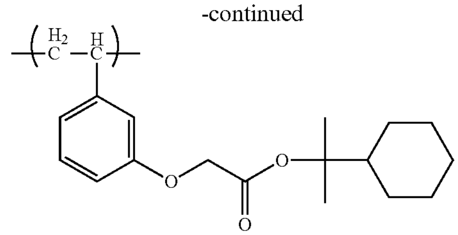
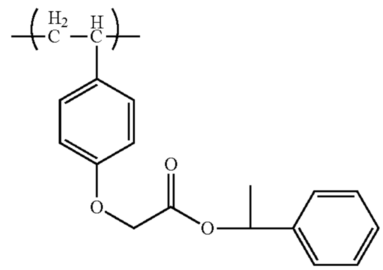
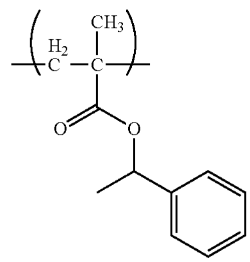
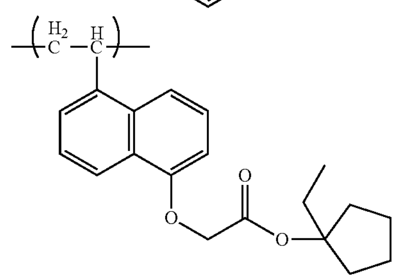
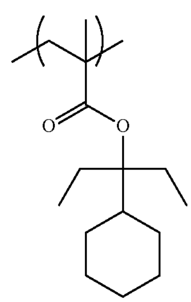
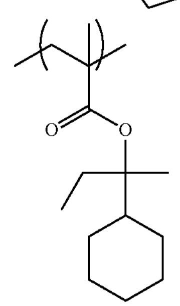
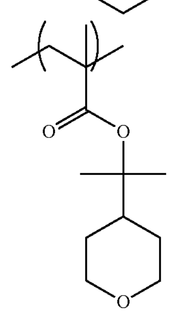
The resin (A) may contain, as the repeating unit (a), a repeating unit represented by the following formula (VI):

(VI)

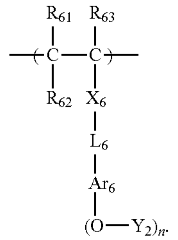

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group. However, $R_{62}$ may combine with $Ar_6$ to form a ring and in this case, $R_{62}$ represents a single bond or an alkylene group.

$X_6$ represents a single bond, —COO— or —CONR$_{64}$—, wherein $R_{64}$ represents a hydrogen atom or an alkyl group.

$L_6$ represents a single bond or an alkylene group.

$Ar_6$ represents an (n+1)-valent aromatic ring group and in the case of combining with $R_{62}$ to form a ring, represents an (n+2)-valent aromatic ring group.

$Y_2$ represents, when n≥2, each independently represents, a hydrogen atom or a group capable of leaving by the action of an acid. However, at least one $Y_2$ represents a group capable of leaving by the action of an acid.

n represents an integer of 1 to 4.

Formula (VI) is described in more detail.

In formula (VI), the alkyl group of $R_{61}$ to $R_{63}$ is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less.

As the alkyl group contained in the alkoxycarbonyl group, the same as the alkyl group in $R_{61}$ to $R_{63}$ is preferred.

The cycloalkyl group may be either monocyclic or polycyclic and is preferably a monocyclic cycloalkyl group having a carbon number of 3 to 10, such as cyclopropyl group, cyclopentyl group and cyclohexyl group, which may have a substituent.

The halogen atom includes fluorine atom, chlorine atom, bromine atom and iodine atom, with fluorine atom being preferred.

In the case where $R_{62}$ represents an alkylene group, the alkylene group is preferably an alkylene group having a carbon atom of 1 to 8, such as methylene group, ethylene group, propylene group, butylene group, hexylene group and octylene group, which may have a substituent.

Examples of the alkyl group of $R_{64}$ in —CONR$_{64}$— ($R_{64}$ represents a hydrogen atom or an alkyl group) represented by $X_6$ are the same as those of the alkyl group of $R_{61}$ to $R_{63}$.

$X_6$ is preferably a single bond, —COO— or —CONH—, more preferably a single bond or —COO—.

The alkylene group of $L_6$ is preferably an alkylene group having a carbon number of 1 to 8, such as methylene group, ethylene group, propylene group, butylene group, hexylene group and octylene group, which may have a substituent. The ring formed by combining $R_{62}$ with $L_6$ is preferably a 5- or 6-membered ring.

$Ar_6$ represents an (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include the groups formed by removing arbitrary (n−1) hydrogen atoms from the above-described specific examples of the divalent aromatic ring group.

The (n+1)-valent aromatic ring group may further have a substituent.

Specific examples of the substituent that the above-described alkyl group, cycloalkyl group, alkoxycarbonyl group, alkylene group and (n+1)-valent aromatic ring group may have are the same as those of the substituent that the groups represented by $R_{51}$ to $R_{53}$ in formula (V) may have.

n is preferably 1 or 2, more preferably 1.

Each of n $Y_2$ independently represents a hydrogen atom or a group capable of leaving by the action of an acid. However, at least one of n $Y_2$ represents a group capable of leaving by the action of an acid.

Examples of the group $Y_2$ capable of leaving by the action of an acid include —C($R_{36}$)($R_{37}$)($R_{38}$), —C(═O)—O—C($R_{36}$)($R_{37}$)($R_{38}$), —C($R_{01}$)($R_{02}$)(O$R_{39}$), —C($R_{01}$)($R_{02}$)—C(═O)—O—C($R_{36}$)($R_{37}$)($R_{38}$), and —CH($R_{36}$)(Ar).

In the formulae, each of $R_{36}$ to $R_{39}$ independently represents an alkyl group, a cycloalkyl group, an aryl group, a group formed by combining an alkylene group and an aryl group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, a group formed by combining an alkylene group and an aryl group, or an alkenyl group.

Ar represents an aryl group.

The alkyl group of $R_{36}$ to $R_{39}$, $R_{01}$ and $R_{02}$ may be linear or branched and is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be monocyclic or polycyclic.

The monocyclic cycloalkyl group is preferably a cycloalkyl group having a carbon number of 3 to 10, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The aryl group of $R_{36}$ to $R_{39}$, $R_{01}$, $R_{02}$ and Ar is preferably an aryl group having a carbon number of 6 to 10, and examples thereof include an aryl group such as phenyl group, naphthyl group and anthryl group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The group formed by combining an alkylene group and aryl group, represented by $R_{36}$ to $R_{39}$, $R_{01}$ and $R_{02}$, is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ with each other may be either monocyclic or polycyclic. The monocyclic ring is preferably a cycloalkyl structure having a carbon number of 3 to 10, and examples thereof include a cyclopropane structure, a cyclobutane structure, a cyclopentane structure, a cyclohexane structure, a cycloheptane structure, and a cyclooctane structure. The polycyclic ring is preferably a cycloalkyl structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the cycloalkyl structure may be substituted with a heteroatom such as oxygen atom.

Each of the groups above of $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group $Y_2$ capable of leaving by the action of an acid is more preferably a structure represented by the following formula (VI-A):

(VI-A)

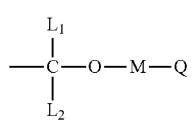

In the formula, each of $L_1$ and $L_2$ independently represents a hydrogen atom, an alkyl group, a cycloalkyl group, an aryl group or a group formed by combining an alkylene group and an aryl group.

M represents a single bond or a divalent linking group.

Q represents an alkyl group, a cycloalkyl group that may contain a heteroatom, an aryl group that may contain a heteroatom, an amino group, an ammonium group, a mercapto group, a cyano group or an aldehyde group.

At least two members of Q, M and $L_1$ may combine with each other to form a ring (preferably a 5- or 6-membered ring).

The alkyl group of $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group, and an octyl group.

The cycloalkyl group of $L_1$ and $L_2$ is, for example, a cycloalkyl group having a carbon number of 3 to 15, and specific preferred examples thereof include a cyclopentyl group, a cyclohexyl group, a norbornyl group, and an adamantyl group.

The aryl group of $L_1$ and $L_2$ is, for example, an aryl group having a carbon number of 6 to 15, and specific preferred examples thereof include a phenyl group, a tolyl group, a naphthyl group, and an anthryl group.

The group formed by combining an alkylene group and an aryl group, represented by $L_1$ and $L_2$ is, for example, an aralkyl group having a carbon number of 6 to 20, such as benzyl group and phenethyl group.

Examples of the divalent linking group of M include an alkylene group (e.g., methylene, ethylene, propylene, butylene, hexylene, octylene), a cycloalkylene group (e.g., cyclopentylene, cyclohexylene, adamantylene), an alkenylene group (e.g., ethenylene, propenylene, butenylene), a divalent aromatic ring group (e.g., phenylene, tolylene, naphthylene), —S—, —O—, —CO—, —$SO_2$—, —N($R_0$)—, and a divalent linking group formed by combining a plurality of these members. $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

Examples of the alkyl group of Q are the same as those of respective groups of $L_1$ and $L_2$.

Examples of the heteroatom-free aliphatic hydrocarbon ring group and heteroatom-free aryl group in the cycloalkyl group that may contain a heteroatom and the aryl group that may contain a heteroatom, represented by Q, include the above-described cycloalkyl group and aryl group of $L_1$ and $L_2$, and the carbon number thereof is preferably from 3 to 15.

Examples of the heteroatom-containing cycloalkyl group and heteroatom-containing aryl group include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the structure is not limited thereto as long as it is a structure generally called a heterocyclic ring (a ring composed of carbon and a heteroatom or a ring composed of a heteroatom).

The ring structure which may be formed by combining at least two members of Q, M and $L_1$ includes a case where at least two members of Q, M and $L_1$ are combined to form, for example, a propylene group or a butylene group and thereby form a 5- or 6-membered ring containing an oxygen atom.

In formula (VI-A), each of the groups represented by $L_1$, $L_2$, M and Q may have a substituent, and examples of the substituent include those described above for the substituent that $R_{36}$ to $R_{39}$, $R_{01}$, $R_{02}$ and Ar may have. The carbon number of the substituent is preferably 8 or less.

The group represented by -M-Q is preferably a group having a carbon number of 1 to 30, more preferably a group having a carbon number of 5 to 20.

The repeating unit represented by formula (VI) is preferably a repeating unit represented by the following formula (3):

(3)

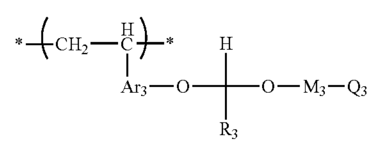

In formula (3), $Ar_3$ represents an aromatic ring group.

$R_3$ represents a hydrogen atom, an alkyl group, a cycloalkyl group, an aryl group, an aralkyl group, an alkoxy group, an acyl group or a heterocyclic group.

$M_3$ represents a single bond or a divalent linking group.

$Q_3$ represents an alkyl group, a cycloalkyl group, an aryl group or a heterocyclic group.

At least two members of $Q_3$, $M_3$ and $R_3$ may combine to form a ring.

The aromatic ring group represented by $Ar_3$ is the same as $Ar_6$ in formula (VI) when n in formula (VI) is 1, and is preferably a phenylene group or a naphthylene group, more preferably a phenylene group.

$Ar_3$ may have a substituent, and examples of the substituent that it may have are the same as those of the substituent that $Ar_6$ in formula (VI) may have.

The alkyl group or cycloalkyl group represented by $R_3$ has the same meaning as the alkyl group or cycloalkyl group represented by $R_{36}$ to $R_{39}$, $R_{01}$ and $R_{02}$.

The aryl group represented by $R_3$ has the same meaning as the aryl group represented by $R_{36}$ to $R_{39}$, $R_{01}$ and $R_{02}$, and the preferred range is also the same.

The aralkyl group represented by $R_3$ is preferably an aralkyl group having a carbon number of 7 to 12, and examples thereof include a benzyl group, a phenethyl group, and a naphthylmethyl group.

The alkyl group moiety in the alkoxy group represented by $R_3$ is the same as the alkyl group represented by $R_{36}$ to $R_{39}$, $R_{01}$ and $R_{02}$, and the preferred range is also the same.

The acyl group represented by $R_3$ includes an aliphatic acyl group having a carbon number of 1 to 10, such as formyl group, acetyl group, propionyl group, butyryl group, isobutyryl group, valeryl group, pivaloyl group, benzoyl group and naphthoyl group, and is preferably an acetyl group or a benzoyl group.

The heterocyclic group represented by $R_3$ includes the above-described heteroatom-containing cycloalkyl group and heteroatom-containing aryl group and is preferably a pyridine ring group or a pyrane ring group.

$R_3$ is preferably an alkyl group, a cycloalkyl group, an aryl group, an aralkyl group, an alkoxy group, an acyl group or a heterocyclic group, and more preferably a linear or branched alkyl group having a carbon number of 1 to 8 (specifically, a methyl group, an ethyl group, a propyl group, an isopropyl group, an n-butyl group, a sec-butyl group, a tert-butyl group, a neopentyl group, a hexyl group, a 2-ethylhexyl group or an octyl group) or a cycloalkyl group having a carbon number of 3 to 15 (specifically, a cyclopentyl group, a cyclohexyl group, a norbornyl group, an adamantyl group or the like). $R_3$ is more preferably a methyl group, an ethyl group, an isopropyl group, a sec-butyl group, a tert-butyl group, a neopentyl group, a cyclohexyl group, an adamantyl group, a cyclohexylmethyl group or an adamantanemethyl group, still more preferably a methyl group, a sec-butyl group, a neopentyl group, a cyclohexylmethyl group or an adamantanemethyl group.

The above-described alkyl group, cycloalkyl group, aryl group, aralkyl group, alkoxy group, acyl group or heterocyclic group may further have a substituent, and examples of the substituent that such a group may have include those described above for the substituent that $R_{36}$ to $R_{39}$, $R_{01}$, $R_{02}$ and Ar may have.

The divalent linking group represented by $M_3$ has the same meaning as M in the structure represented by formula (VI-A), and the preferred range is also the same. $M_3$ may have a substituent, and examples of the substituent that $M_3$ may have are the same as those of the substituent that M in the group represented by formula (VI-A) may have.

The alkyl group, cycloalkyl group and aryl group represented by $Q_3$ have the same meanings as those of Q in the structure represented by formula (VI-A), and the preferred ranges are also the same.

The heterocyclic group represented by $Q_3$ includes the above-described heteroatom-containing cycloalkyl group and heteroatom-containing aryl group of Q in the structure represented by formula (VI-A), and the preferred ranges are also the same.

$Q_3$ may have a substituent, and examples of the substituent that $Q_3$ may have are the same as those of the substituent that Q in the group represented by formula (VI-A) may have.

The ring formed by combining at least two members of $Q_3$, $M_3$ and $R_3$ has the same meaning as the ring that may be formed by combining at least two members of Q, M and $L_1$ in formula (VI-A), and the preferred range is also the same.

As specific preferred examples of the repeating unit (a), specific examples of the repeating unit represented by formula (VI) are illustrated below, but the present invention is not limited thereto.

(VI-1)

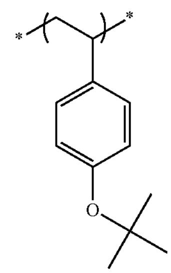

(VI-2)

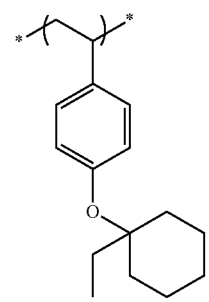

(VI-3)

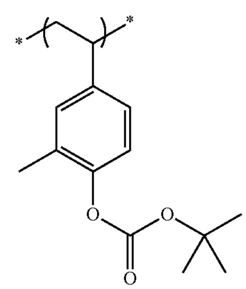

(VI-4)

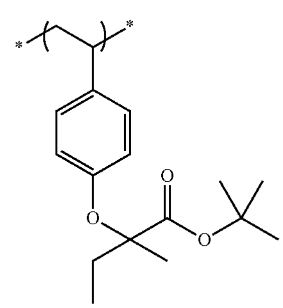

-continued
(VI-5)
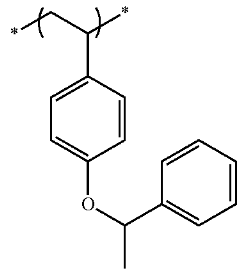
(VI-6)
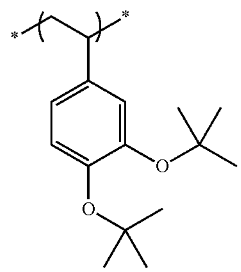
(VI-7)
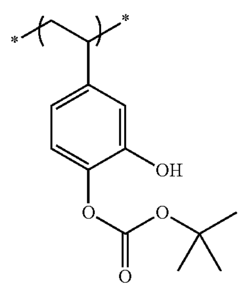
(VI-8)
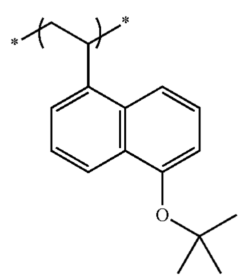
(VI-9)
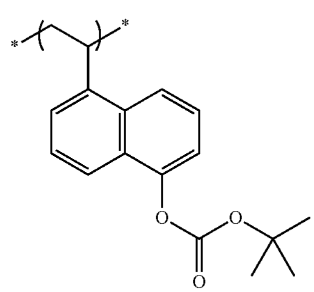
-continued
(VI-10)
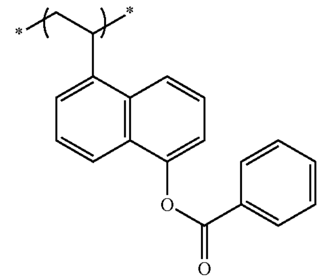
(VI-11)
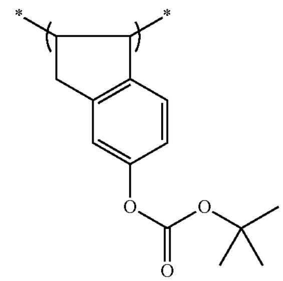
(VI-12)
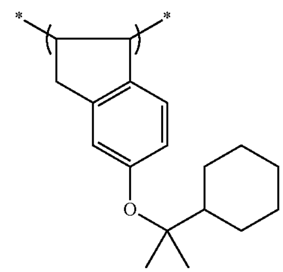
(VI-13)
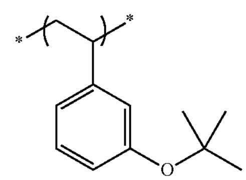
(VI-14)
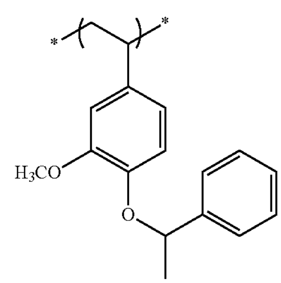
(VI-15)
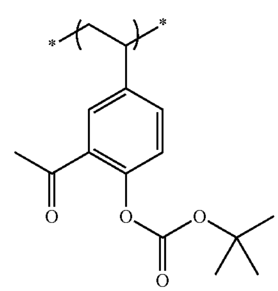

-continued
(VI-16)
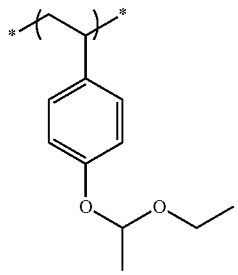
(VI-17)
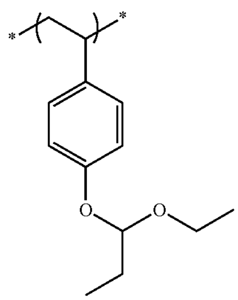
(VI-18)
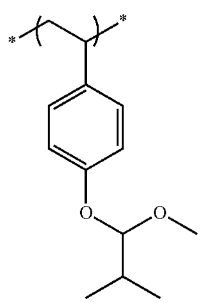
(VI-19)
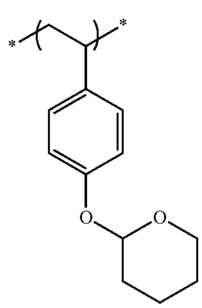
(VI-20)
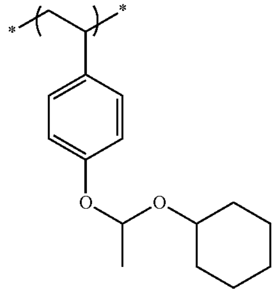
-continued
(VI-21)
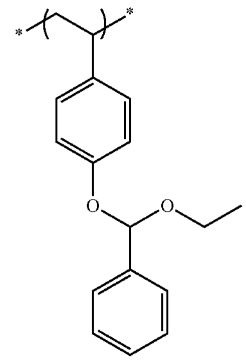
(VI-22)
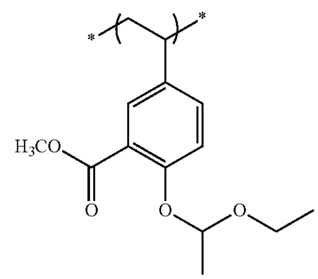
(VI-23)
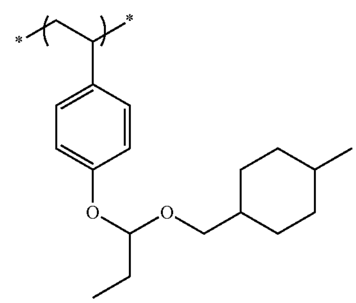
(VI-24)
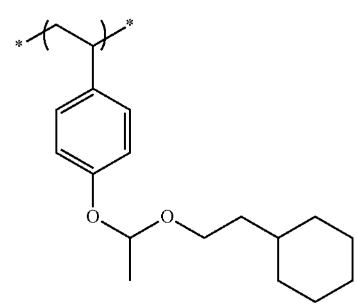
(VI-25)
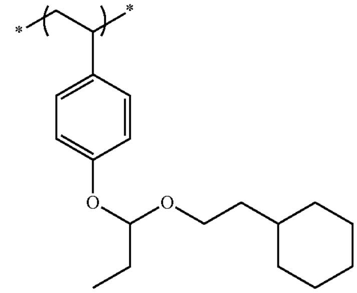

-continued
(VI-26)
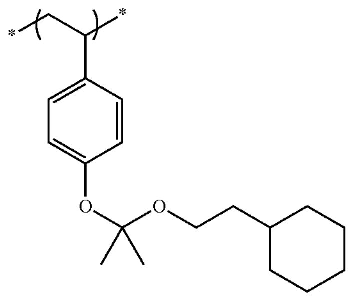
(VI-27)
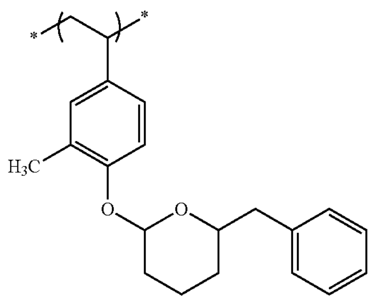
(VI-28)
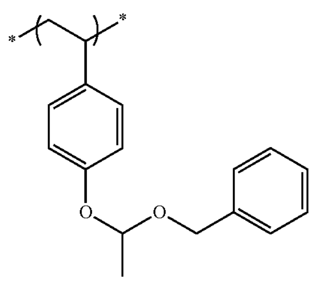
(VI-29)
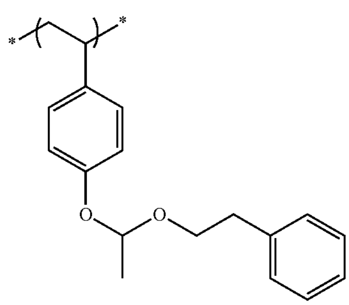
(VI-30)
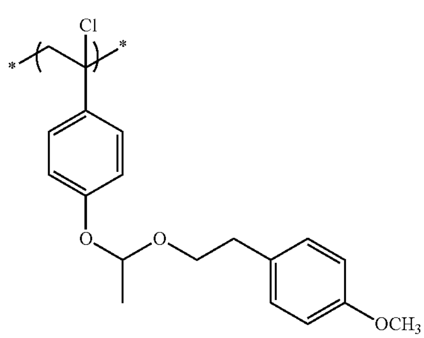
-continued
(VI-31)
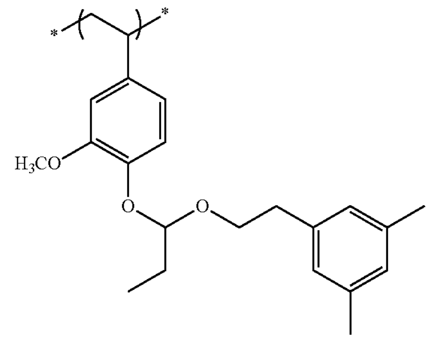
(VI-32)
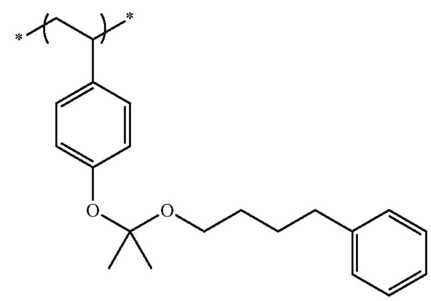
(VI-33)
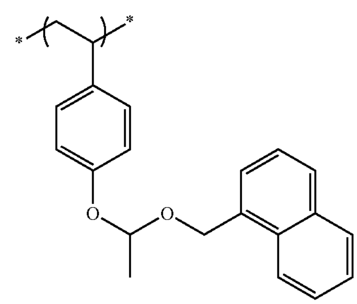
(VI-34)
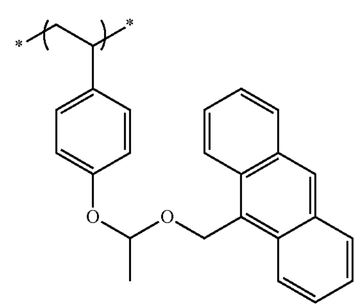
(VI-35)
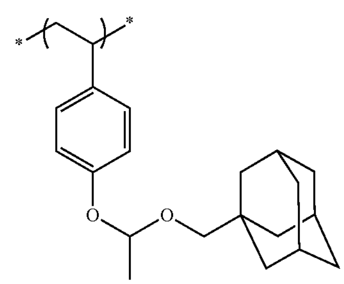

-continued
(VI-36)
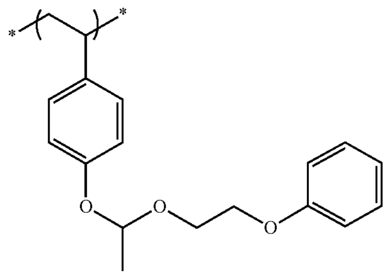
(VI-37)
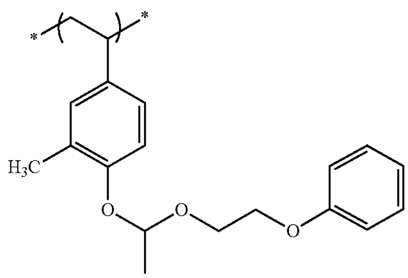
(VI-38)
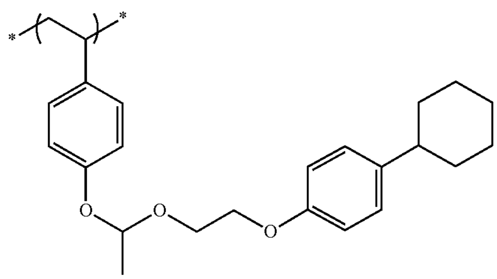
(VI-39)
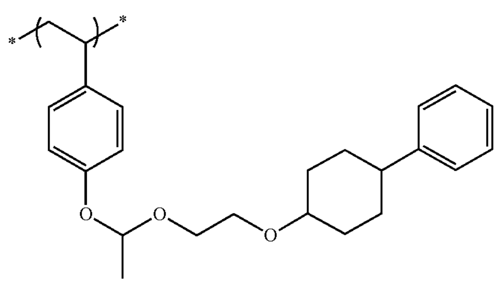
(VI-40)
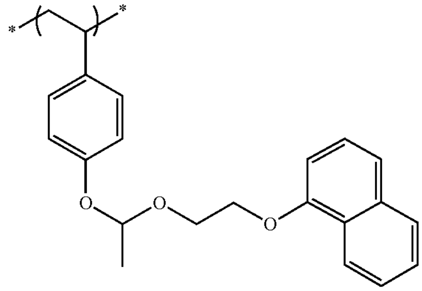
-continued
(VI-41)
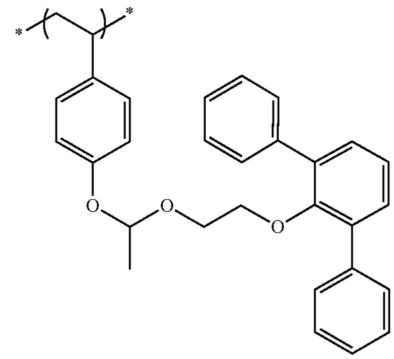
(VI-42)
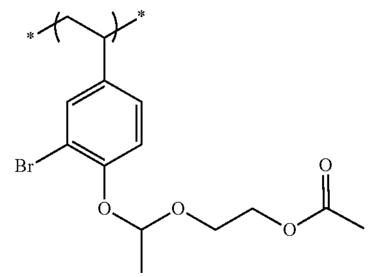
(VI-43)
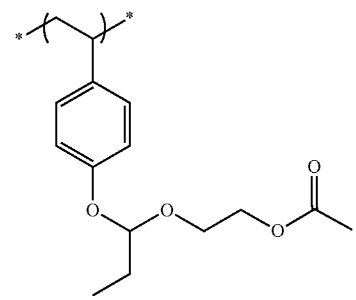
(VI-44)
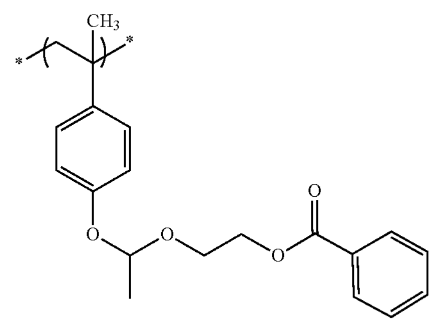
(VI-45)
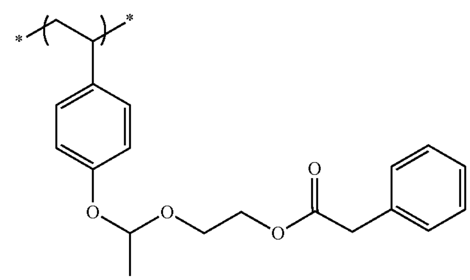

-continued
(VI-46)
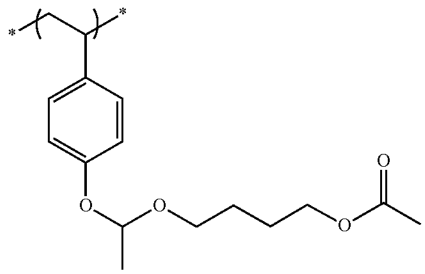
(VI-47)
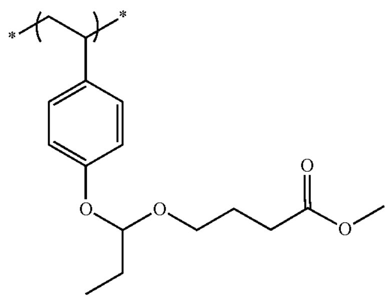
(VI-48)
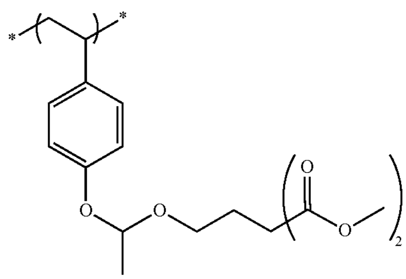
(VI-49)
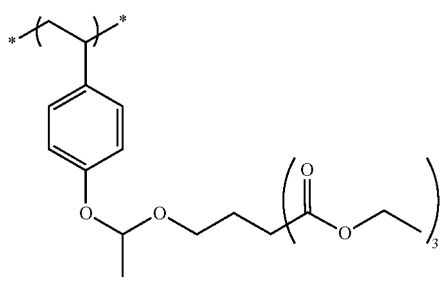
(VI-50)
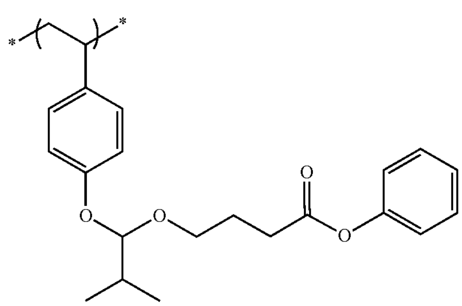
-continued
(VI-51)
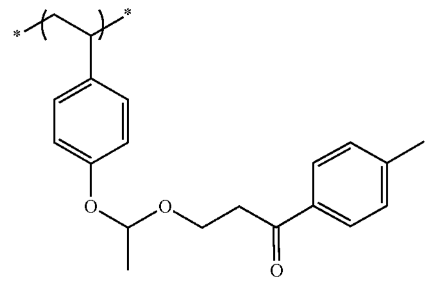
(VI-52)
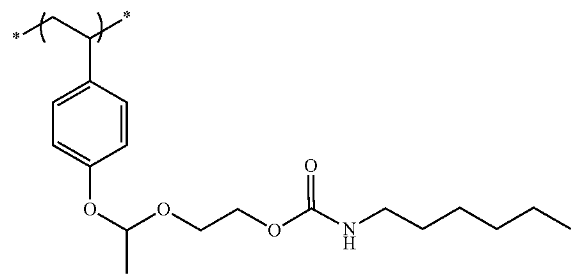
(VI-53)
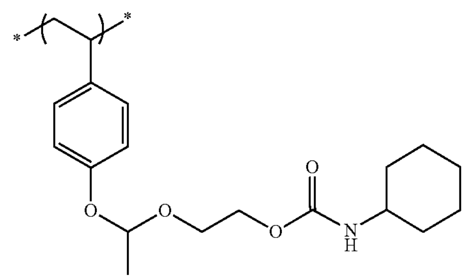
(VI-54)
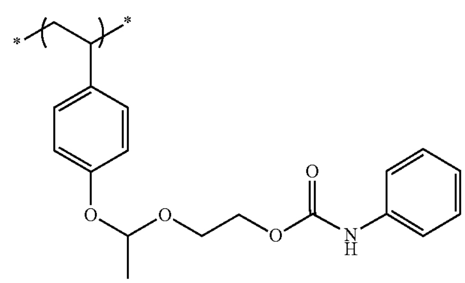
(VI-55)
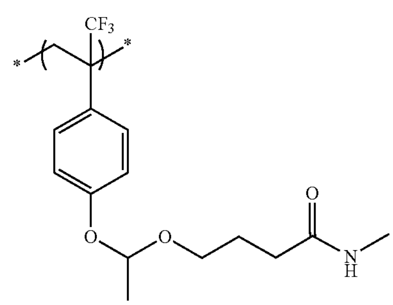

(VI-56)
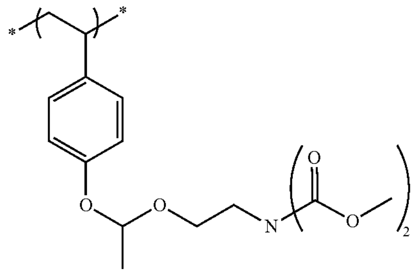
(VI-57)
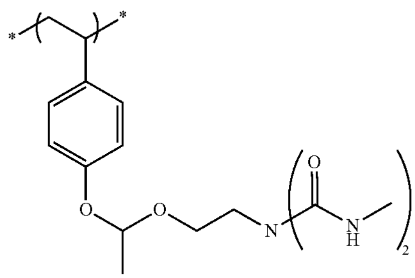
(VI-58)
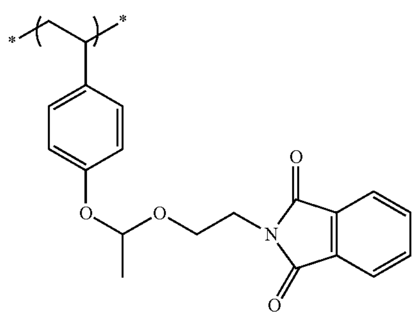
(VI-59)
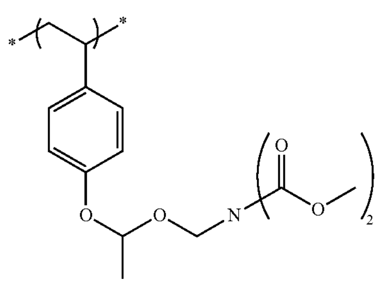
(VI-60)
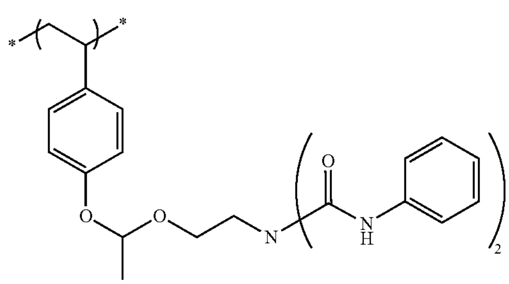
(VI-61)
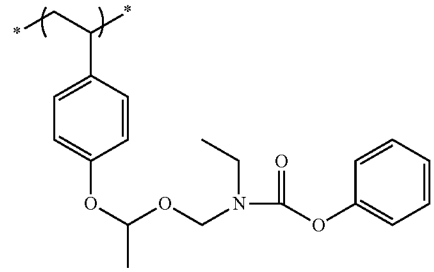
(VI-62)
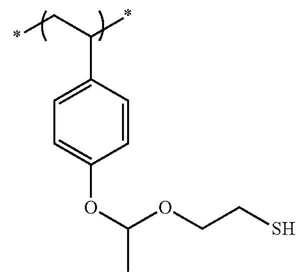
(VI-63)
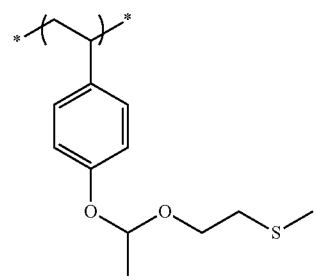
(VI-64)
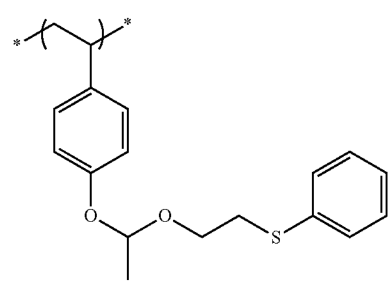
(VI-65)
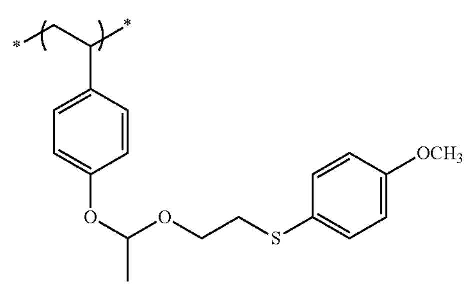

-continued
(VI-66)
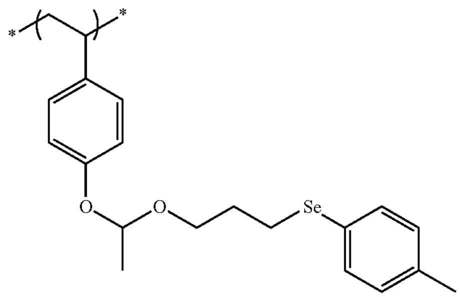
(VI-67)
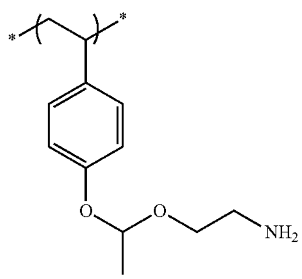
(VI-68)
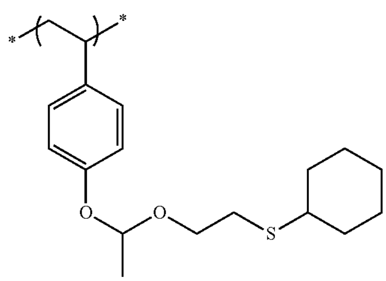
(VI-69)
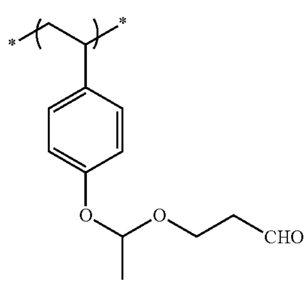
(VI-70)
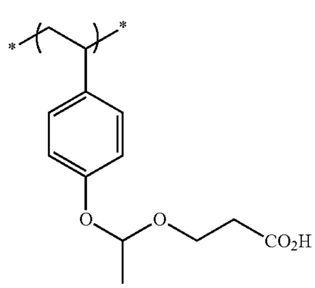
-continued
(VI-71)
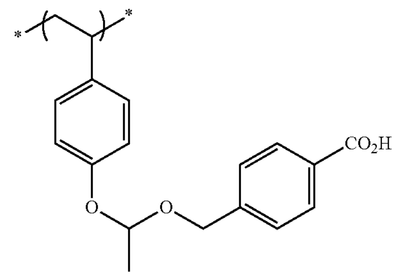
(VI-72)
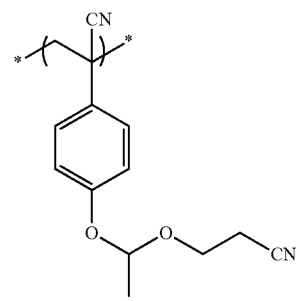
(VI-73)
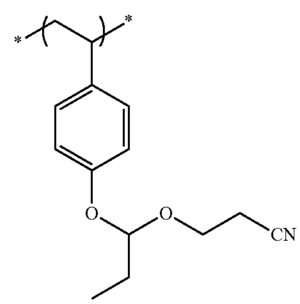
(VI-74)
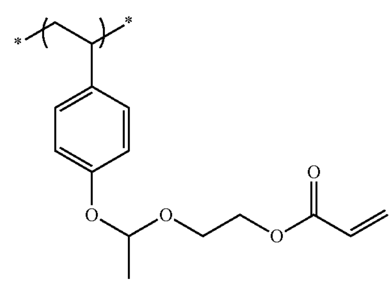
(VI-75)
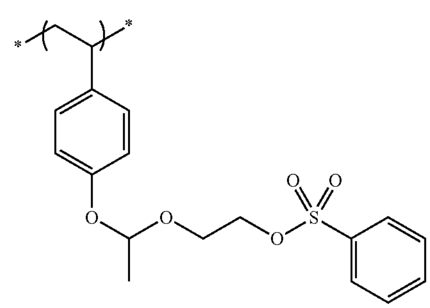

-continued
(VI-76)
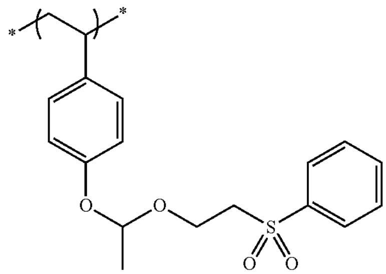
(VI-77)
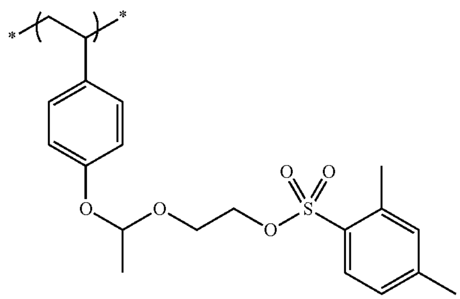
(VI-78)
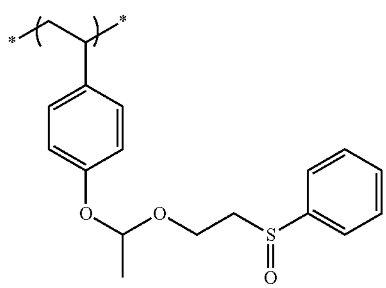
(VI-79)
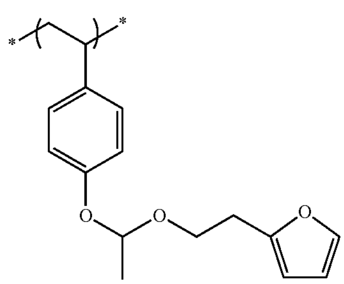
(VI-80)
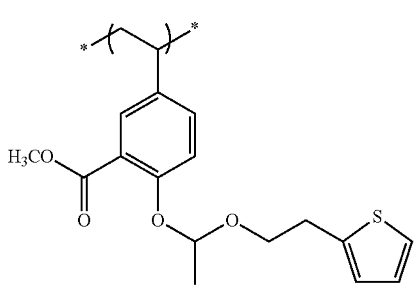
-continued
(VI-81)
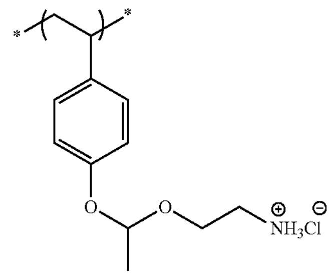
(VI-82)
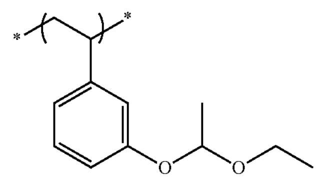
(VI-83)
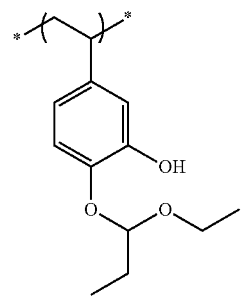
(VI-84)
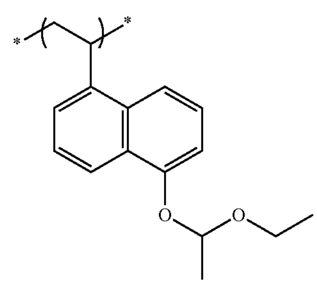
(VI-85)
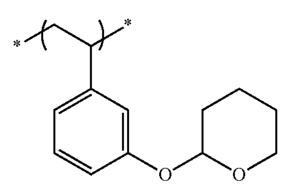
(VI-86)
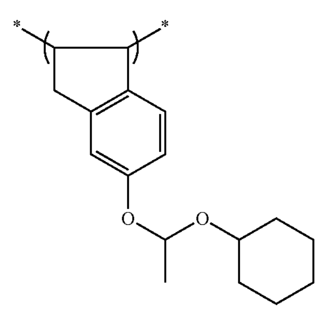

-continued
(VI-87)
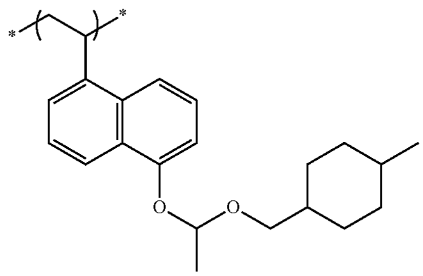
(VI-88)
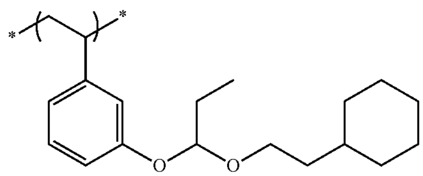
(VI-89)
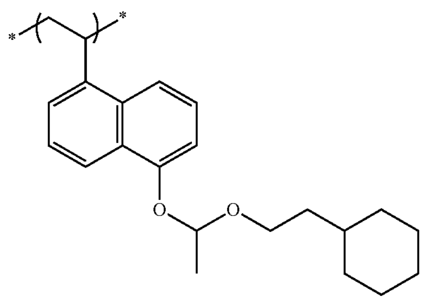
(VI-90)
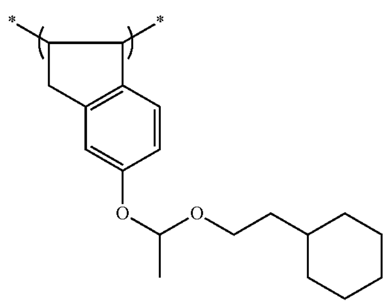
(VI-91)
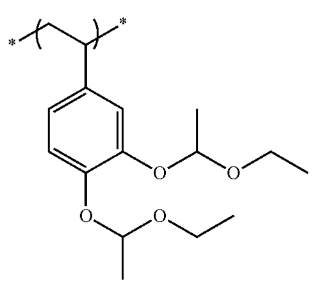
(VI-92)
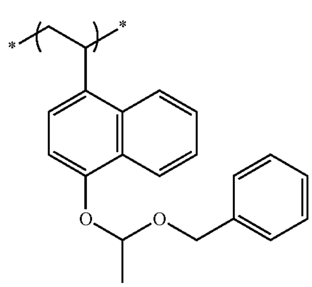
-continued
(VI-93)
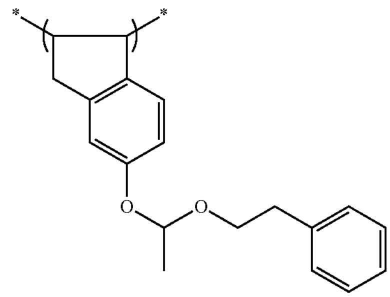
(VI-94)
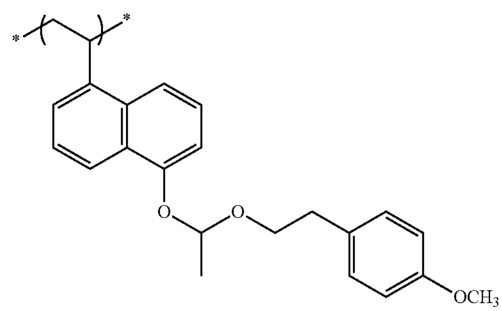
(VI-95)
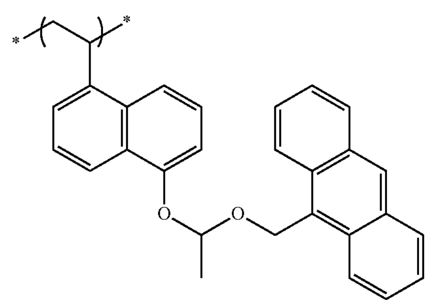
(VI-96)
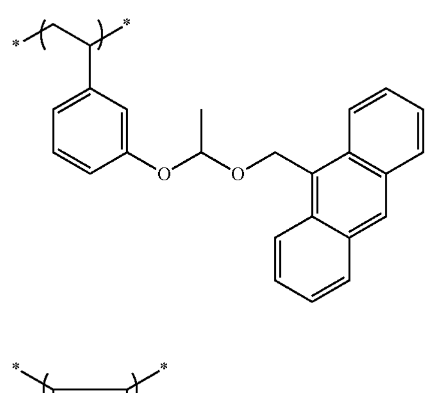
(VI-97)
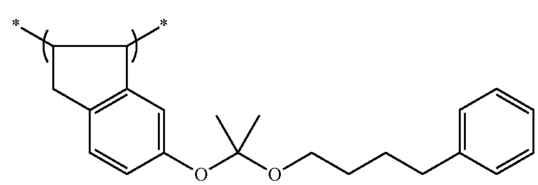

-continued
(VI-98)
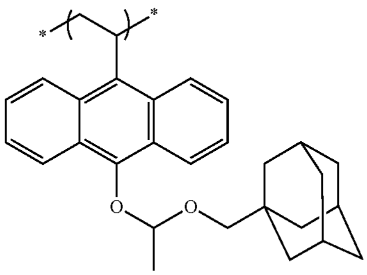
(VI-99)
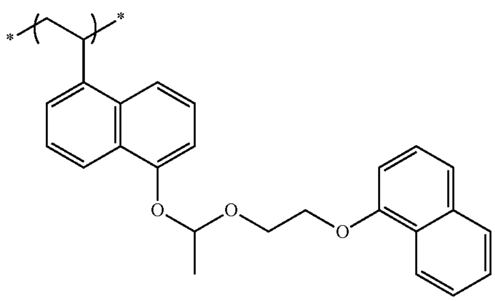
(VI-100)
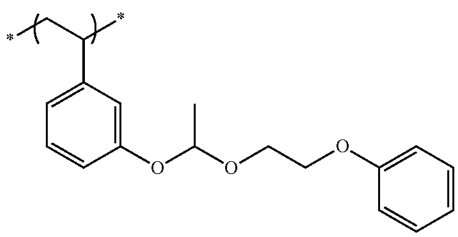
(VI-101)
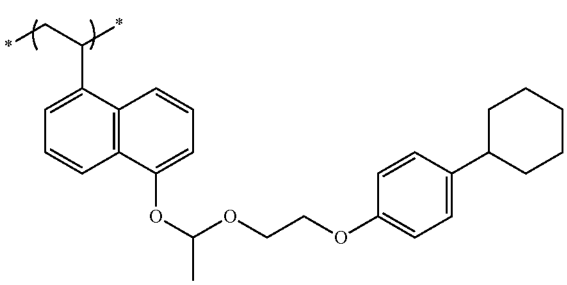
(VI-102)
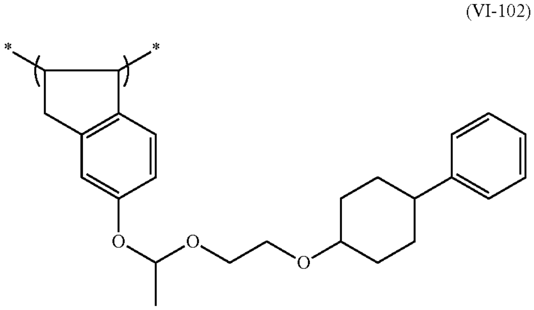
-continued
(VI-103)
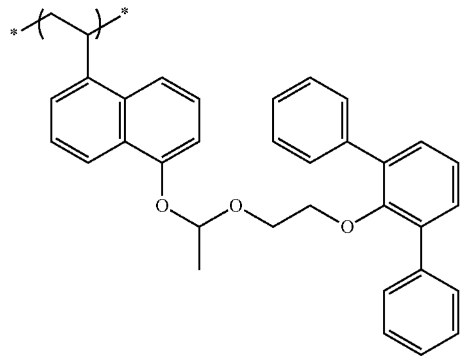
(VI-104)
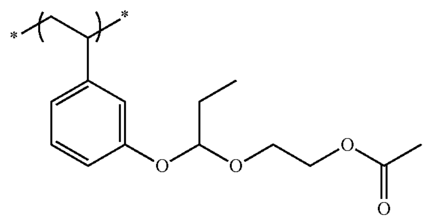
(VI-105)
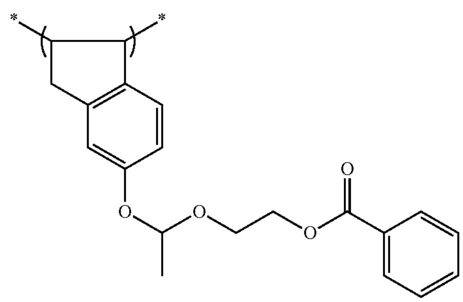
(VI-106)
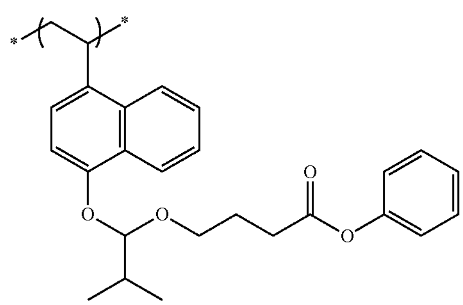
(VI-107)
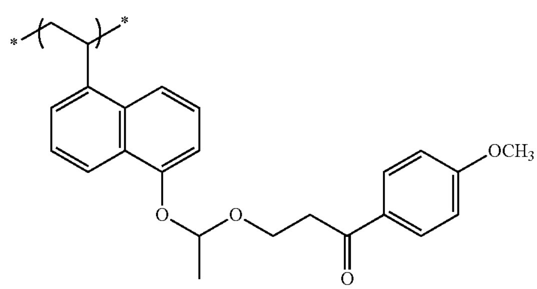

-continued
(VI-108)
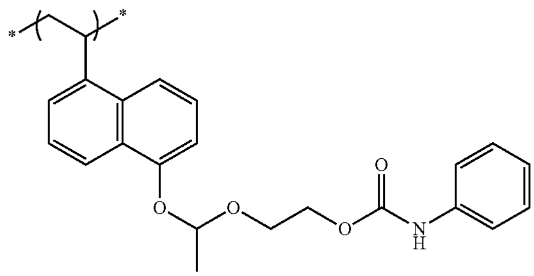
(VI-109)
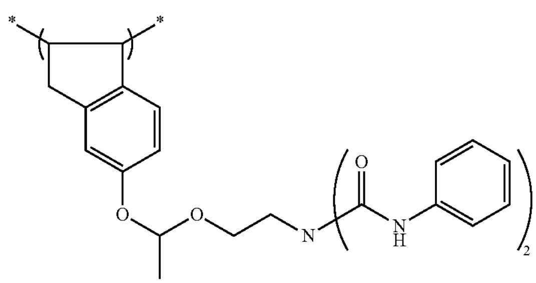
(VI-110)
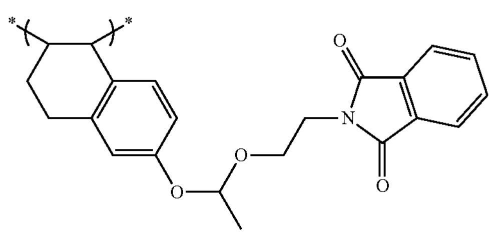
(VI-111)
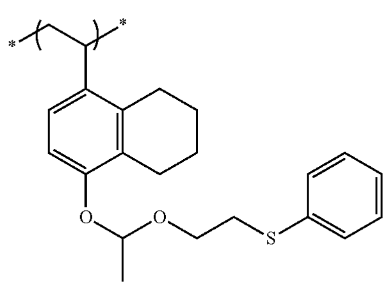
(VI-112)
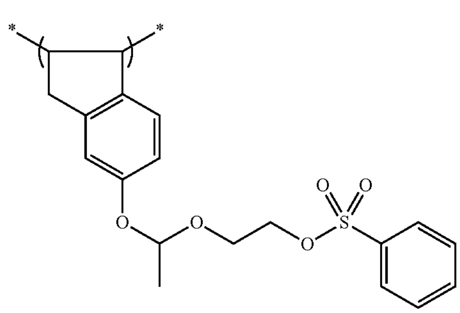
-continued
(VI-113)
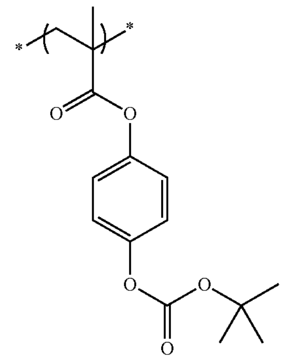
(VI-114)
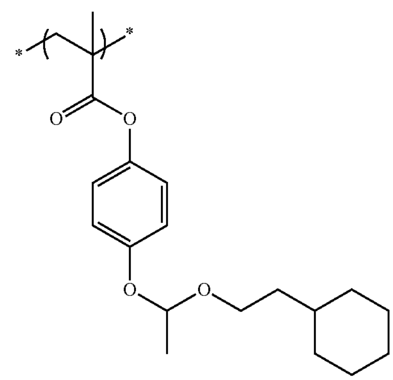
(VI-115)
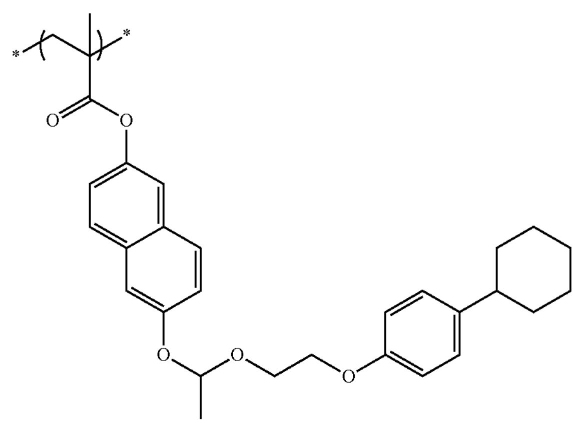
(VI-116)
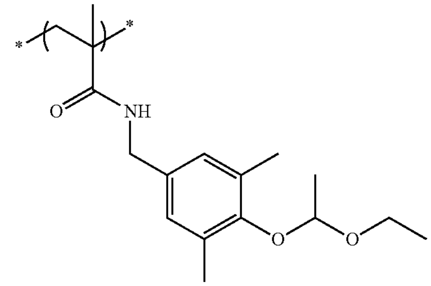

-continued
(VI-117)
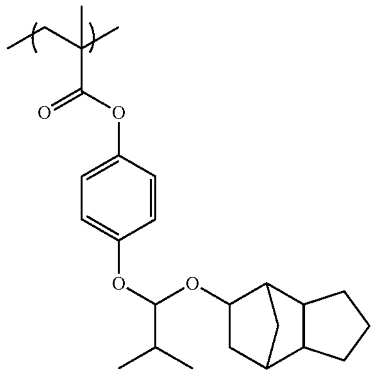
(VI-118)
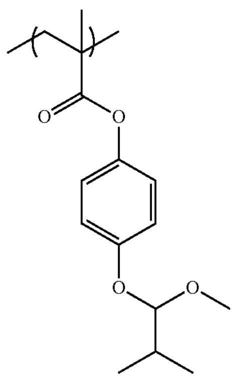
(VI-119)
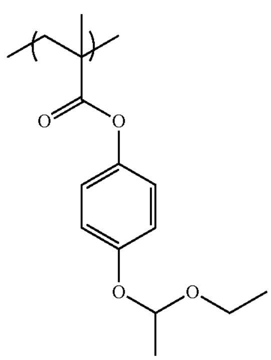
(VI-120)
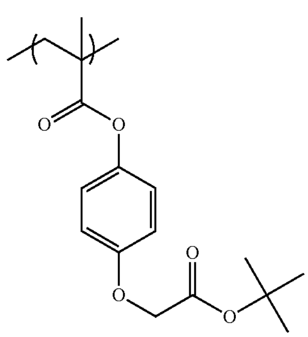
-continued
(VI-121)
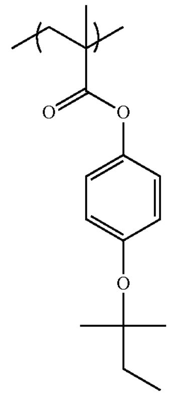
(VI-122)
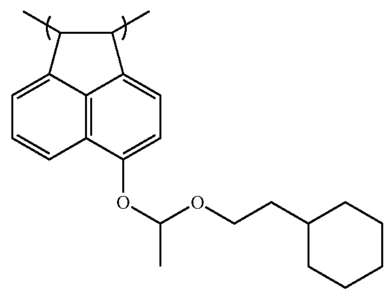
(VI-123)
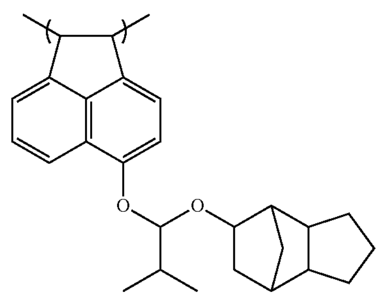
(VI-124)
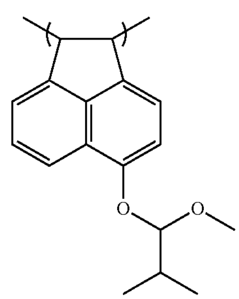
(VI-125)
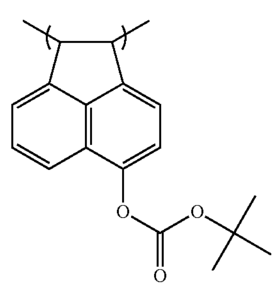

-continued
(VI-126)
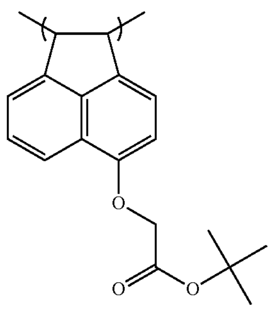
(VI-127)
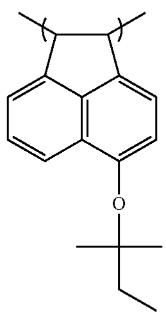
(VI-128)
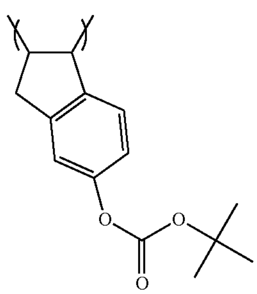
(VI-129)
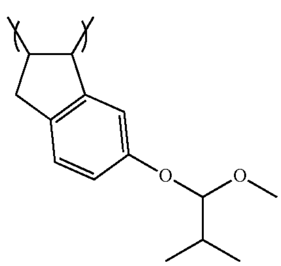
(VI-130)
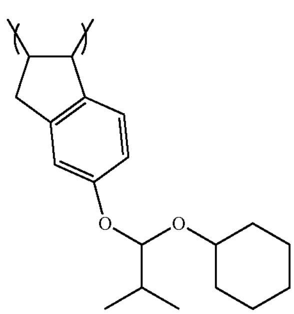
-continued
(VI-131)
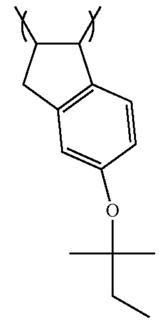
(VI-132)
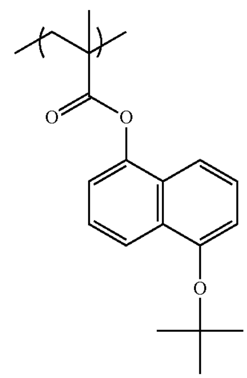
(VI-133)
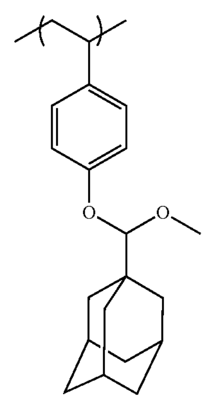
(VI-134)
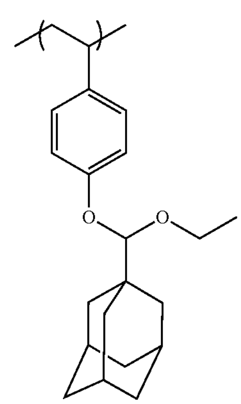

-continued
(VI-135)
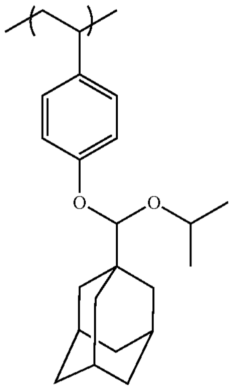
(VI-136)
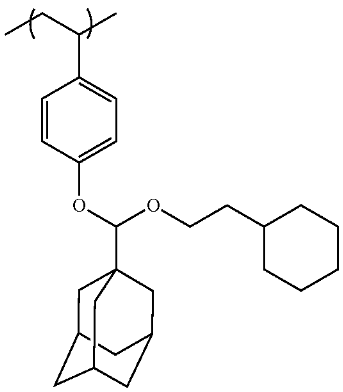
(VI-137)
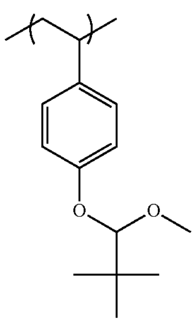
(VI-138)
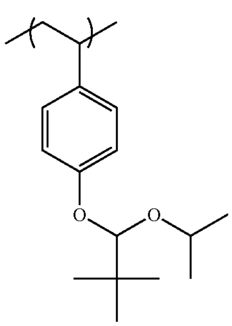
-continued
(VI-139)
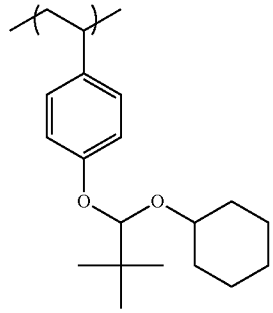
(VI-140)
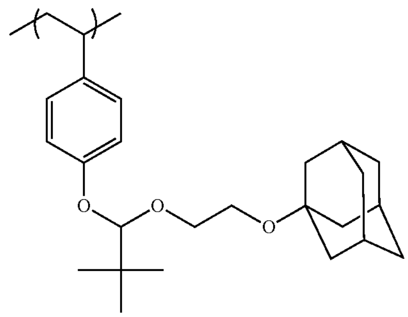
(VI-141)
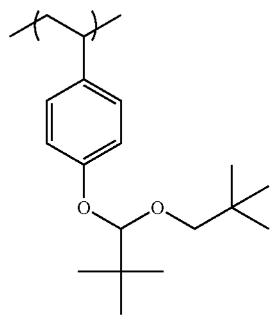
(VI-142)
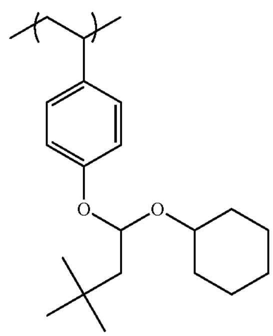
(VI-143)
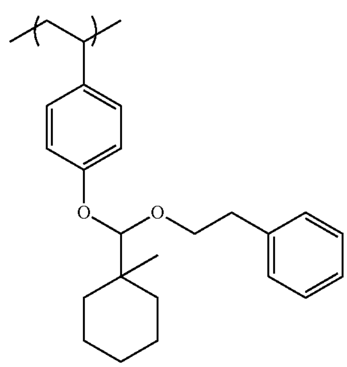

-continued
(VI-144)
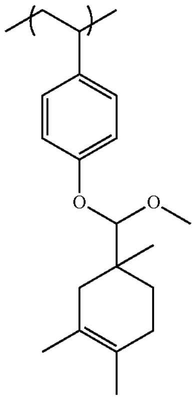
(VI-145)
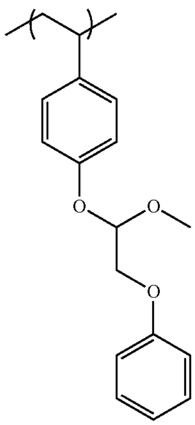
(VI-146)
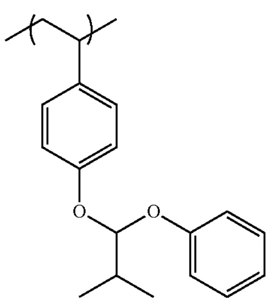
(VI-147)
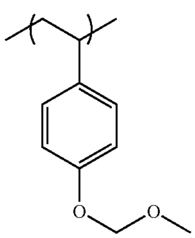
(VI-148)
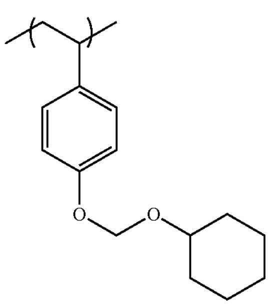
-continued
(VI-149)
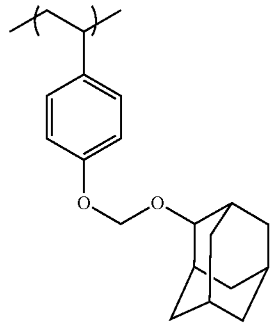
(VI-150)
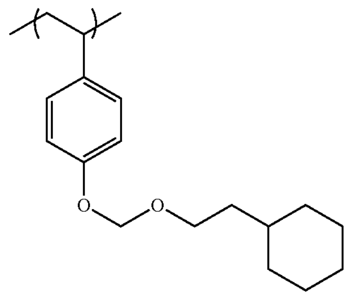
(VI-151)
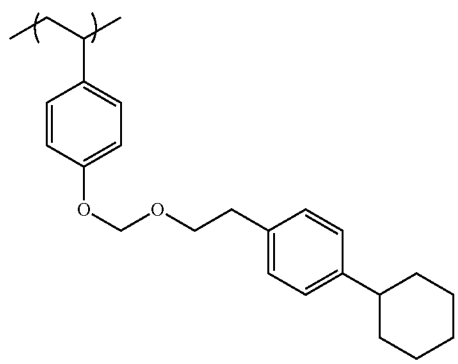
(VI-152)
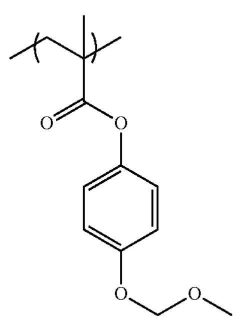

-continued (VI-153)

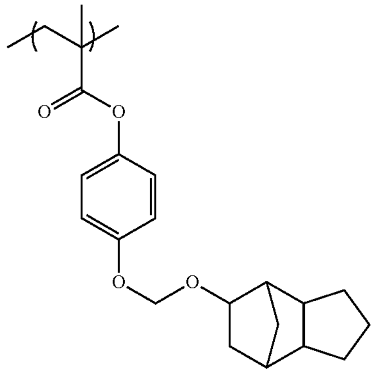

It is also preferred that the resin (A) contains a repeating unit represented by the following formula (4):

(4)

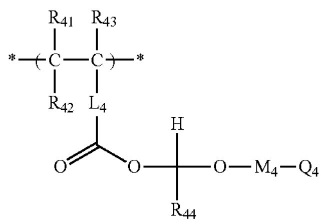

In formula (4), each of $R_{41}$, $R_{42}$ and $R_{43}$ independently represents a hydrogen atom, an alkyl group, a cycloalkyl group, a halogen atom, a cyano group or an alkoxycarbonyl group. $R_{42}$ may combine with $L_4$ to form a ring and in this case, $R_{42}$ represents an alkylene group.

$L_4$ represents a single bond or a divalent linking group and in the case of forming a ring together with $R_{42}$, represents a trivalent linking group.

$R_{44}$ represents a hydrogen atom, an alkyl group, a cycloalkyl group, an aryl group, an aralkyl group, an alkoxy group, an acyl group or a heterocyclic group.

$M_4$ represents a single bond or a divalent linking group.

$Q_4$ represents an alkyl group, a cycloalkyl group, an aryl group or a heterocyclic group.

At least two members of $Q_4$, $M_4$ and $R_{44}$ may combine to form a ring.

$R_{41}$, $R_{42}$ and $R_{43}$ have the same meanings as $R_{51}$, $R_{52}$ and $R_{53}$ in formula (V), and the preferred ranges are also the same.

$L_4$ has the same meaning as $L_5$ in formula (V), and the preferred range is also the same.

$R_{44}$ has the same meaning as $R_3$ in formula (3), and the preferred range is also the same.

$M_4$ has the same meaning as $M_3$ in formula (3), and the preferred range is also the same.

$Q_4$ has the same meaning as $Q_3$ in formula (3), and the preferred range is also the same. The ring formed by combining at least two members of $Q_4$, $M_4$ and $R_{44}$ includes the ring formed by combining at least two members of $Q_3$, $M_3$ and $R_3$, and the preferred range is also the same.

Specific examples of the repeating unit represented by formula (4) are illustrated below, but the present invention is not limited thereto.

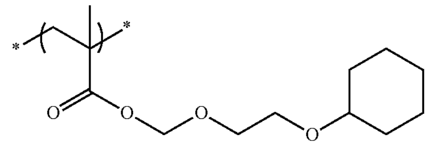

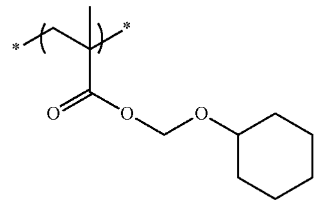

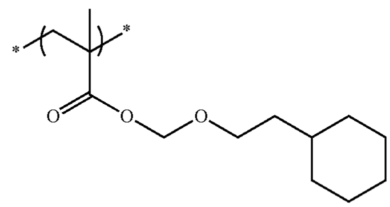

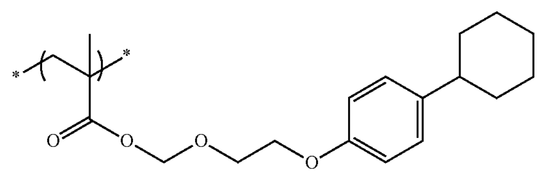

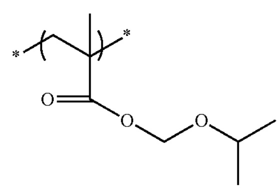

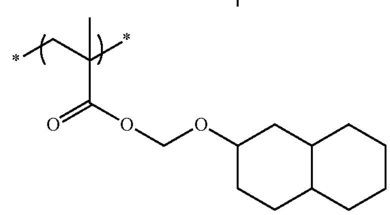

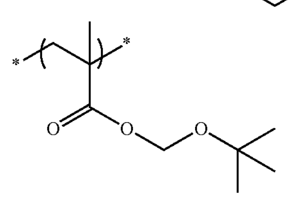

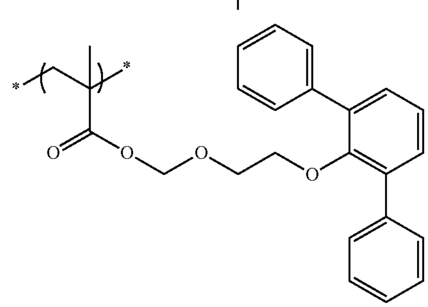

-continued
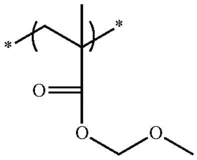
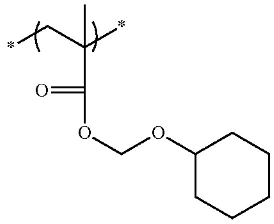
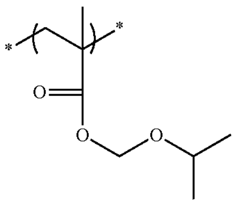
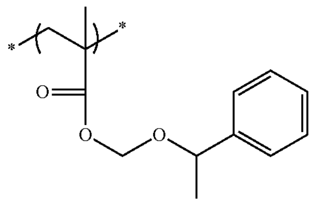
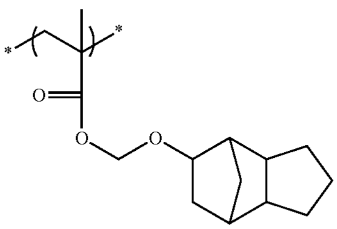
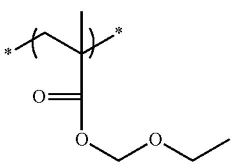
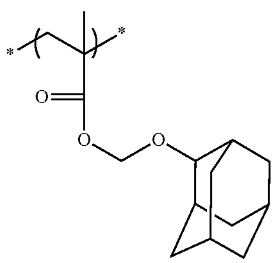
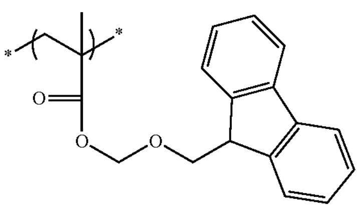
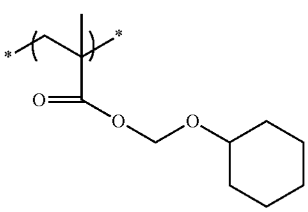
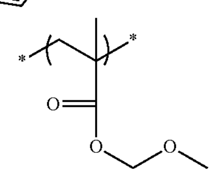
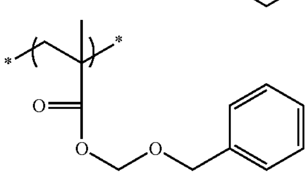
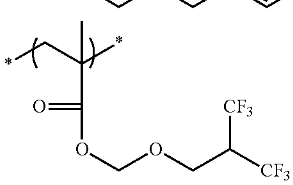
-continued
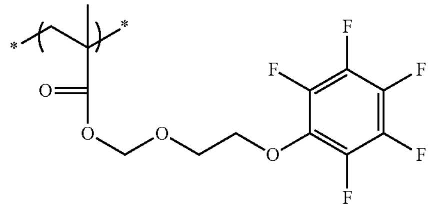
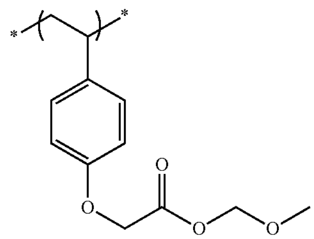
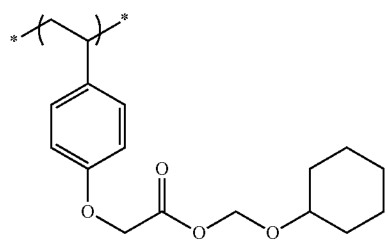
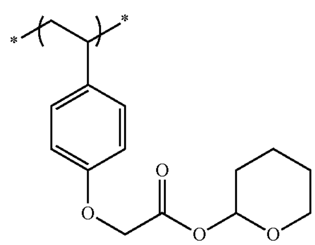
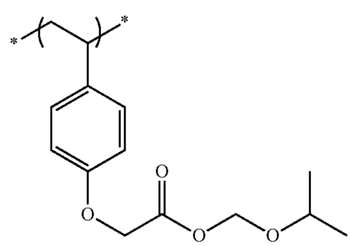
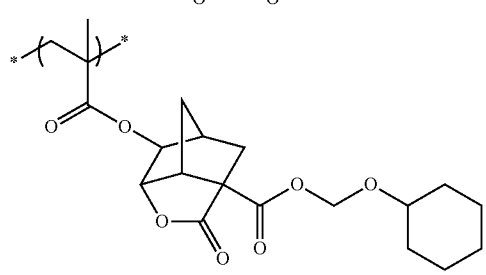
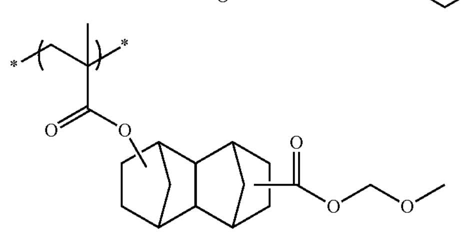

-continued

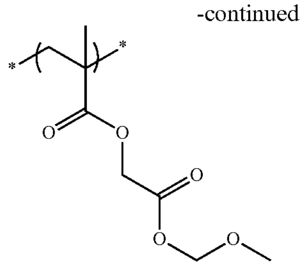

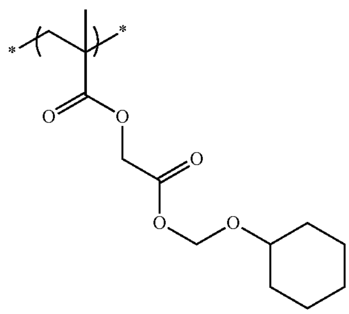

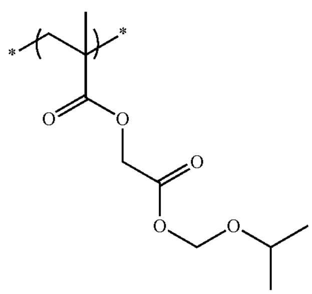

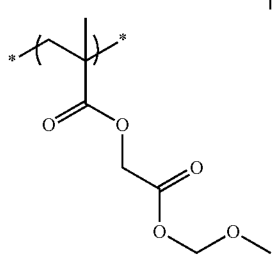

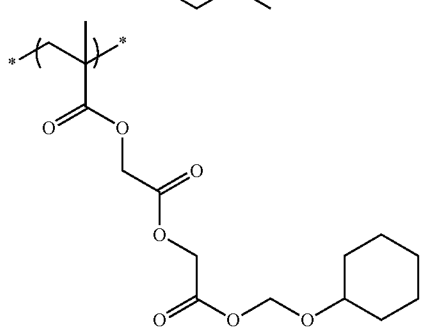

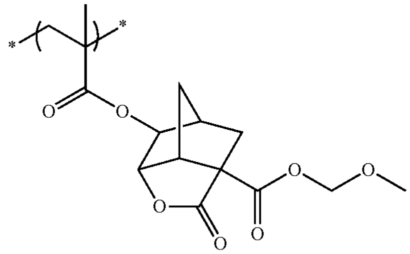

-continued

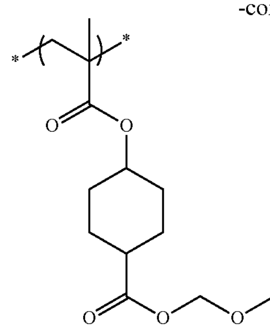

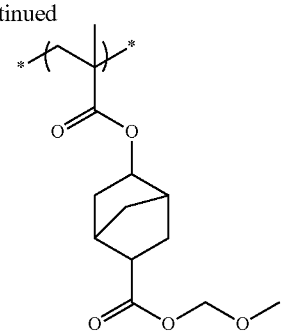

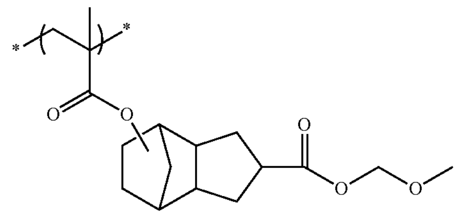

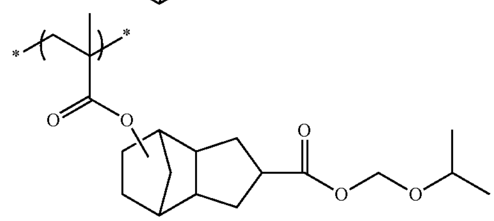

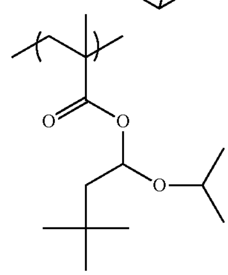

Also, the resin (A) may contain, as the repeating unit (a), a repeating unit represented by the following formula (BZ):

(BZ)

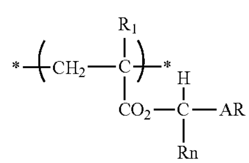

In formula (BZ), AR represents an aryl group, Rn represents an alkyl group, a cycloalkyl group or an aryl group, and Rn and AR may combine with each other to form a non-aromatic ring.

$R_1$ represents a hydrogen atom, an alkyl group, a cycloalkyl group, a halogen atom, a cyano group or an alkyloxycarbonyl group.

The aryl group of AR is preferably an aryl group having a carbon number of 6 to 20, such as phenyl group, naphthyl group, anthryl group and fluorene group, more preferably an aryl group having a carbon number of 6 to 15.

In the case where AR is a naphthyl group, an anthryl group or a fluorene group, the bonding site between AR and the carbon atom to which Rn is bonded is not particularly limited. For example, when AR is a naphthyl group, the carbon atom may be bonded to the α-position or the β-position of the naphthyl group, or when AR is an anthryl group, the carbon atom may be bonded to the 1-position, the 2-position or the 9-position of the anthryl group.

The aryl group of AR may have one or more substituents. Specific examples of the substituent include a linear or branched alky group having a carbon number of 1 to 20, such as methyl group, ethyl group, propyl group, isopropyl group, n-butyl group, isobutyl group, tert-butyl group, pentyl group, hexyl group, octyl group and dodecyl group, an alkoxy group containing such an alkyl group moiety, a cycloalkyl group such as cyclopentyl group and cyclohexyl group, a cycloalkyl group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a linear or branched alkyl group having a carbon number of 1 to 5 or an alkoxy group containing such an alkyl group moiety, more preferably a para-methyl group or a para-methoxy group.

In the case where the aryl group of AR has a plurality of substituents, at least two members out of the plurality of substituents may combine with each other to form a ring. The ring is preferably a 5- to 8-membered ring, more preferably a 5- or 6-membered ring. The ring may be also a heterocyclic ring containing a heteroatom such as oxygen atom, nitrogen atom and sulfur atom in the ring members.

Furthermore, this ring may have a substituent. Examples of the substituent are the same as those described later for the further substituent that Rn may have.

In view of the roughness performance, the repeating unit (a) represented by formula (BZ) preferably contains two or more aromatic rings. Usually, the number of aromatic rings contained in this repeating unit is preferably 5 or less, more preferably 3 or less.

Also, in view of the roughness performance, AR in the repeating unit (a) represented by formula (BZ) preferably contains two or more aromatic rings, and AR is more preferably a naphthyl group or a biphenyl group. Usually, the number of aromatic rings contained in AR is preferably 5 or less, more preferably 3 or less.

Rn represents an alkyl group, a cycloalkyl group or an aryl group as described above.

The alkyl group of Rn may be a linear alkyl group or a branched alkyl group. This alkyl group is preferably an alky group having a carbon number of 1 to 20, such as methyl group, ethyl group, propyl group, isopropyl group, n-butyl group, isobutyl group, tert-butyl group, pentyl group, hexyl group, cyclohexyl group, octyl group and dodecyl group. The alkyl group of Rn is preferably an alkyl group having a carbon number of 1 to 5, more preferably an alkyl group having a carbon number of 1 to 3.

The cycloalkyl group of Rn includes, for example, a cycloalkyl group having a carbon number of 3 to 15, such as cyclopentyl group and cyclohexyl group.

The aryl group of Rn is preferably, for example, an aryl group having a carbon number of 6 to 14, such as phenyl group, xylyl group, toluoyl group, cumenyl group, naphthyl group and anthryl group.

Each of the alkyl group, cycloalkyl group and aryl group as Rn may further has a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group and a sulfonylamino group are preferred.

$R_1$ represents a hydrogen atom, an alkyl group, a cycloalkyl group, a halogen atom, a cyano group or an alkyloxycarbonyl group as described above.

Examples of the alkyl group and cycloalkyl group of $R_1$ are the same as those described above for Rn. Each of these alkyl group and cycloalkyl group may have a substituent. Examples of this substituent are the same as those described above for Rn.

In the case where $R_1$ is an alkyl or cycloalkyl group having a substituent, particularly preferred examples of $R_1$ include a trifluoromethyl group, an alkyloxycarbonylmethyl group, an alkylcarbonyloxymethyl group, a hydroxymethyl group and an alkoxymethyl group.

The halogen atom of $R_1$ includes fluorine atom, chlorine atom, bromine atom and iodine atom, with fluorine atom being preferred.

As the alkyl group moiety contained in the alkyloxycarbonyl group of $R_1$, for example, the configuration recited above as the alkyl group of $R_1$ may be employed.

Rn and AR preferably combine with each other to form a non-aromatic ring and in this case, particularly the roughness performance can be more improved.

The non-aromatic ring that may be formed by combining Rn and AR with each other is preferably a 5- to 8-membered ring, more preferably a 5- or 6-membered ring.

The non-aromatic ring may be an aliphatic ring or a heterocyclic ring containing, as a ring member, a heteroatom such as oxygen atom, nitrogen atom and sulfur atom.

The non-aromatic ring may have a substituent. Examples of the substituent are the same as those described above for the further substituent that Rn may have.

Specific examples of the repeating unit (a) represented by formula (BZ) are illustrated below, but the present invention is not limited thereto.

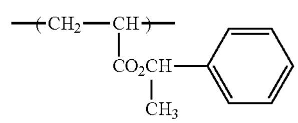

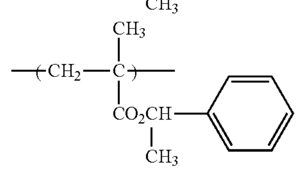

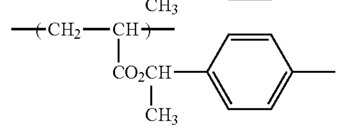

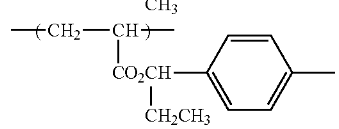

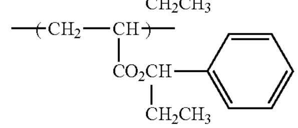

-continued
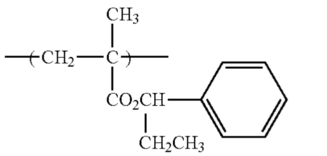
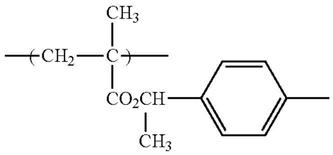
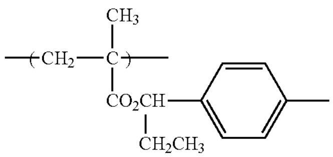
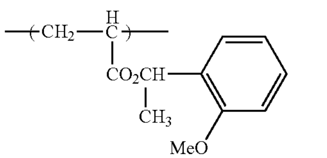
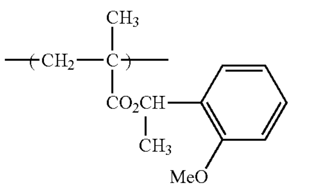
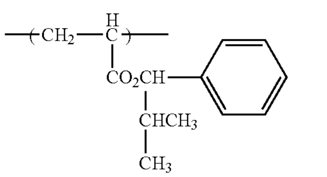
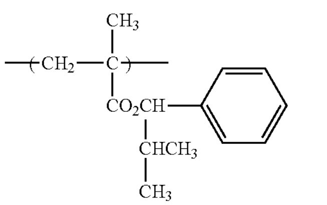
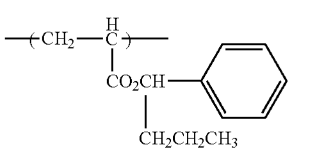
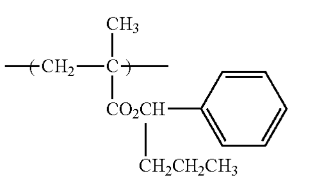
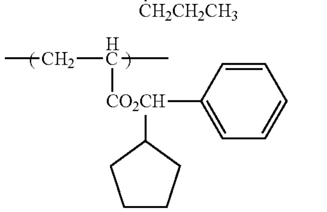
-continued
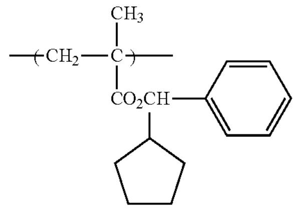
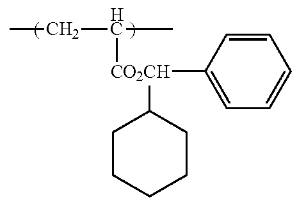
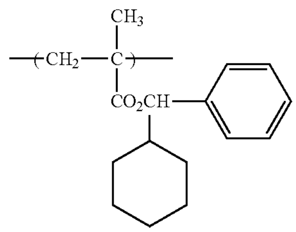
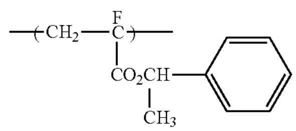
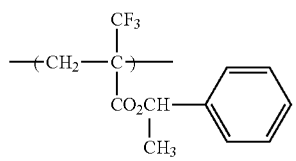
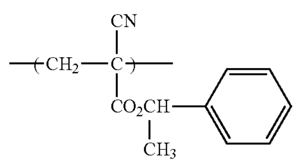
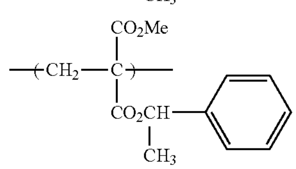
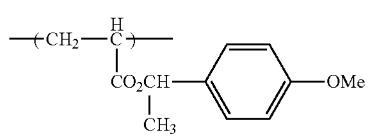
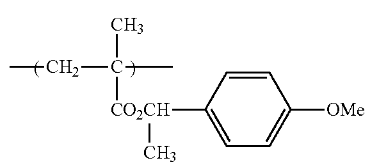
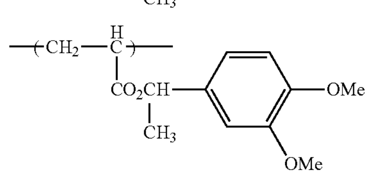

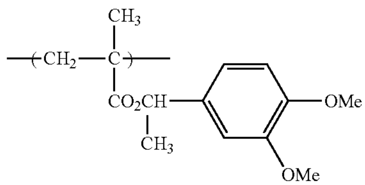
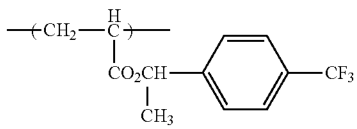
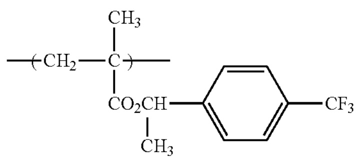
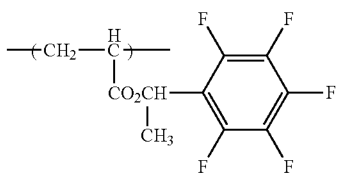
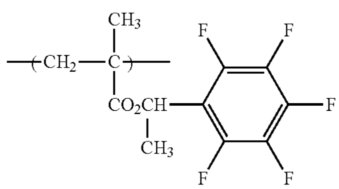
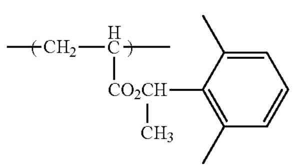
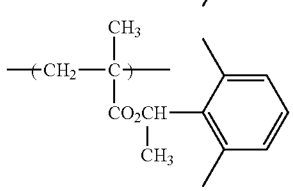
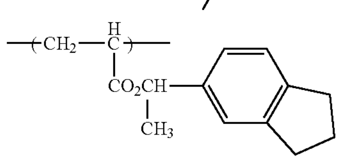
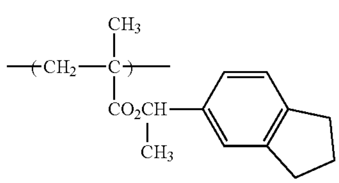
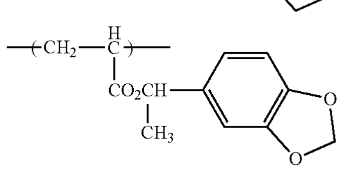
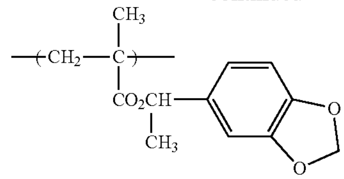
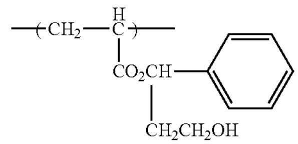
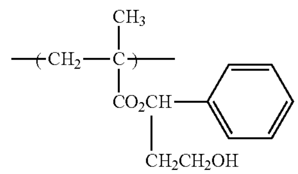
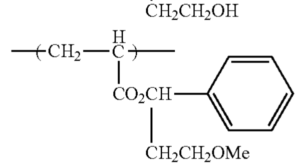
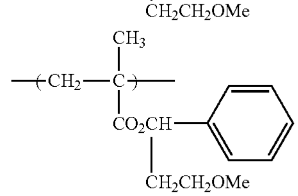
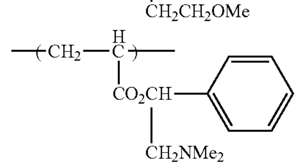
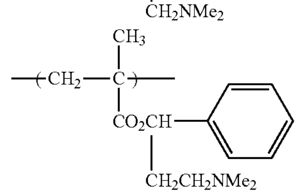
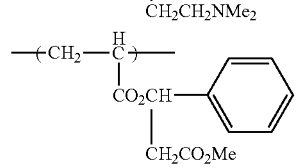
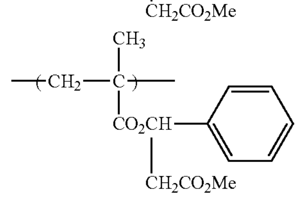
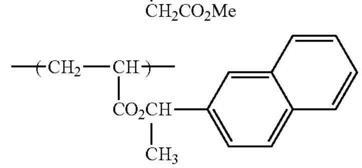
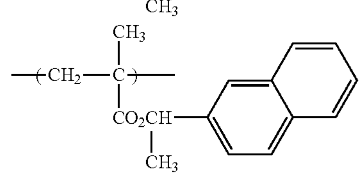

-continued
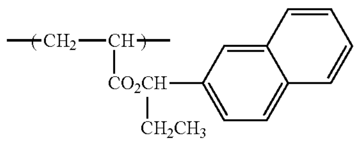
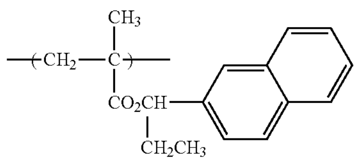
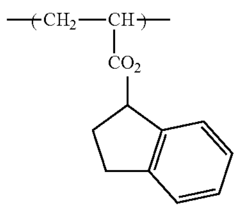
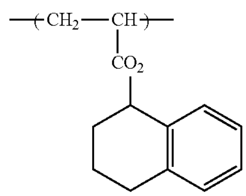
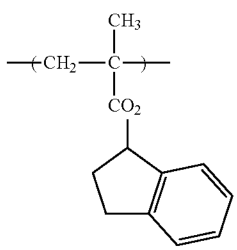
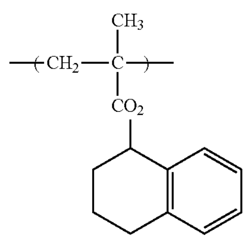
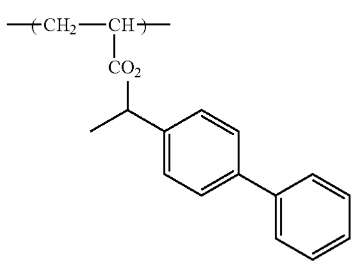
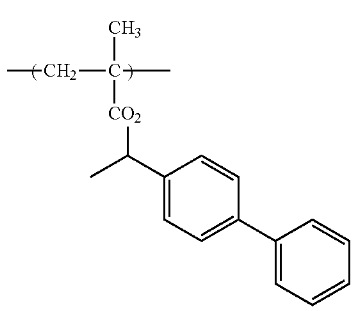
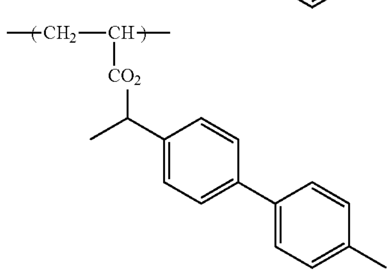
-continued
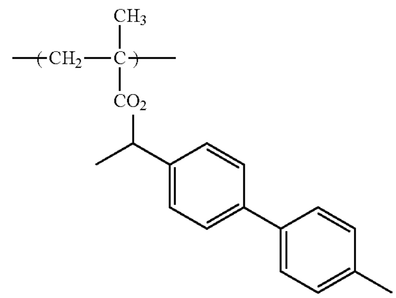
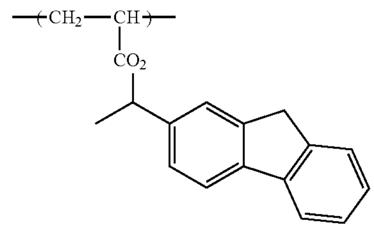
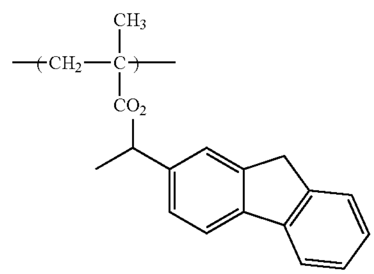
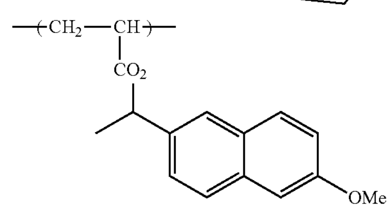
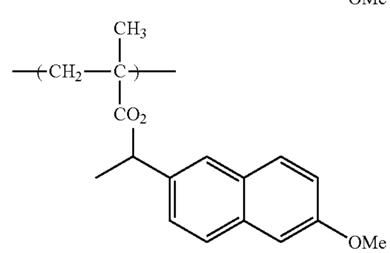
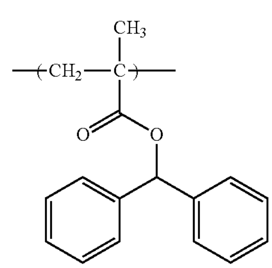
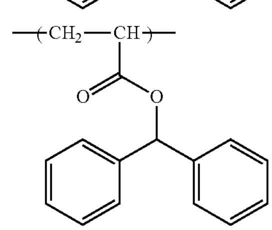

-continued
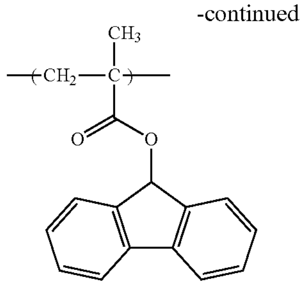
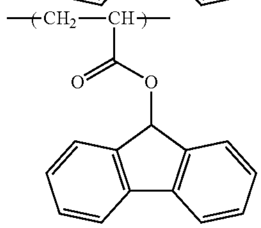
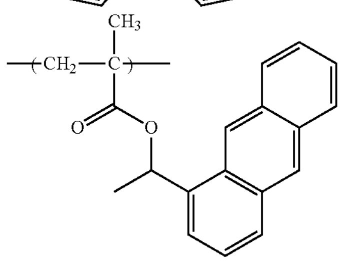
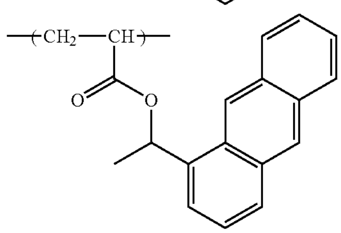
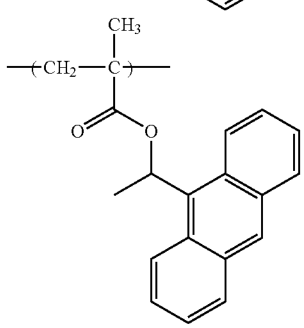
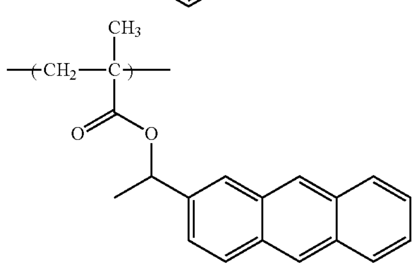
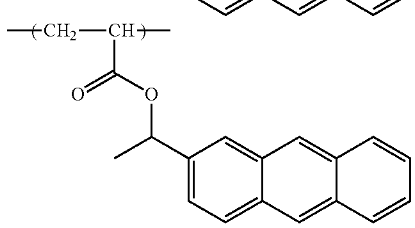
-continued
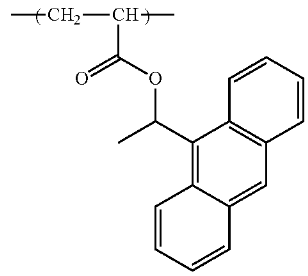
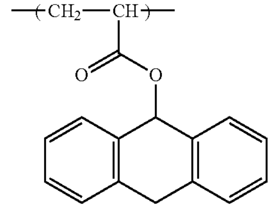
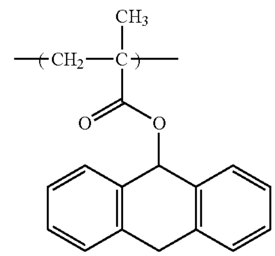
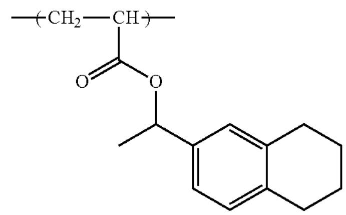
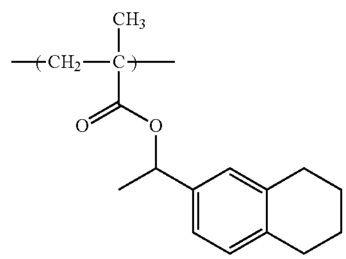
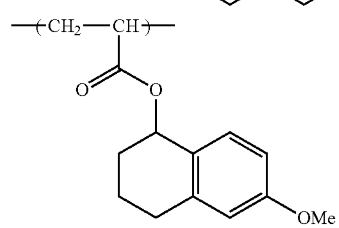
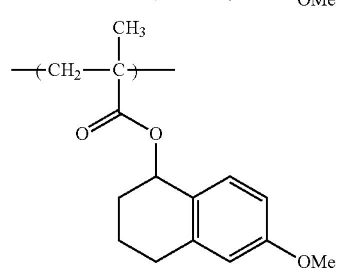
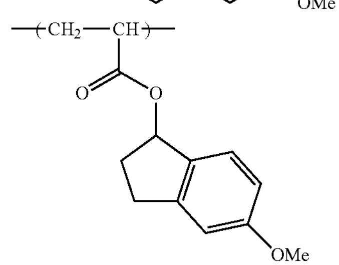

-continued

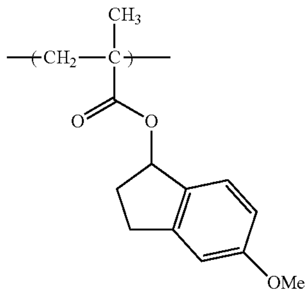

As an embodiment of the acid-decomposable group-containing repeating unit different from the repeating units exemplified above, the repeating unit may be in an embodiment of producing an alcoholic hydroxyl group. In this case, the repeating unit is preferably represented by at least one formula selected from the group consisting of the following formulae (I-1) to (I-10). This repeating unit is more preferably represented by at least one formula selected from the group consisting of the following formulae (I-1) to (I-3), still more preferably represented by the following formula (I-1).

(I-1)

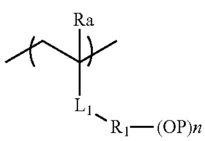

(I-2)

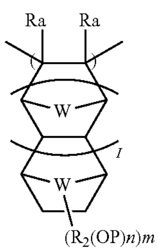

(I-3)

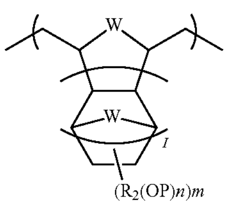

(I-4)

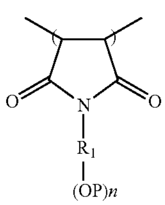

(I-5)

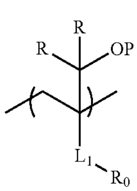

-continued (I-6)

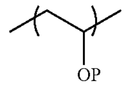

(I-7)

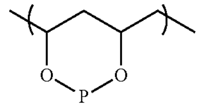

(I-8)

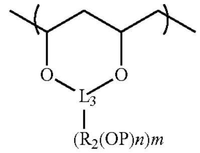

(I-9)

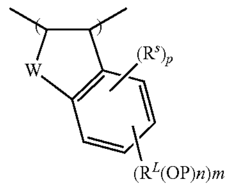

(I-10)

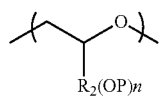

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents an (n+1)-valent organic group.

$R_2$ represents, when m≥2, each independently represents, a single bond or an (n+1)-valent organic group.

Each OP independently represents the above-described group capable of decomposing by the action of an acid to produce an alcoholic hydroxy group, and when n≥2 and/or m≥2, two or more OP may combine with each other to form a ring.

W represents a methylene group, an oxygen atom or a sulfur atom,

Each of n and m represents an integer of 1 or more. Incidentally, in the case where $R_2$ in formula (I-2), (I-3) or (I-8) represents a single bond, n is 1.

l represents an integer of 0 or more.

$L_1$ represents a linking group represented by —COO—, —OCO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

$R^L$ represents, when m≥2, each independently represents, an (n+1)-valent linking group.

$R^S$ represents, when p≥2, each independently represents, a substituent, and when p≥2, the plurality of $R^S$ may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen or a methyl group.

W represents a methylene group, an oxygen atom or a sulfur atom. W is preferably a methylene group or an oxygen atom.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, this chain hydrocarbon group may be linear or branched. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, this alicyclic hydrocarbon group may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—] or an imino group [—N(R)—] (wherein R is a hydrogen atom or an alkyl group).

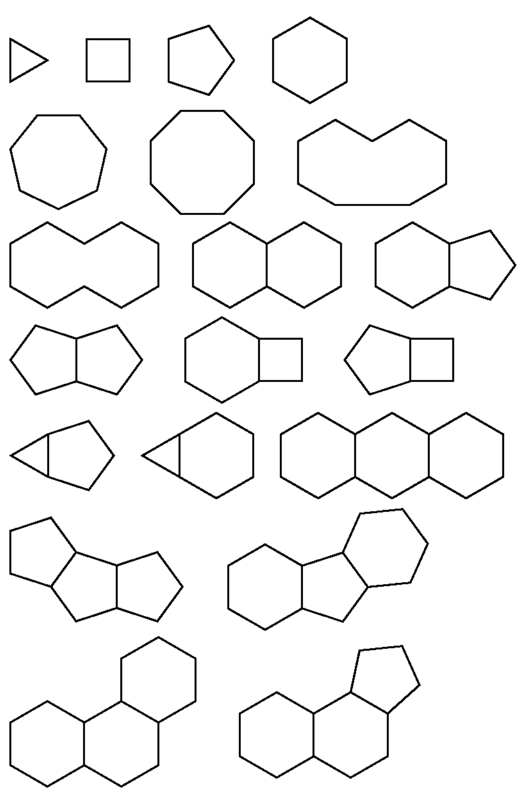

-continued

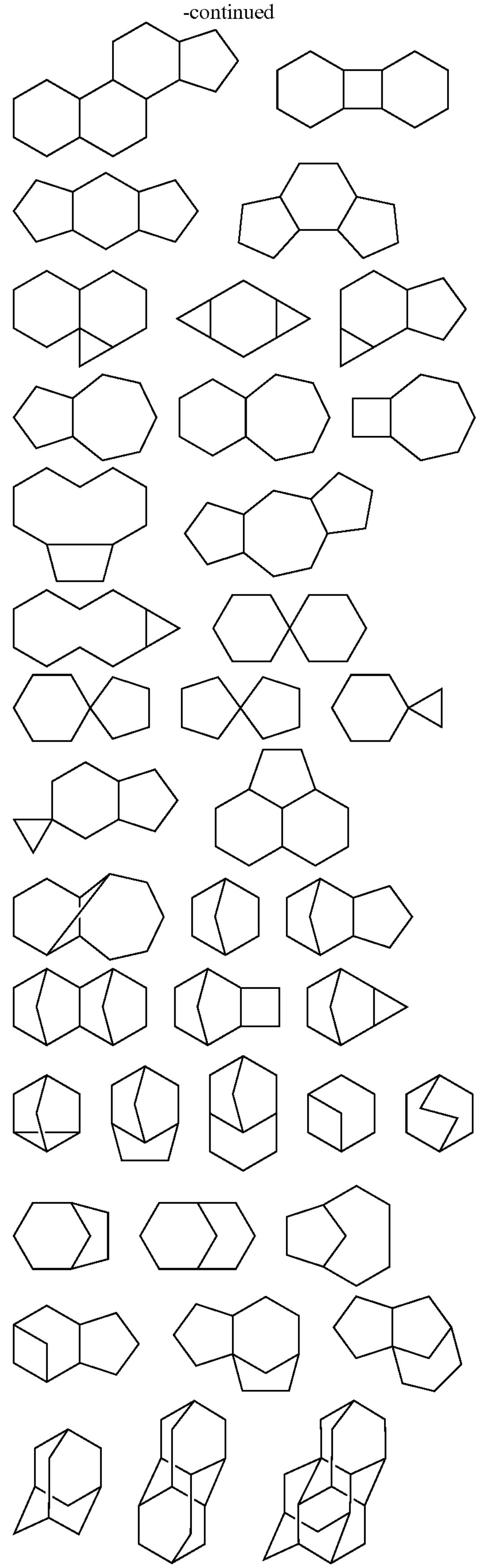

-continued

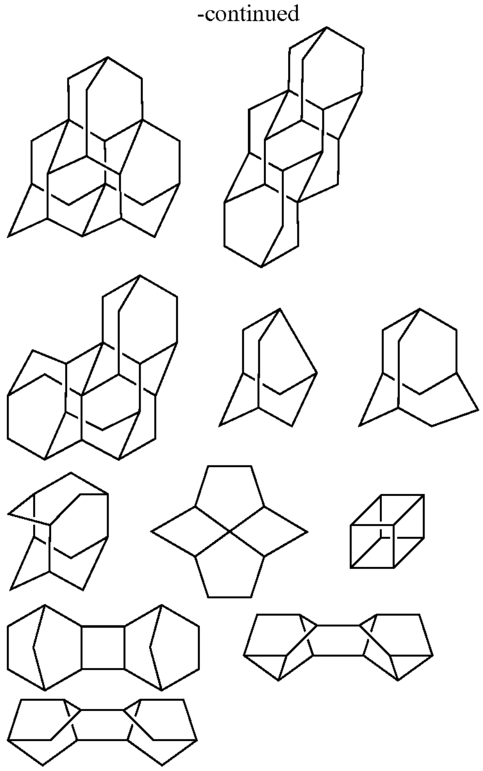

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

$L_1$ represents a linking group represented by —COO—, —OCO—, —CONH—, —O—, —Ar—, —$SO_3$— or —$SO_2$NH—, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be linear or branched. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group, and an alkenyl group. $R_0$ is preferably a hydrogen atom or an alkyl group, more preferably a hydrogen atom or a methyl group.

$L_3$ represents an (m+2)-valent linking group. That is, $L_3$ represents a trivalent or higher valent linking group. Examples of such a linking group include corresponding groups in specific examples illustrated later.

$R^L$ represents an (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group, and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l is an integer of 0 or more. l is preferably 0 or 1.

p is an integer of 0 to 3.

Specific examples of the repeating unit having a group capable of decomposing by the action of an acid to produce an alcoholic hydroxy group are illustrated below. In specific examples, Ra and OP have the same meanings as those in formulae (I-1) to (I-3). In the case where a plurality of OP combine with each other to form a ring, the corresponding ring structure is conveniently denoted by "O—P—O".

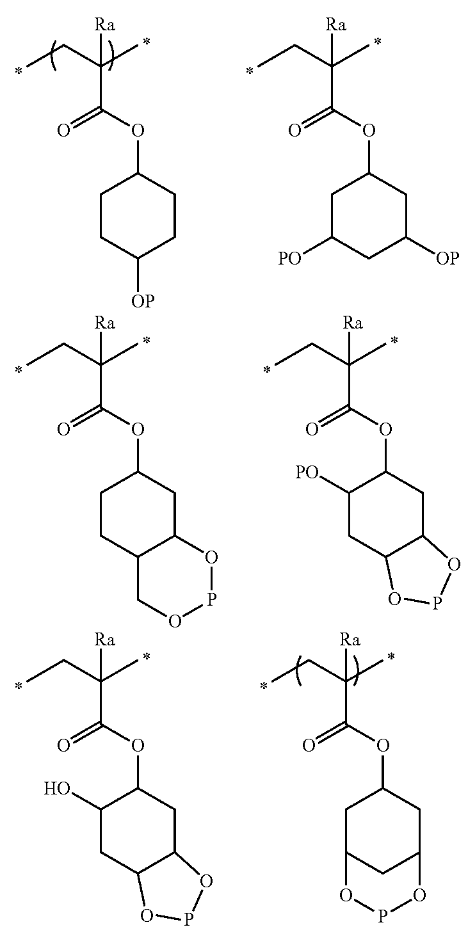

-continued
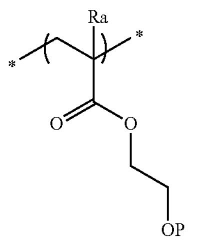
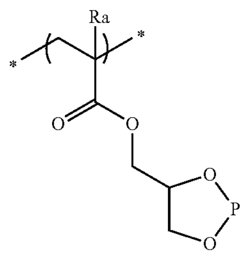
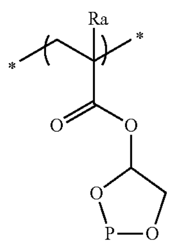
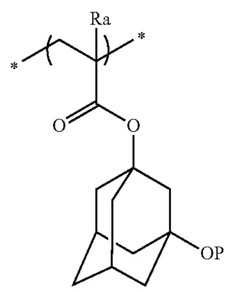
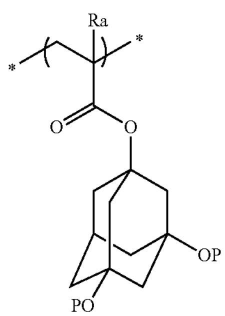
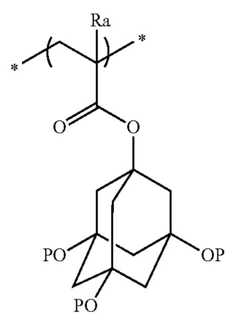
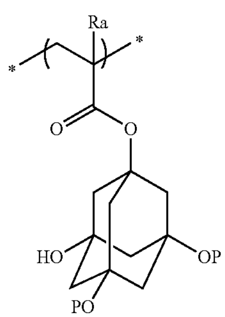
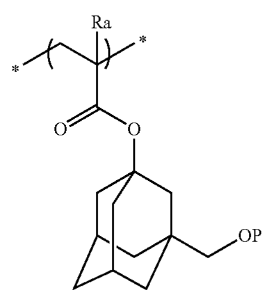
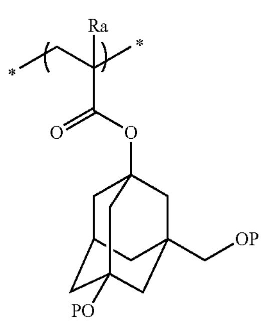
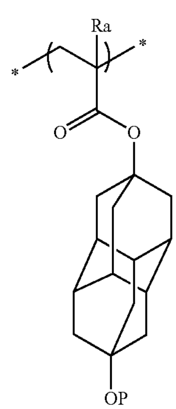
-continued
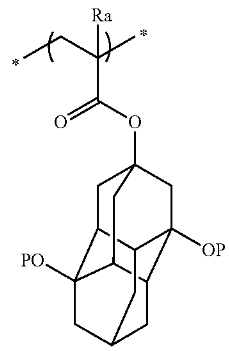
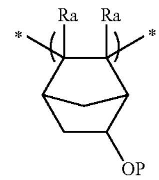
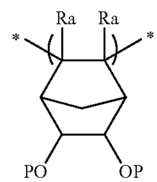
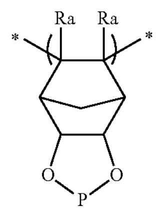
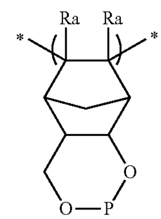
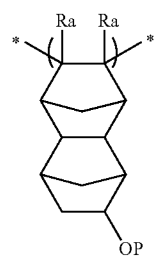
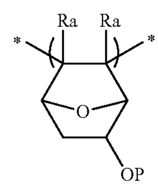
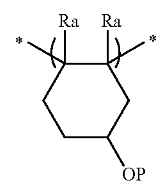
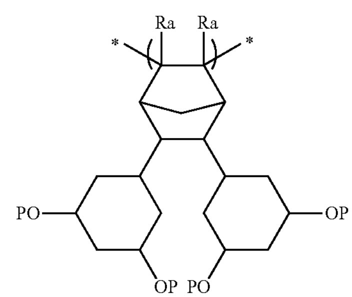
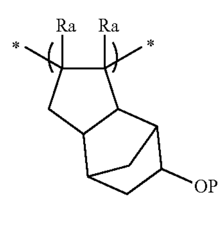
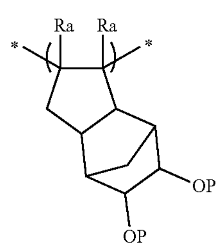
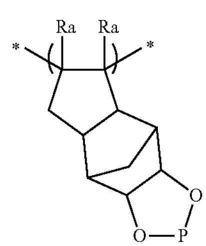
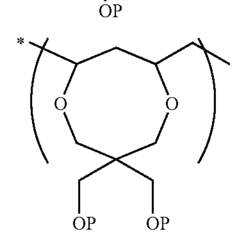

-continued

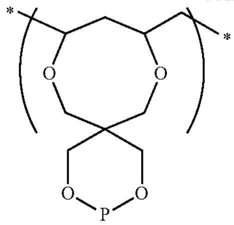

The group capable of decomposing by the action of an acid to produce an alcoholic hydroxy group is preferably represented by at least one formula selected from the group consisting of the following formulae (II-1) to (II-4):

(II-1)

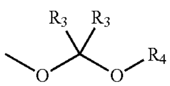

(II-2)

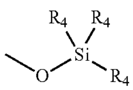

(II-3)

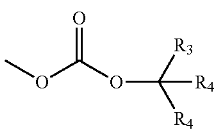

(II-4)

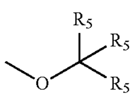

In the formulae, each $R_3$ independently represents a hydrogen atom or a monovalent organic group. $R_3$ may combine with each other to form a ring.

Each $R_4$ independently represents a monovalent organic group. $R_4$ may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$ may combine with each other to form a ring, provided that when one or two of those three $R_5$ are a hydrogen atom, at least one of the remaining $R_5$ represents an aryl group, an alkenyl group or an alkynyl group.

It is also preferred that the group capable of decomposing by the action of an acid to produce an alcoholic hydroxy group is represented by at least one formula selected from the group consisting of the following formulae (II-5) to (II-9):

(II-5)

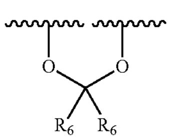

(II-6)

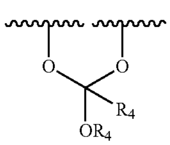

-continued (II-7)

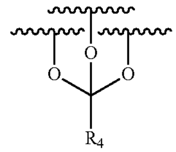

(II-8)

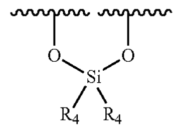

(II-9)

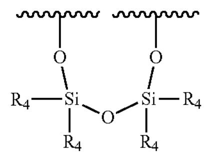

In the formulae, $R_4$ has the same meaning as in formulae (II-1) to (II-3).

Each $R_6$ independently represents a hydrogen atom or a monovalent organic group. $R_6$ may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be linear or branched. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group, and an n-butyl group.

The cycloalkyl group of $R_3$ may be monocyclic or polycyclic. The carbon number of the cycloalkyl group of $R_3$ is preferably from 3 to 10, more preferably from 4 to 8. Examples of the cycloalkyl group of $R_3$ include a cyclopropyl group, a cyclobutyl group, a cyclopentyl group, a cyclohexyl group, a norbornyl group, and an adamantyl group.

Also, in formula (II-1), at least either one $R_3$ is preferably a monovalent organic group. When such a configuration is employed, particularly high sensitivity can be achieved.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of those three $R_5$ are a hydrogen atom, at least one of the remaining $R_5$ represents an aryl group, an alkenyl group or an alkynyl group. $R_5$ is preferably a hydrogen atom or an alkyl group. The alkyl group may or may not have a substituent. In the case where the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described above for $R_3$.

Specific examples of the group capable of decomposing by the action of an acid to produce an alcoholic hydroxyl group are illustrated below.

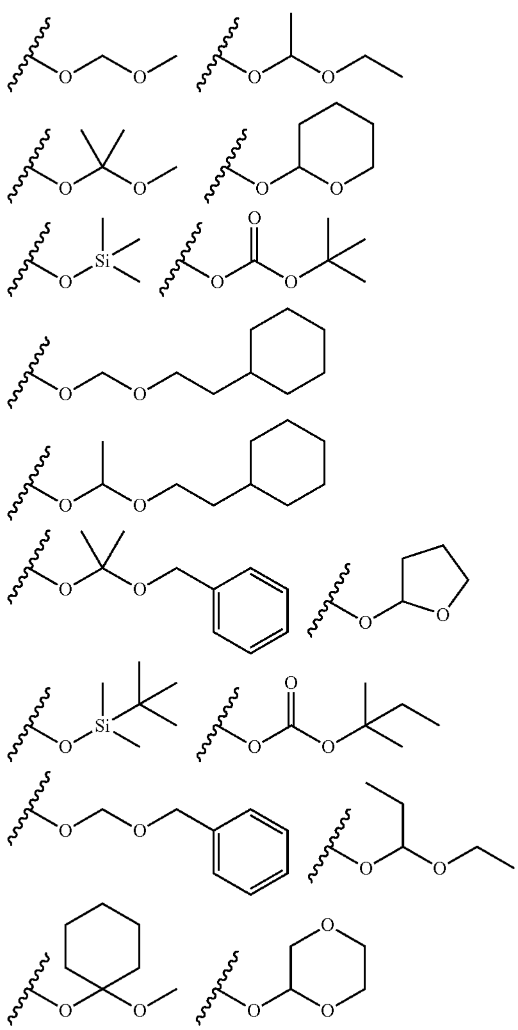

-continued

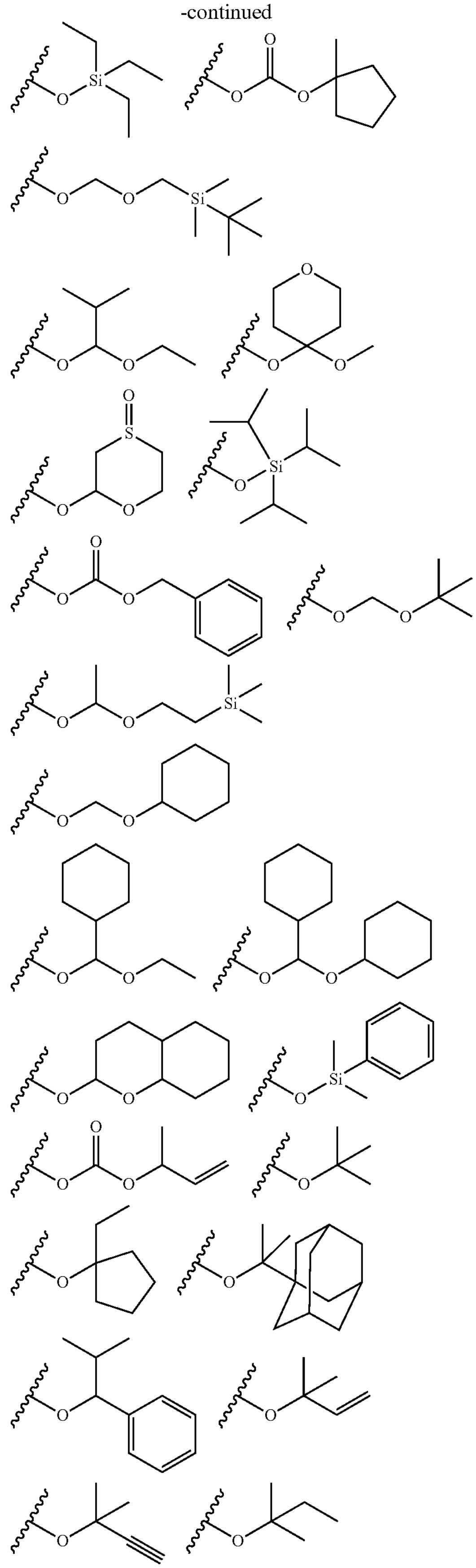

-continued
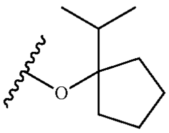
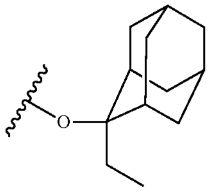
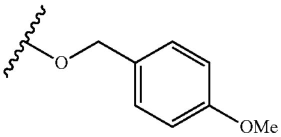
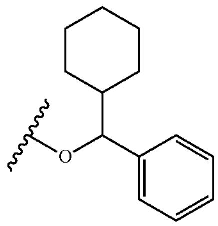
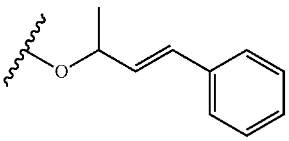
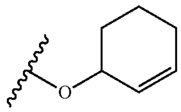
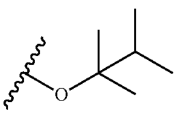
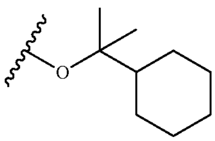
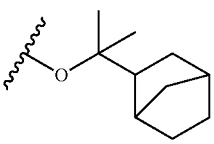
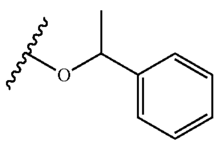
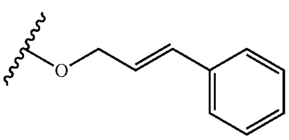
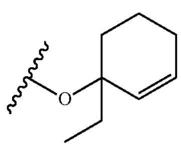
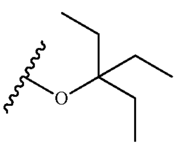
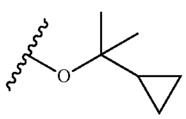
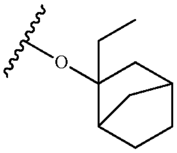
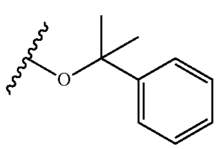
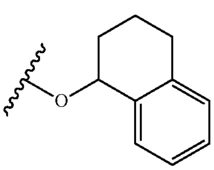
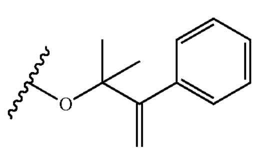
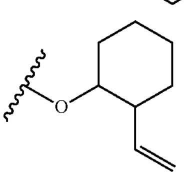
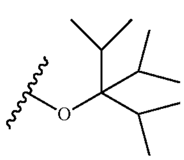
-continued
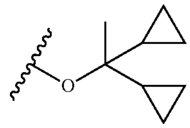
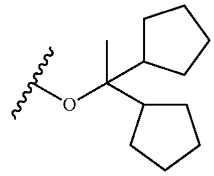
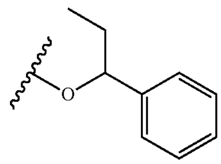
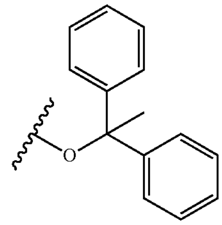
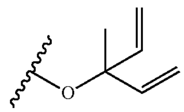
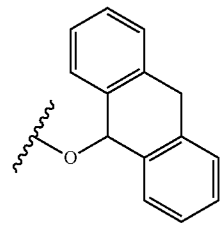
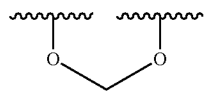
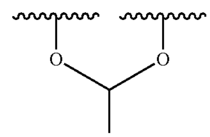
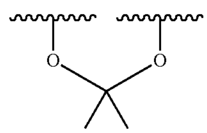
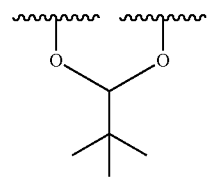
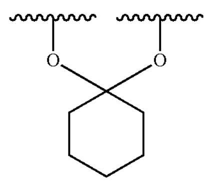
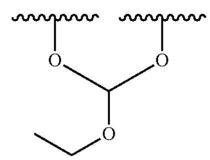
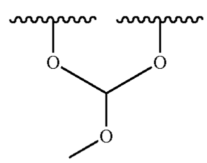
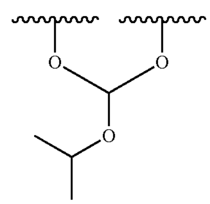
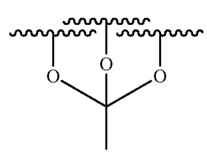
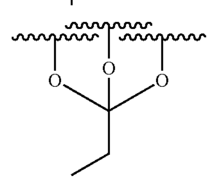
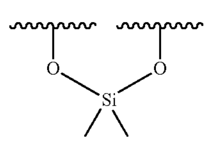
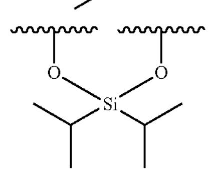

-continued
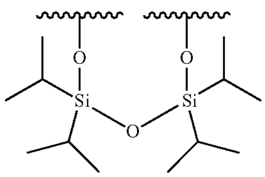
Specific examples of the repeating unit having a group capable of decomposing by the action of an acid to produce an alcoholic hydroxy group are illustrated below. In specific examples, $Xa_1$ represents a hydrogen atom, $CH_3$, $CF_3$ or $CH_2OH$.
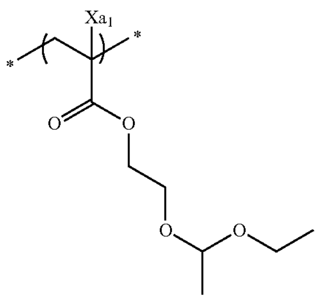
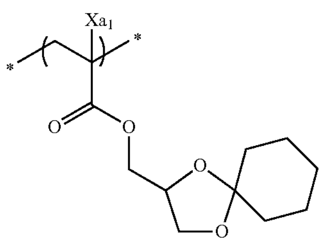
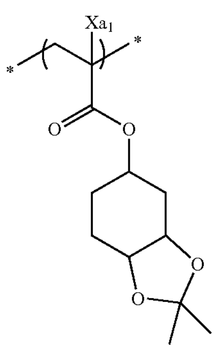
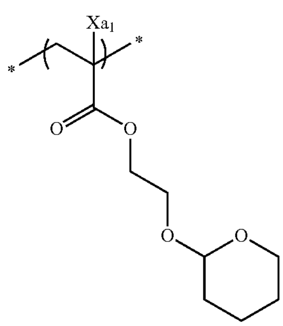
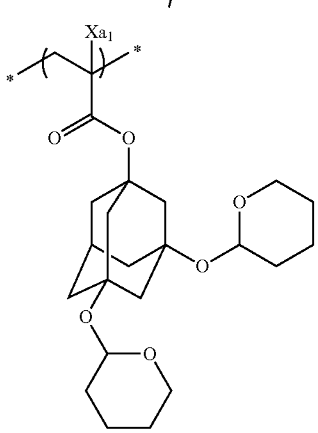
-continued
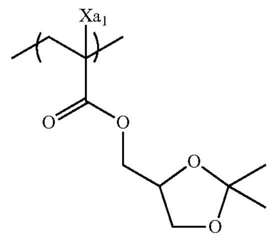
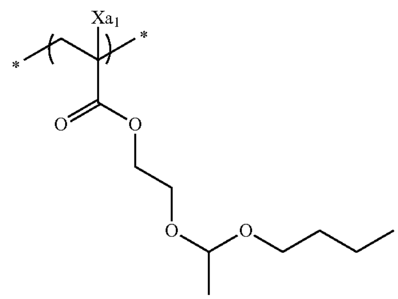
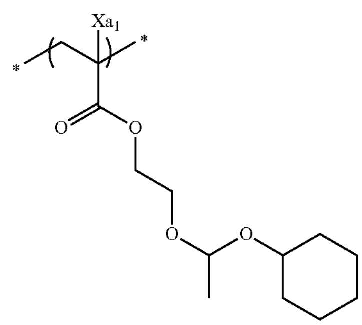
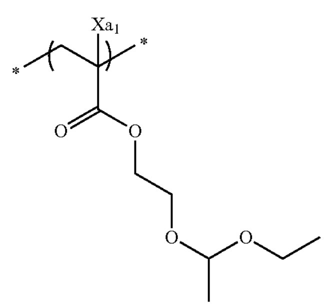
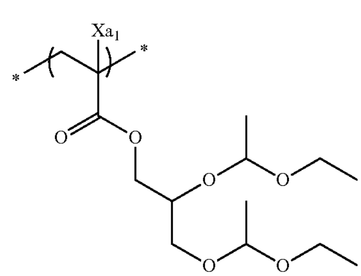

-continued

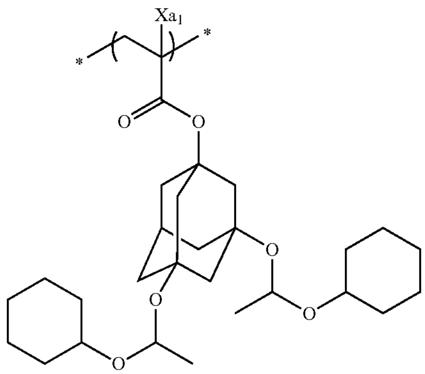

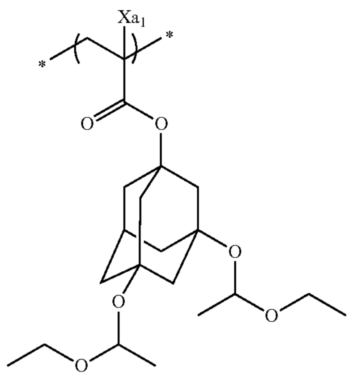

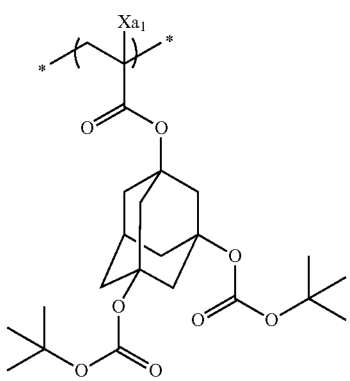

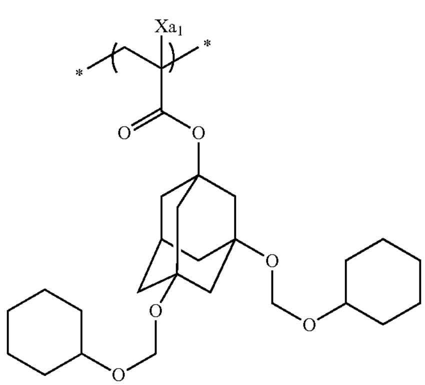

-continued

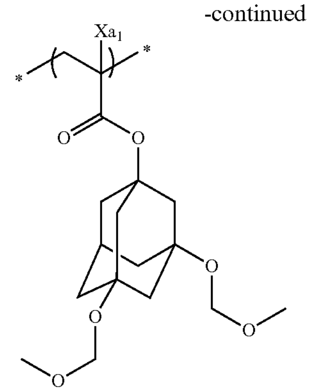

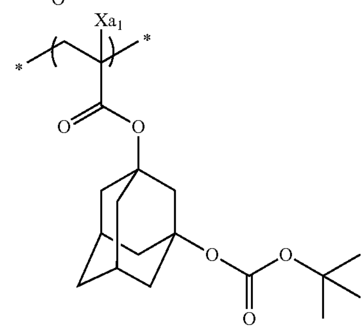

As for the repeating unit having an acid-decomposable group, one kind may be used, or two more kinds may be used in combination.

The content of the repeating unit having an acid-decomposable group (in the case of containing a plurality of kinds of repeating units, the total thereof) in the resin (A) is preferably from 5 to 80 mol %, more preferably from 5 to 75 mol %, still more preferably from 10 to 65 mol %, based on all repeating units in the resin (A).

(b) Repeating Unit Represented by Formula (1)

The resin (A) contains a repeating unit represented by the following formula (1):

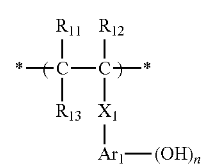

(1)

In formula (1), each of $R_{11}$, $R_{12}$ and $R_{13}$ independently represents a hydrogen atom, an alkyl group, a cycloalkyl group, a halogen atom, a cyano group or an alkoxycarbonyl group. $R_{13}$ may combine with $Ar_1$ to form a ring and in this case, $R_{13}$ represents an alkylene group.

$X_1$ represents a single bond or a divalent linking group.

$Ar_1$ represents an (n+1)-valent aromatic ring group and in the case of combining with $R_{13}$ to form a ring, represents an (n+2)-valent aromatic ring group.

n represents an integer of 1 to 4.

Specific examples of the alkyl group, cycloalkyl group, halogen atom and alkoxycarbonyl group of $R_{11}$, $R_{12}$ and $R_{13}$ in formula (1) and the substituent that these groups may have are the same as specific examples described for respective groups represented by $R_{51}$, $R_{52}$ and $R_{53}$ in formula (V).

$Ar_1$ represents an (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group, naphthylene group and anthracenylene group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent that the above-described alkylene group and (n+1)-valent aromatic ring group may have include the alkyl group recited for $R_{51}$ to $R_{53}$ in formula (V), an alkoxy group such as methoxy group, ethoxy group, hydroxyethoxy group, propoxy group, hydroxypropoxy group and butoxy group, and an aryl group such as phenyl group.

The divalent linking group of $X_1$ includes —COO— or —$CONR_{64}$—.

Examples of the alkyl group of $R_{64}$ in —$CONR_{64}$— ($R_{64}$ represents a hydrogen atom or an alkyl group) represented by $X_1$ are the same as those of the alkyl group of $R_{61}$ to $R_{63}$.

$X_1$ is preferably a single bond, —COO— or —CONH—, more preferably a single bond or —COO—.

$Ar_1$ is preferably an aromatic ring group having a carbon number of 6 to 18, which may have a substituent, more preferably a benzene ring group, a naphthalene ring group or a biphenylene ring group.

The repeating unit (b) preferably has a hydroxystyrene structure, that is, $Ar_1$ is preferably a benzene ring group.

n represents an integer of 1 to 4, preferably represents 1 or 2, more preferably represents 1.

Specific examples of the repeating unit represented by formula (1) are illustrated below, but the present invention is not limited thereto. In the formulae, a represents 1 or 2.

(B-1)

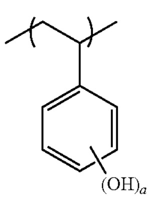

(B-2)

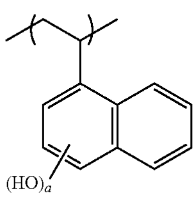

(B-3)

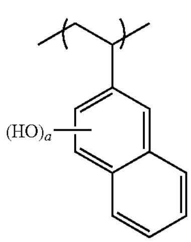

-continued (B-4)

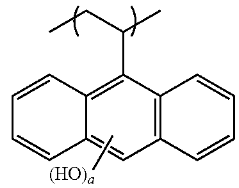

(B-5)

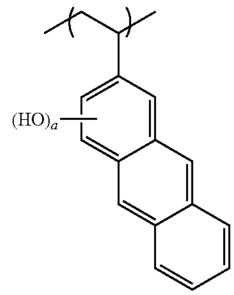

(B-6)

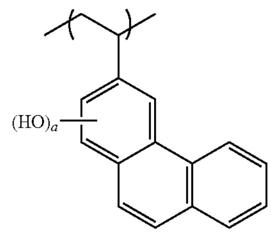

(B-7)

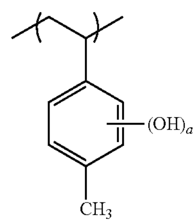

(B-8)

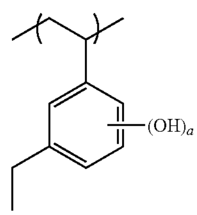

(B-9)

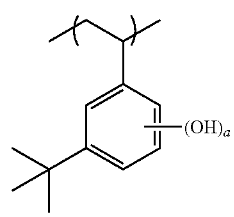

(B-10)\

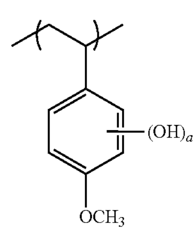

-continued
(B-11)
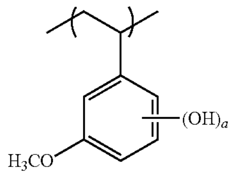
(B-12)
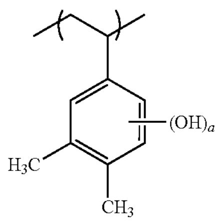
(B-13)
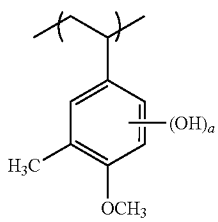
(B-14)
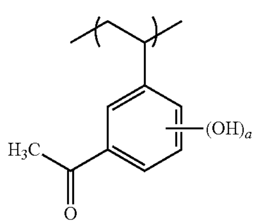
(B-15)
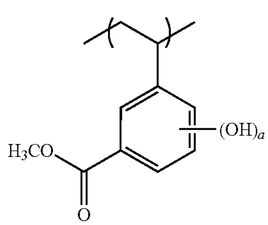
(B-16)
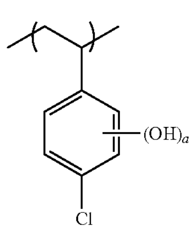
(B-17)
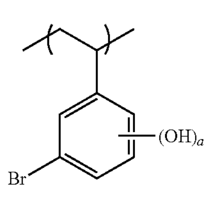
-continued
(B-18)
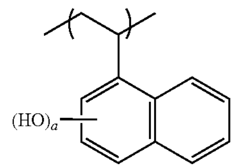
(B-19)
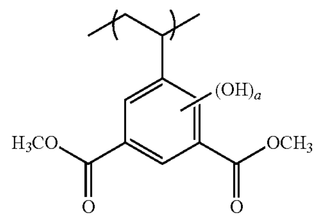
(B-20)
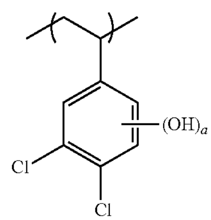
(B-21)
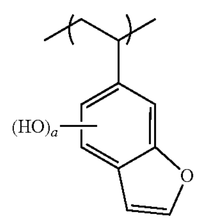
(B-22)
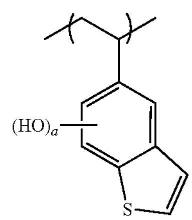
(B-23)
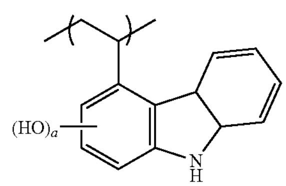
(B-24)
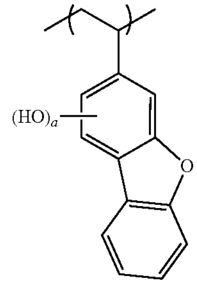

-continued (B-25)

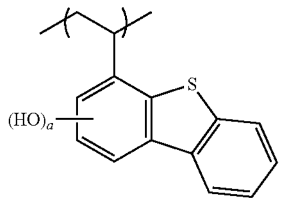

(B-26)

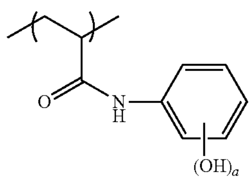

(B-27)

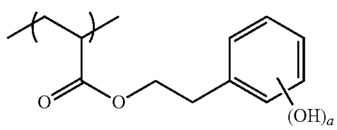

(B-28)

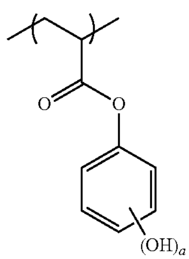

(B-29)

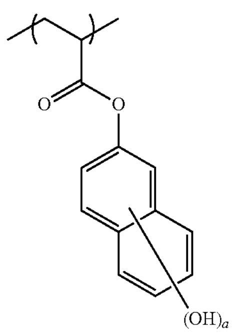

(B-30)

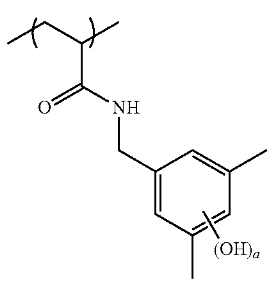

The resin (A) may contain two or more kinds of repeating units represented by formula (1).

The content of the repeating unit represented by formula (1) (in the case of containing a plurality of kinds of repeating units, the total thereof) is preferably from 3 to 98 mol %, more preferably from 10 to 80 mol %, still more preferably from 25 to 70 mol %, based on all repeating units in the resin (A).

(c) Repeating Unit Having a Polar Group Except for the Repeating Unit Represented by Formula (1)

The resin (A) preferably contains (c) a repeating unit having a polar group. By containing the repeating unit (c), for example, the sensitivity of the composition containing the resin can be enhanced. The repeating unit (c) is preferably a non-acid-decomposable repeating unit (that is, preferably has no acid-decomposable group).

The "polar group" that can be contained in the repeating unit (c) includes, for example, the following (1) to (4). In the following, the "electronegativity" means a Pauling's value.

(1) Functional group containing a structure where an oxygen atom and an atom having an electronegativity difference from oxygen atom of 1.1 or more are bonded through a single bond Examples of this polar group include a group containing a structure represented by O—H such as hydroxy group.

(2) Functional group containing a structure where a nitrogen atom and an atom having an electronegativity difference from nitrogen atom of 0.6 or more are bonded through a single bond Examples of this polar group include a group containing a structure represented by N—H such as amino group.

(3) Functional group containing a structure where two atoms differing in the electronegativity by 0.5 or more are bonded through a double bond or a triple bond Examples of this polar group include a group containing a structure represented by C≡N, C═O, N═O, S═O or C═N.

(4) Functional group having an ionic moiety

Examples of this polar group include a group having a moiety represented by $N^+$ or $S^+$.

Specific examples of the partial structure that can be contained in the "polar group" are illustrated below.

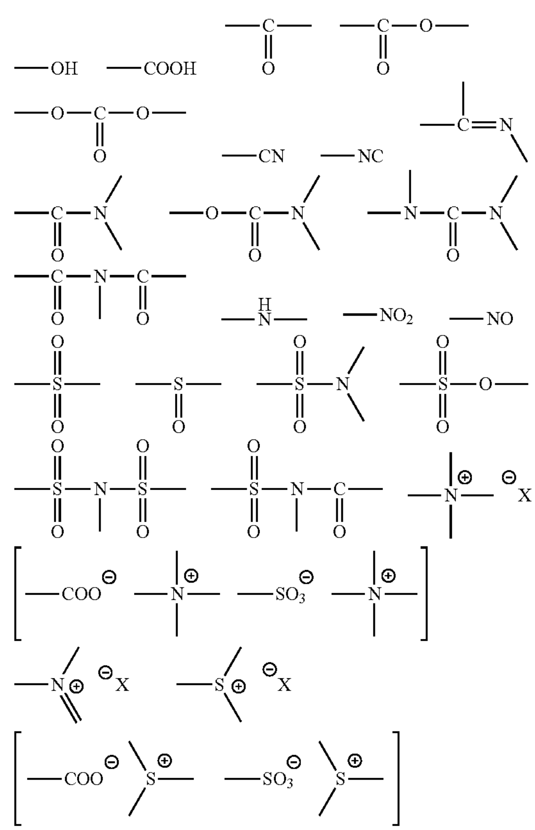

The "polar group" that can be contained in the repeating unit (c) is preferably, for example, at least one selected from the group consisting of (I) a hydroxy group, (II) a cyano group, (III) a lactone group, (IV) a carboxylic acid group or a sulfonic acid group, (V) an amide group, a sulfonamide group or a group corresponding to a derivative thereof, (VI) an ammonium group or a sulfonium group, and a group formed by combining two or more thereof.

The polar group is preferably selected from a hydroxyl group, a cyano group, a lactone group, a carboxylic acid group, a sulfonic acid group, an amide group, a sulfonamide group, an ammonium group, a sulfonium group, and a group formed by combining two or more thereof, more preferably an alcoholic hydroxy group, a cyano group, a lactone group, or a cyanolactone structure-containing group.

When a repeating unit having an alcoholic hydroxy group is further incorporated into the resin, the exposure latitude (EL) of a composition containing the resin can be more enhanced.

When a repeating unit having a cyano group is further incorporated into the resin, the sensitivity of a composition containing the resin can be more enhanced.

When a repeating unit having a lactone group is further incorporated into the resin, the dissolution contrast for an organic solvent-containing developer can be more enhanced. Also, the composition containing the resin can be more improved in the dry etching resistance, coatability and adherence to substrate.

When a repeating unit having a group containing a cyano group-containing lactone structure is further incorporated into the resin, the dissolution contrast for an organic solvent-containing developer can be more enhanced. Also, the composition containing the resin can be further improved in the sensitivity, dry etching resistance, coatability and adherence to substrate. In addition, a single repeating unit can play functions attributable to a cyano group and a lactone group, respectively, and the latitude in designing the resin can be more broadened.

In the case where the polar group contained in the repeating unit (c) is an alcoholic hydroxy group, the repeating unit is preferably represented by at least one formula selected from the group consisting of the following formulae (I-1H) to (I-10H), more preferably represented by at least one formula selected from the group consisting of the following formulae (I-1H) to (I-3H), still more preferably represented by the following formula (I-1H):

(I-1H)

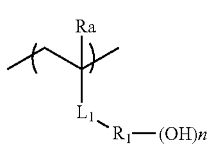

(I-2H)

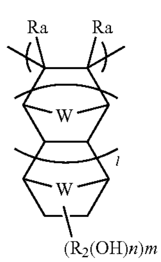

-continued (I-3H)

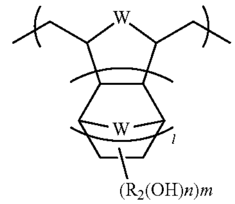

(I-4H)

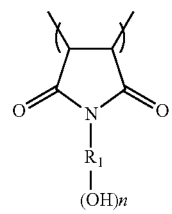

(I-5H)

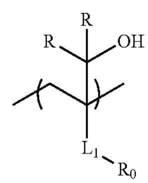

(I-6H)

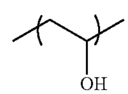

(I-7H)

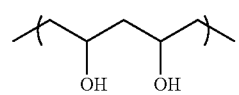

(I-8H)

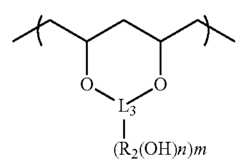

(I-9H)

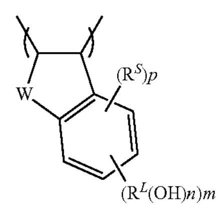

(I-10H)

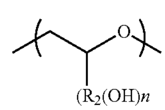

In the formulae, Ra, $R_1$, $R_2$, W, n, m, 1, $L_1$, R, $R_0$, $L_3$, $R^L$, $R^S$ and p have the same meanings as in formulae (I-1) to (I-10).

When a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity brought about by the group capable of decomposing by the action of an acid to produce an alcoholic hydroxy group, the exposure latitude (EL) can be improved without deteriorating other performances.

The content of the repeating unit having an alcoholic hydroxy group is preferably from 1 to 60 mol %, more preferably from 3 to 50 mol %, still more preferably from 5 to 40 mol %, based on all repeating units in the resin (A).

Specific examples of the repeating unit represented by any one of formulae (I-1H) to (I-10H) are illustrated below. In specific examples, Ra has the same meaning as in formulae (I-1H) to (I-10H).

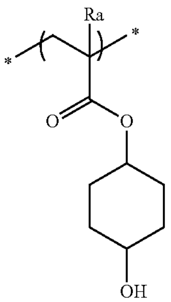
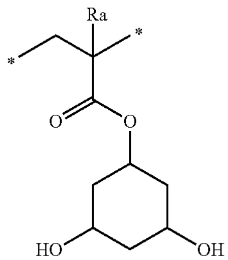
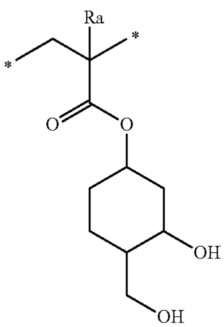
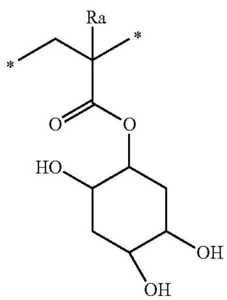
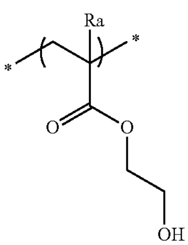
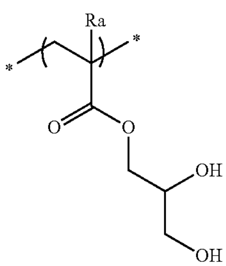
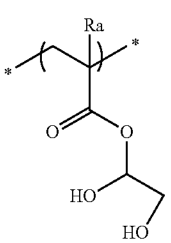
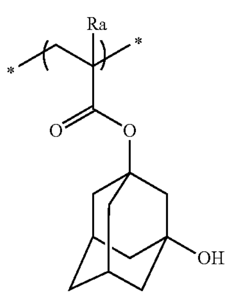

-continued

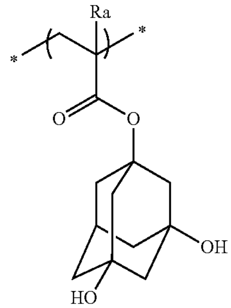
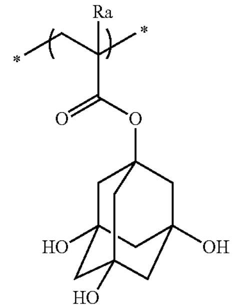
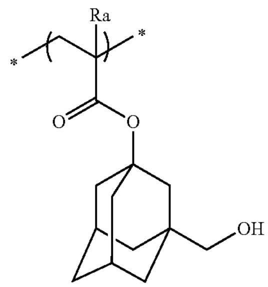
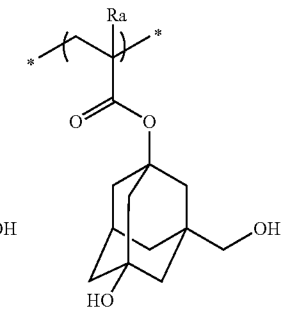
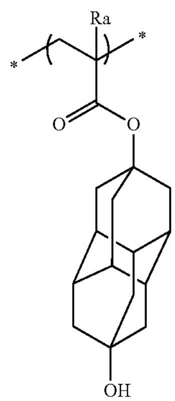
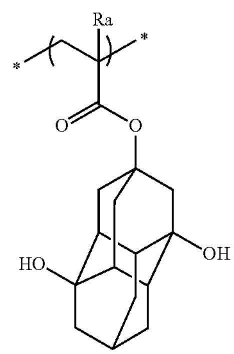
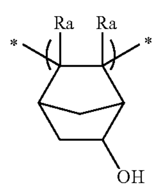
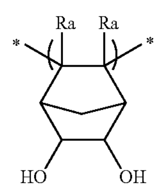
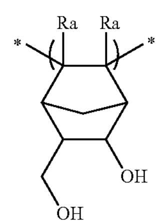
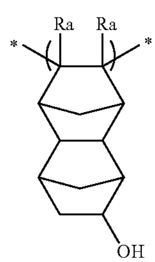
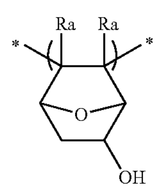
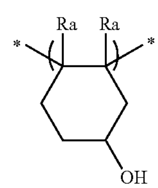

-continued

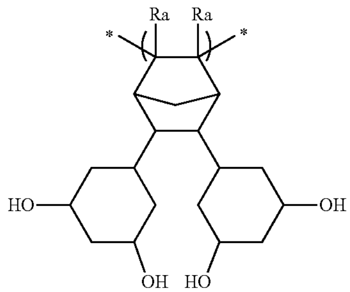

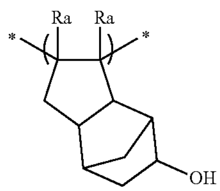

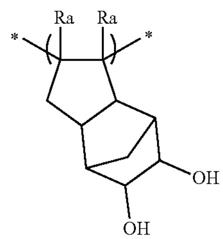

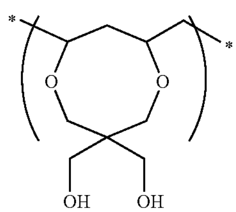

In the case where the polar group contained in the repeating unit (c) is an alcoholic hydroxy group or a cyano group, one preferred embodiment of the repeating unit is a repeating unit having an alicyclic hydrocarbon structure substituted with a hydroxyl group or a cyano group. At this time, the repeating unit preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIIc). Thanks to this repeating unit, adherence to substrate and affinity for developer are enhanced.

(VIIa)

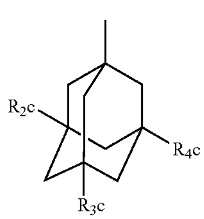

-continued (VIIb)

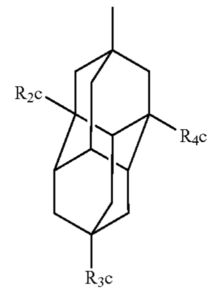

(VIIc)

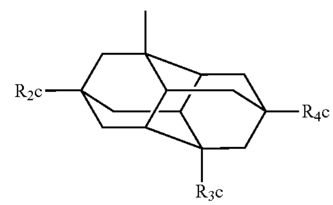

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group. A structure where one or two members of $R_2c$ to $R_4c$ are a hydroxyl group with the remaining being a hydrogen atom is preferred. In formula (VIIa), it is more preferred that two members of $R_2c$ to $R_4c$ are a hydroxyl group and the remaining is a hydrogen atom.

The repeating unit having a partial structure represented by formulae (VIIa) to (VIIc) includes repeating units represented by the following formulae (AIIa) to (AIIc):

(AIIa)

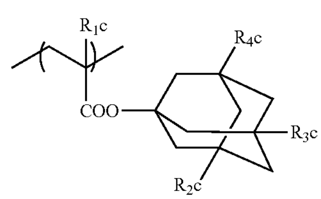

(AIIb)

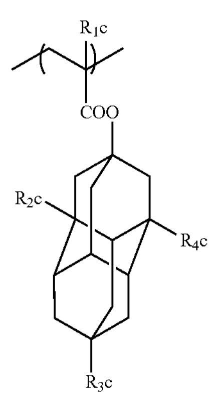

-continued (AIIc)

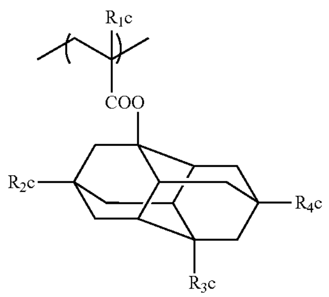

In formulae (AIIa) to (AIIc), $R_{1c}$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The resin (A) may or may not contain a repeating unit having a hydroxyl group or a cyano group, but in the case of containing a repeating unit having a hydroxyl group or a cyano group, the content thereof is preferably from 1 to 60 mol %, more preferably from 3 to 50 mol %, still more preferably from 5 to 40 mol %, based on all repeating units in the resin (A).

Specific examples of the repeating unit having a hydroxyl group or a cyano group are illustrated below, but the present invention is not limited thereto.

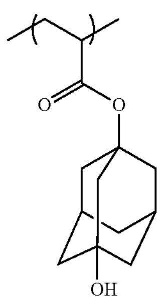

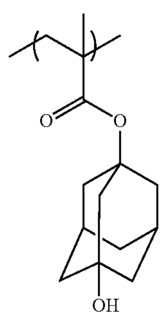

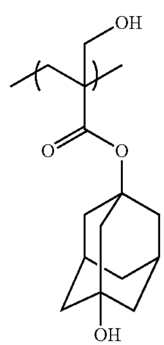

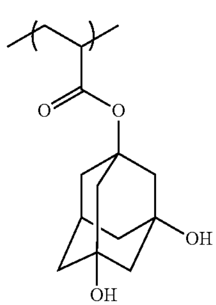

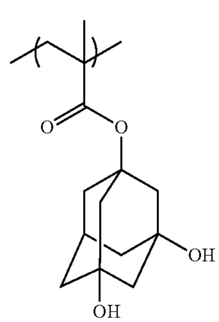

-continued

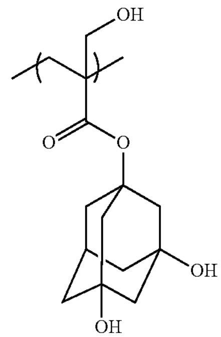

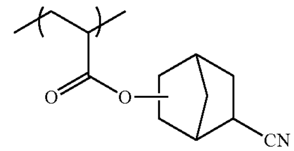

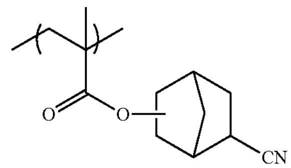

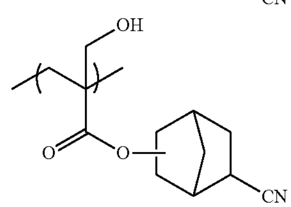

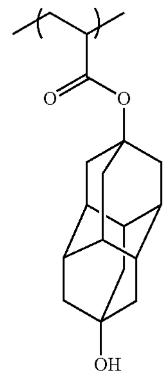

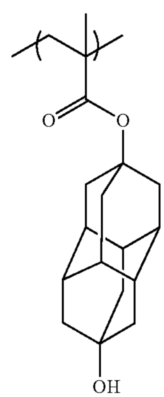

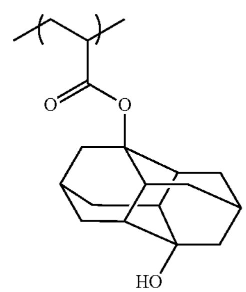

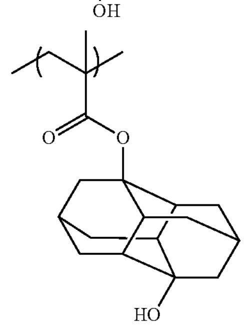

The repeating unit (c) may be a repeating unit having a lactone structure as the polar group.

The repeating unit having a lactone structure is preferably a repeating unit represented by the following formula (AII):

(AII)

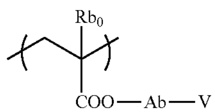

In formula (AII), $Rb_0$ represents a hydrogen atom, a halogen atom or an alkyl group (preferably having a carbon number of 1 to 4) which may have a substituent.

Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combining these. Ab is preferably a single bond or a divalent linking group represented by $-Ab_1-CO_2-$.

$Ab_1$ is a linear or branched alkylene group or a monocyclic or polycyclic cycloalkylene group and is preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

LC1-1

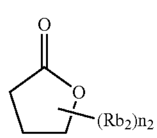

LC1-2

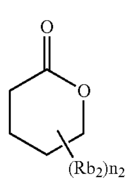

LC1-3

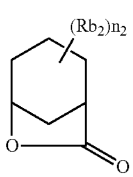

-continued

LC1-4

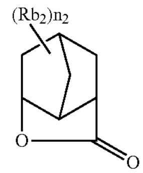

LC1-5

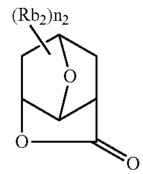

LC1-6

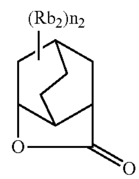

LC1-7

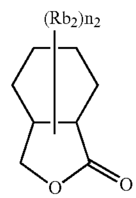

LC1-8

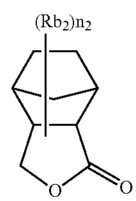

LC1-9

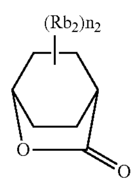

LC1-10

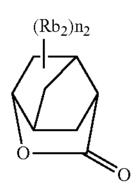

LC1-11

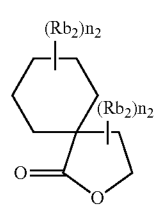

-continued

LC1-12

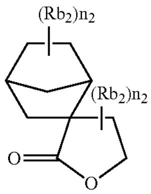

LC1-13

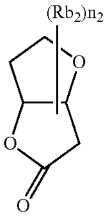

LC1-14

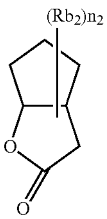

LC1-15

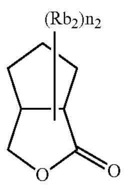

LC1-16

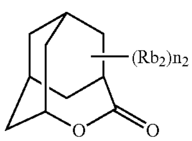

LC1-17

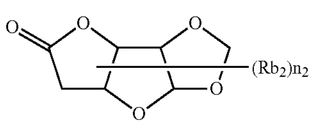

The lactone structure moiety may or may not have a substituent ($Rb_2$). Preferred examples of the substituent ($Rb_2$) include an alkyl group having a carbon number of 11 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine with each other to form a ring.

The repeating unit having a lactone group usually has an optical isomer, and any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The resin (A) may or may not contain a repeating unit having a lactone structure, but in the case of containing a repeating unit having a lactone structure, the content of the repeating unit in the resin (A) is preferably from 1 to 70 mol %, more preferably from 3 to 65 mol %, still more preferably from 5 to 60 mol %, based on all repeating units.

Specific examples of the lactone structure-containing repeating unit in the resin (A) are illustrated below, but the present invention is not limited thereto. In the formulae, Rx represents H, $CH_3$, $CH_2OH$ or $CF_3$.

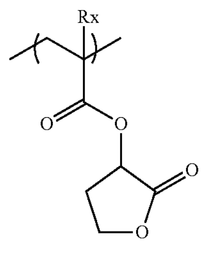

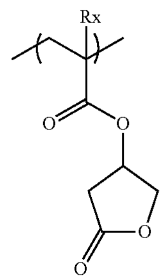

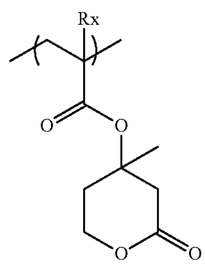

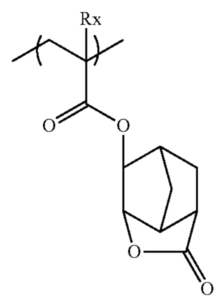

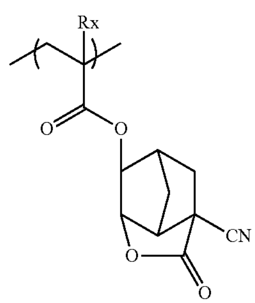

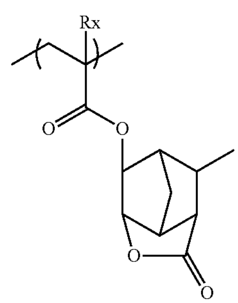

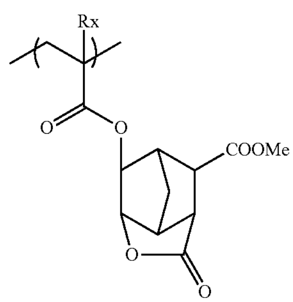

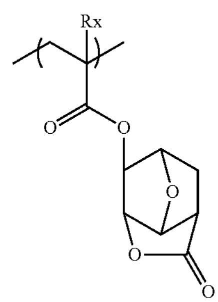

-continued

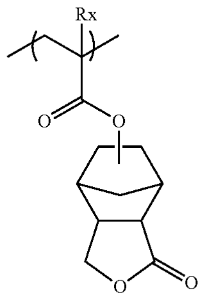

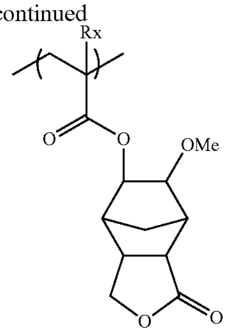

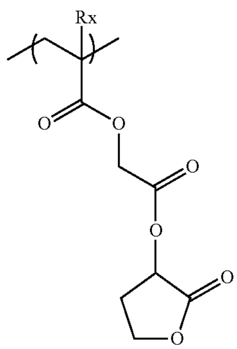

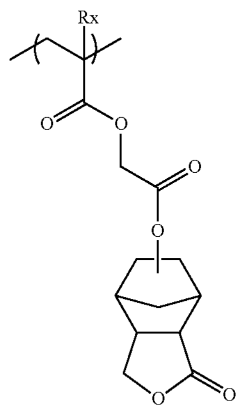

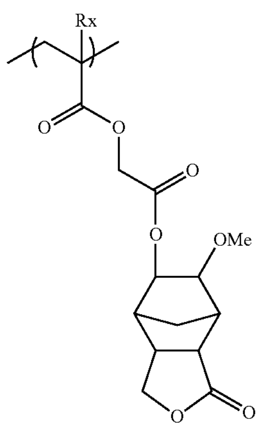

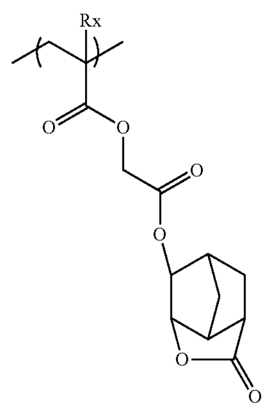

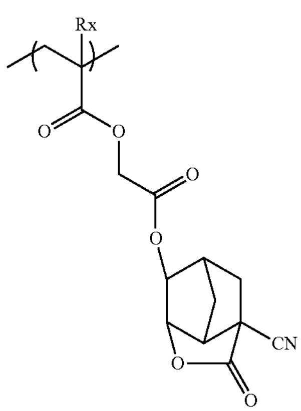

It is also one of particularly preferred embodiments that the polar group which can be contained in the repeating unit (c) is an acidic group. Preferred acidic groups include a phenolic hydroxyl group, a carboxylic acid group, a sulfonic acid group, a fluorinated alcohol group (such as hexafluoroisopropanol group), a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group. Among others, the repeating unit (c) is preferably a repeating unit having a carboxyl group. By virtue of containing a repeating unit having an acidic group, the resolution increases in usage of forming contact holes. As the repeating unit having an acidic group, all of a repeating unit where an acidic group is directly bonded to the main chain of the resin, such as repeating unit by an acrylic acid or a methacrylic acid, a repeating unit where an acidic group is bonded to the main chain of the resin through a linking group, and a repeating unit where an acidic group is introduced into the polymer chain terminal by using an acidic group-containing polymerization initiator or chain transfer agent at the polymerization, are preferred. In particular, a repeating unit by an acrylic acid or a methacrylic acid is preferred.

The acidic group that can be contained in the repeating unit (c) may or may not contain an aromatic ring, but in the case containing an aromatic ring, the acidic group is preferably selected from those except for a phenolic hydroxyl group. In the case where the repeating unit (c) contains an acidic group, the content of the repeating unit having an acidic group is preferably 30 mol % or less, more preferably 20 mol % or less, based on all repeating units in the resin (A). In the case where the resin (A) contains a repeating unit having an acidic group, the content of the repeating unit having an acidic group in the resin (A) is usually 1 mol % or more.

Specific examples of the repeating unit having an acidic group are illustrated below, but the present invention is not limited thereto.

In specific examples, Rx represents H, $CH_3$, $CH_2OH$ or $CF_3$.

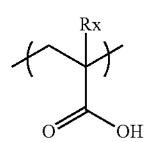

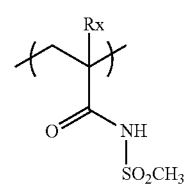

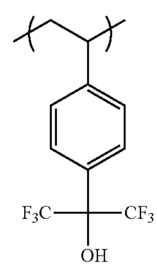

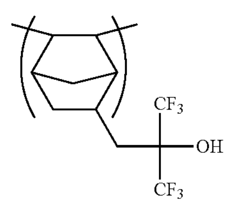

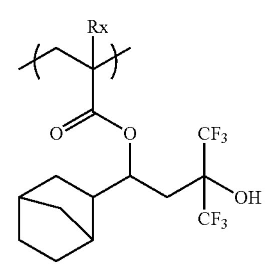

-continued

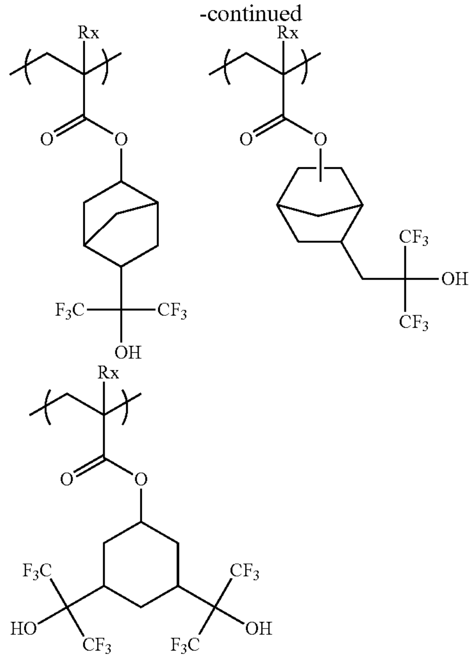

(d) Repeating Unit Having a Plurality of Aromatic Rings

The resin (A) may contain (d) a repeating unit having a plurality of aromatic rings represented by the following formula (c1):

(c1)

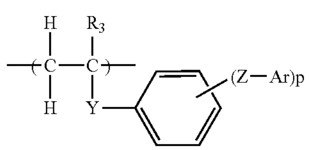

In formula (c1), $R_3$ represents a hydrogen atom, an alkyl group, a halogen atom, a cyano group or a nitro group;

Y represents a single bond or a divalent linking group;

Z represents a single bond or a divalent linking group;

Ar represents an aromatic ring group; and p represents an integer of 1 or more.

The alkyl group as $R_3$ may be either linear or branched, and examples thereof include a methyl group, an ethyl group, an n-propyl group, an i-propyl group, an n-butyl group, a sec-butyl group, a tert-butyl group, an n-pentyl group, an n-hexyl group, an n-heptyl group, an n-octyl group, an n-nonyl group, an n-decanyl group, and an i-butyl group. The alkyl group may further have a substituent, and preferred examples of the substituent include an alkoxy group, a hydroxyl group, a halogen atom, and a nitro group. Among others, the alkyl group having a substituent is preferably, for example, a $CF_3$ group, an alkyloxycarbonylmethyl group, an alkylcarbonyloxymethyl group, a hydroxymethyl group or an alkoxymethyl group.

The halogen atom as $R_3$ includes fluorine atom, chlorine atom, bromine atom and iodine atom, with fluorine atom being preferred.

Y represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —$SO_2NH$—, —$CF_2$—, —$CF_2CF_2$—, —$OCF_2O$—, —$CF_2OCF_2$—, —SS—, —$CH_2SO_2CH_2$—, —$CH_2COCH_2$—, —$COCF_2CO$—, —COCO—, —OCOO—, —$OSO_2O$—, an amino group (nitrogen atom), an acyl group, an alkylsulfonyl group, —CH═CH—, —C≡C—, an aminocarbonylamino group, an aminosulfonylamino group, and a group formed by a combination thereof. Y preferably has a carbon number of 15 or less, more preferably a carbon number of 10 or less.

Y is preferably a single bond, a —COO— group, a —COS— group or a —CONH— group, more preferably a —COO— group or a —CONH— group, still more preferably a —COO— group.

Z represents a single bond or a divalent linking group, and examples of the divalent linking group include an ether group (oxygen atom), a thioether group (sulfur atom), an alkylene group, an arylene group, a carbonyl group, a sulfide group, a sulfone group, —COO—, —CONH—, —$SO_2NH$—, an amino group (nitrogen atom), an acyl group, an alkylsulfonyl group, —CH═CH—, an aminocarbonylamino group, an aminosulfonylamino group, and a group formed by a combination thereof.

Z is preferably a single bond, an ether group, a carbonyl group or —COO—, more preferably a single bond or an ether group, still more preferably a single bond.

Ar represents an aromatic ring group, and specific examples thereof include a phenyl group, a naphthyl group, an anthracenyl group, a phenanthrenyl group, a quinolinyl group, a furanyl group, a thiophenyl group, a fluorenyl-9-on-yl group, an anthraquinolinyl group, a phenanthraquinolinyl group, and a pyrrole group, with a phenyl group being preferred. Such an aromatic ring group may further have a substituent, and preferred examples of the substituent include an alkyl group, an alkoxy group, a hydroxy group, a halogen atom, a nitro group, an acyl group, an acyloxy group, an acylamino group, a sulfonylamino group, an aryl group such as phenyl group, an aryloxy group, an arylcarbonyl group, and a heterocyclic residue. Among these, from the standpoint of preventing deterioration of the exposure latitude or pattern profile due to out-of-band light, a phenyl group is preferred.

p is an integer of 1 or more and is preferably an integer of 1 to 3.

The repeating unit (d) is more preferably a repeating unit represented by the following formula (c2):

(c2)

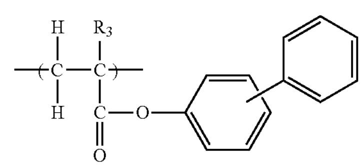

In formula (c2), $R_3$ represents a hydrogen atom or an alkyl group. Preferred examples of the alkyl group as $R_3$ are the same as in formula (c1).

Here, as concerns the extreme-ultraviolet (EUV) exposure, leakage light (out-of-band light) generated in the ultraviolet region at a wavelength of 100 to 400 nm worsens the surface roughness, as a result, the resolution and LWR performance tend to be impaired due to bridge between patterns or disconnection of pattern.

However, the aromatic ring in the repeating unit (d) functions as an internal filter capable of absorbing the above-described out-of-band light. Accordingly, in view of high resolution and low LWR, the resin (A) preferably contains the repeating unit (d).

In this connection, from the standpoint of obtaining high resolution, the repeating unit (d) is preferably free from a phenolic hydroxyl group (a hydroxyl group bonded directly on an aromatic ring).

Specific examples of the repeating unit (d) are illustrated below, but the present invention is not limited thereto.

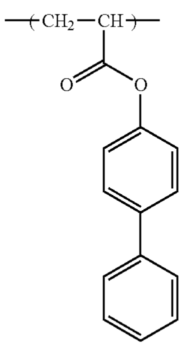

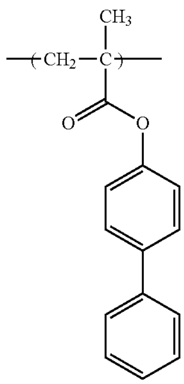

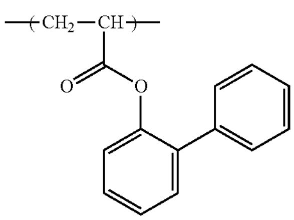

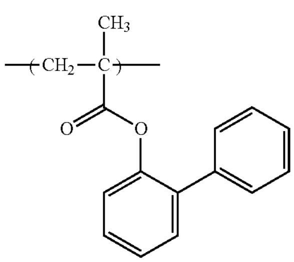

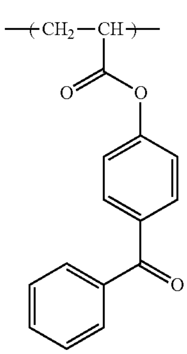

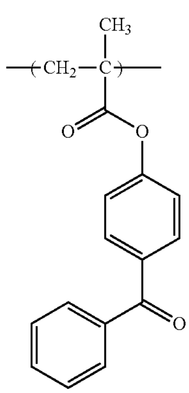

-continued

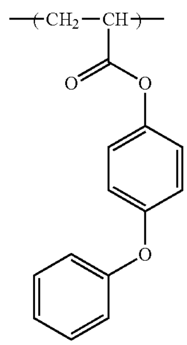

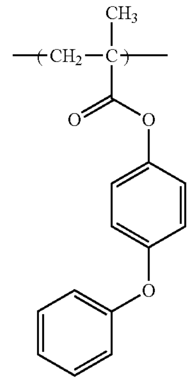

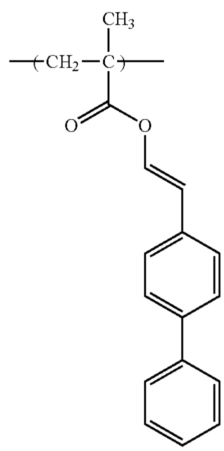

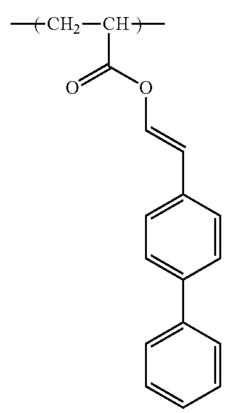

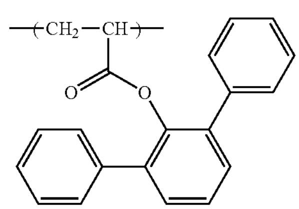

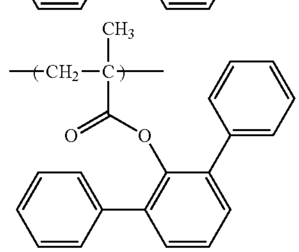

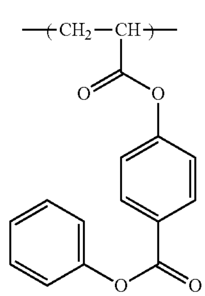

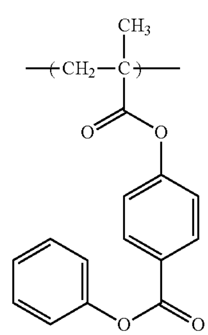

-continued
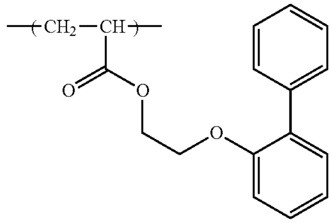
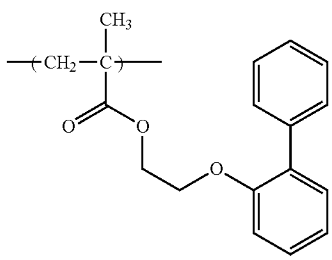
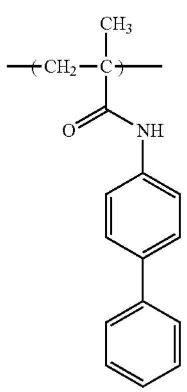
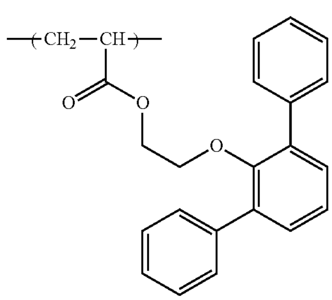
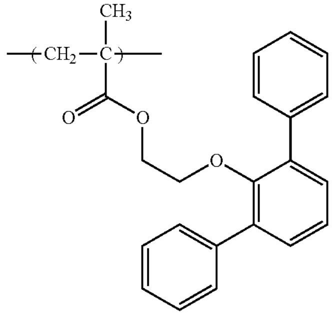
-continued
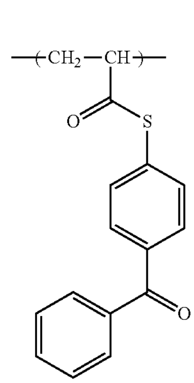
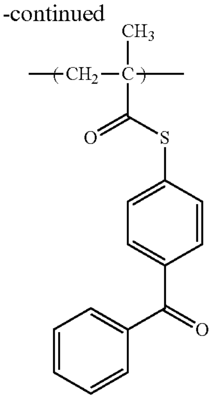
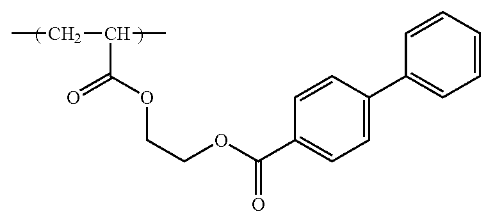
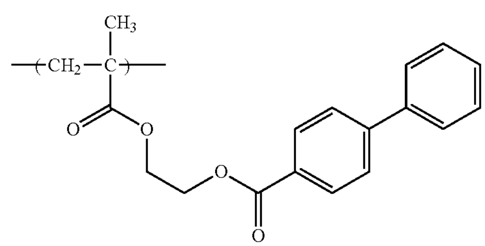
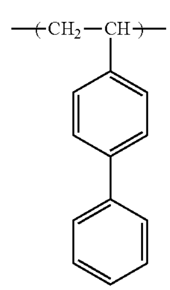
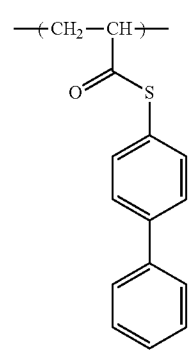
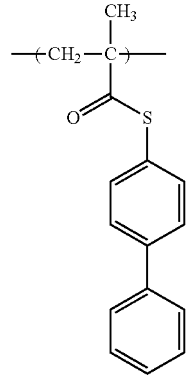
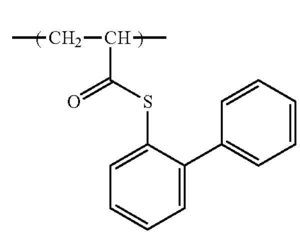

-continued
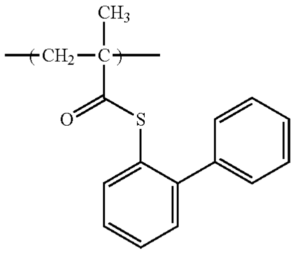
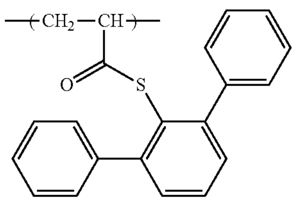
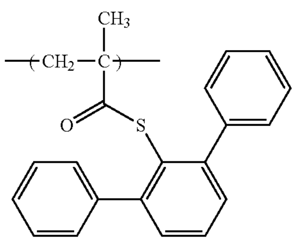
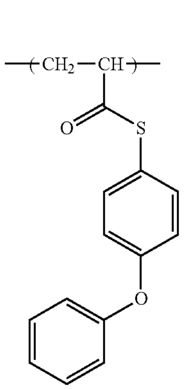
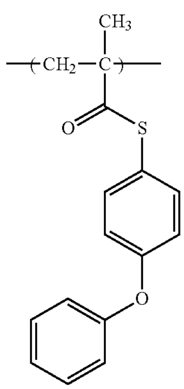
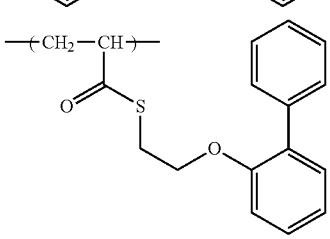
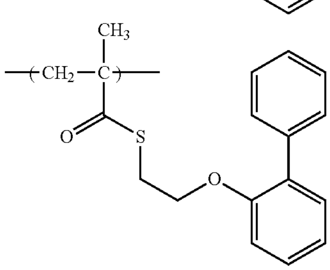
-continued
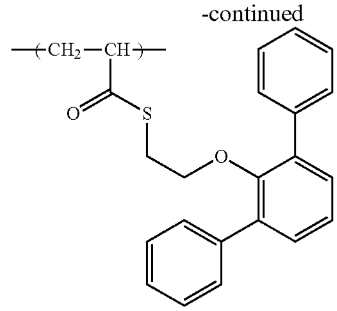
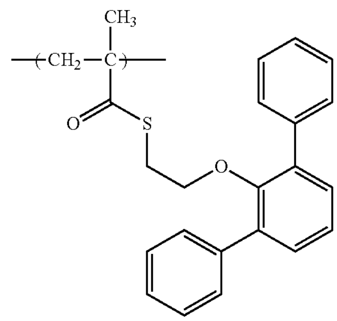
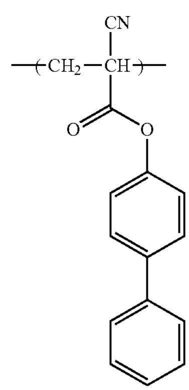
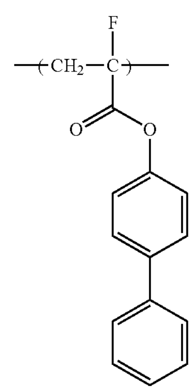
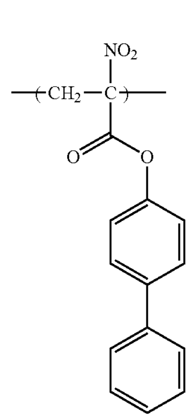
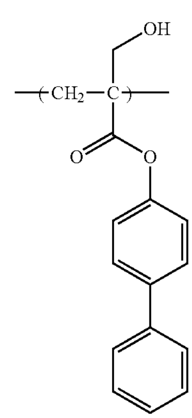

-continued

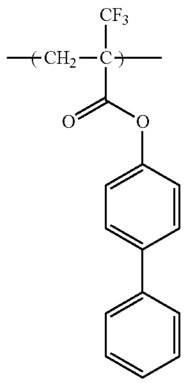

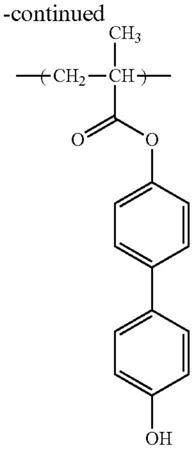

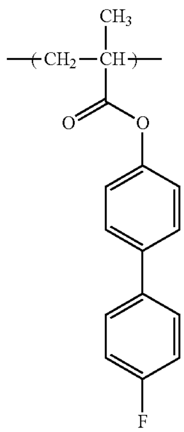

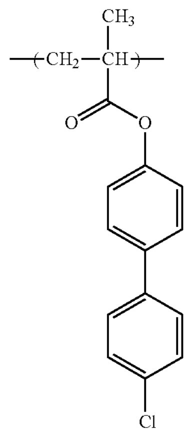

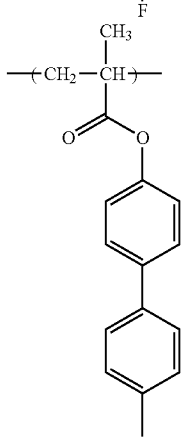

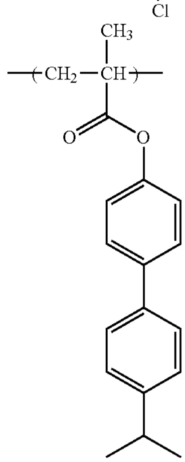

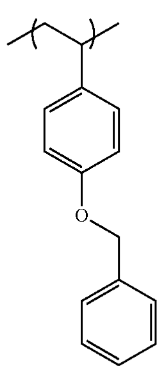

The resin (A) may or may not contain the repeating unit (d), but in the case containing the repeating unit (d), the content thereof is preferably from 1 to 30 mol %, more preferably from 1 to 20 mol %, still more preferably from 1 to 15 mol %, based on all repeating units in the resin (A). As for the repeating unit (d) contained in the resin (A), two or more kinds of repeating units may be contained in combination.

The resin (A) for use in the present invention may appropriately contain a repeating unit other than the above-described repeating units (a) to (d). As an example of such a repeating unit, the resin may contain a repeating unit having an alicyclic hydrocarbon structure free from a polar group (for example, the above-described acid group, a hydroxyl group or a cyano group) and not exhibiting acid decomposability. Thanks to this configuration, the solubility of the resin at the development using an organic solvent-containing developer can be appropriately adjusted. Such a repeating unit includes a repeating unit represented by formula (IV):

(IV)

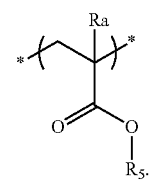

In formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bomane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group, and a tricyclo[5,2,1,$0^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having an alicyclic hydrocarbon structure free from a polar group and not exhibiting acid decomposability, but in the case of containing this repeating unit, the content thereof is preferably from 1 to 20 mol %, more preferably from 5 to 15 mol %, based on all repeating units in the resin (A).

Specific examples of the repeating unit having an alicyclic hydrocarbon structure free from a polar group and not exhibiting acid decomposability are illustrated below, but the present invention is not limited thereto. In the formulae, Ra represents H, $CH_3$, $CH_2OH$ or $CF_3$.

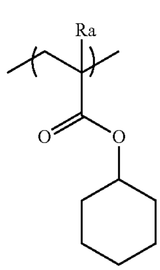
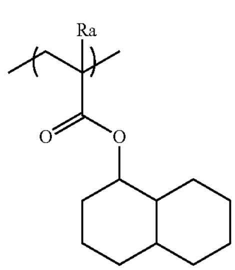

-continued

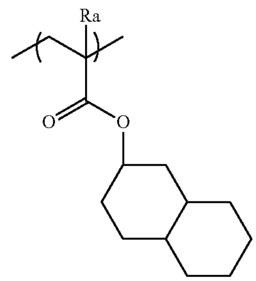
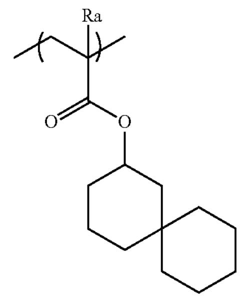

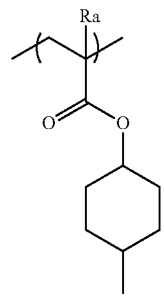
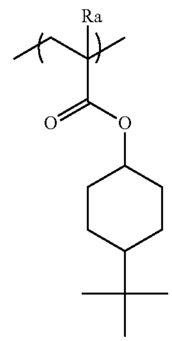
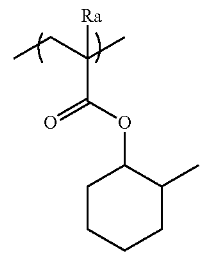

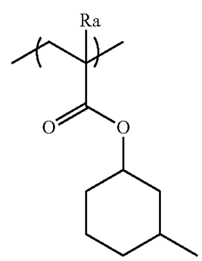
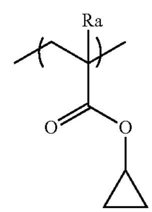
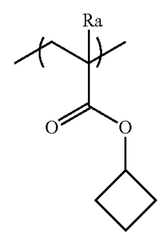

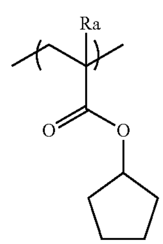
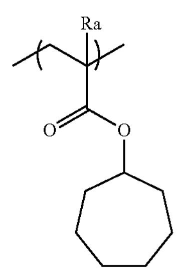
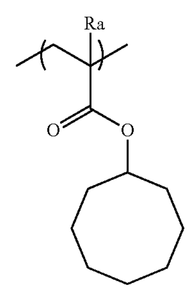

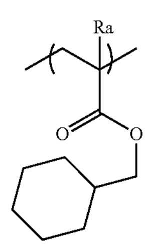
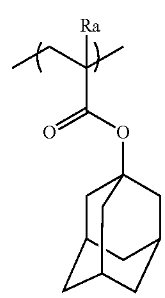
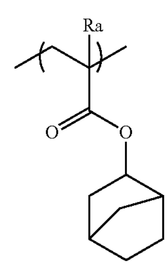

-continued

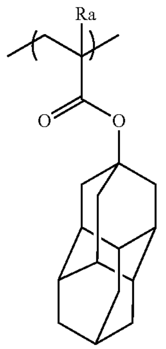

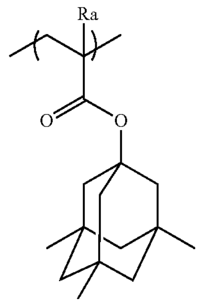

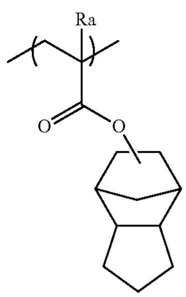

Also, the resin (A) may further contain a repeating unit represented by the following formula (5):

(5)

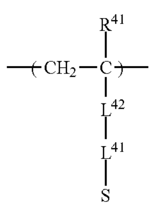

$R^{41}$ represents a hydrogen atom or a methyl group. $L_{41}$ represents a single bond or a divalent linking group. $L^{42}$ represents a divalent linking group. S represents a structural moiety capable of decomposing upon irradiation with an actinic ray or radiation to generate an acid on the side chain.

Specific examples of the repeating unit represented by formula (5) are illustrated below, but the present invention is not limited thereto.

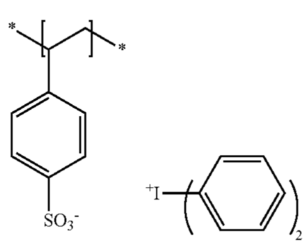

-continued

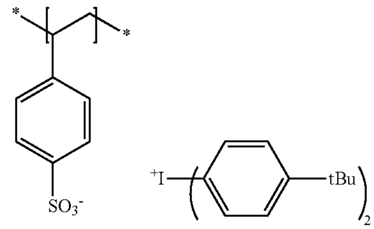

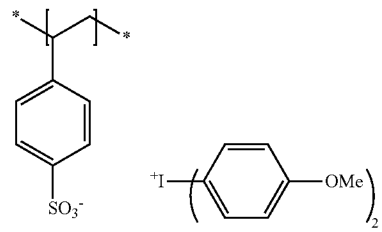

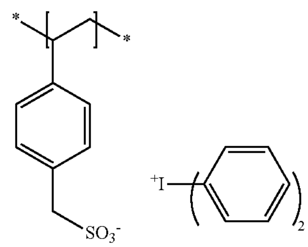

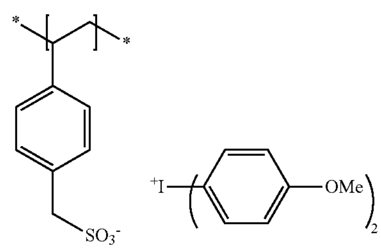

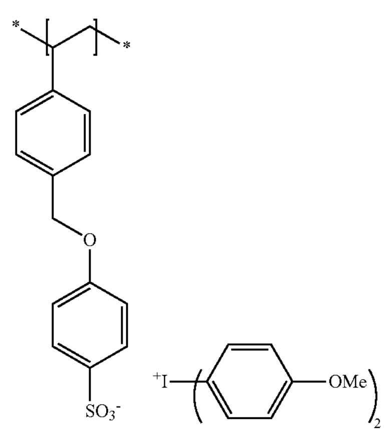

-continued
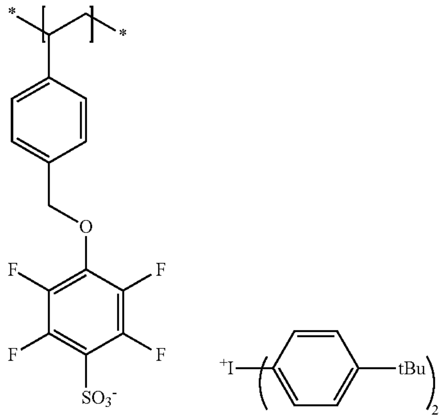
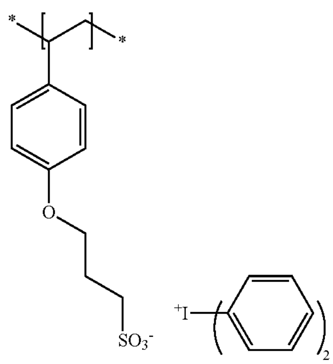
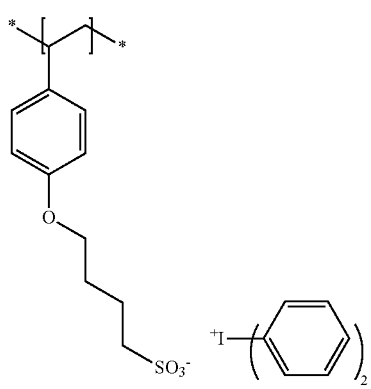
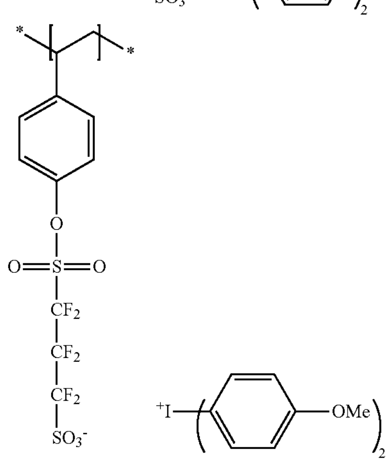
-continued
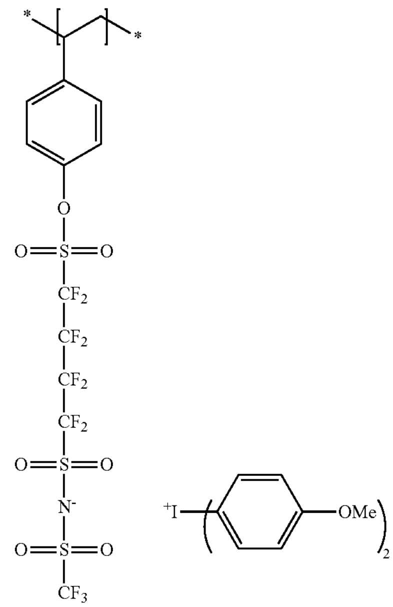
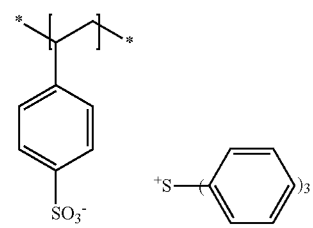
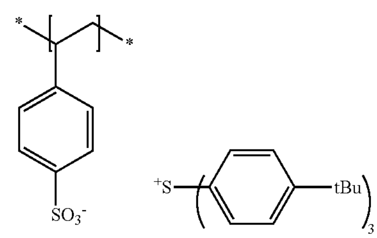
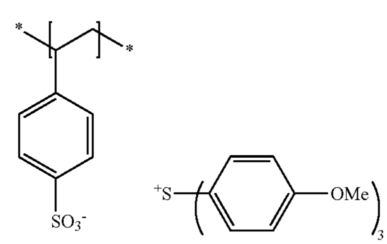
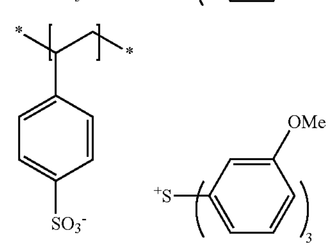

-continued
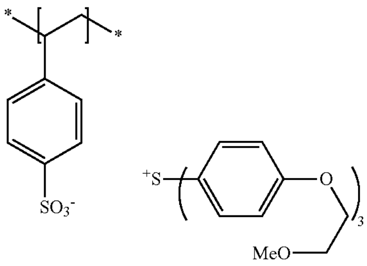
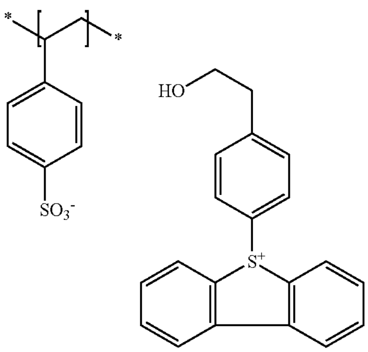
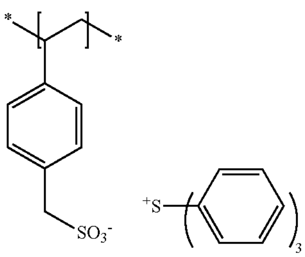
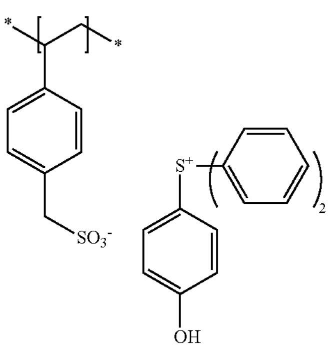
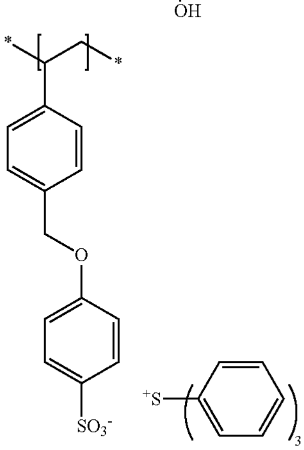
-continued
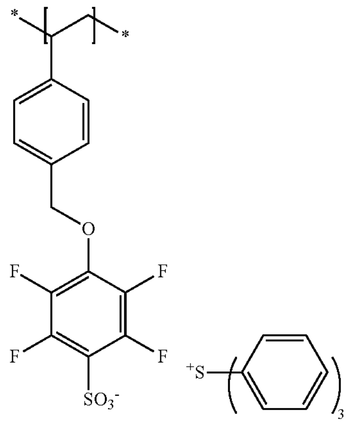
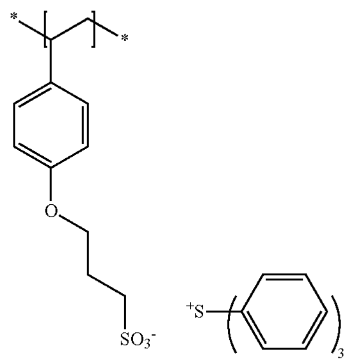
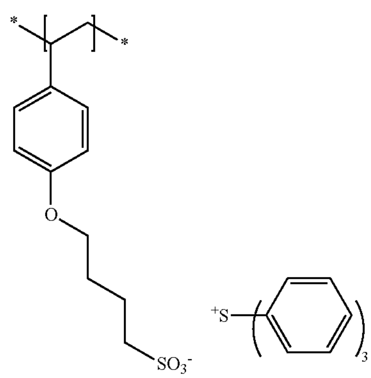
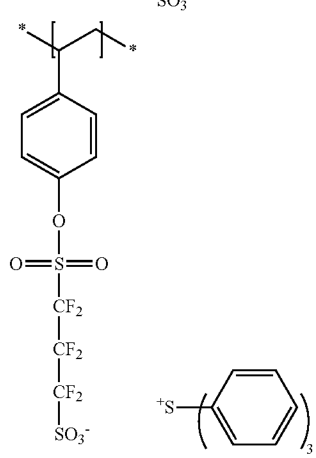

-continued
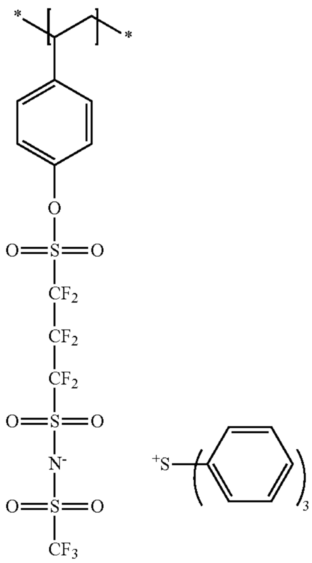
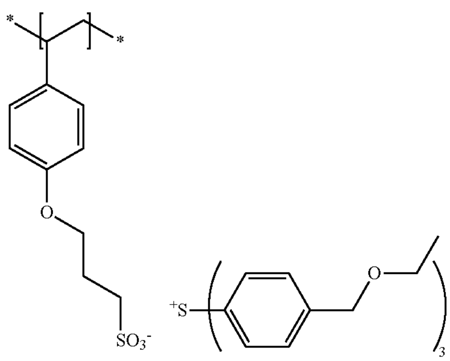
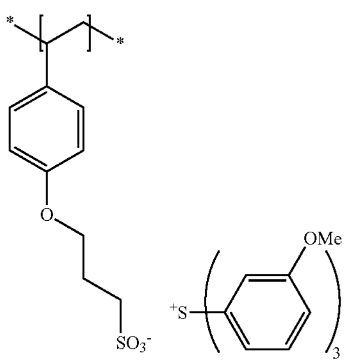
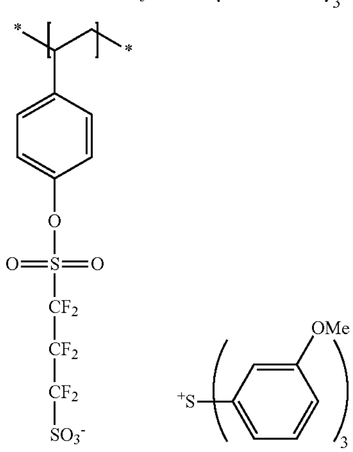
-continued
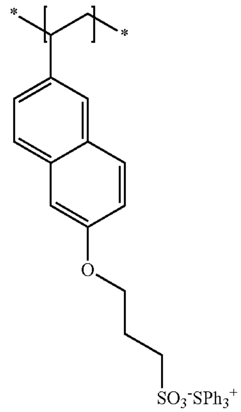
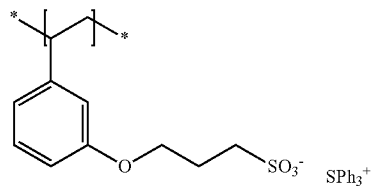
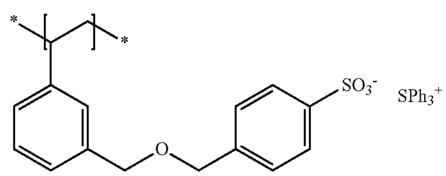
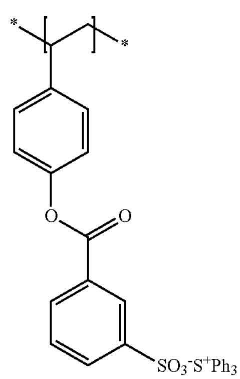
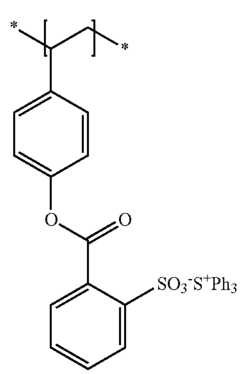

-continued
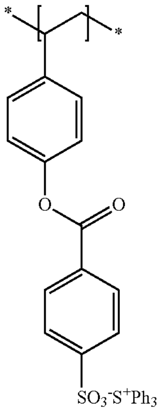
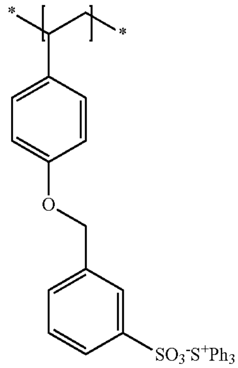
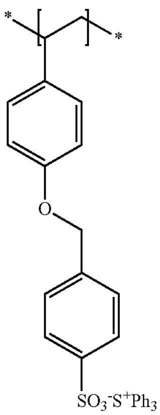
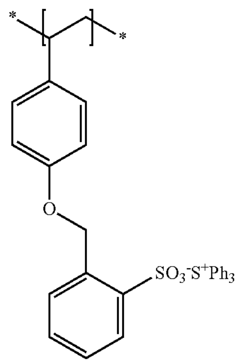
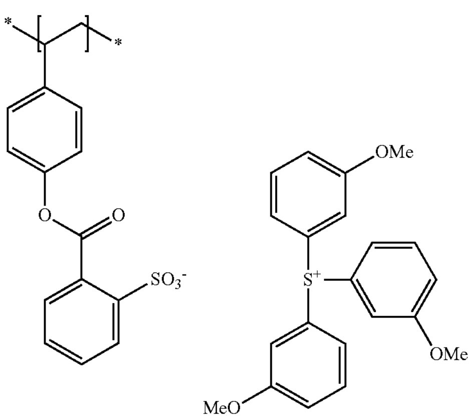
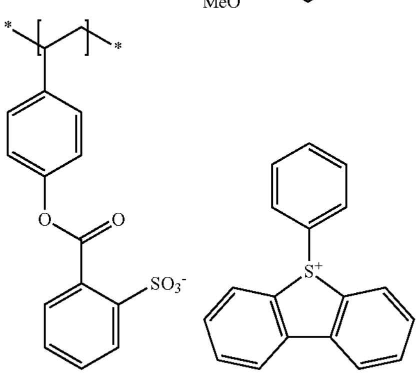
-continued
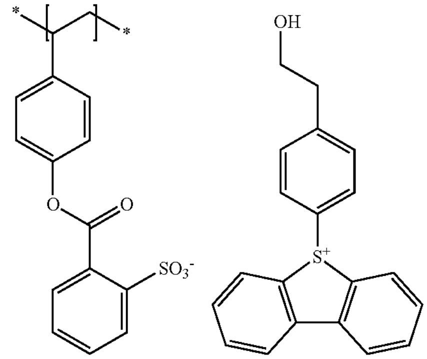
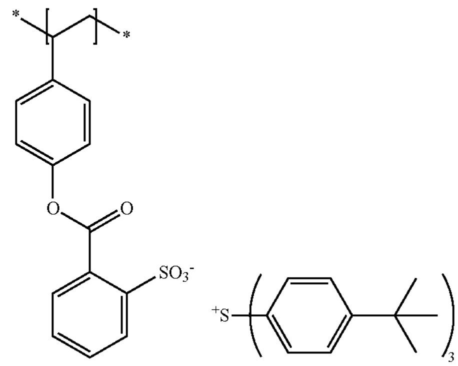
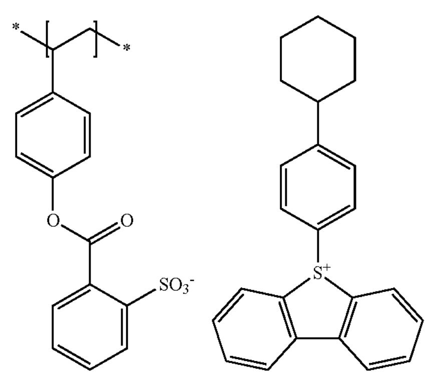
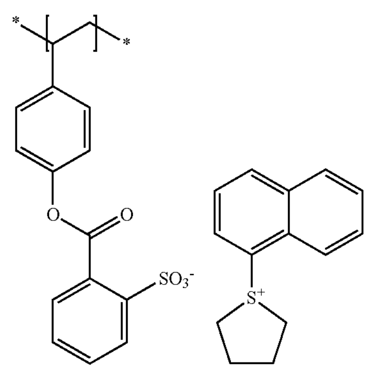

-continued
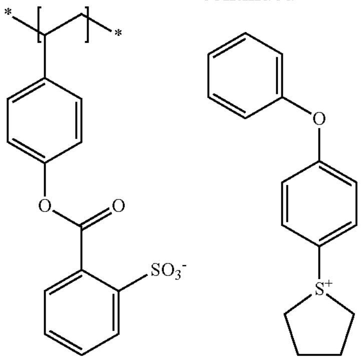
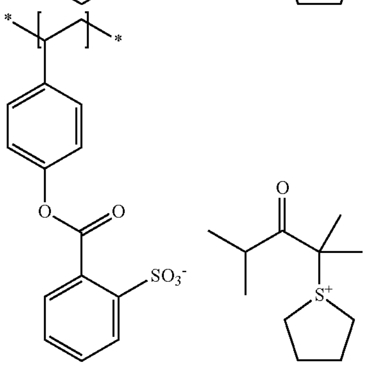
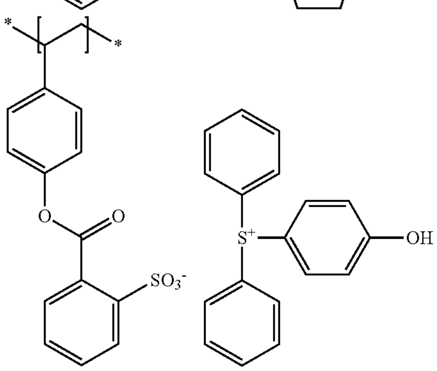
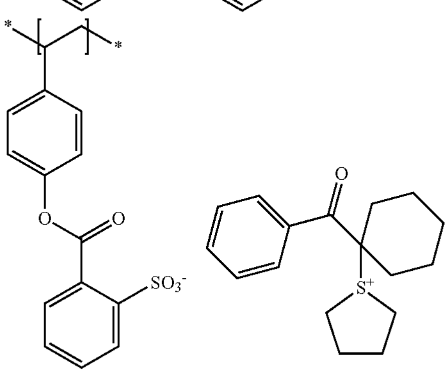
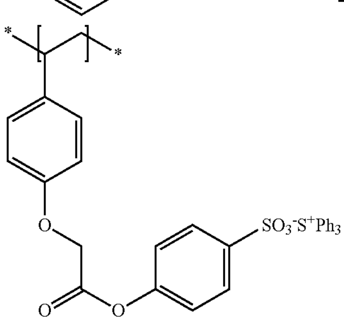
-continued
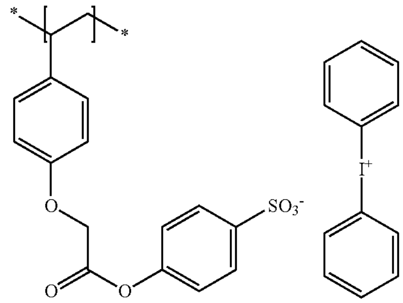
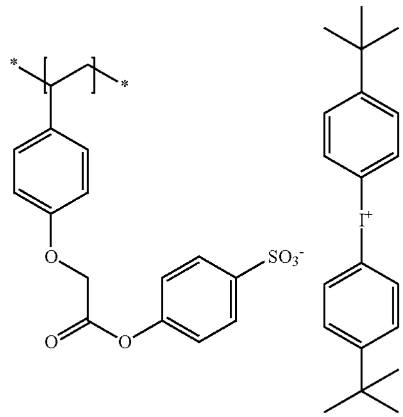
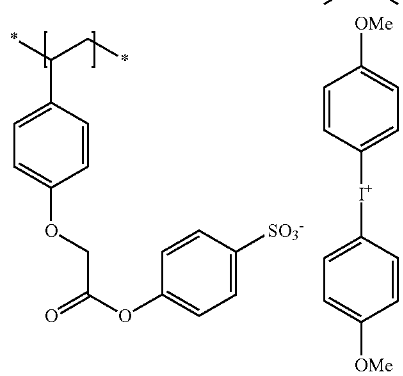
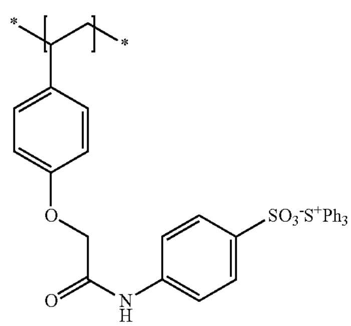
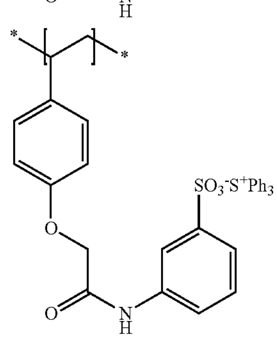

-continued
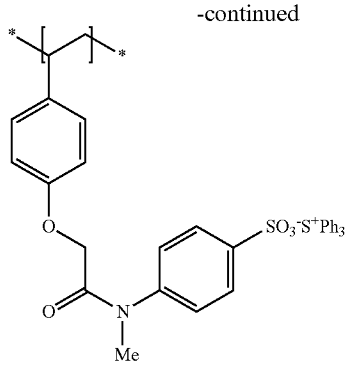
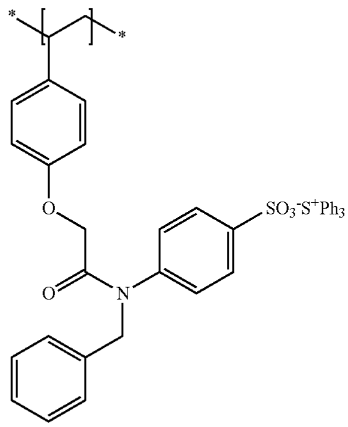
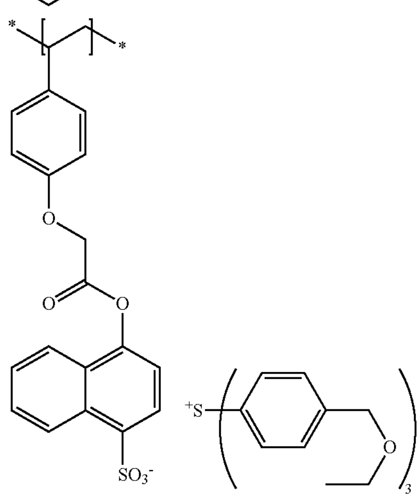
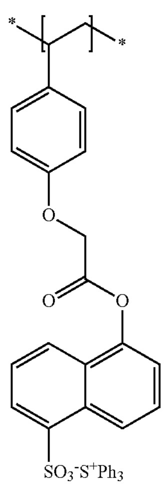
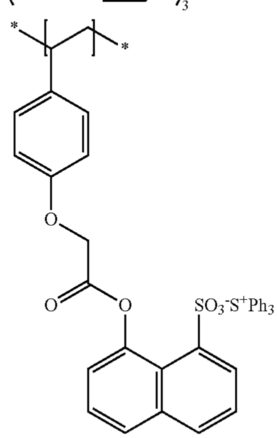
-continued
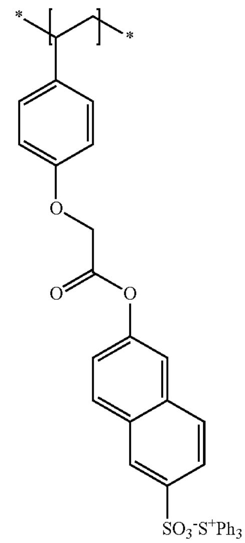
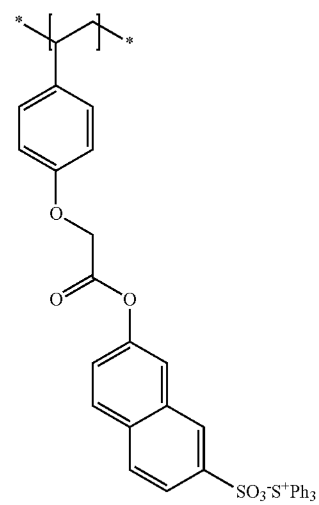
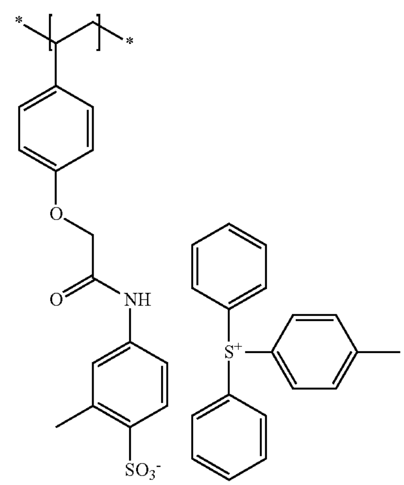

-continued
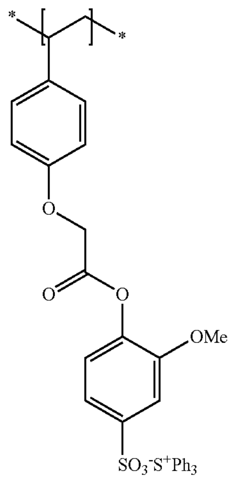
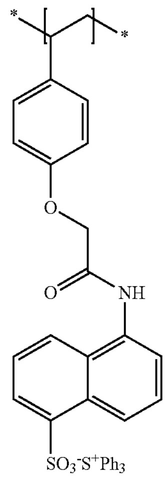
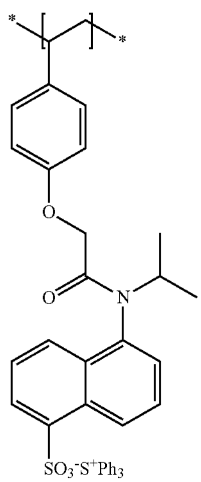
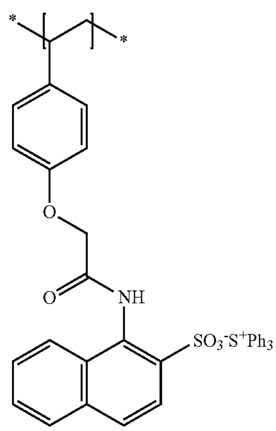
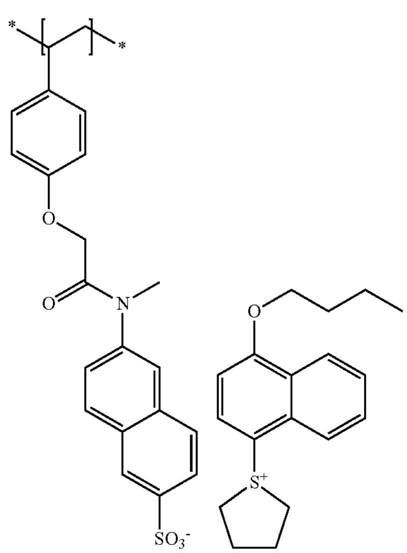
-continued
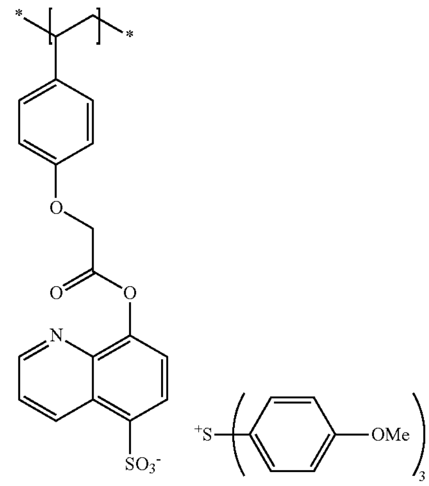
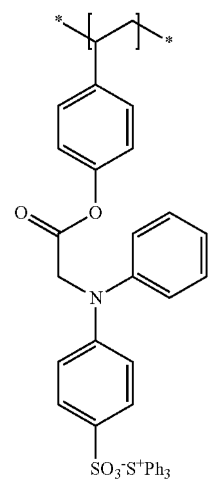
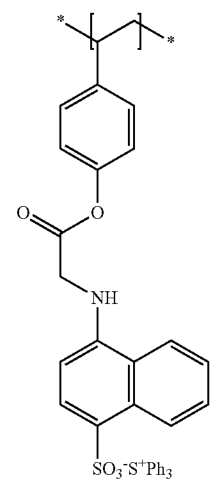
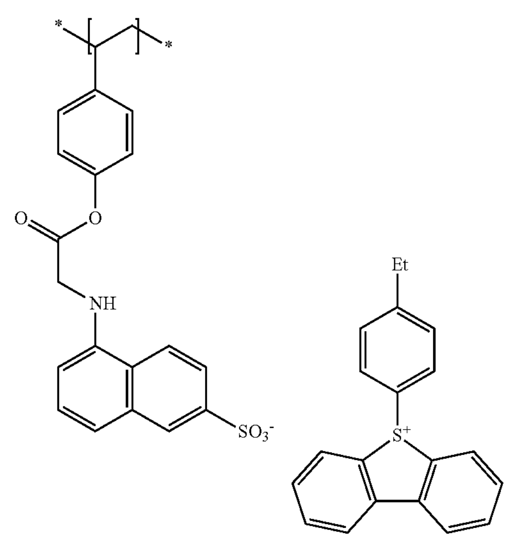

-continued
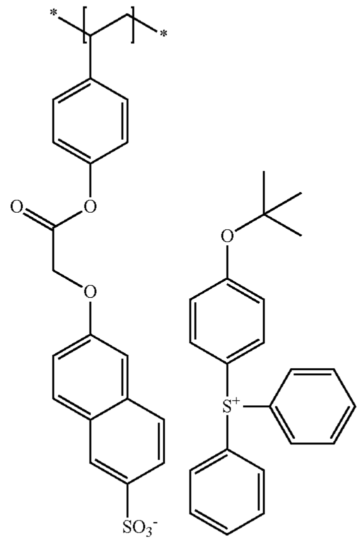
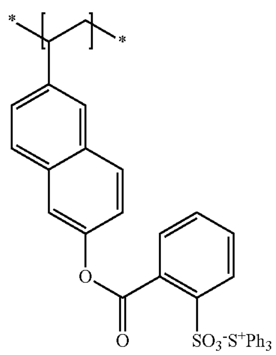
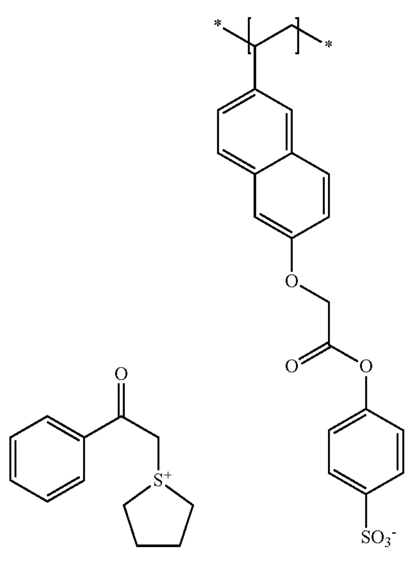
-continued
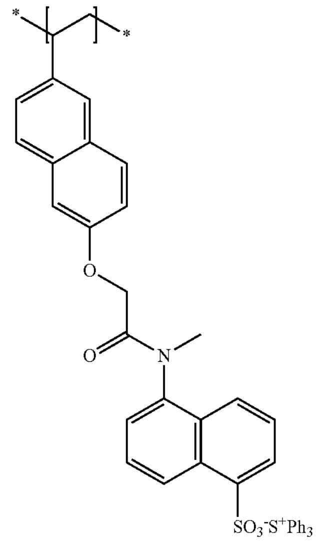
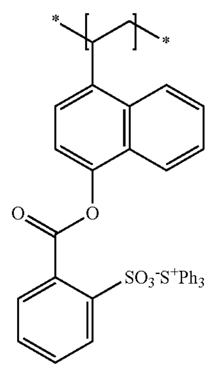
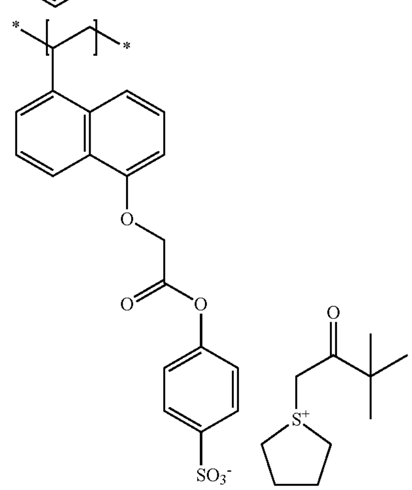
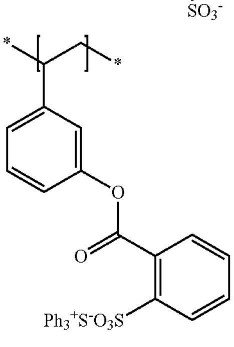
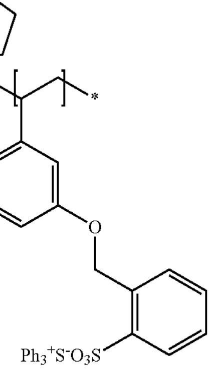

-continued
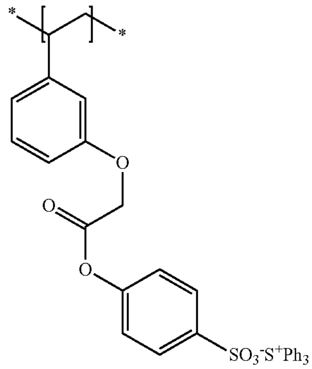
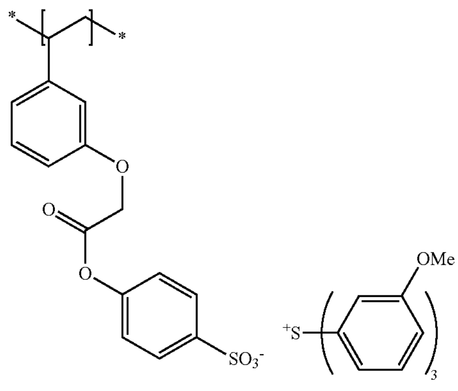
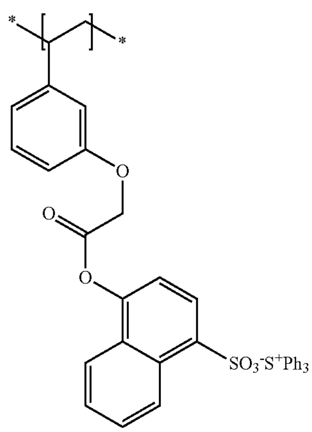
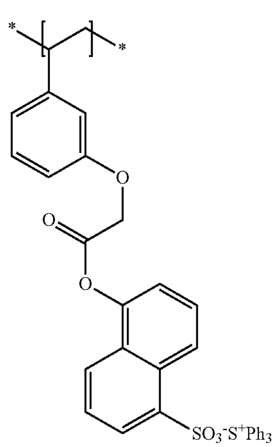
-continued
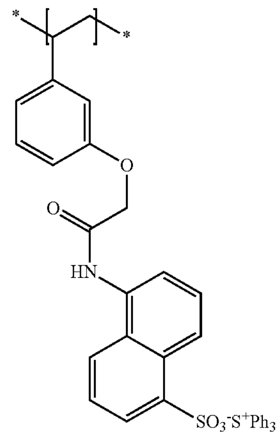
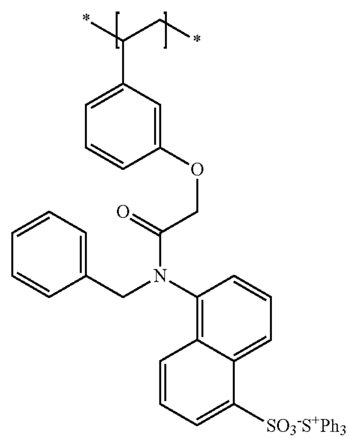
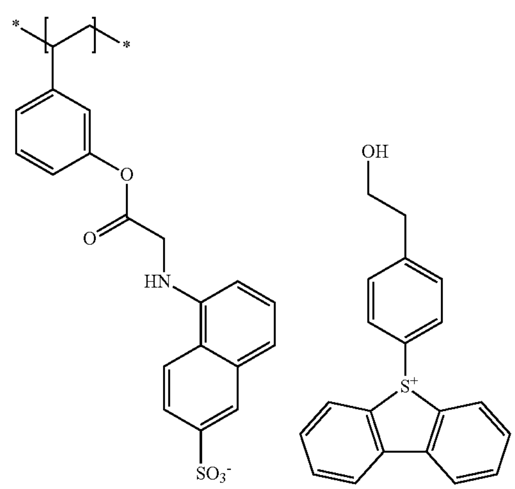
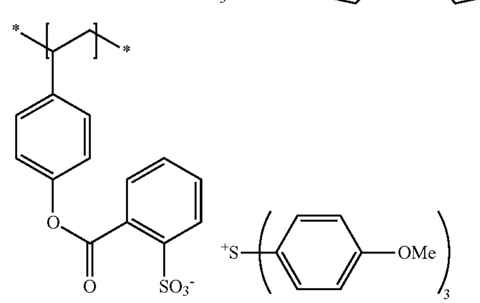

-continued
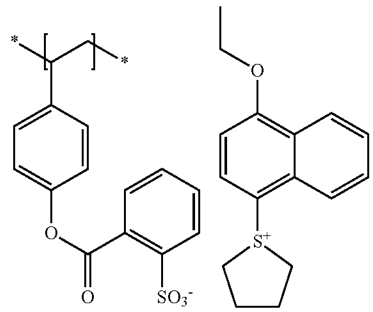
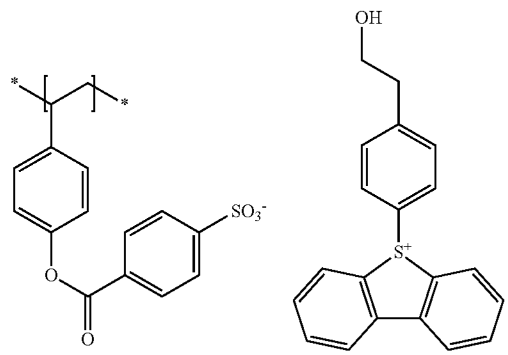
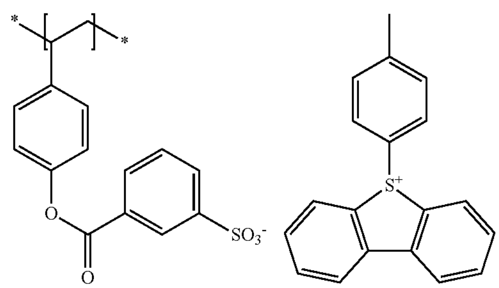
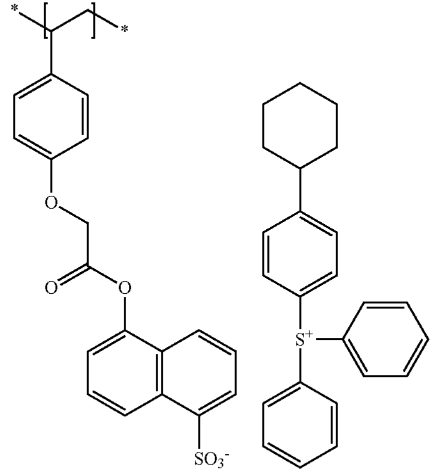
-continued
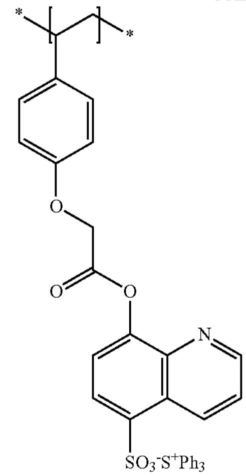
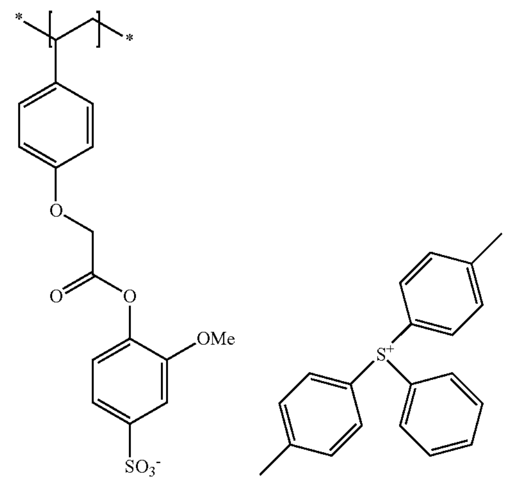
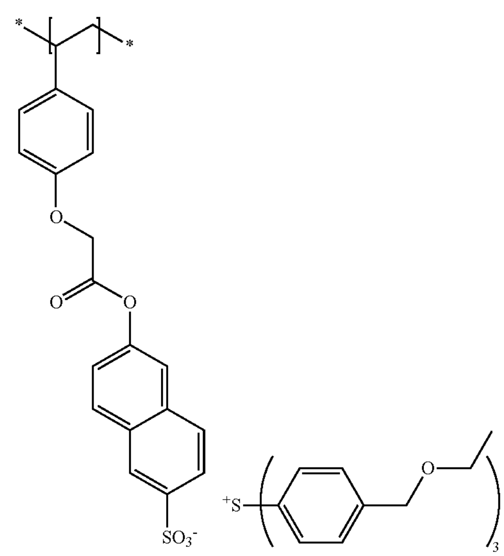

-continued
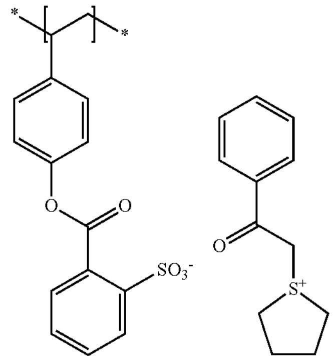
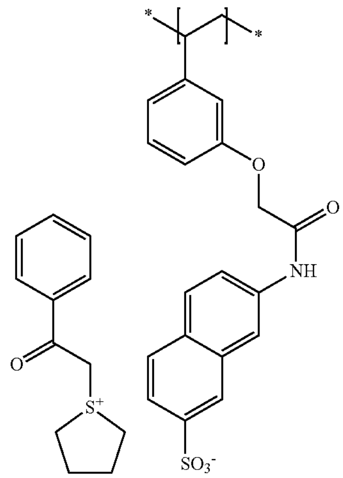
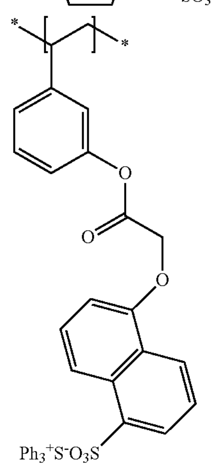
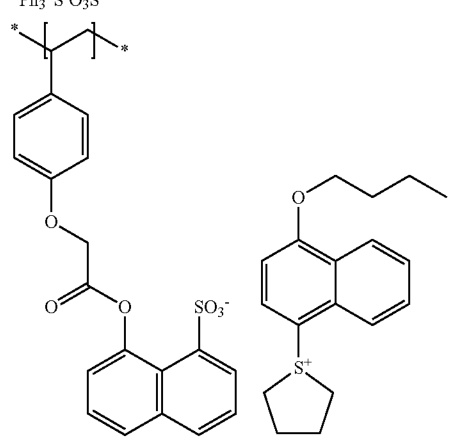
-continued
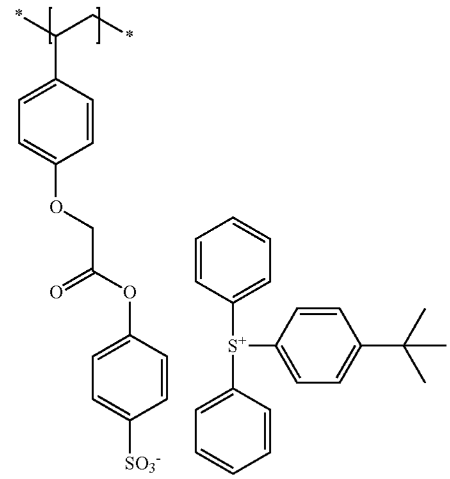
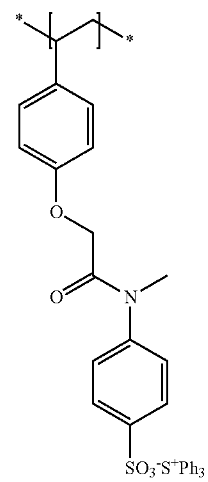
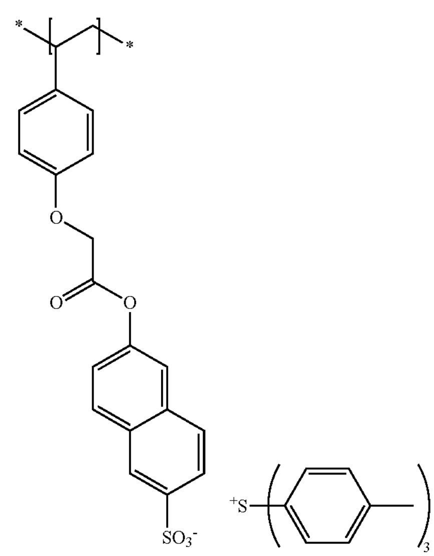

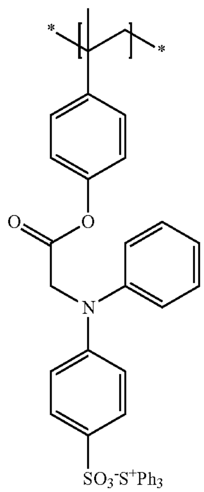
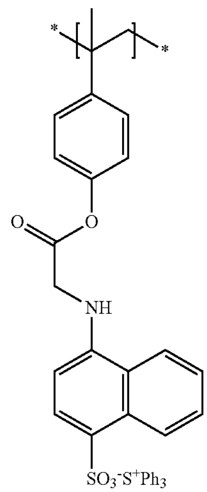
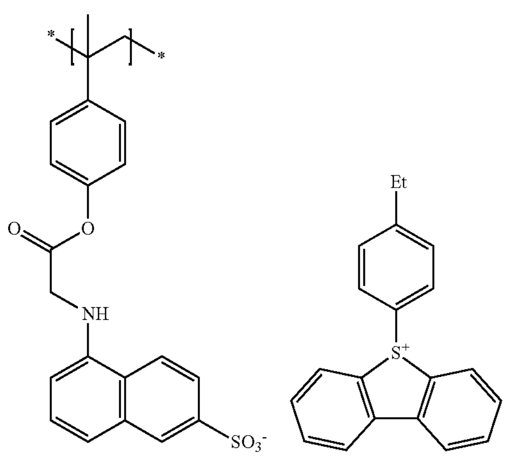
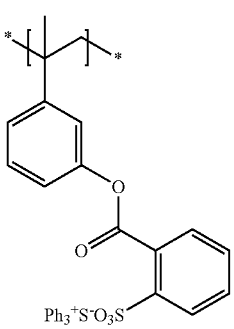
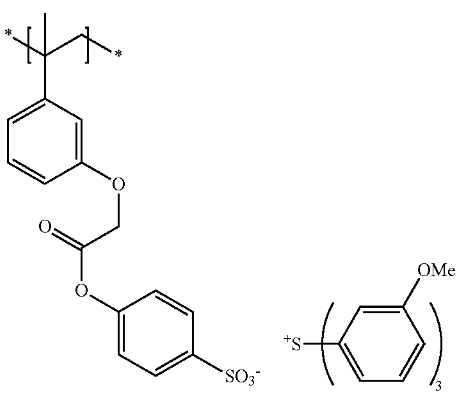
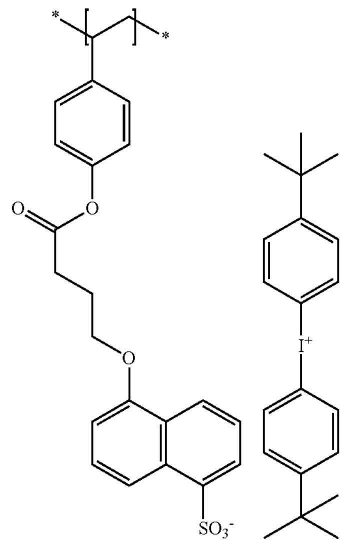
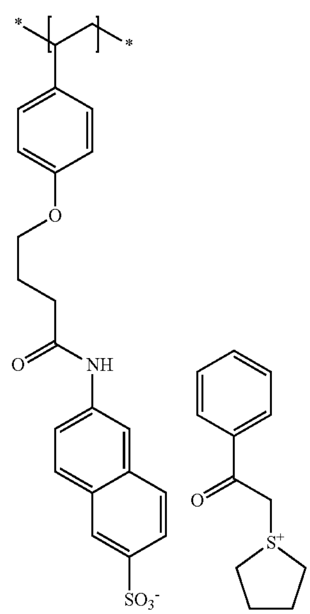
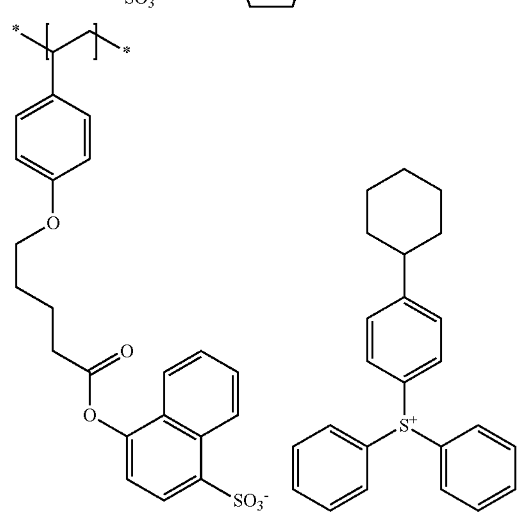

-continued
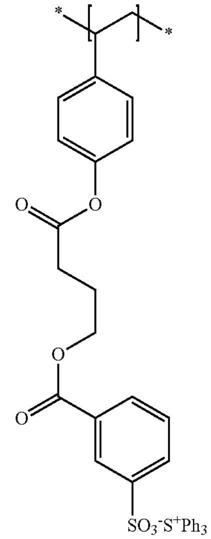
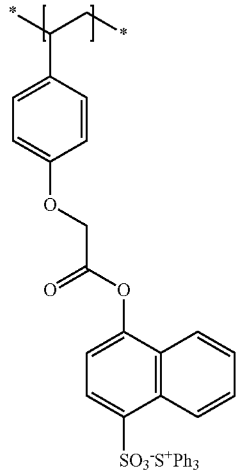
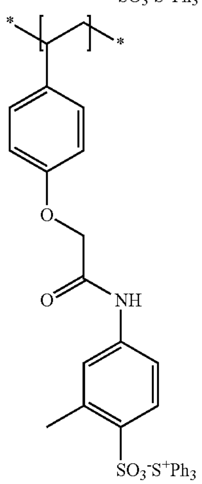
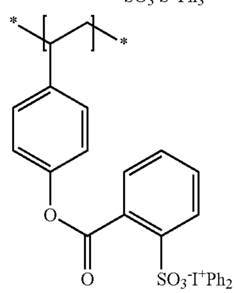
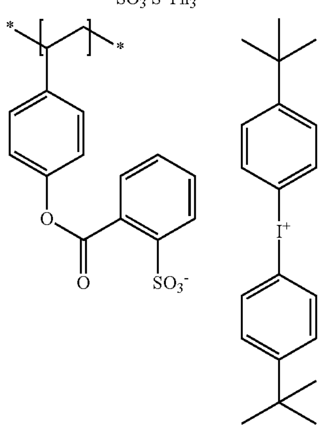
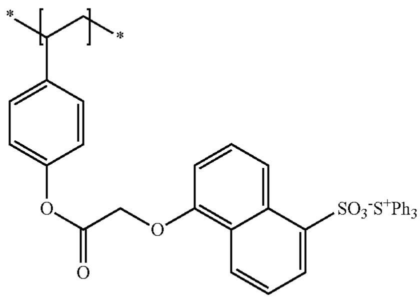
-continued
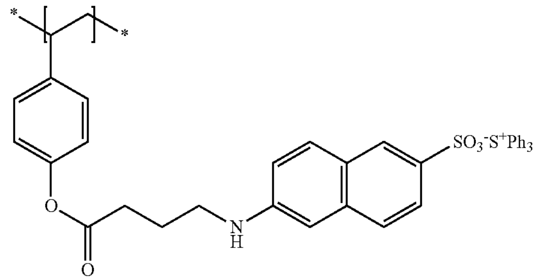
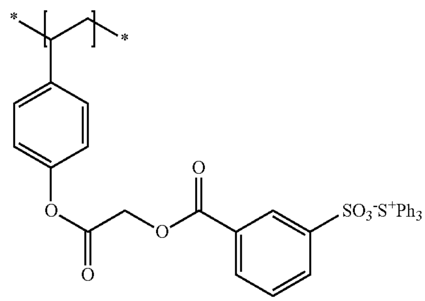
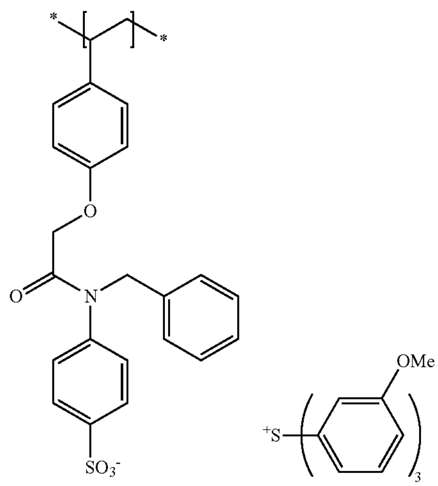
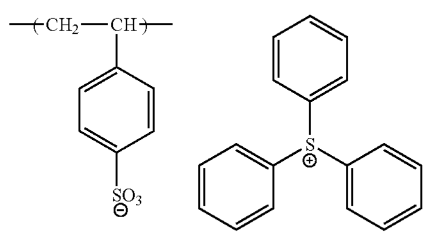
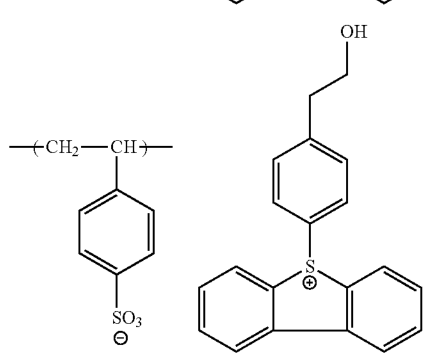

-continued
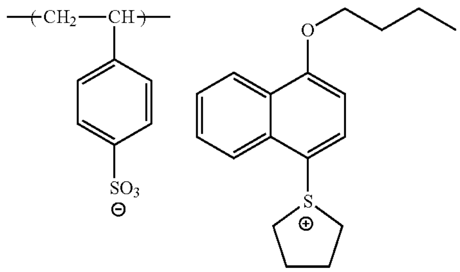
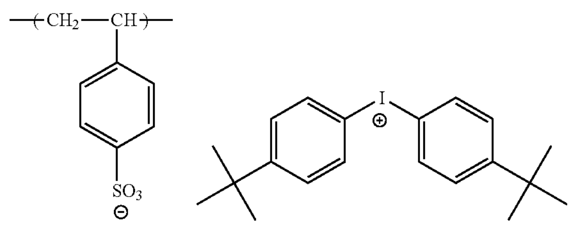
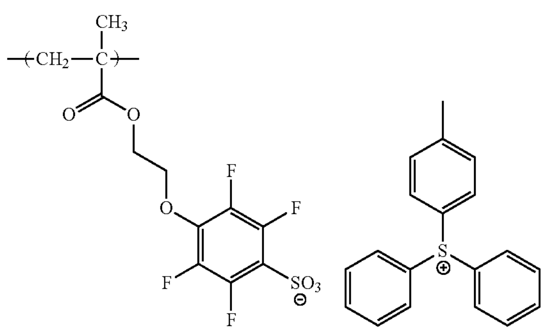
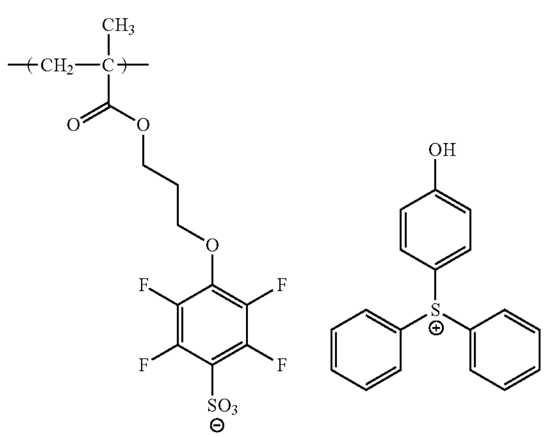
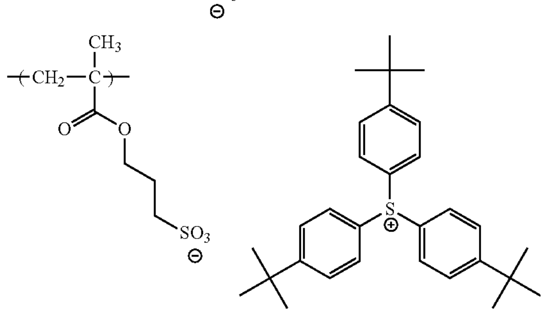
-continued
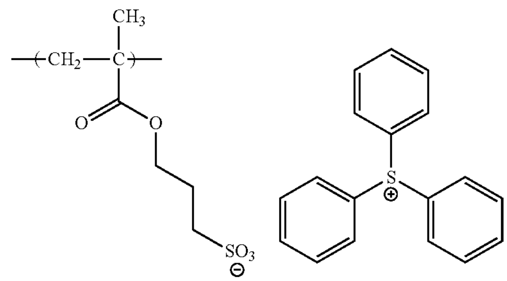
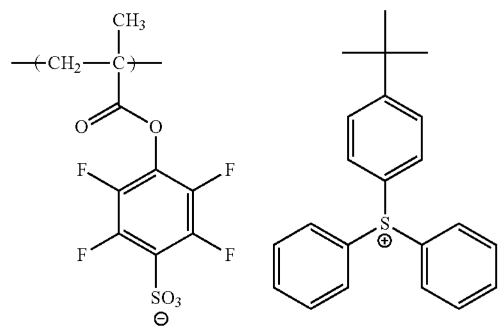
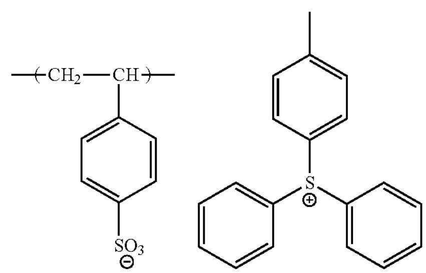
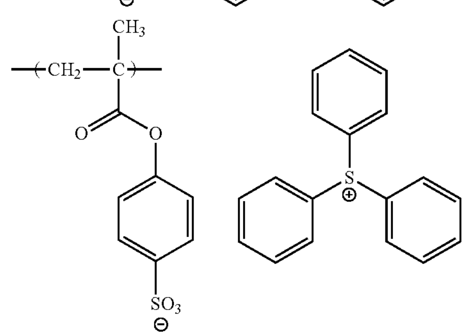
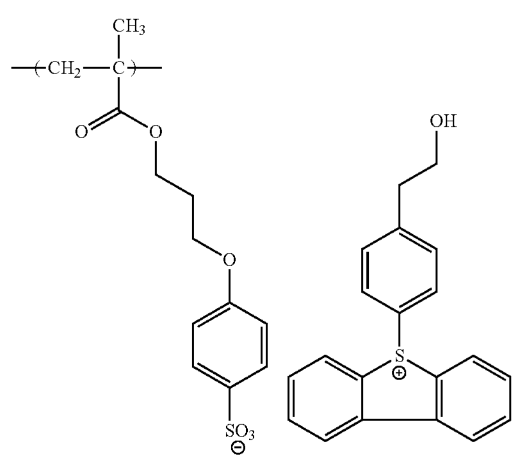

-continued
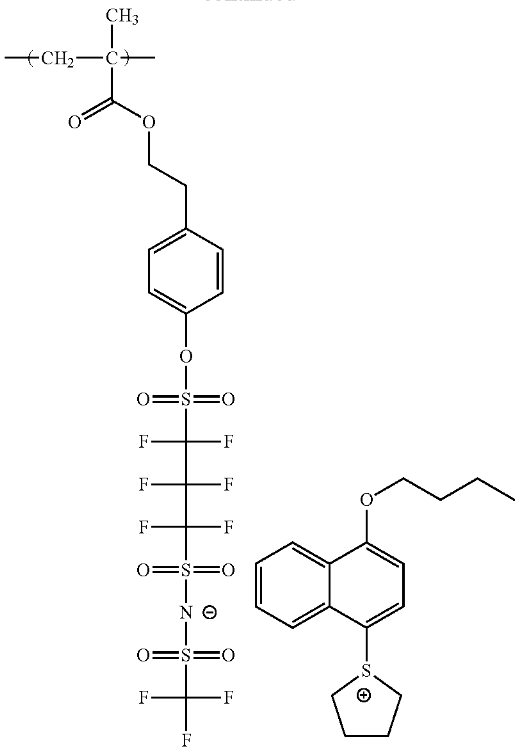
-continued
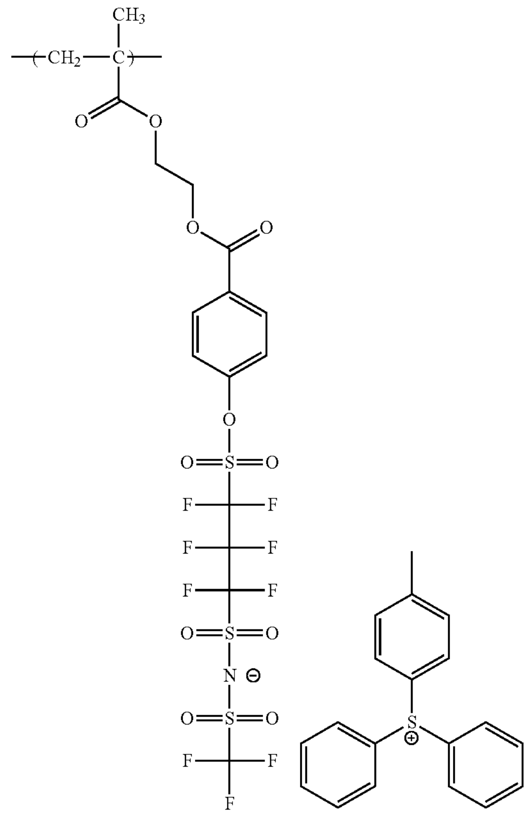
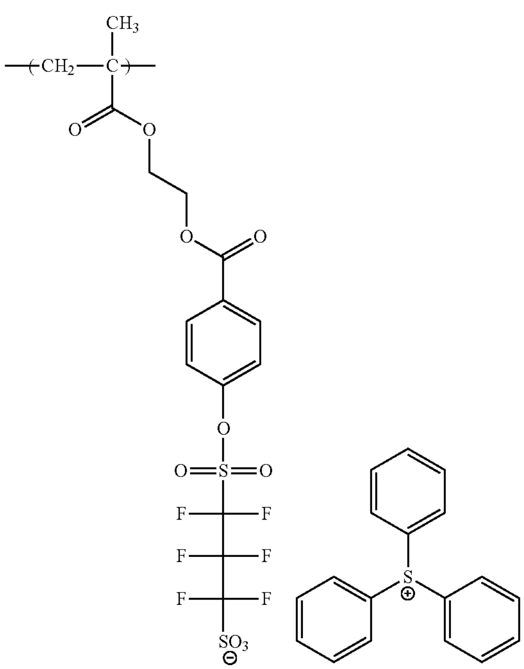
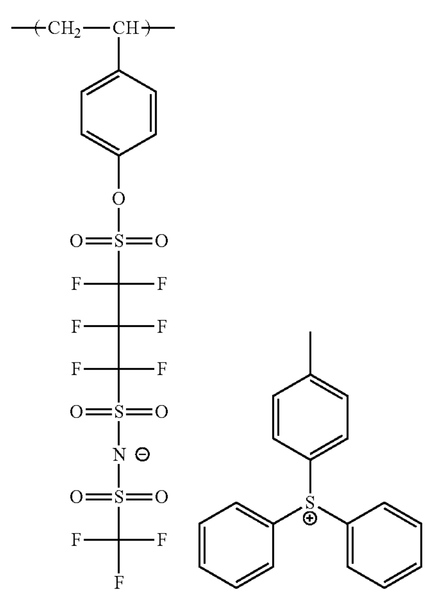

-continued
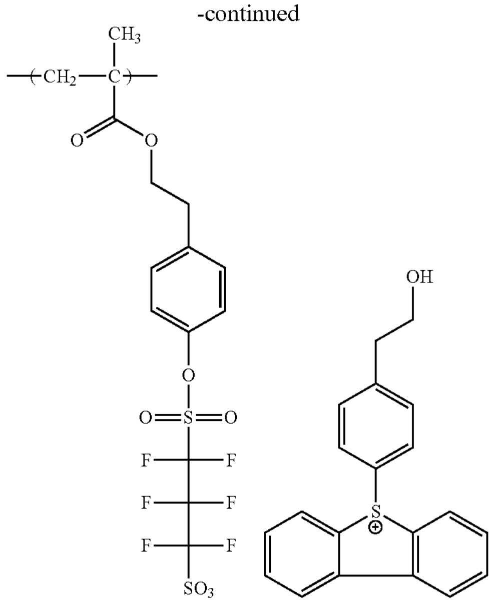
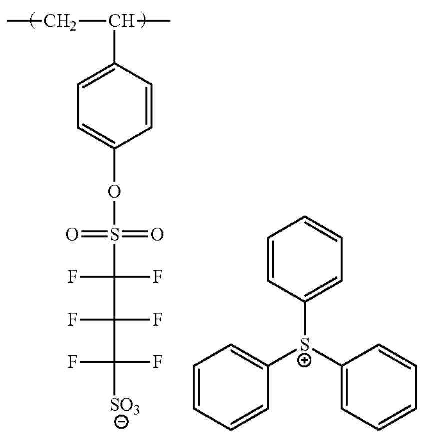
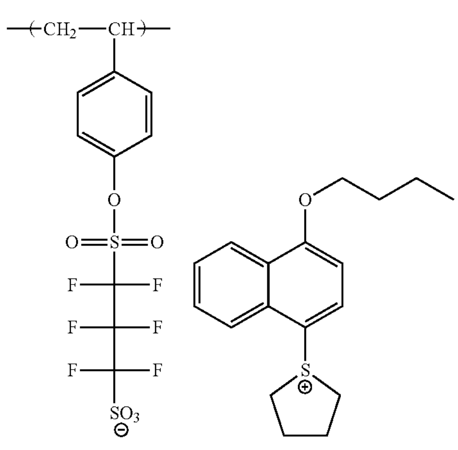
-continued
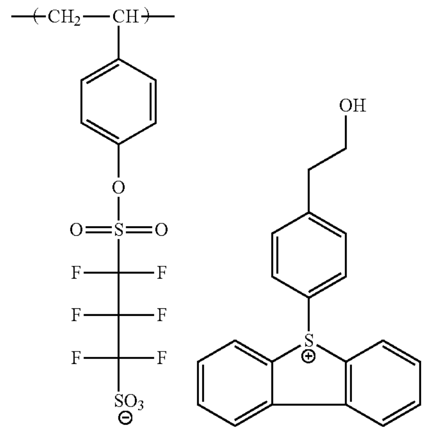
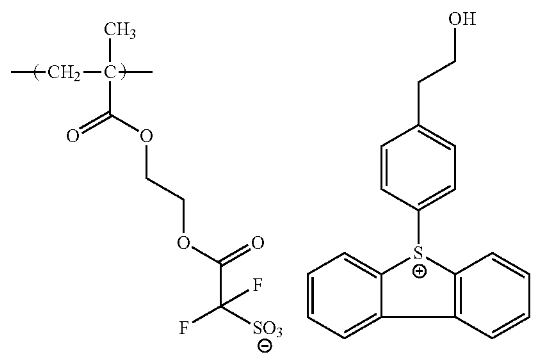
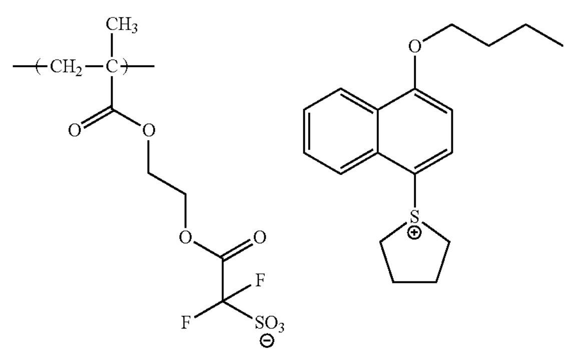
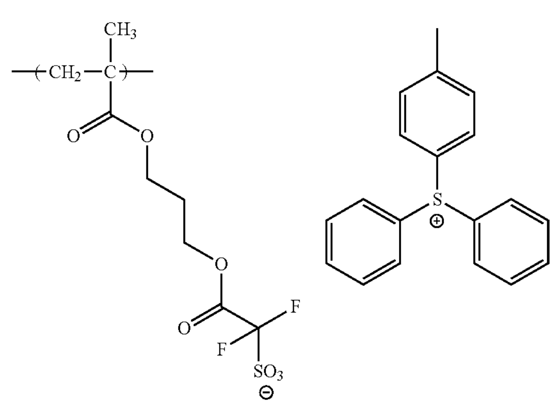

-continued
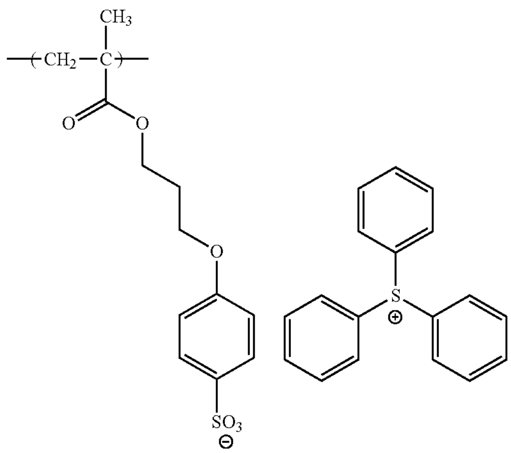
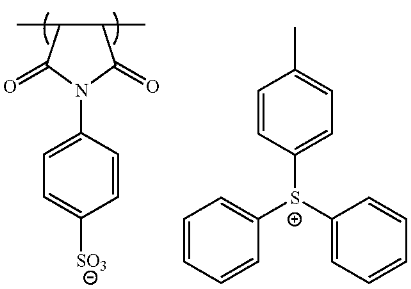
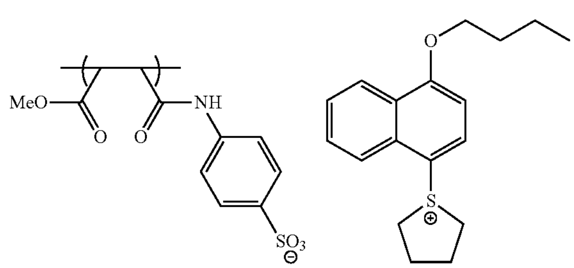
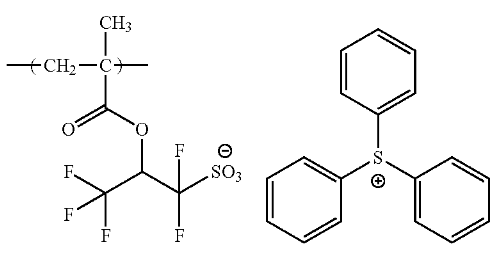
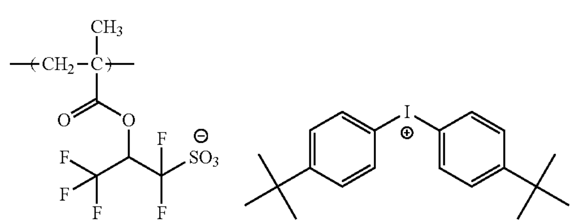
-continued
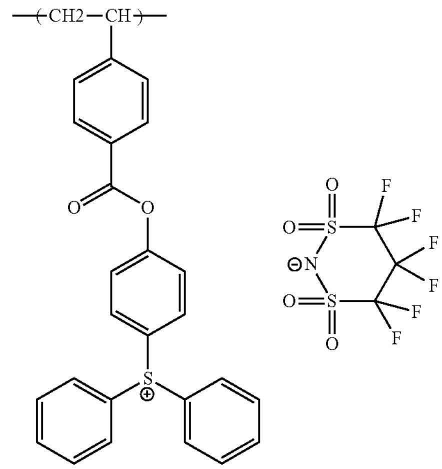
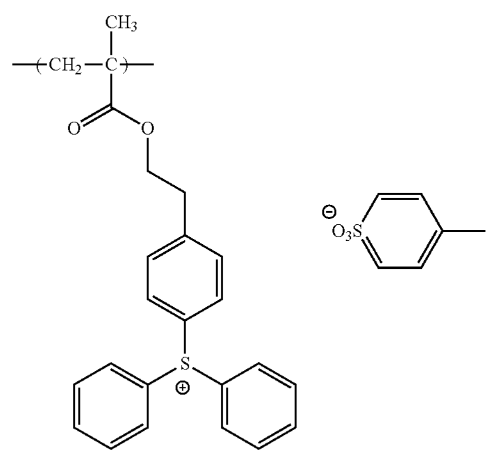
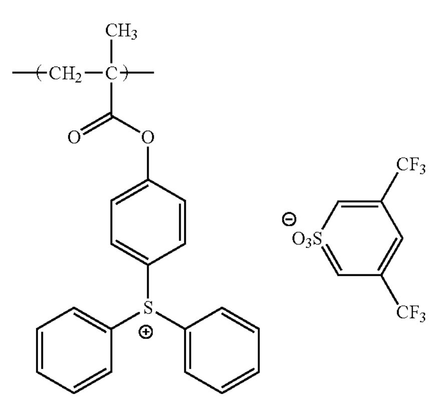

-continued
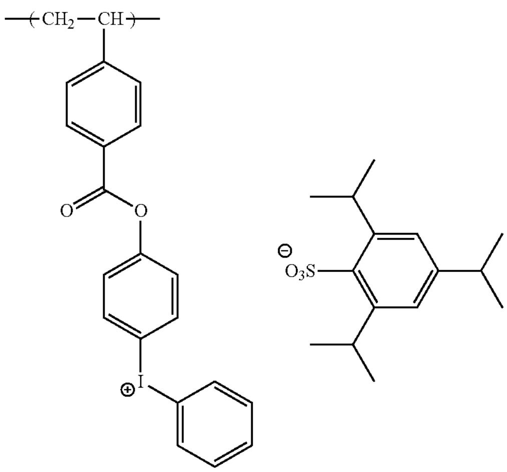
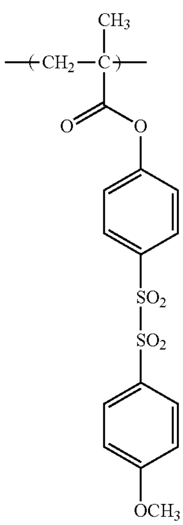
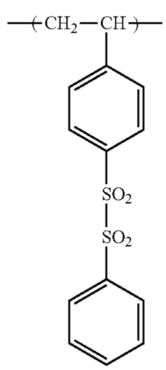
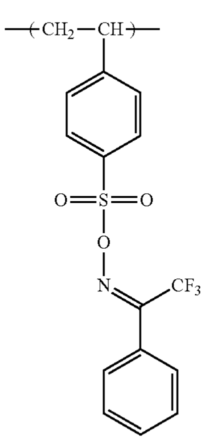
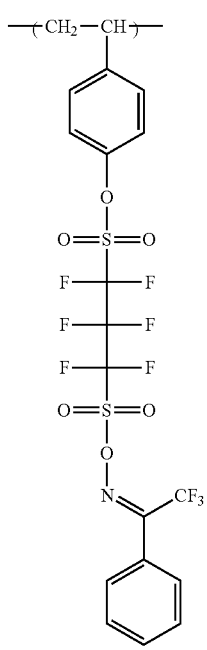
-continued
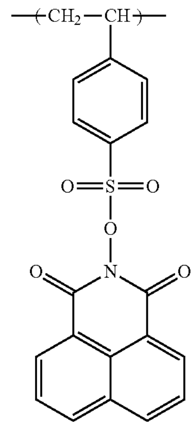
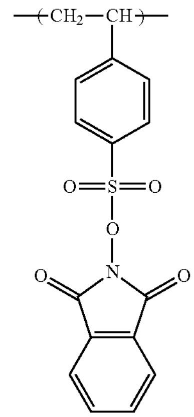
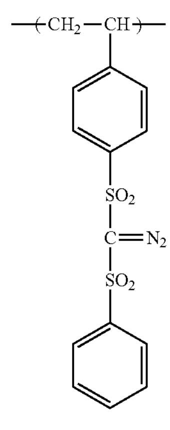
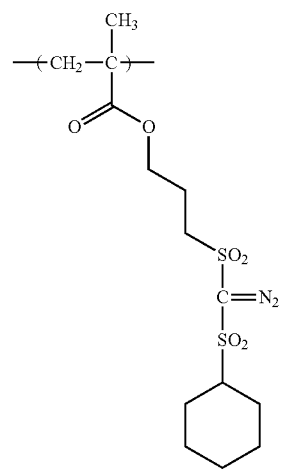
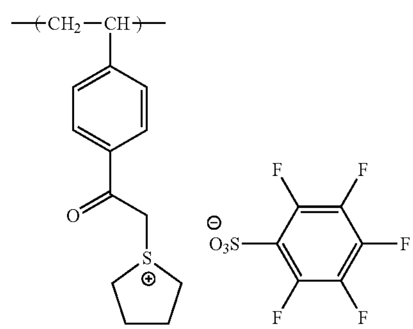
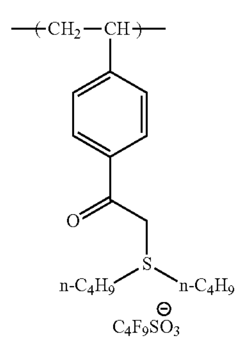

-continued
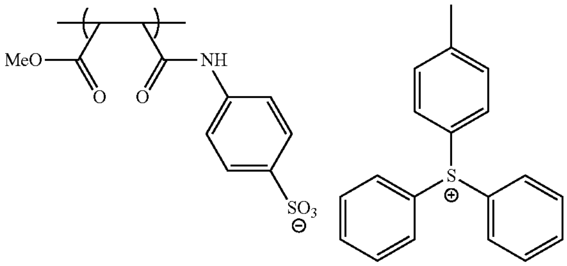
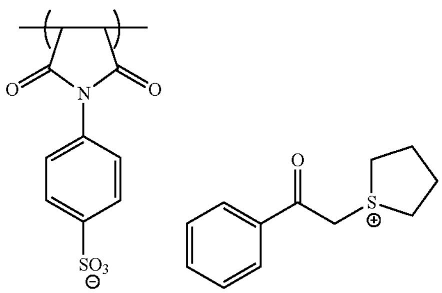
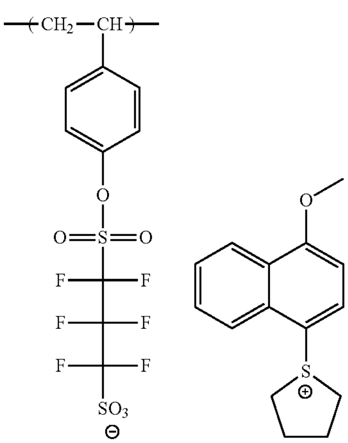
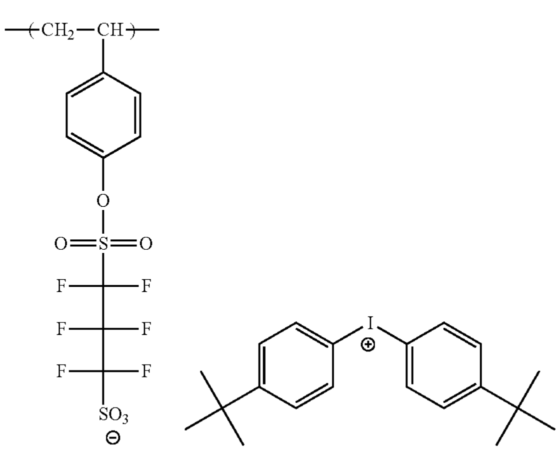
-continued
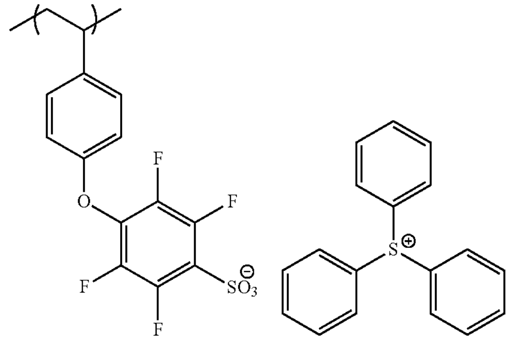
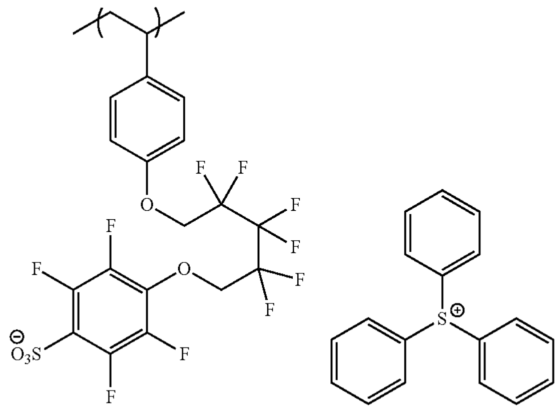
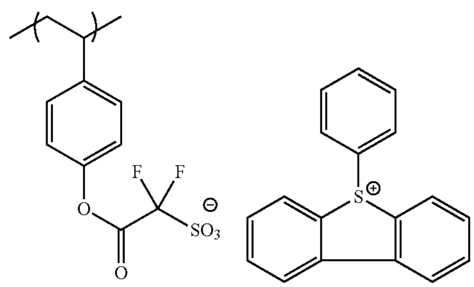
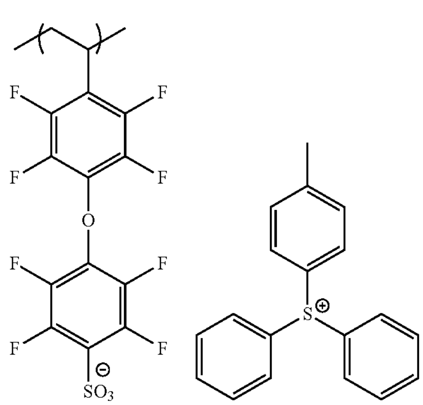

-continued
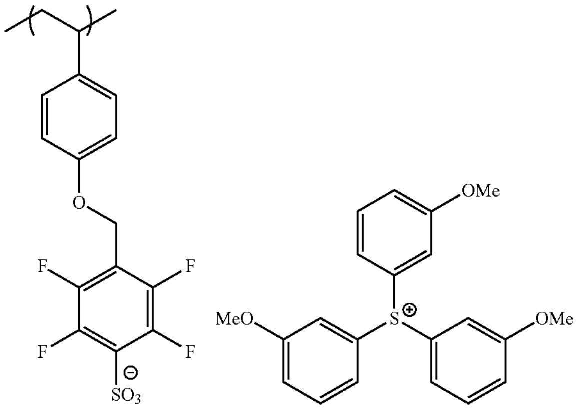
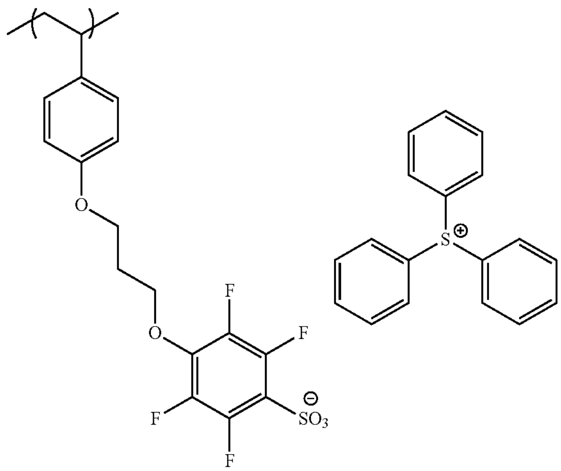
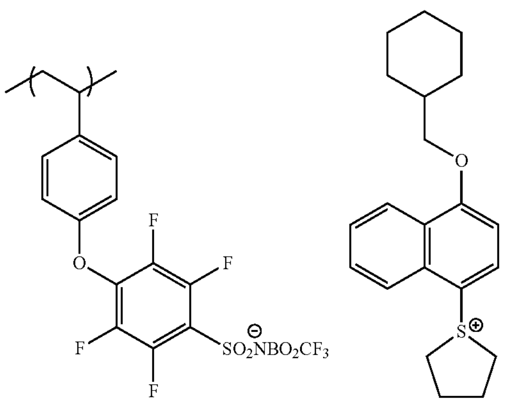
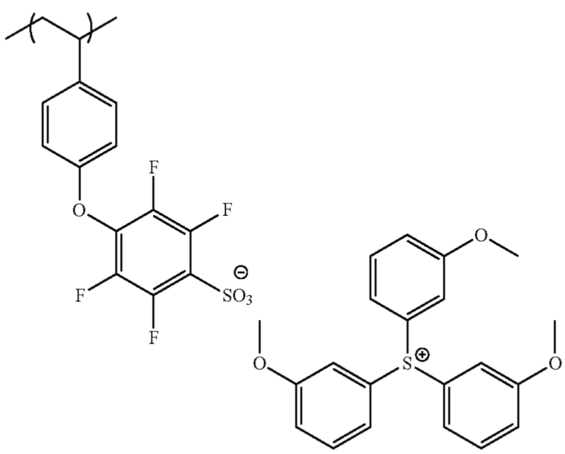
-continued
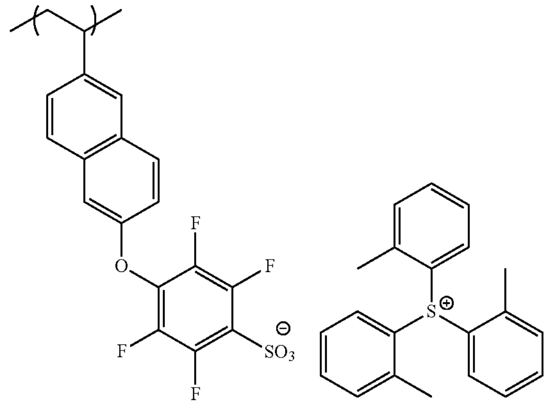
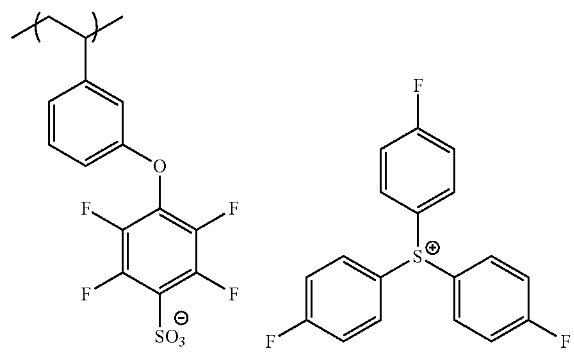
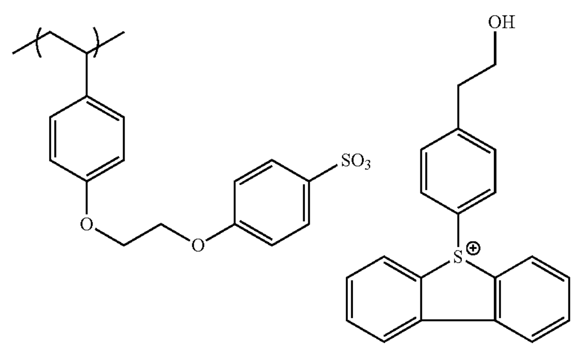
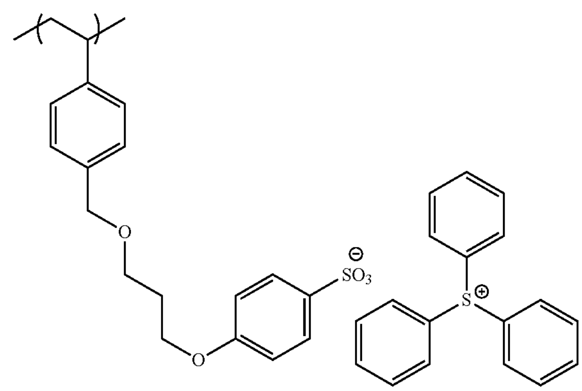

-continued
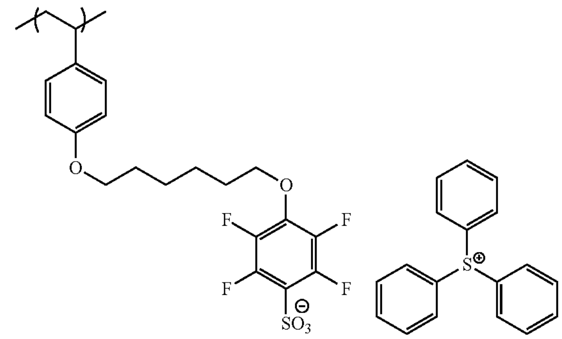
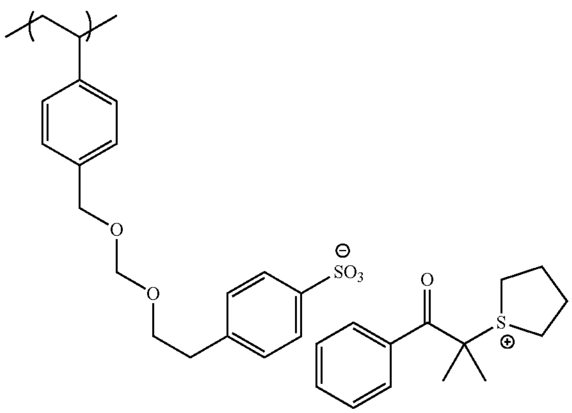
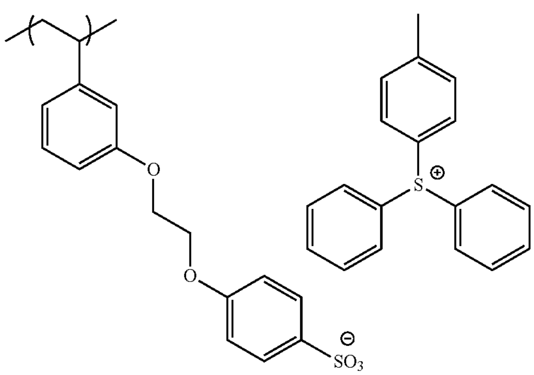
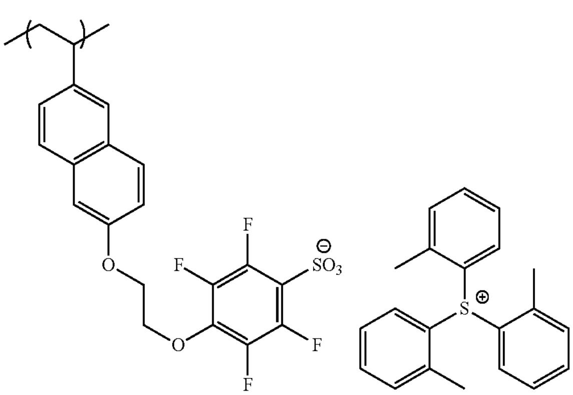
-continued
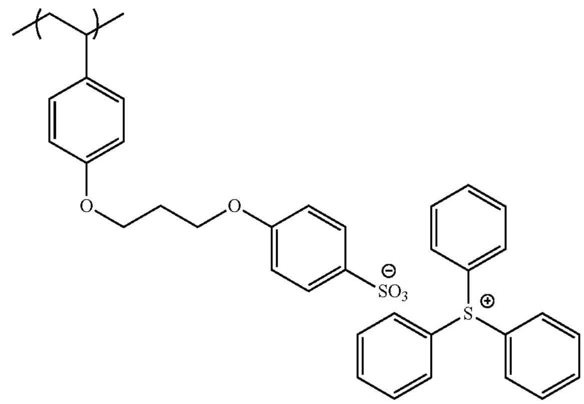
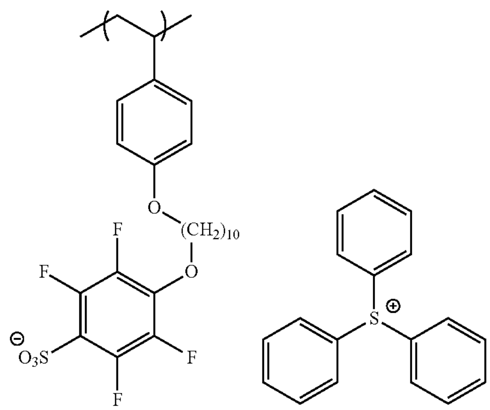
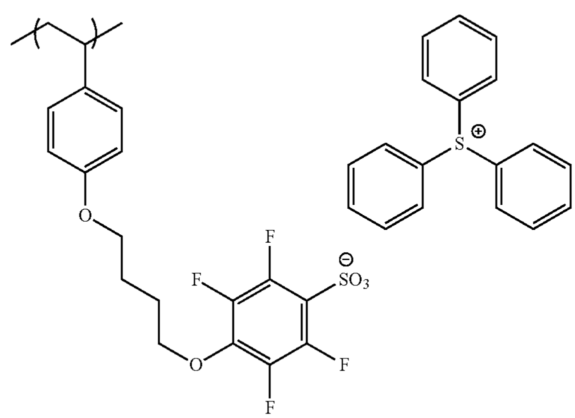
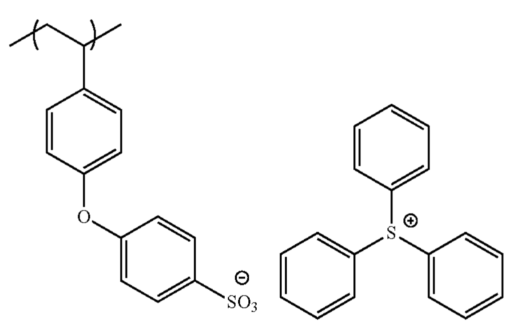

-continued

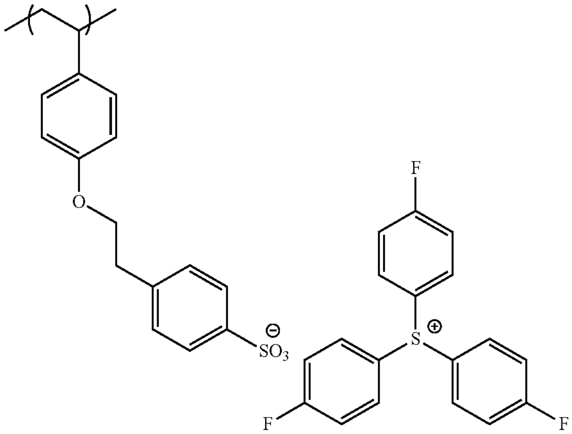

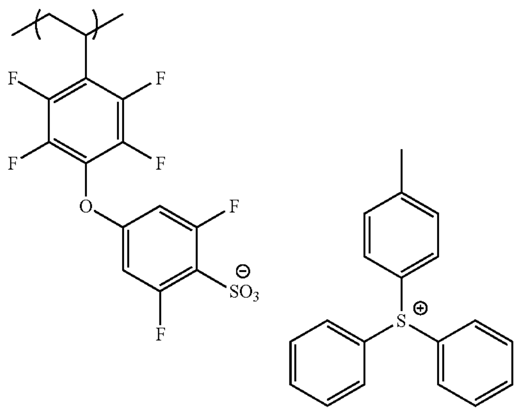

The content of the repeating unit represented by formula (5) in the resin (A) is preferably from 1 to 40 mol %, more preferably from 2 to 30 mol %, still more preferably from 5 to 25 mol %, based on all repeating units in the resin (A).

Also, from the standpoint of elevating Tg, increasing the dry etching resistance or producing an effect such as internal filer for the out-of-band light, the resin (A) may contain the following monomer component.

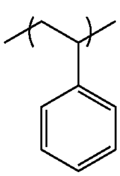

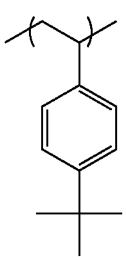

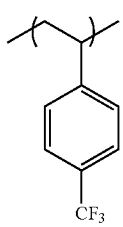

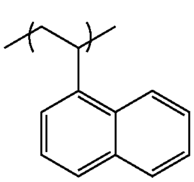

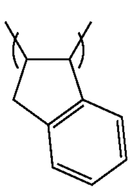

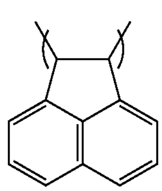

-continued

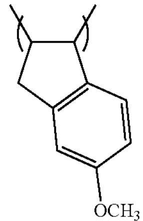

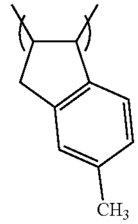

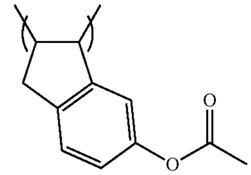

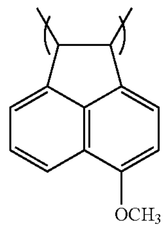

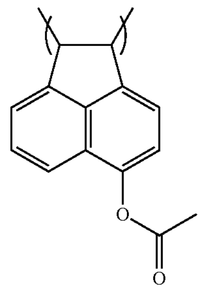

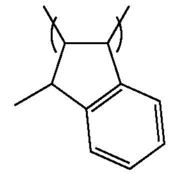

In the resin (A) for use in the composition of the present invention, the molar ratio of respective repeating structural units contained is appropriately set to control the dry etching resistance of resist, suitability for standard developer, adherence to substrate, resist profile and performances generally required of a resist, such as resolution, heat resistance and sensitivity.

Specific examples of the resin (A) are illustrated below, but the present invention is not limited thereto.

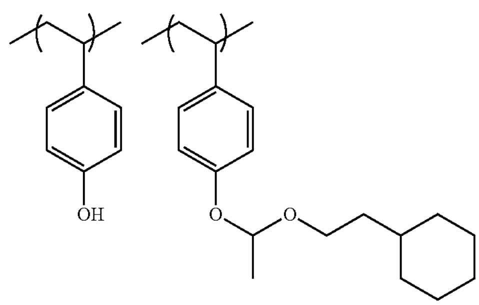

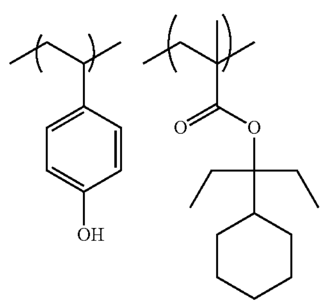

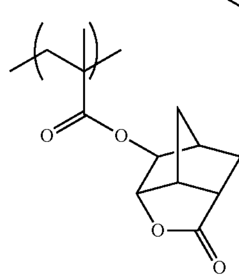

-continued
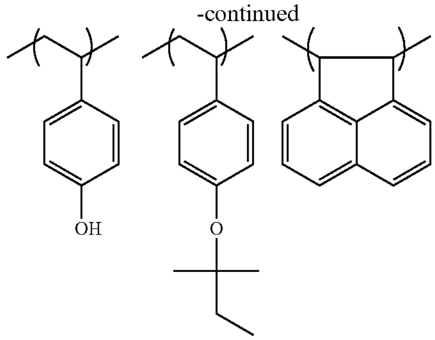
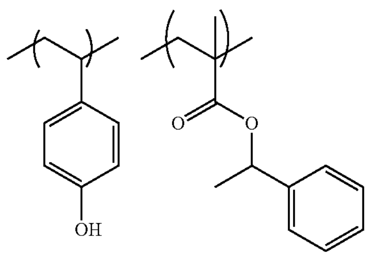
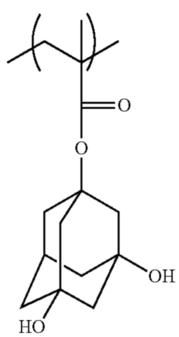
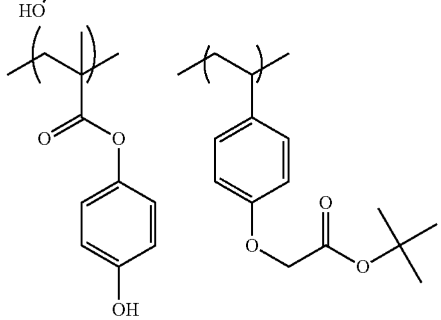
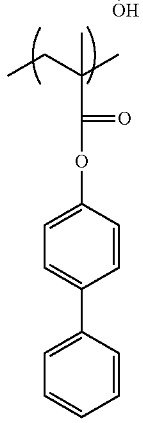
-continued
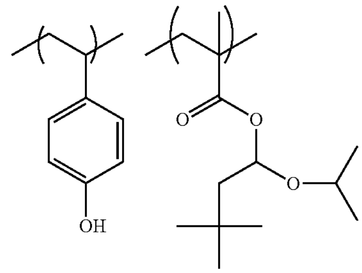
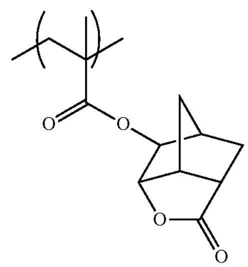
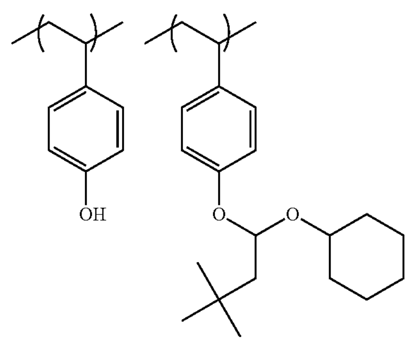
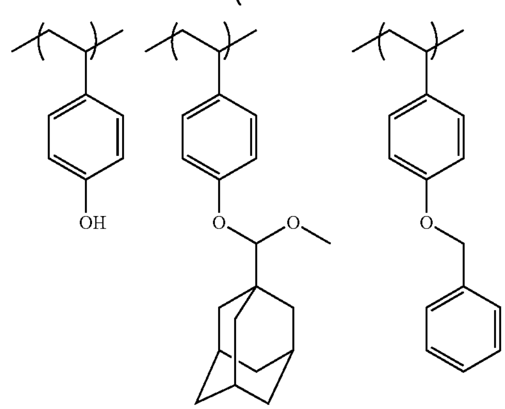
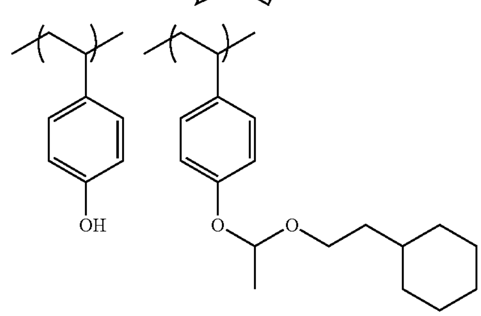

-continued
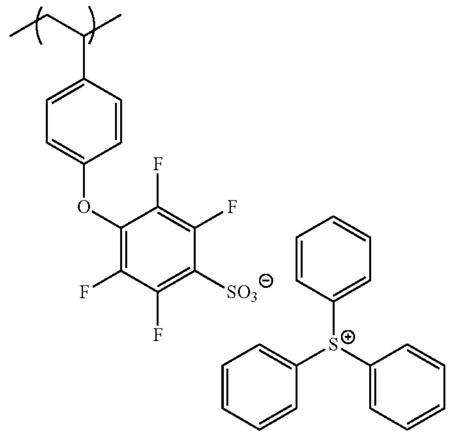
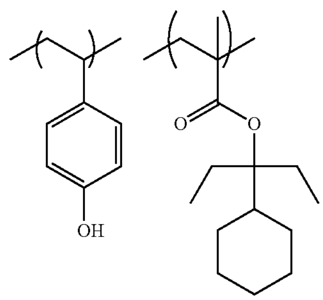
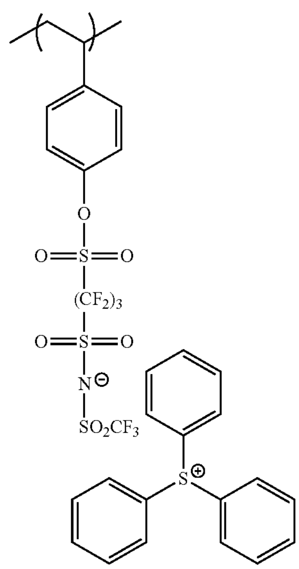
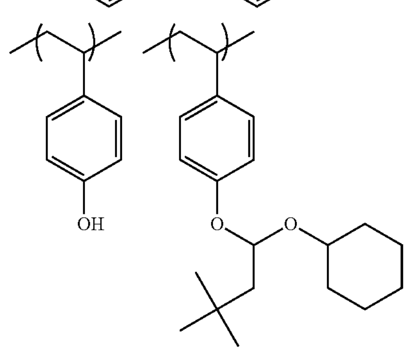
-continued
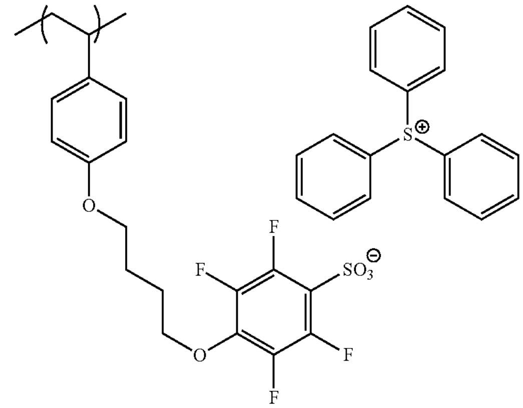
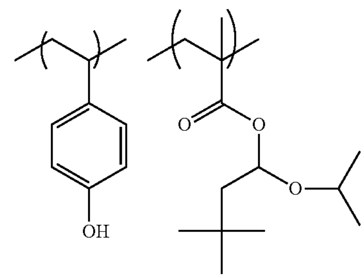
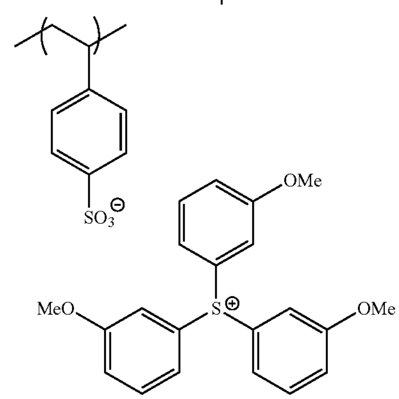
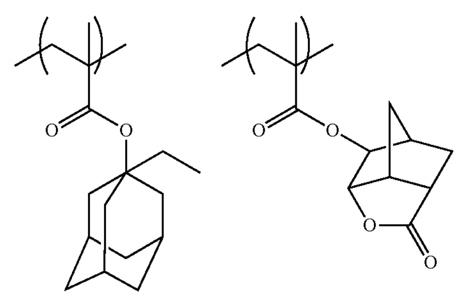
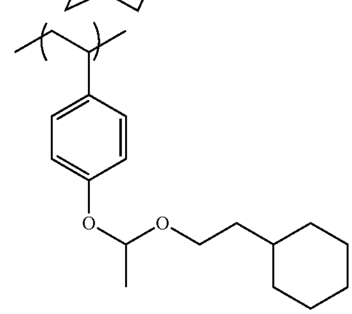

-continued

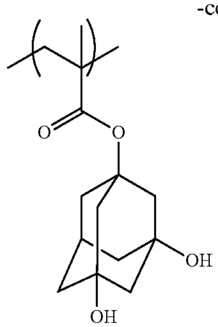

The form of the resin (A) for use in the present invention may be any of random type, block type, comb type and star type.

The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures and then performing a polymer reaction.

Examples of the general synthesis method include a batch polymerization method of dissolving unsaturated monomers and a polymerization initiator in a solvent and heating the solution, thereby effecting the polymerization, and a dropping polymerization method of adding dropwise a solution containing unsaturated monomers and a polymerization initiator to a heated solvent over 1 to 10 hours. A dropping polymerization method is preferred.

The solvent used for the polymerization includes, for example, a solvent which can be used when preparing the later-described actinic ray-sensitive or radiation-sensitive resin composition, and it is more preferred to perform the polymerization by using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). If desired, the polymerization may be performed in the presence of a chain transfer agent (e.g., alkylmercaptan).

The concentration during the reaction is from 5 to 70 mass %, preferably from 10 to 50 mass %, and the reaction temperature is usually from 10 to 150° C., preferably from 30 to 120° C., more preferably from 40 to 100° C.

The reaction time is usually from 1 to 48 hours, preferably from 1 to 24 hours, more preferably from 1 to 12 hours.

After the completion of reaction, the reaction solution is allowed to cool to room temperature and purified. In the purification, a conventional method, for example, a liquid-liquid extraction method of applying water washing or combining an appropriate solvent to remove residual monomers or oligomer components, a purification method in a solution sate, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation of the slurry by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile, and dimethyl 2,2'-azobis(2-methylpropionate). The initiator is added additionally or in parts, if desired. After the completion of reaction, the reaction product is poured in a solvent, and the desired polymer is collected, for example, by a method for powder or solid recovery. The concentration during the reaction is from 5 to 50 mass %, preferably from 10 to 30 mass %, and the reaction temperature is usually from 10 to 150° C., preferably from 30 to 120° C., more preferably from 60 to 100° C.

The molecular weight of the resin (A) according to the present invention is not particularly limited, but the weight average molecular weight is preferably from 1,000 to 100,000, more preferably from 1,500 to 60,000, still more preferably from 2,000 to 30,000. When the weight average molecular weight is from 1,000 to 100,000, the heat resistance and dry etching resistance can be kept from deterioration and at the same time, the film-forming property can be prevented from becoming poor due to impairment of developability or increase in the viscosity. Here, the weight average molecular weight of the resin indicates a molecular weight in terms of polystyrene measured by GPC (carrier: THF (tetrahydrofuran) or N-methyl-2-pyrrolidone (NMP)).

The polydispersity (Mw/Mn) is preferably from 1.00 to 5.00, more preferably from 1.00 to 3.50, still more preferably from 1.00 to 2.50. As the molecular weight distribution is narrower, the resolution and resist profile are more excellent, the side wall of the resist pattern is smoother, and the roughness is more improved.

In the description of the present invention, the weight average molecular weight (Mw) and polydispersity of the resin can be determined, for example, by using HLC-8120 (manufactured by Tosoh Corporation) and using, as a column, TSK gel Multipore HXL-M (manufactured by Tosoh Corporation, 7.8 mmHD×30.0 cm) and, as an eluent, THF (tetrahydrofuran) or NMP (N-methyl-2-pyrrolidone).

As for the resin (A) used in the present invention, one kind of a resin may be used alone, or two or more kinds of resins may be used in combination. The content of the resin (A) is preferably from 20 to 99 mass %, more preferably from 30 to 99 mass %, still more preferably from 40 to 99 mass %, based on the total solid content in the actinic ray-sensitive or radiation-sensitive resin composition of the present invention. (In this specification, mass ratio is equal to weight ratio.)

[2] Ionic Compound Represented by Formula (2)

The actinic ray-sensitive or radiation-sensitive resin composition according to the present invention contains an ionic compound represented by the following formula (2). However, the anion moiety in the ionic compound represented by the following formula (2) does not have an ionic group except for on the position of $A^-$ in the following formula (2).

(2)

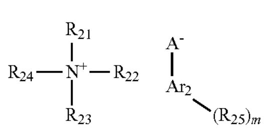

Each of $R_{21}$, $R_{22}$, $R_{23}$ and $R_{24}$ independently represents a primary or secondary alkyl group or an aryl group.

$A^-$ represents $COO^-$ or $O^-$.

$Ar_2$ represents an (m+1)-valent aromatic ring group having no substituent other than $A^-$ and $R_{25}$, provided that $Ar_2$ is not an ionic group.

$R_{25}$ represents an alkyl group, a cycloalkyl group, a thioalkyl group, an aryl group, a halogen atom, a cyano group, a nitro group, an alkoxy group, a thioalkoxy group, a carbonyloxy group, a carbonylamino group, an alkoxycarbonyl group or an alkylaminocarbonyl group, and when m is 2 or more, each $R_{25}$ of a plurality of $R_{25}$ may be the same as or different from every other $R_{25}$ or may combine with another $R_{25}$ to form a ring, provided that $R_{25}$ is not an ionic group.

m represents an integer of 0 or more.

The primary or secondary alkyl group of $R_{21}$, $R_{22}$, $R_{23}$ and $R_{24}$ includes a linear or branched alkyl group having a carbon number of 20 or less, such as methyl group, ethyl group, propyl group, isopropyl group, n-butyl group, sec-butyl group, pentyl group, hexyl group, 2-ethylhexyl group, octyl group and dodecyl group, and is preferably a linear alkyl group having a carbon number of 1 to 8, more preferably a methyl group, an ethyl group, a propyl group or an n-butyl group. Because, it is considered that as the steric hindrance around the nitrogen atom in the ionic compound represented by formula (2) is smaller, the interaction with a hydroxyl group in the repeating unit represented by formula (1) in the resin (A) becomes stronger to bring about uniform existence of the ionic compound represented by formula (2) in the resin (A), as a result, the pattern profile is improved.

The aryl group of $R_{21}$, $R_{22}$, $R_{23}$ and $R_{24}$ includes an aryl group having a carbon number of 6 to 18, such as phenyl group and naphthyl group, and is preferably an aryl group having a carbon number of 6 to 10.

Each of $R_{21}$, $R_{22}$, $R_{23}$ and $R_{24}$ is preferably an alkyl group.

Each of $R_{21}$, $R_{22}$, $R_{23}$ and $R_{24}$ may have a substituent, and examples of the substituent include a hydroxyl group, a halogen atom (e.g., fluorine, chlorine, bromine, iodine), an aryl group such as phenyl group and naphthyl group, a nitro group, a cyano group, an amido group, a sulfonamido group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

$A^-$ is preferably $COO^-$.

The aromatic ring group represented by $Ar_2$ includes an aromatic ring group having a carbon number of 6 to 18, such as benzene ring and naphthyl ring, and is preferably an aromatic ring group having a carbon number of 6 to 10, more preferably a benzene ring.

The alkyl group represented by $R_{25}$ may have a substituent and is preferably a linear or branched alkyl group having a carbon number of 1 to 15, more preferably an alkyl group having a carbon number of 1 to 10, still more preferably an alkyl group having a carbon number of 1 to 6. Specific examples of the alkyl group of $R_{25}$ include a methyl group, an ethyl group, a propyl group, an isopropyl group, an n-butyl group, a sec-butyl group, a tert-butyl group, a neopentyl group, a hexyl group, a 2-ethylhexyl group, an octyl group, and a dodecyl group. The alkyl group of $R_{111}$ to $R_{113}$ is preferably a methyl group, an ethyl group, an isopropyl group, an n-butyl group or a tert-butyl group, more preferably a methyl group.

The cycloalkyl group represented by $R_{25}$ may have a substituent and may be monocyclic or polycyclic, and the cycloalkyl group is preferably a cycloalkyl group having a carbon number of 3 to 15, more preferably a cycloalkyl group having a carbon number of 3 to 10, still more preferably a cycloalkyl group having a carbon number of 3 to 6. Specific examples of the cycloalkyl group of $R_{25}$ include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of $R_{25}$ is preferably a cyclohexyl group.

The aryl group represented by $R_{25}$ may have a substituent and is preferably an aryl group having a carbon number of 6 to 15, more preferably an aryl group having a carbon number of 6 to 12, and the aryl group encompasses a structure where a plurality of aromatic rings are connected to each other through a single bond (for example, a biphenyl group and a terphenyl group). Specific examples of the aryl group of $R_{25}$ include a phenyl group, a naphthyl group, an anthranyl group, a biphenyl group, and a terphenyl group. The aryl group of $R_{25}$ is preferably a phenyl group.

The halogen atom represented by $R_{25}$ is preferably a chlorine atom, a bromine atom or a fluorine atom.

The alkyl group in the thioalkyl group, alkoxy group, thioalkoxy group, alkoxycarbonyl group or alkylaminocarbonyl group represented by $R_{25}$ has the same meaning as the alkyl group represented by $R_{25}$, and the preferred range is also the same. The thioalkyl group, alkoxy group, thioalkoxy group, alkoxycarbonyl group or alkylaminocarbonyl group represented by $R_{25}$ may have a substituent.

Examples of the substituent that the alkyl group, cycloalkyl group, aryl group, thioalkyl group, alkoxy group, thioalkoxy group, alkoxycarbonyl group or alkylaminocarbonyl group of $R_{25}$ may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), a heterocyclic group (preferably having a carbon number of 4 to 15), an alkoxycarbonyl group (preferably having a carbon number of 2 to 7), an acyl group (preferably having a carbon number of 2 to 12), and an alkoxycarbonyloxy group (preferably having a carbon number of 2 to 7).

Examples of the heterocyclic group as the substituent that the alkyl group, cycloalkyl group, aryl group, thioalkyl group, alkoxy group, thioalkoxy group, alkoxycarbonyl group or alkylaminocarbonyl group of $R_{25}$ may further have include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

In the case where a plurality of $R_{25}$ are present, the plurality of $R_{25}$ may combine with each other to form a ring, and the ring formed includes a tetrahydrofuran ring.

$R_{25}$ is preferably a methyl group, an ethyl group, an n-butyl group, a tert-butyl group, a cyclohexyl group, a phenyl group, a pyranyl group, a chlorine atom, a bromine atom, a fluorine atom, a methoxy group, an ethoxy group, a butoxy group, a thiomethyl group, a nitro group, a methoxycarbonyl group, a tert-butoxycarbonyl group, an isopropylaminocarbonyl group or a methylcarbonylamino group, more preferably a cyclohexyl group, a fluorine atom or a methoxy group.

m is preferably an integer of 0 to 3, more preferably an integer of 0 to 2, still more preferably 0 or 1.

Specific examples of the cation moiety in the ionic compound represented by formula (2) are illustrated below, but the present invention is not limited thereto.

(B1-1)

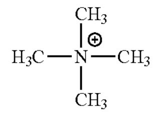

(B1-2)

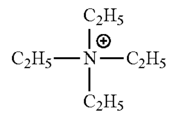

(B1-3)

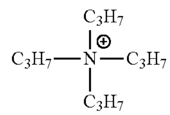

(B1-4)

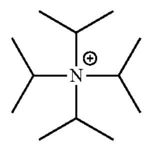

(B1-5)

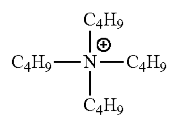

(B1-6)

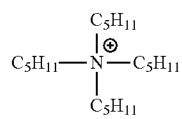

(B1-7)

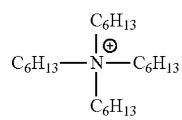

(B1-8)

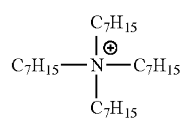

(B1-9)

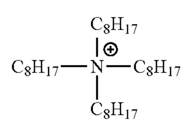

(B1-10)

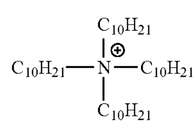

(B1-11)

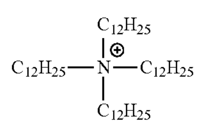

(B1-12)

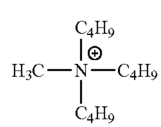

-continued
(B1-13)
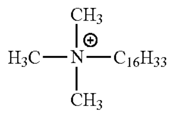
(B1-14)
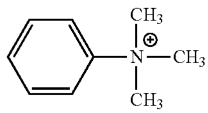
(B1-15)
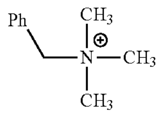
(B1-16)
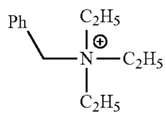
(B1-17)
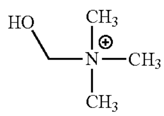
(B1-18)
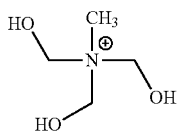
(B1-19)
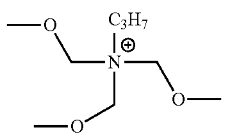
(B1-20)
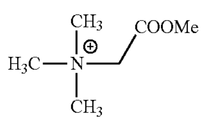
Specific examples of the anion moiety in the ionic compound represented by formula (2) are illustrated below, but the present invention is not limited thereto.
(B2-1)
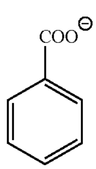
(B2-2)
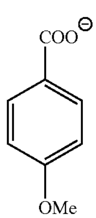
-continued
(B2-3)
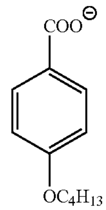
(B2-4)
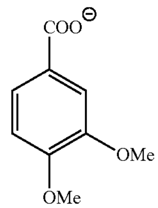
(B2-5)
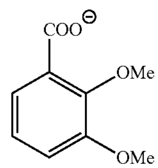
(B2-6)
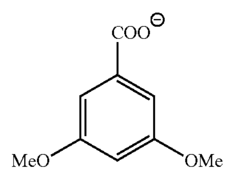
(B2-7)
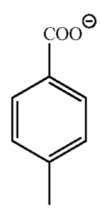
(B2-8)
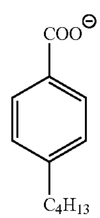
(B2-9)
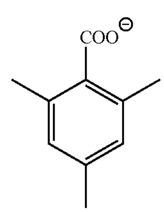
(B2-10)
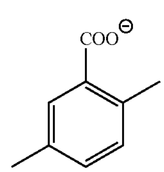

-continued
(B2-11)
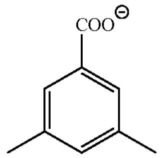
(B2-12)
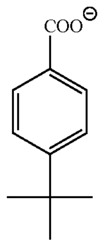
(B2-13)
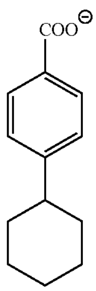
(B2-14)
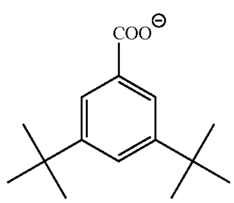
(B2-15)
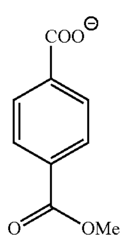
(B2-16)
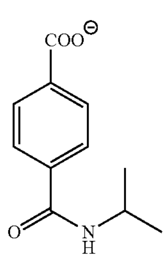
-continued
(B2-17)
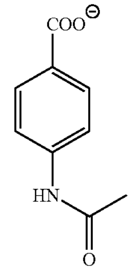
(B2-18)
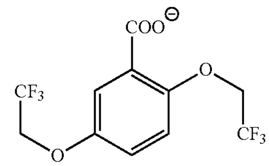
(B2-19)
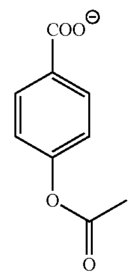
(B2-20)
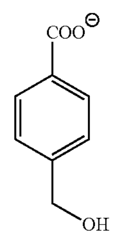
(B2-21)
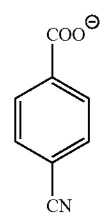
(B2-22)
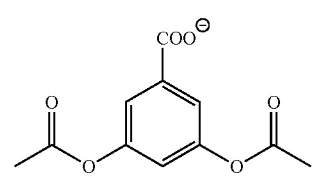

-continued
(B2-23)
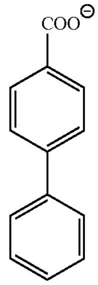
(B2-24)
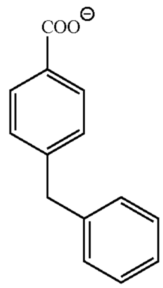
(B2-25)
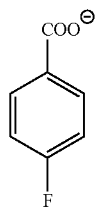
(B2-26)
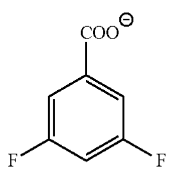
(B2-27)
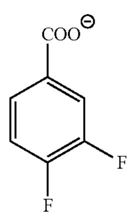
(B2-28)
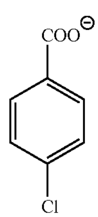
(B2-29)
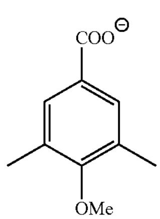
-continued
(B2-30)
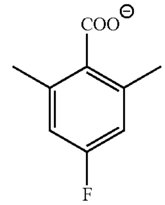
(B2-31)
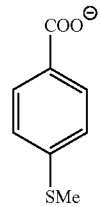
(B2-32)
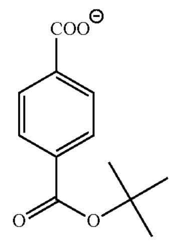
(B2-33)
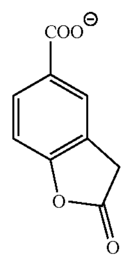
(B2-34)
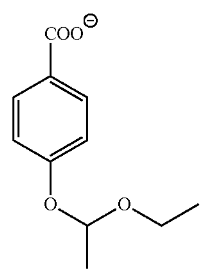
(B2-35)
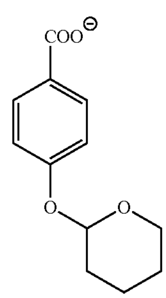

-continued
(B2-36)
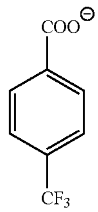
(B2-37)
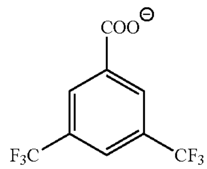
(B2-38)
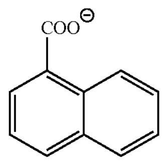
(B2-39)
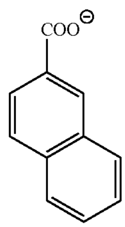
(B2-40)
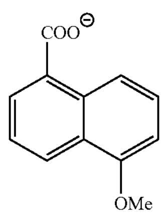
(B2-41)
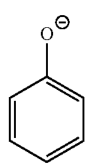
(B2-42)
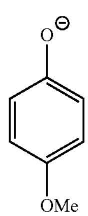
(B2-43)
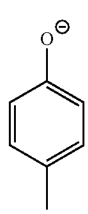
-continued
(B2-44)
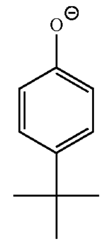
(B2-45)
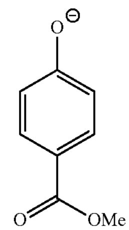
(B2-46)
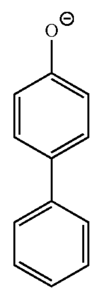
(B2-47)
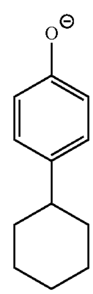
(B2-48)
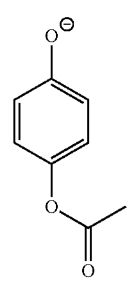
(B2-49)
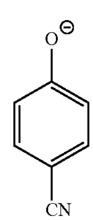

-continued
(B2-50)
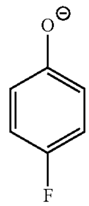
(B2-51)
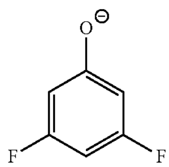
(B2-52)
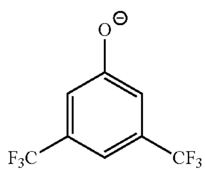
(B2-53)
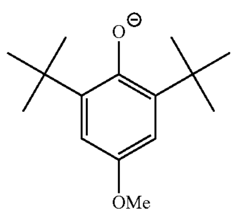
(B2-54)
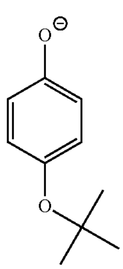
(B2-55)
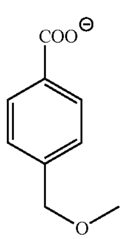
(B2-56)
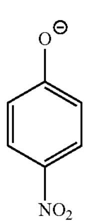
-continued
(B2-57)
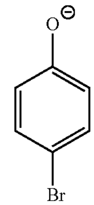
(B2-58)
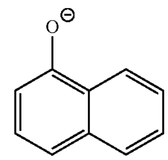
(B2-59)
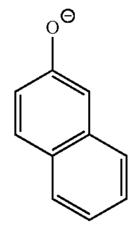
(B2-60)
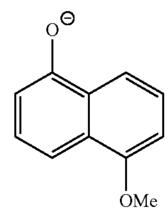
Specific examples of the ionic compound represented by formula (2) are shown in Table 1 below.
TABLE 1
| Basic Compound | Cation Structure | Anion Structure |
|---|---|---|
| B-01 | B1-1 | B2-1 |
| B-02 | B1-1 | B2-2 |
| B-03 | B1-1 | B2-9 |
| B-04 | B1-1 | B2-13 |
| B-05 | B1-1 | B2-15 |
| B-06 | B1-1 | B2-19 |
| B-07 | B1-1 | B2-25 |
| B-08 | B1-1 | B2-41 |
| B-09 | B1-1 | B2-51 |
| B-10 | B1-1 | B2-58 |
| B-11 | B1-2 | B2-4 |
| B-12 | B1-2 | B2-14 |
| B-13 | B1-2 | B2-38 |
| B-14 | B1-2 | B2-45 |
| B-15 | B1-2 | B2-55 |
| B-16 | B1-3 | B2-3 |
| B-17 | B1-3 | B2-10 |
| B-18 | B1-3 | B2-33 |
| B-19 | B1-3 | B2-49 |
| B-20 | B1-3 | B2-54 |
| B-21 | B1-4 | B2-5 |
| B-22 | B1-4 | B2-22 |
| B-23 | B1-4 | B2-48 |
| B-24 | B1-5 | B2-1 |
| B-25 | B1-5 | B2-13 |
| B-26 | B1-5 | B2-20 |
| B-27 | B1-5 | B2-26 |
| B-28 | B1-5 | B2-34 |
| B-29 | B1-5 | B2-39 |

TABLE 1-continued

| Basic Compound | Cation Structure | Anion Structure |
|---|---|---|
| B-30 | B1-5 | B2-41 |
| B-31 | B1-5 | B2-42 |
| B-32 | B1-5 | B2-51 |
| B-33 | B1-5 | B2-59 |
| B-34 | B1-6 | B2-7 |
| B-35 | B1-6 | B2-36 |
| B-36 | B1-7 | B2-1 |
| B-37 | B1-7 | B2-11 |
| B-38 | B1-7 | B2-28 |
| B-39 | B1-7 | B2-32 |
| B-40 | B1-7 | B2-43 |
| B-41 | B1-8 | B2-8 |
| B-42 | B1-8 | B2-44 |
| B-43 | B1-9 | B2-1 |
| B-44 | B1-9 | B2-16 |
| B-45 | B1-9 | B2-41 |
| B-46 | B1-9 | B2-47 |
| B-47 | B1-10 | B2-2 |
| B-48 | B1-10 | B2-12 |
| B-49 | B1-10 | B2-31 |
| B-50 | B1-10 | B2-42 |
| B-51 | B1-10 | B2-56 |
| B-52 | B1-11 | B2-1 |
| B-53 | B1-11 | B2-21 |
| B-54 | B1-11 | B2-27 |
| B-55 | B1-11 | B2-52 |
| B-56 | B1-12 | B2-1 |
| B-57 | B1-12 | B2-17 |
| B-58 | B1-12 | B2-23 |
| B-59 | B1-12 | B2-37 |
| B-60 | B1-13 | B2-17 |
| B-61 | B1-13 | B2-37 |
| B-62 | B1-13 | B2-50 |
| B-63 | B1-14 | B2-17 |
| B-64 | B1-14 | B2-23 |
| B-65 | B1-14 | B2-35 |
| B-66 | B1-14 | B2-50 |
| B-67 | B1-15 | B2-1 |
| B-68 | B1-15 | B2-2 |
| B-69 | B1-15 | B2-25 |
| B-70 | B1-15 | B2-41 |
| B-71 | B1-16 | B2-19 |
| B-72 | B1-16 | B2-38 |
| B-73 | B1-16 | B2-45 |
| B-74 | B1-16 | B2-53 |
| B-75 | B1-17 | B2-1 |
| B-76 | B1-17 | B2-12 |
| B-77 | B1-17 | B2-17 |
| B-78 | B1-17 | B2-41 |
| B-79 | B1-17 | B2-50 |
| B-80 | B1-18 | B2-18 |
| B-81 | B1-18 | B2-24 |
| B-82 | B1-18 | B2-37 |
| B-83 | B1-18 | B2-53 |
| B-84 | B1-19 | B2-1 |
| B-85 | B1-19 | B2-24 |
| B-86 | B1-19 | B2-41 |
| B-87 | B1-19 | B2-57 |
| B-88 | B1-20 | B2-1 |
| B-89 | B1-20 | B2-41 |
| B-90 | B1-20 | B2-60 |

As for the ionic compound represented by formula (2), one kind may be used alone, or two or more kinds may be used in combination. The content percentage of the ionic compound represented by formula (2) is preferably from 0.001 to 10 mass %, more preferably from 0.01 to 5 mass %, based on the total solid content in the actinic ray-sensitive or radiation-sensitive resin composition of the present invention.

[3](B) Compound Capable of Generating an Acid Upon Irradiation with an Actinic Ray or Radiation The composition of the present invention usually, preferably contains a compound capable of generating an acid upon irradiation with an actinic ray or radiation (hereinafter, sometimes referred to as "acid generator").

The acid generator is not particularly limited as long as it is a known acid generator, but a compound capable of generating an organic acid, for example, at least any one of a sulfonic acid, a bis(alkylsulfonyl)imide and a tris(alkylsulfonyl)methide, upon irradiation with an actinic ray or radiation is preferred.

The (B) compound capable of generating an acid upon irradiation with an actinic ray or radiation may be in a low molecular compound form or in a form of being incorporated into a part of a polymer. Also, a low molecular compound form and a form of being incorporated into a part of a polymer may be used in combination.

In the case where the (B) compound capable of generating an acid upon irradiation with an actinic ray or radiation is in a low molecular compound form, the molecular weight is preferably 3,000 or less, more preferably 2,000 or less, still more preferably 1,000 or less.

In the case where the (B) compound capable of generating an acid upon irradiation with an actinic ray or radiation is in a form of being incorporated into a part of a polymer, the compound may be incorporated into a part of the above-described resin (A) to constitute the resin (A) or may be incorporated into a resin different from the resin (A).

More preferred compounds include compounds represented by the following formulae (ZI), (ZII) and (ZIII):

(ZI)

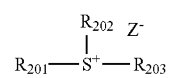

(ZII)

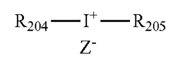

(ZIII)

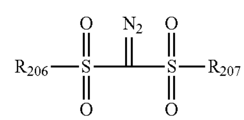

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylenes group, pentylene group).

$Z^-$ represents a non-nucleophilic anion (an anion having an extremely low ability of causing a nucleophilic reaction).

Examples of the non-nucleophilic anion include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure, which each group has, may further have an alkyl group (preferably having a carbon number of 1 to 15) as a substituent.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Also, the alkyl groups in the bis(alkylsulfonyl)imide anion may combine with each other to form a ring structure. In this case, the acid strength is increased.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less for enhancing the sensitivity.

An anion represented by the following formula (AN1) is also a preferred embodiment of the non-nucleophilic anion:

(AN1)

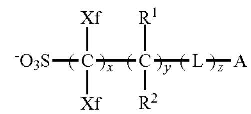

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of L's are present, each L may be the same as or different from every other L.

A represents a cyclic organic group.

x represents an integer of 1 to 20, y represents an integer of 0 to 10, and z represents an integer of 0 to 10.

Formula (AN1) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

x is preferably from 1 to 10, more preferably from 1 to 5.

y is preferably from 0 to 4, more preferably 0.

z is preferably from 0 to 5, more preferably from 0 to 3.

The divalent linking group of L is not particularly limited and includes, for example, —COO—, —OCO—, —CO—, —O—, —S—, —SO—, —$SO_2$—, an alkylene group, a cycloalkylene group, an alkenylene group, and a linking group formed by combining a plurality thereof. A linking group having a total carbon number of 12 or less is preferred. Among these, —COO—, —OCO—, —CO— and —O— are preferred, and —COO—, —OCO— are more preferred.

The cyclic organic group of A is not particularly limited as long as it has a cyclic structure, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film during heating after exposure can be suppressed and MEEF can be improved.

The aryl group includes a benzene ring, a naphthalene ring, a phenanthrene ring, and an anthracene ring.

The heterocyclic group includes those derived from a furan ring, a thiophene ring, a benzofuran ring, a benzothiophene ring, a dibenzofuran ring, a dibenzothiophene ring and a pyridine ring. Among these, heterocyclic groups derived from a furan ring, a thiophene ring and a pyridine ring are preferred.

The cyclic organic group also includes a lactone structure. Specific examples thereof include lactone structures represented by formulae (LC1-1) to (LC1-17) which may be contained in the resin (A).

The cyclic organic group may have a substituent, and examples of the substituent include an alkyl group (may be any of linear, branched or cyclic; preferably having a carbon number of 1 to 12), a cycloalkyl group (may be any of monocyclic, polycyclic or spirocyclic; preferably having a carbon number of 3 to 20), an aryl group (preferably having a carbon number of 6 to 14), a hydroxy group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

Examples of the organic group of $R_{201}$, $R_{202}$ and $R_{203}$ include an aryl group, an alkyl group, and a cycloalkyl group.

At least one of three members $R_{201}$, $R_{202}$ and $R_{203}$ is preferably an aryl group, and it is more preferred that all of these three members are an aryl group. The aryl group may be a heteroaryl group such as indole residue and pyrrole residue, other than a phenyl group, a naphthyl group and the like. The alkyl group and cycloalkyl group of $R_{201}$ to $R_{203}$ may be preferably a linear or branched alkyl group having a carbon number of 1 to 10 and a cycloalkyl group having a carbon number of 3 to 10. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

In the case where two members out of $R_{201}$ to $R_{203}$ are combined to form a ring structure, the ring structure is preferably a structure represented by the following formula (A1):

(A1)

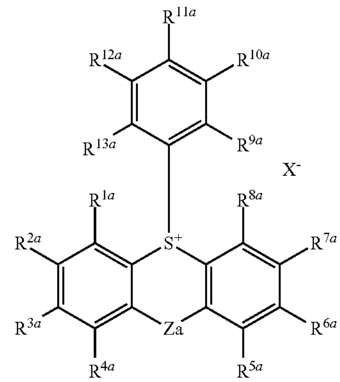

In formula (A1), each of $R^{1a}$ to $R^{13a}$ independently represents a hydrogen atom or a substituent.

It is preferred that from one to three members out of $R^{1a}$ to $R^{13a}$ are not a hydrogen atom; and it is more preferred that any one of $R^{9a}$ to $R^{13a}$ is not a hydrogen atom.

Za represents a single bond or a divalent linking group.

$X^-$ has the same meaning as $Z^-$ in formula (ZI).

Specific examples of $R^{1a}$ to $R^{13a}$ when these are not a hydrogen atom include a halogen atom, a linear, branched or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other known substituents.

In the case where $R^{1a}$ to $R^{13a}$ are not a hydrogen atom, each of $R^{1a}$ to $R^{13a}$ is preferably a linear, branched or cyclic alkyl group substituted with a hydroxyl group.

Examples of the divalent linking group of Za include an alkylene group, an arylene group, a carbonyl group, a sulfonyl group, a carbonyloxy group, a carbonylamino group, a sulfonylamide group, an ether bond, a thioether bond, an amino group, a disulfide group, —$(CH_2)_n$—CO—, —$(CH_2)_n$—$SO_2$—, —CH═CH—, an aminocarbonylamino group, and an aminosulfonylamino group (n is an integer of 1 to 3).

Incidentally, when at least one of $R_{201}$, $R_{202}$ and $R_{203}$ is not an aryl group, the preferred structure includes a cation structure such as compounds described in paragraphs 0046 to 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI).

The aryl group, alkyl group and cycloalkyl group of $R_{204}$ to $R_{207}$ may have a substituent. Examples of the substituent include those of the substituent which may be substituted on the aryl group, alkyl group and cycloalkyl group of $R_{201}$ to $R_{203}$ in the compound (ZI).

$Z^-$ represents a non-nucleophilic anion, and examples thereof are the same as those of the non-nucleophilic anion of $Z^-$ in formula (ZI).

The acid generator further includes compounds represented by the following formulae (ZIV), (ZV) and (ZVI):

$$Ar_3—SO_2—SO_2—Ar_4 \qquad \text{(ZIV)}$$

(ZV)

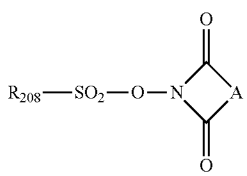

(ZVI)

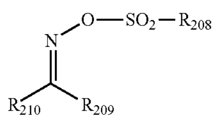

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Out of the acid generators, particularly preferred examples are illustrated below.

(z1)

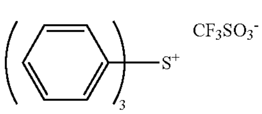

-continued (z2)

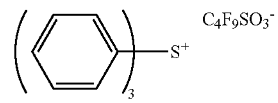

(z3)

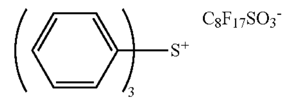

(z4)

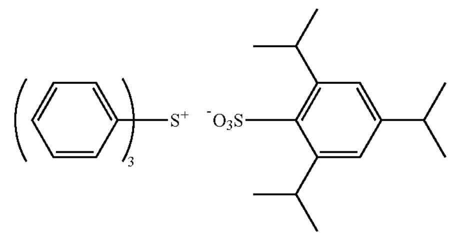

(z5)

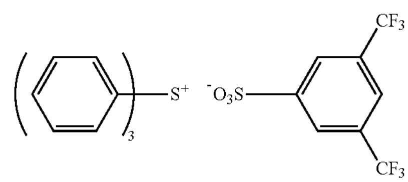

(z6)

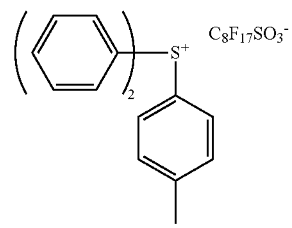

(z7)

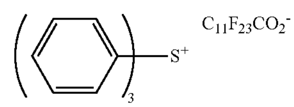

(z8)

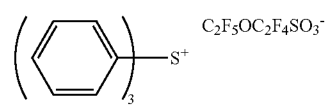

(z9)

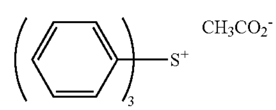

(z10)

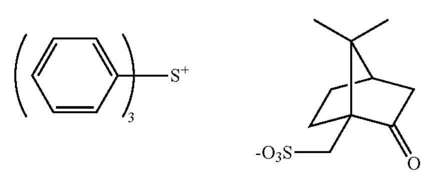

(z11)

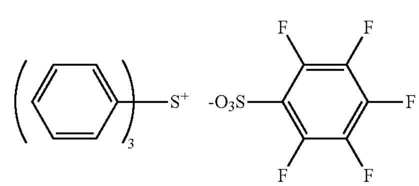

-continued
(z12)
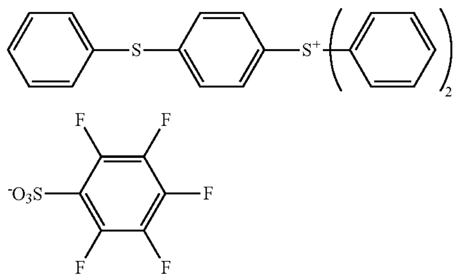
(z13)
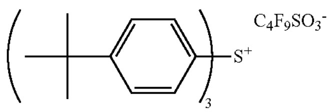
(z14)
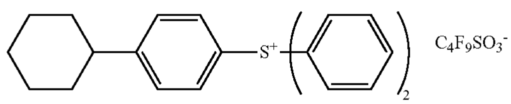
(z15)
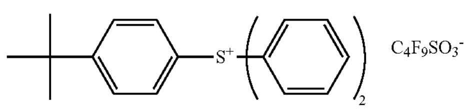
(z16)
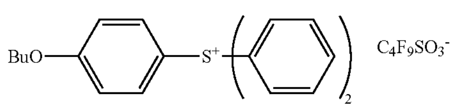
(z17)
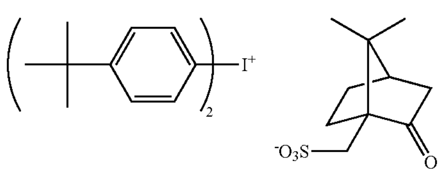
(z18)
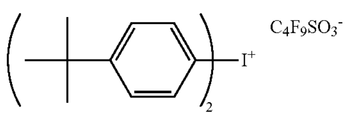
(z19)
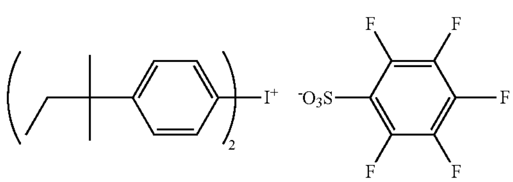
(z20)
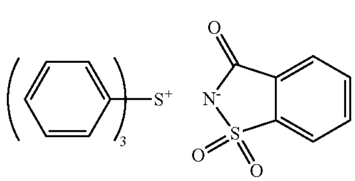
(z21)
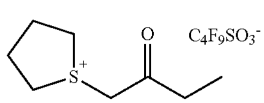
-continued
(z22)
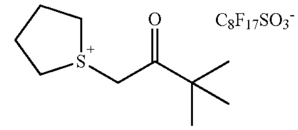
(z23)
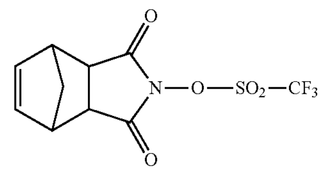
(z24)
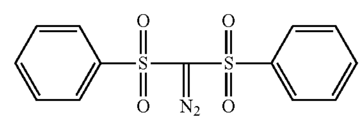
(z25)
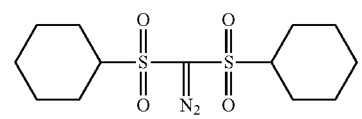
(z26)
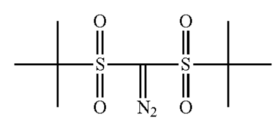
(z27)
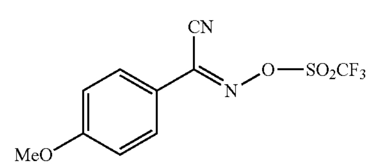
(z28)
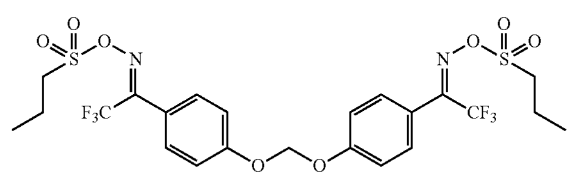
(z29)
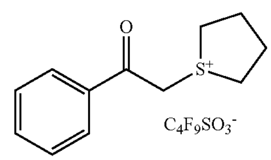
(z30)
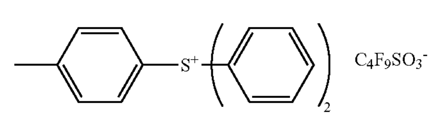
(z31)
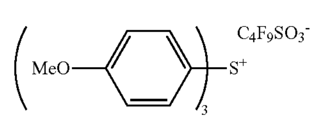

-continued
(z32)
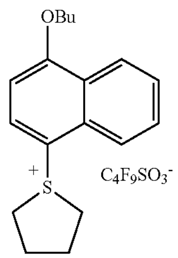
(z33)
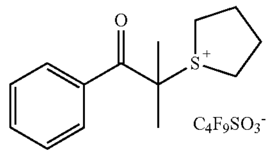
(z34)
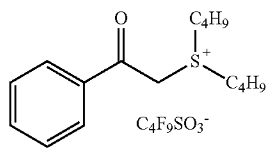
(z35)
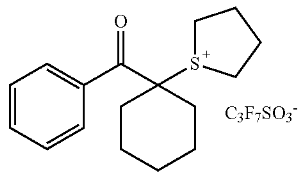
(z36)
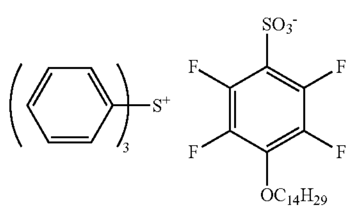
(z37)
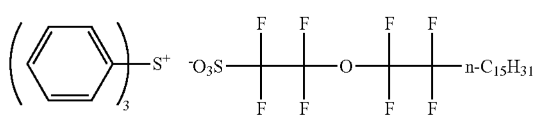
(z38)
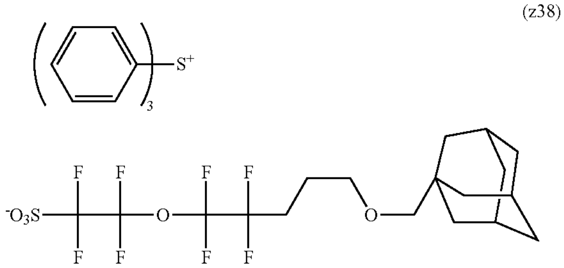
(z39)
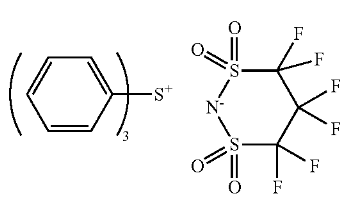
-continued
(z40)
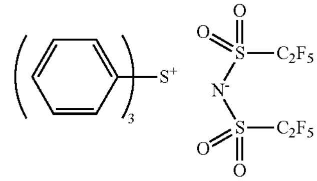
(z41)
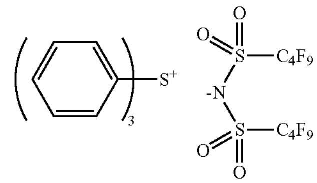
(z42)
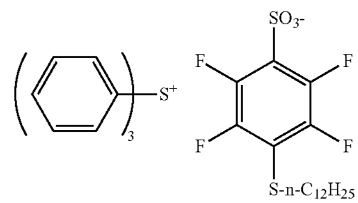
(z43)
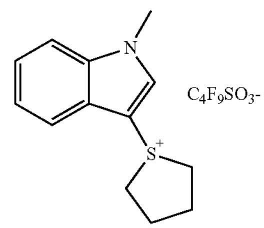
(z44)
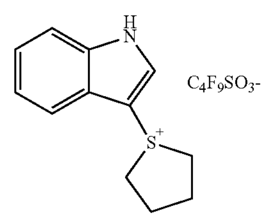
(z45)
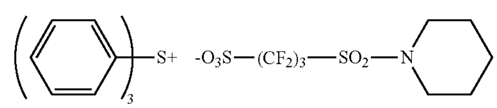
(z46)
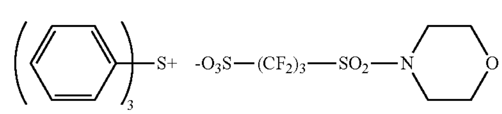
(z47)
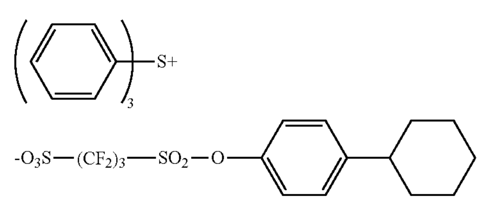
(z48)
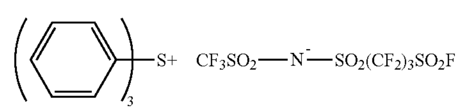

-continued
(z49)
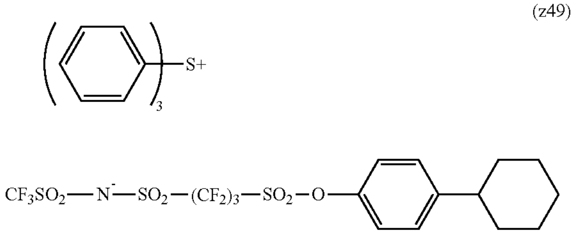
(z50)
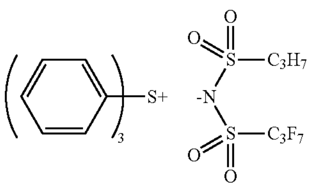
(z51)
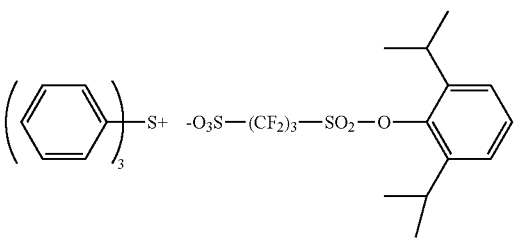
(z52)
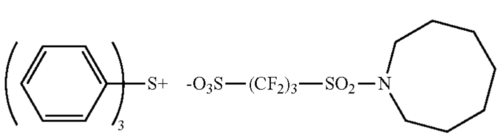
(z53)
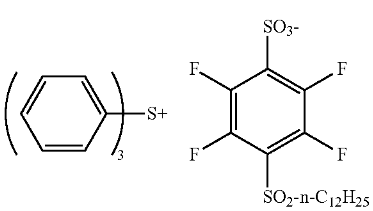
(z54)
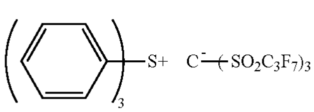
(z55)
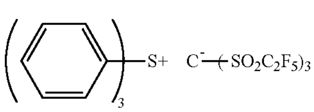
(z56)
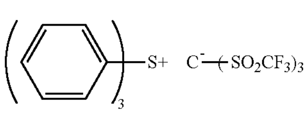
(z57)
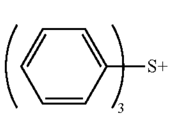
-continued
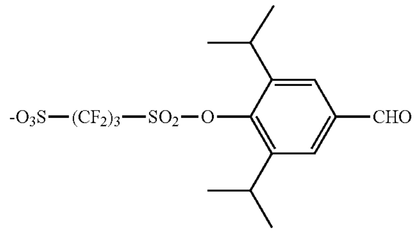
(z58)
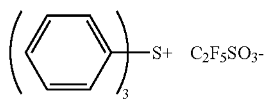
(z59)
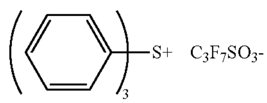
(z60)
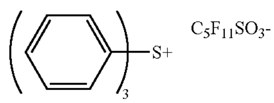
(z61)
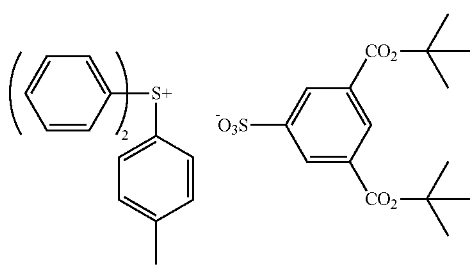
(z62)
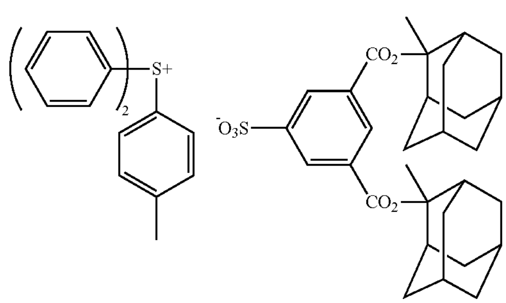
(z63)
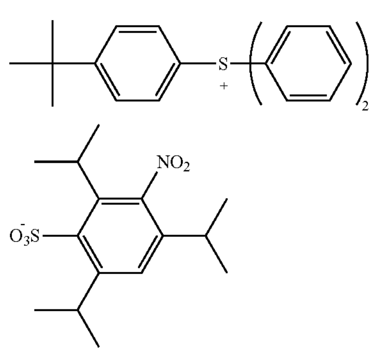
(z64)
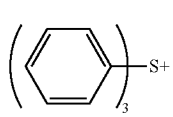

-continued
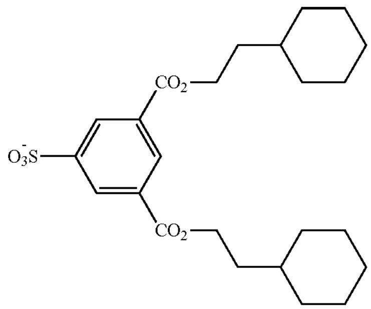
(z65)
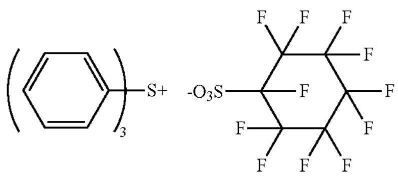
(z66)
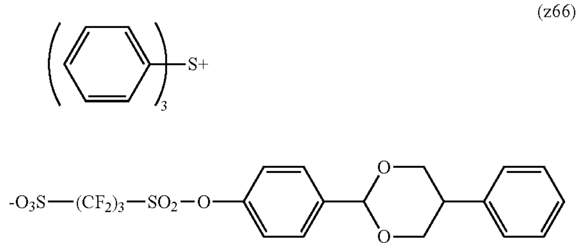
(z67)
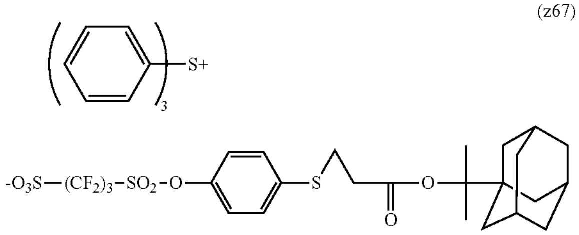
(z68)
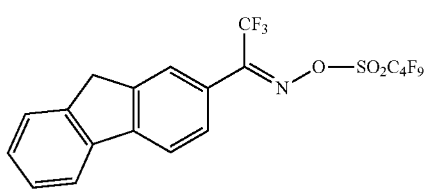
(z69)
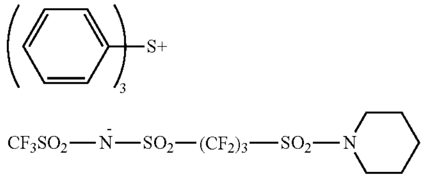
(z70)
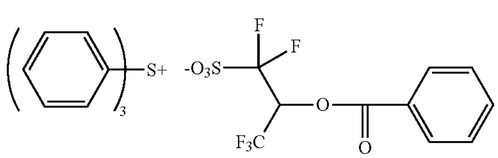
-continued
(z71)
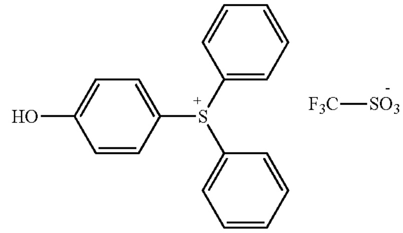
(z72)
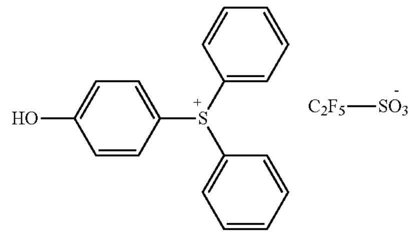
(z73)
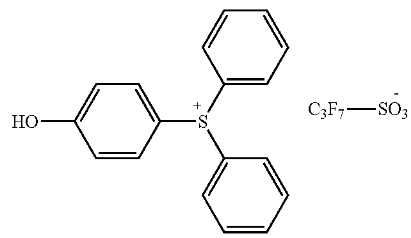
(z74)
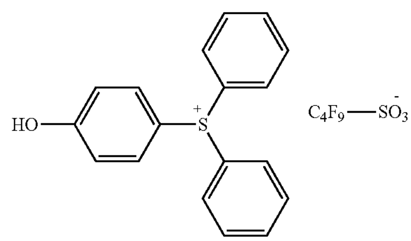
(z75)
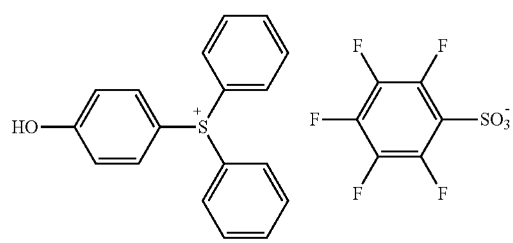
(z76)
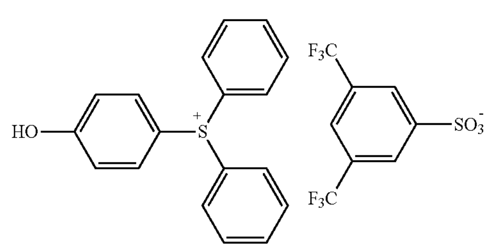

-continued
(z77)
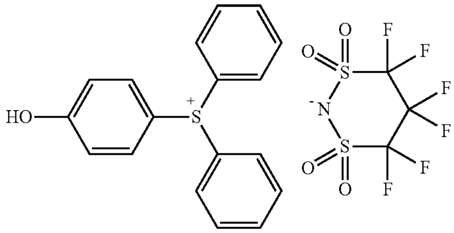
(z78)
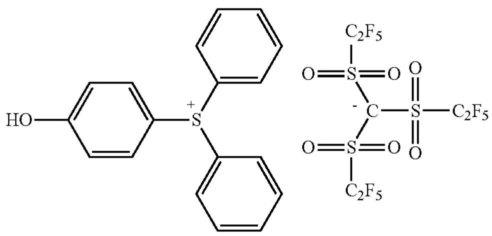
(z79)
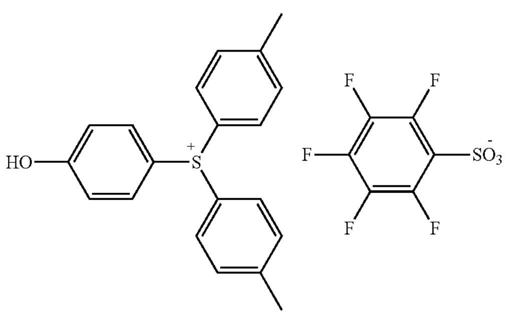
(z80)
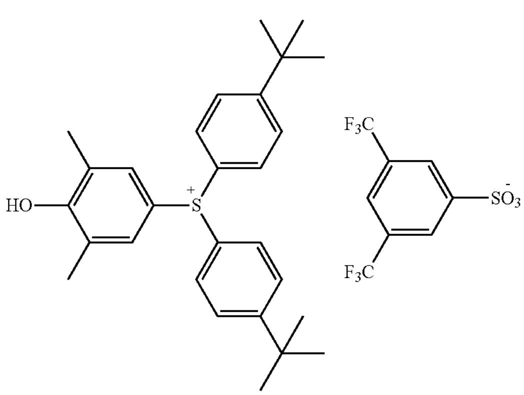
-continued
(z81)
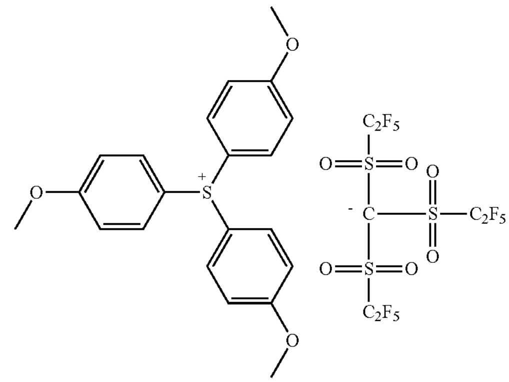
(z82)
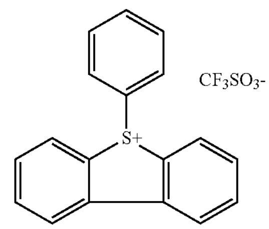
(z83)
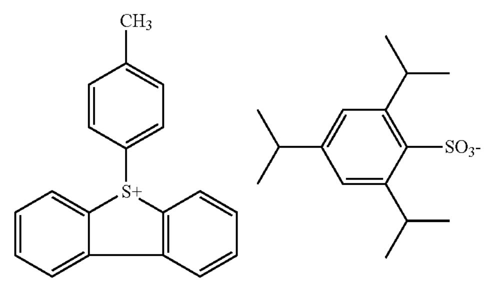
(z84)
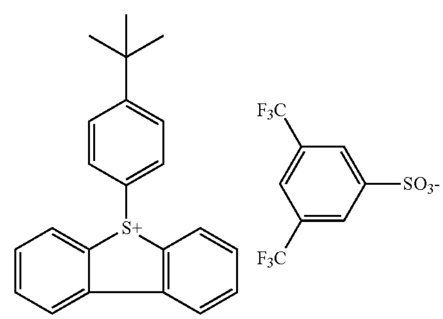
(z85)
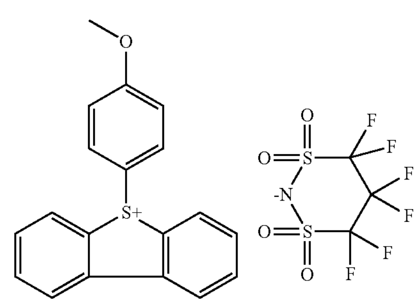

-continued
(z86)
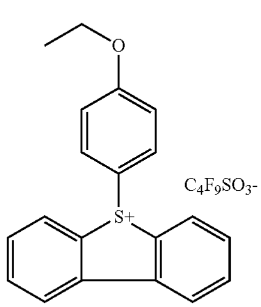
(z87)
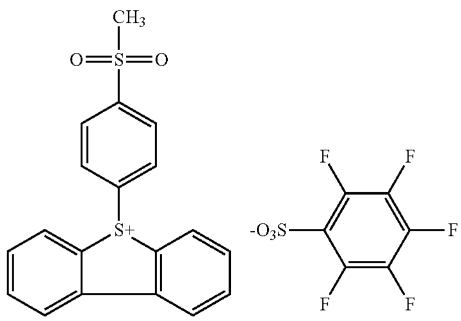
(z88)
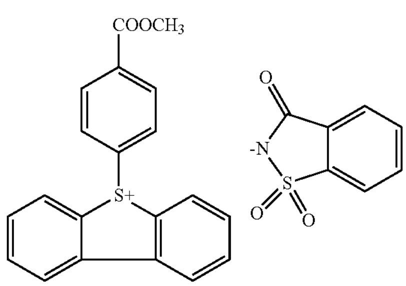
(z89)
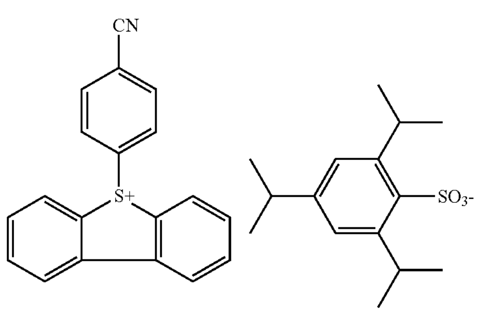
(z90)
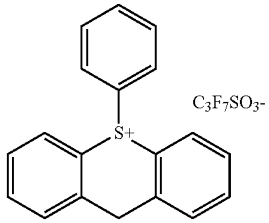
-continued
(z91)
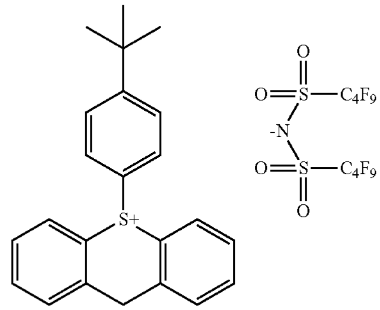
(z92)
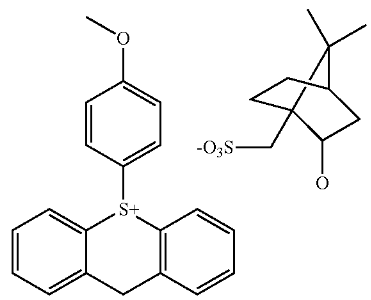
(z93)
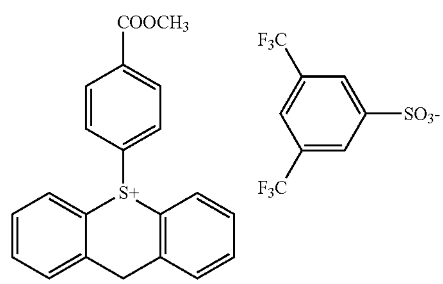
(z94)
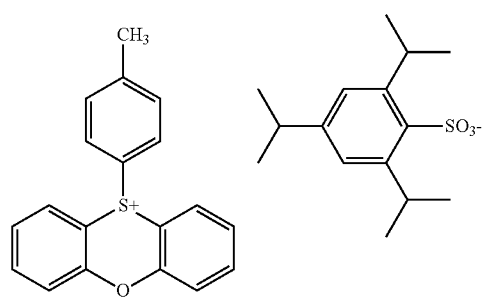
(z95)
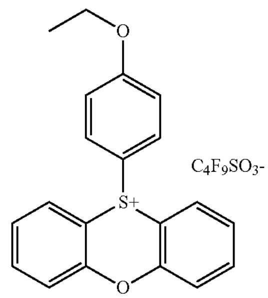

-continued
(z96)
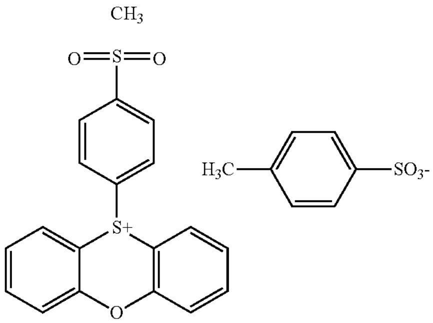
(z97)
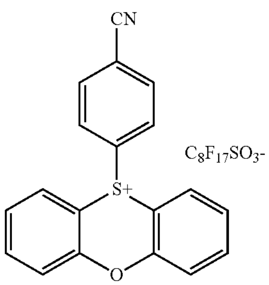
(z98)
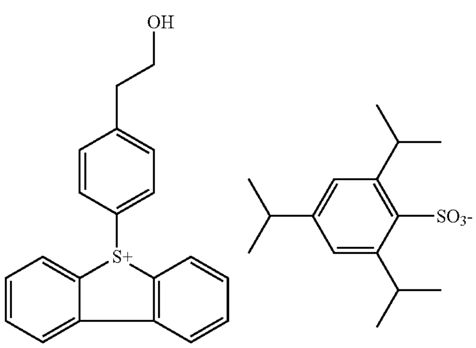
(z99)
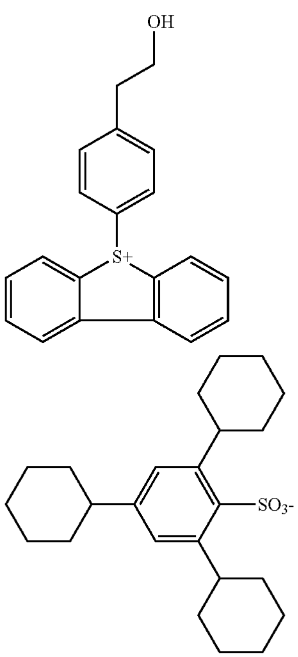
-continued
(z100)
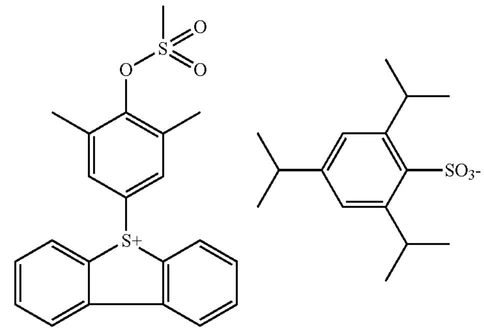
(z101)
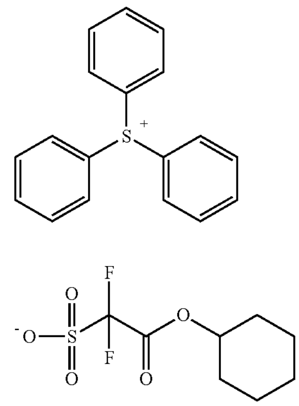
(z102)
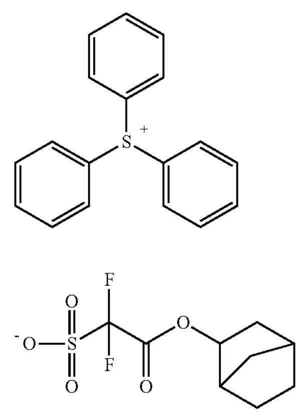
(z103)
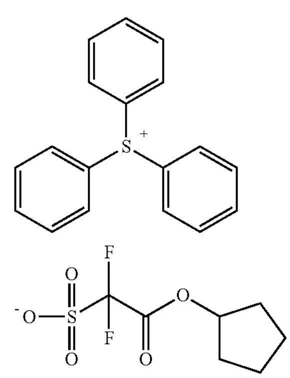

(z104)
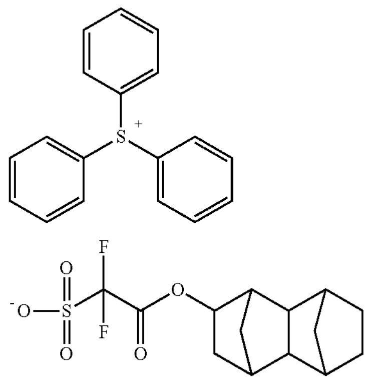
(z105)
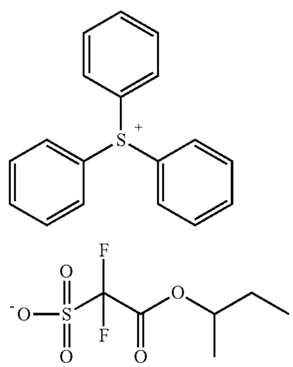
(z106)
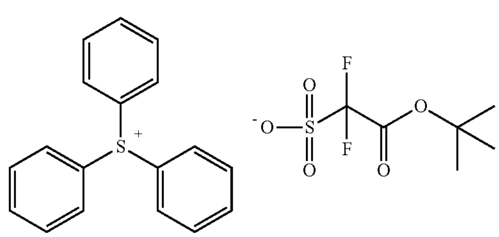
(z107)
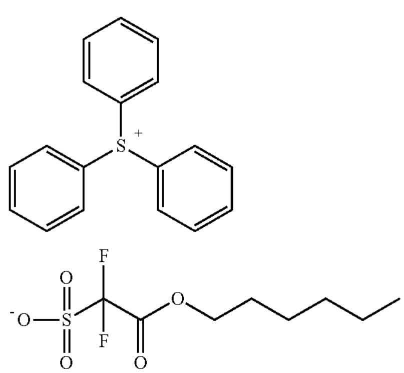
(z108)
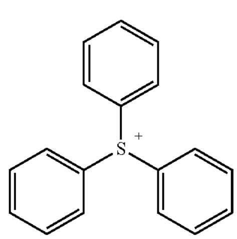
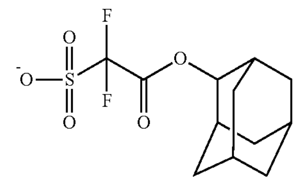
(z109)
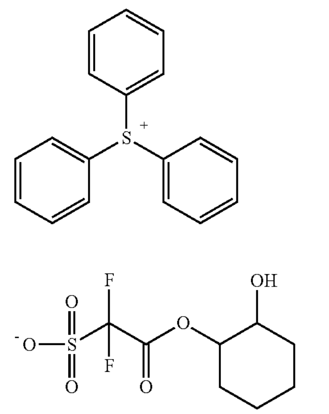
(z110)
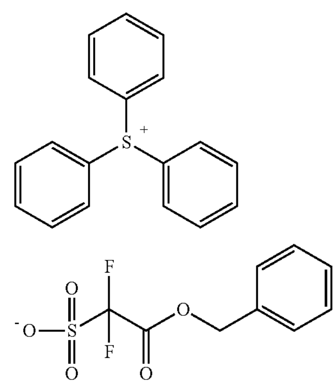
(z111)
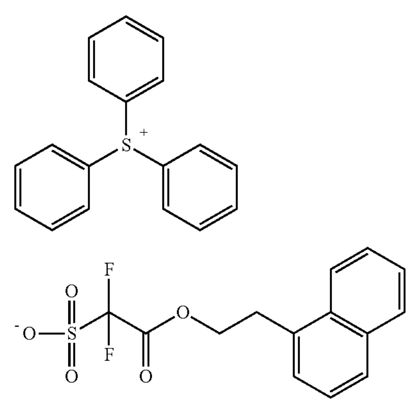
(z112)
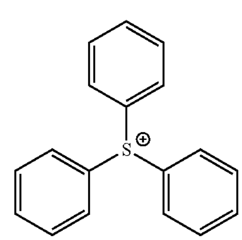

-continued
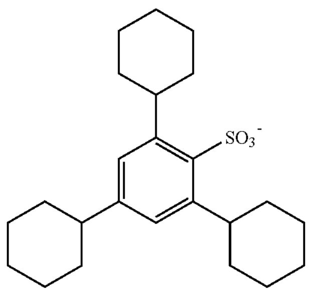
(z113)
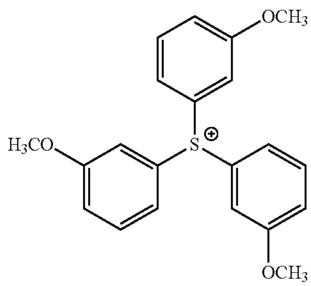
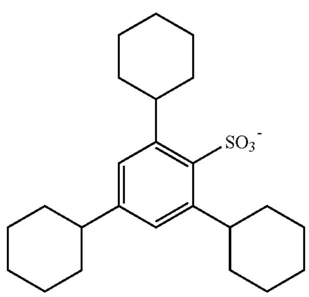
(z114)
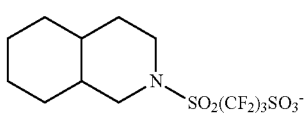
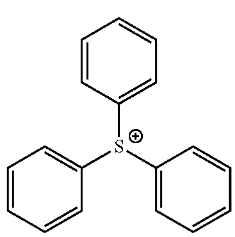
(z115)
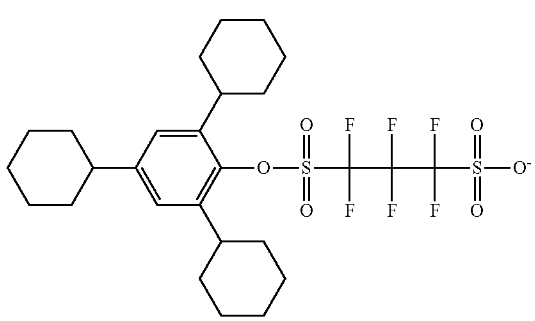
-continued
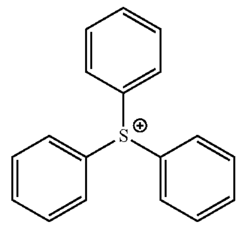
(z116)
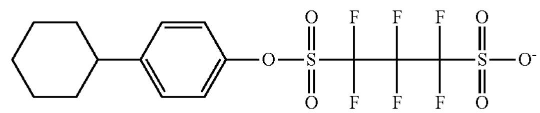
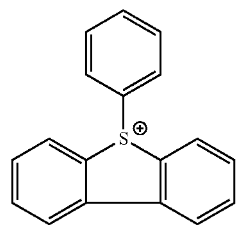
(z117)
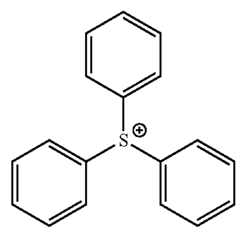
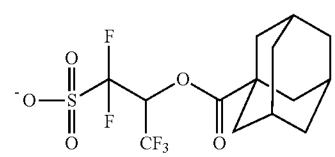
(z118)
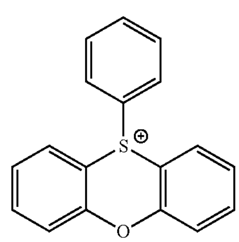
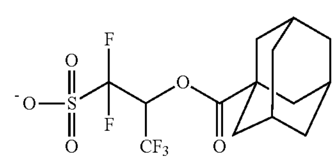
(z119)
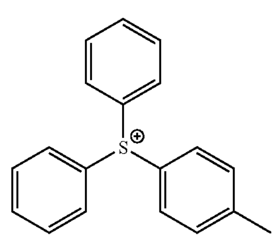

-continued
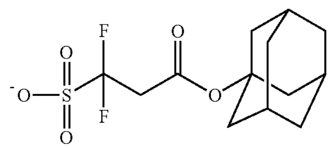
(z120)
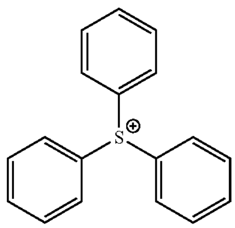
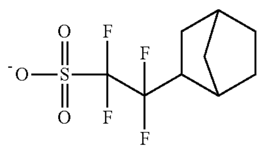
(z121)
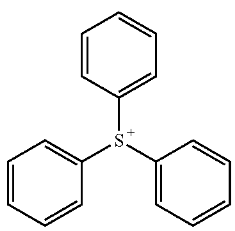
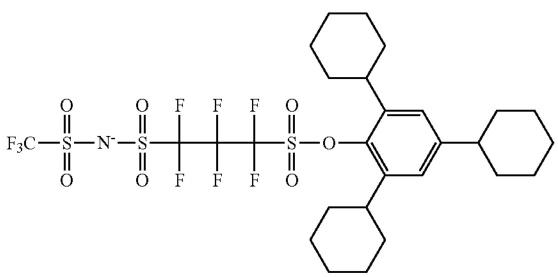
(z122)
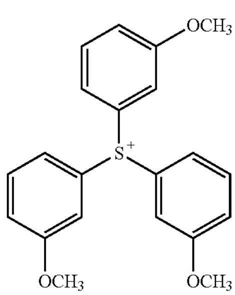
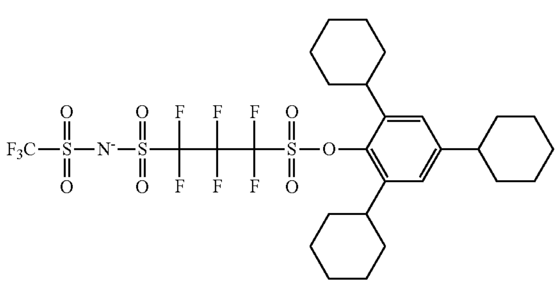
-continued
(z123)
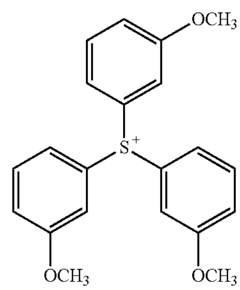
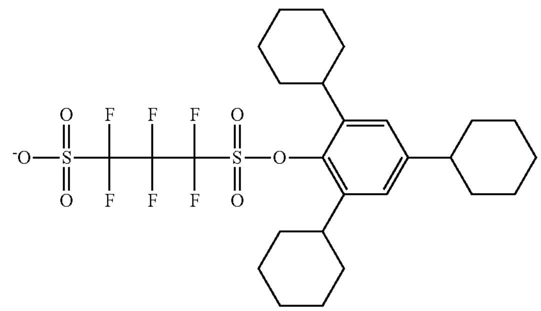
(z124)
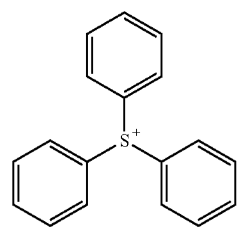
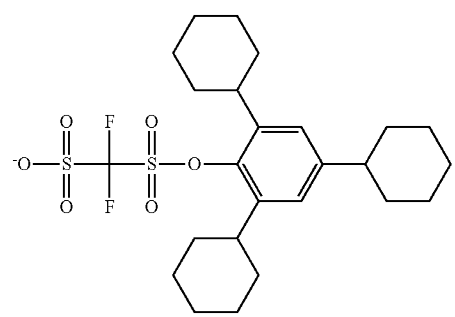
(z125)
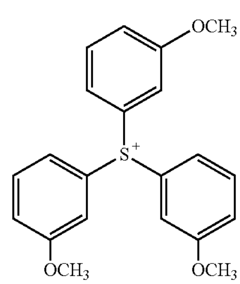

-continued

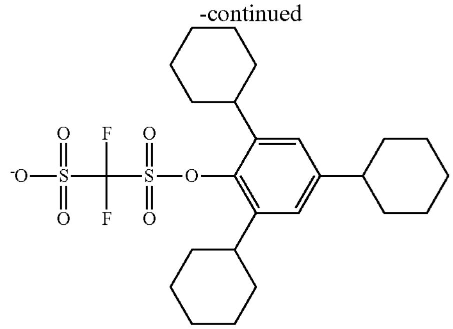

(z126)

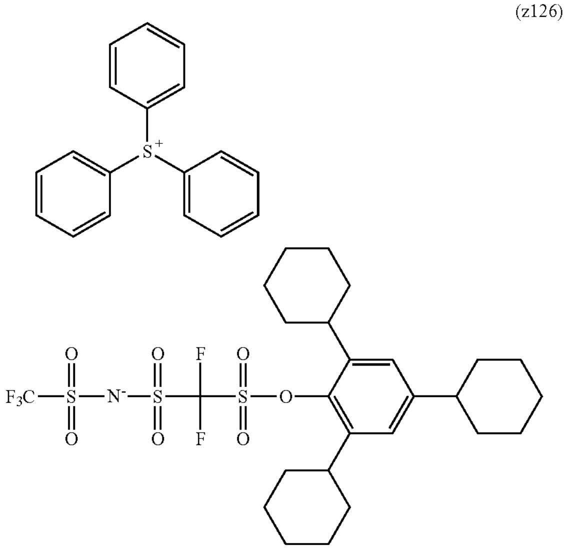

(z127)

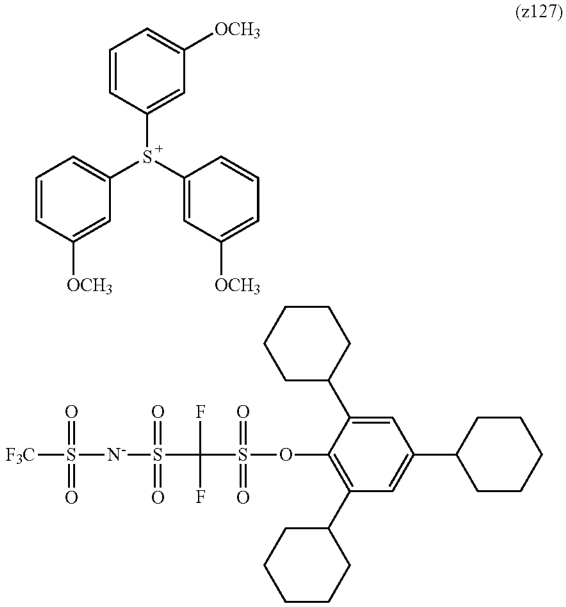

(z128)

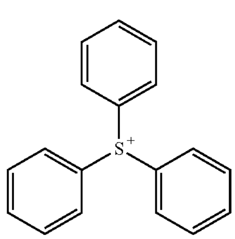

-continued

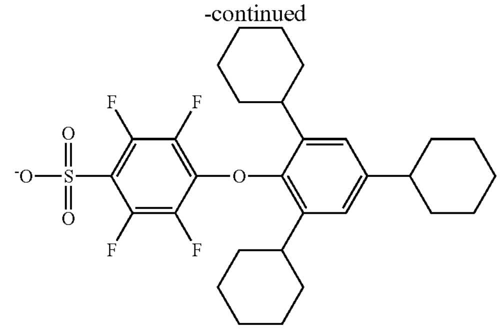

(z129)

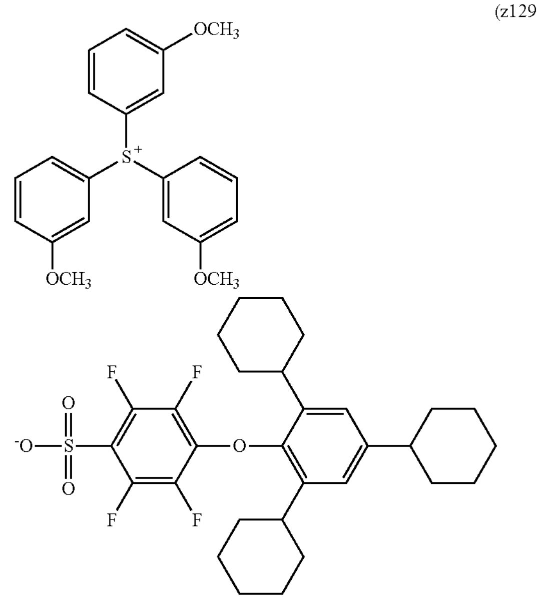

In the present invention, from the standpoint of improving the resolution by preventing the acid generated upon exposure from diffusing into the unexposed area, the acid-generating compound (A) is preferably a compound capable of generating an acid having a size of 240 Å$^3$ or more in volume, more preferably a compound capable of generating an acid having a size of 300 Å$^3$ or more in volume, still more preferably a compound capable of generating an acid having a size of 350 Å$^3$ or more in volume, yet still more preferably a compound capable of generating an acid having a size of 400 Å$^3$ or more in volume. However, in view of sensitivity and solubility in a coating solvent, the volume above is preferably 2,000 Å$^3$ or less, more preferably 1,500 Å$^3$ or less. The value of this volume is determined using "WinMOPAC" produced by Fujitsu Limited. That is, first, the chemical structure of the acid according to each example is input, and next, using this structure as the initial structure, the most stable conformation of each acid is determined by molecular force field calculation using an MM3 method. Thereafter, with respect to the most stable conformation, molecular orbital calculation using a PM3 method is performed, whereby the "accessible volume" of each acid can be computed.

Examples of the acid generator particularly preferred in the present invention are illustrated below. In some of these examples, a computed value of volume (unit: Å$^3$) is shown together. The computed value determined here is a volume value of an acid in which a proton is bonded to the anion moiety.

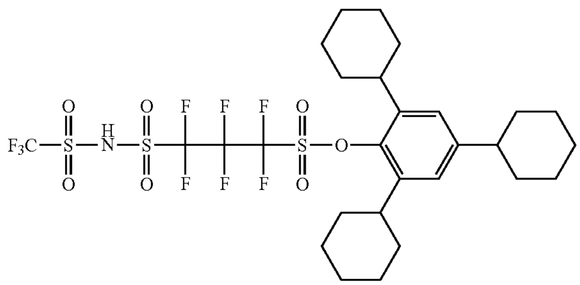
585Å$^3$
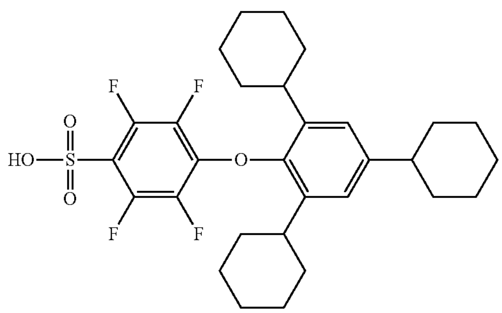
585Å$^3$
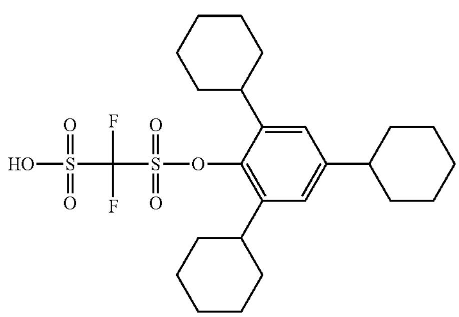
525Å$^3$
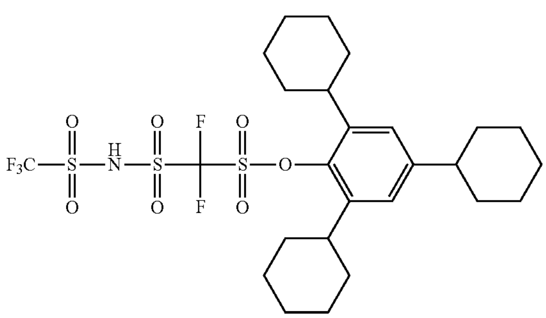
554Å$^3$
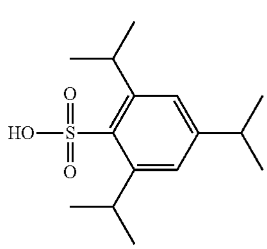
303Å$^3$
-continued
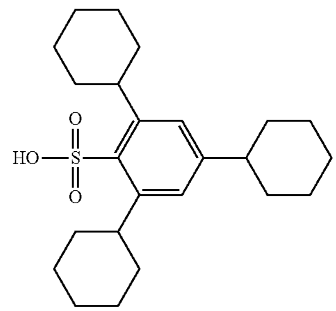
437Å$^3$
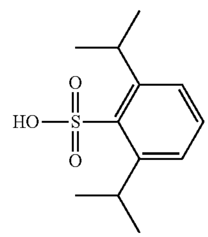
244Å$^3$
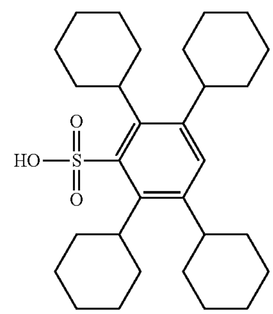
529Å$^3$
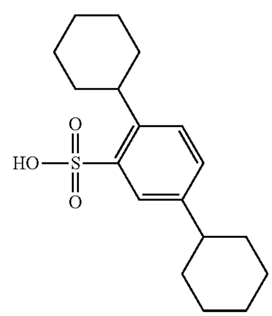
336Å$^3$
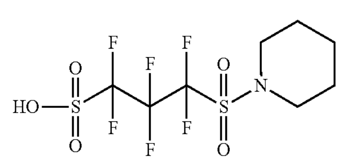
244Å$^3$
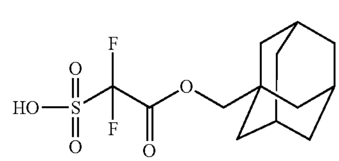
271Å$^3$ -continued
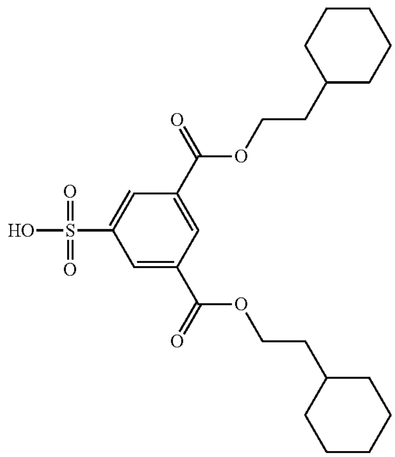
457Å$^3$
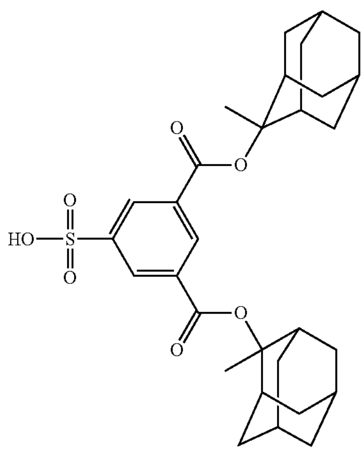
511Å$^3$
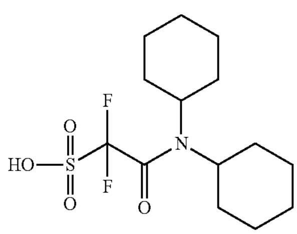
311Å$^3$
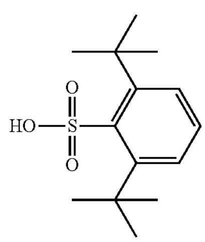
280Å$^3$
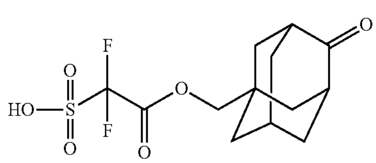
266Å$^3$
-continued
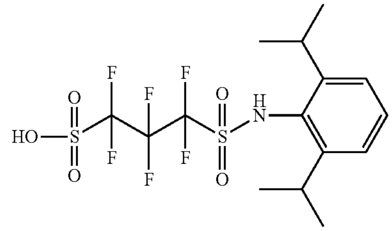
339Å$^3$
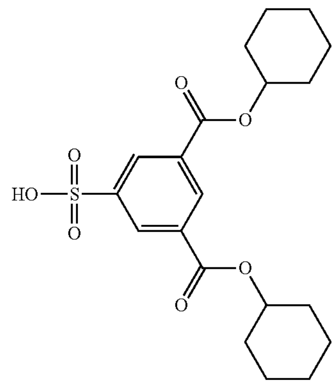
380Å$^3$
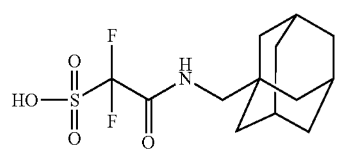
277Å$^3$
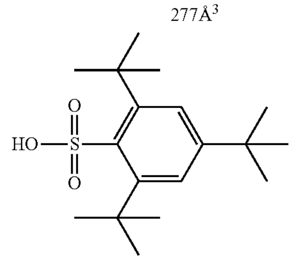
357Å$^3$
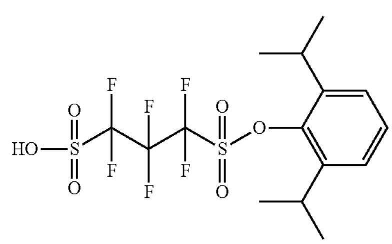
347Å$^3$
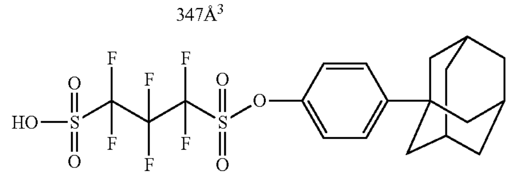
380Å$^3$ -continued
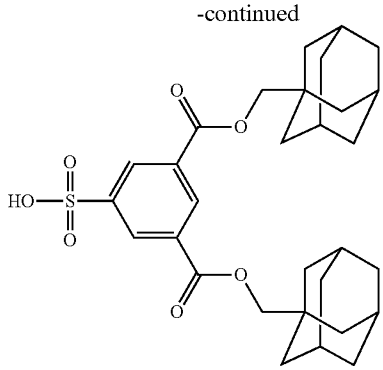
519Å$^3$
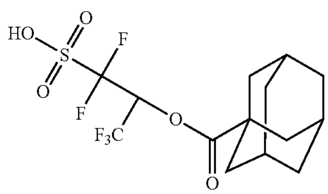
291Å$^3$
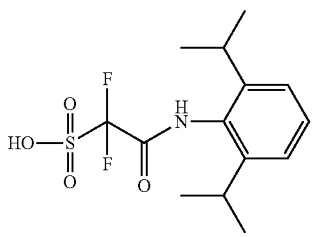
297Å$^3$
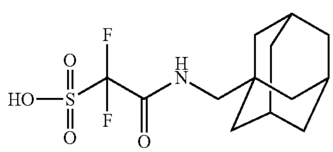
277Å$^3$
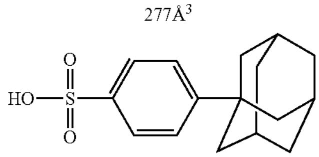
281Å$^3$
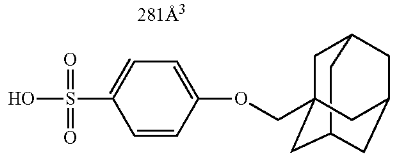
310Å$^3$
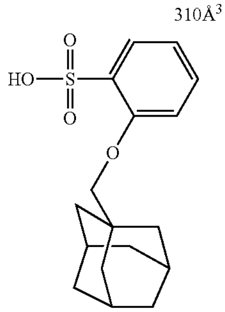
309Å$^3$
-continued
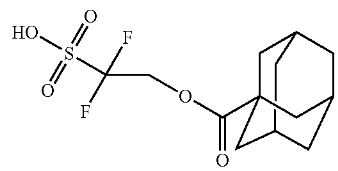
270Å$^3$
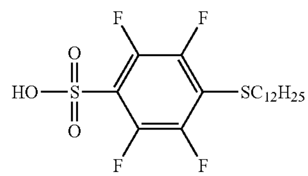
393Å$^3$
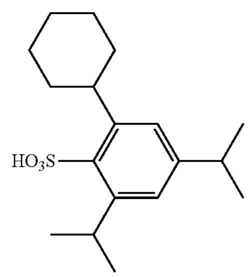
350Å$^3$
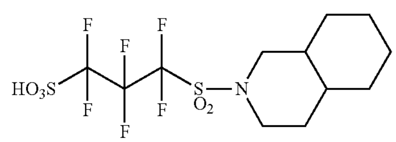
311Å$^3$
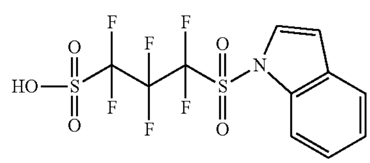
250Å$^3$
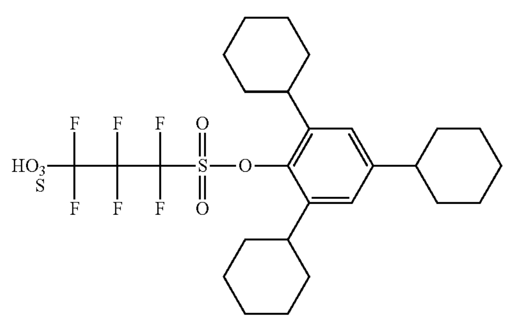
535Å$^3$
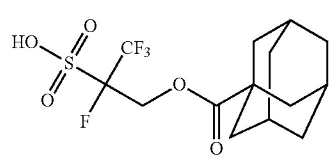
290Å$^3$ -continued

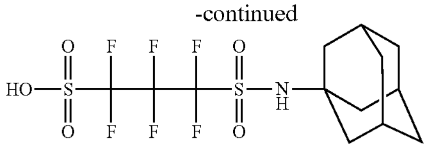

315Å[3]

As for the acid generator, one kind may be used alone, or two or more kinds may be used in combination.

The content percentage of the acid generator in the composition is preferably from 0.1 to 50 mass %, more preferably from 0.5 to 40 mass %, still more preferably from 1 to 30 mass %, based on the total solid content of the composition.

[4](C) Resist Solvent (Coating Solvent)

The solvent which can be used when preparing the composition is not particularly limited as long as it dissolves respective components, but examples thereof include an alkylene glycol monoalkyl ether carboxylate (e.g., propylene glycol monomethyl ether acetate (PGMEA; another name: 1-methoxy-2-acetoxypropane)), an alkylene glycol monoalkyl ether (e.g., propylene glycol monomethyl ether (PGME; 1-methoxy-2-propanol)), a lactic acid alkyl ester (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (e.g., ethyl ethoxypropionate). Other examples of the solvent which can be used include solvents described in paragraph [0244] et seq. of U.S. Patent Application Publication No. 2008/0248425A1.

Among the solvents above, an alkylene glycol monoalkyl ether carboxylate and an alkylene glycol monoalkyl ether are preferred.

One of these solvents may be used alone, or two or more thereof may be mixed and used. In the case of mixing two or more solvents, it is preferred to mix a solvent having a hydroxyl group and a solvent having no hydroxyl group. The mass ratio between the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

[5] Combined Basic Compound

The composition of the present invention may contain a basic compound other than the compound represented by formula (2). The basic compound is preferably a nitrogen-containing organic basic compound. The basic compound that can be used is not particularly limited but, for example, amine compounds, nitrogen-containing heterocyclic compounds and ammonium salts described in JP-A-2012-93398 may be used. In addition, for example, compounds synthesized in Examples of JP-A-2002-363146 and compounds described in paragraph 0108 of JP-A-2007-298569 can be also used.

As for the basic compound, one compound may be used alone, or two or more compounds may be used in combination.

The amount of the basic compound used is usually from 0.001 to 10 mass %, preferably from 0.01 to 5 mass %, based on the total solid content of the actinic ray-sensitive or radiation-sensitive resin composition.

[6] Compound Capable of Decomposing by an Action of an Acid to Generate an Acid

The actinic ray-sensitive or radiation-sensitive resin composition of the present invention may further contain one kind or two or more kinds of compounds capable of decomposing by the action of an acid to generate an acid. The acid generated from the compound capable of decomposing by the action of an acid to generate an acid is preferably a sulfonic acid, a methide acid or an imide acid.

Examples of the compound capable of decomposing by the action of an acid to generate an acid, which can be used in the present invention, are illustrated below, but the present invention is not limited thereto.

(PA-1)

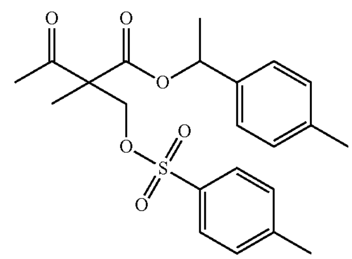

(PA-2)

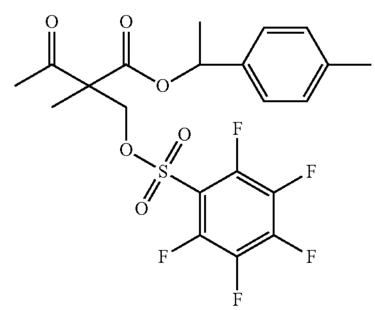

(PA-3)

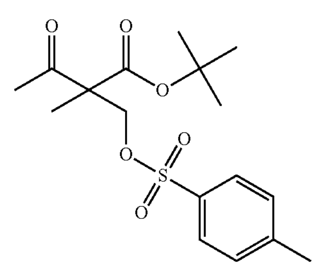

(PA-4)

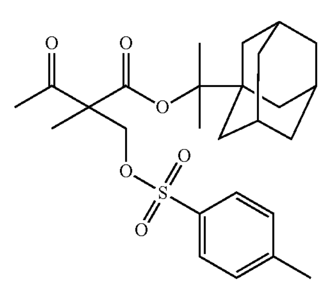

-continued
(PA-5)
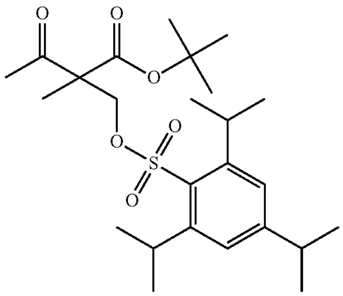
(PA-6)
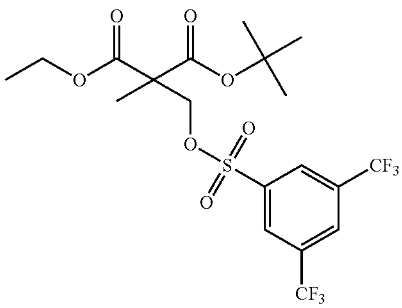
(PA-7)
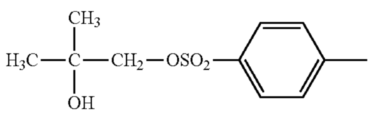
(PA-8)
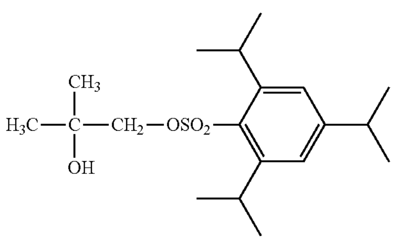
(PA-9)
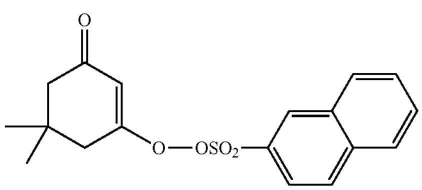
(PA-10)
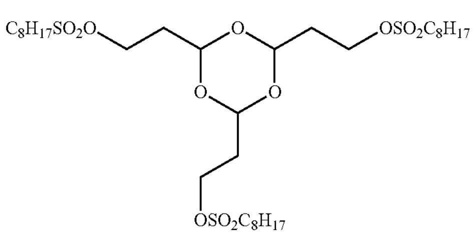
(PA-11)
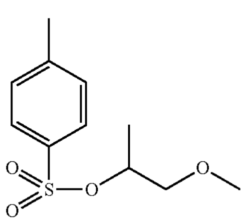
-continued
(PA-12)
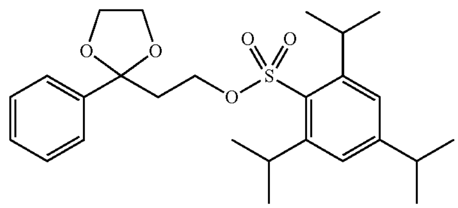
(PA-13)
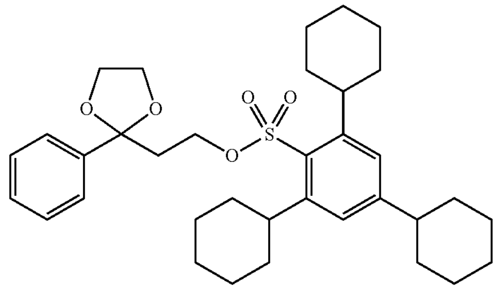
(PA-14)
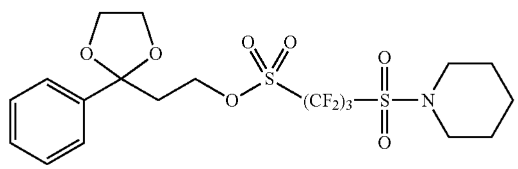
(PA-15)
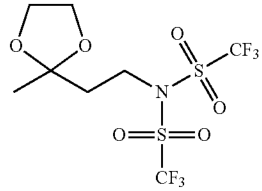
(PA-16)
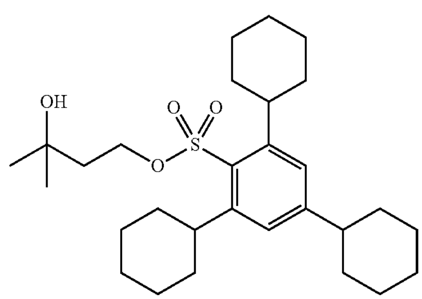
(PA-17)
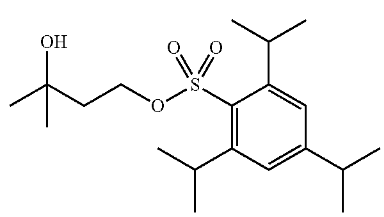

-continued (PA-18)

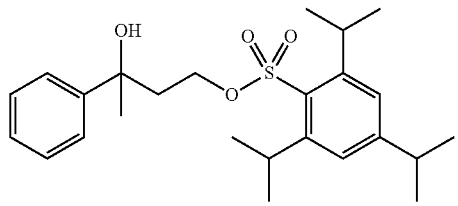

As for the compound capable of decomposing by the action of an acid to generate an acid, one kind may be used alone, or two or more kinds may be used in combination.

The content of the compound capable of decomposing by the action of an acid to generate an acid is preferably from 0.1 to 40 mass %, more preferably from 0.5 to 30 mass %, still more preferably from 1.0 to 20 mass %, based on the total solid content of the actinic ray-sensitive or radiation-sensitive resin composition.

[7] Hydrophobic Resin (HR)

The actinic ray-sensitive or radiation-sensitive resin composition of the present invention may contain (HR) a hydrophobic resin separately from the resin (A).

The hydrophobic resin (HR) preferably contains a fluorine atom-containing group, a silicon atom-containing group or a hydrocarbon group having a carbon number of 5 or more so as to be unevenly distributed to the film surface. Such a group may be present in the main chain of the resin or may be substituted on the side chain. Specific examples of the hydrophobic resin (HR) are illustrated below.

(HR-1)

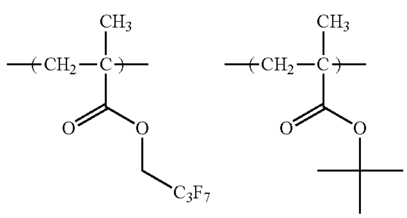

(HR-2)

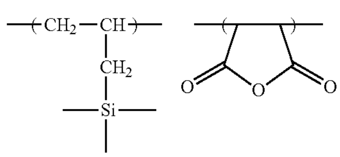

(HR-3)

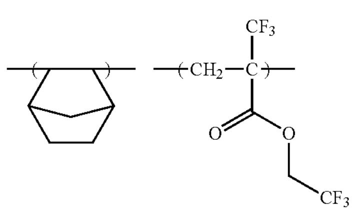

(HR-4)

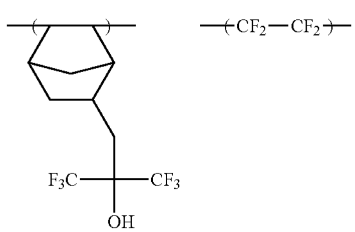

-continued (HR-5)

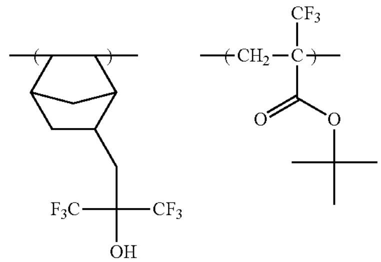

(HR-6)

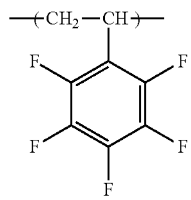

(HR-7)

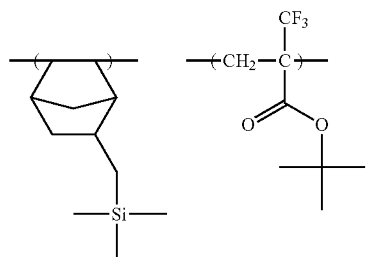

(HR-8)

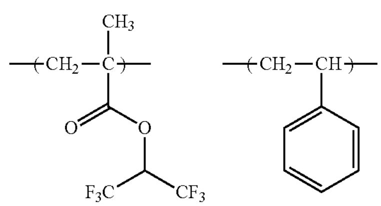

(HR-9)

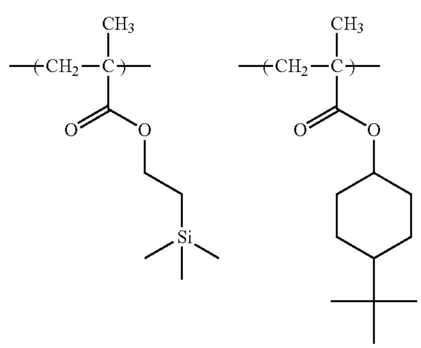

(HR-10)

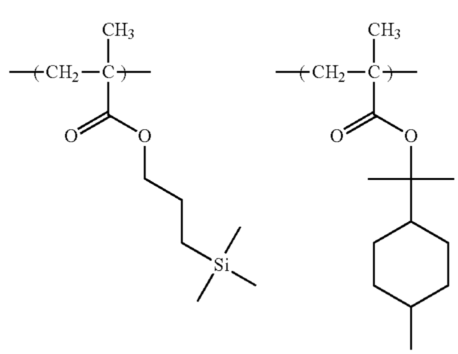

-continued
(HR-11)
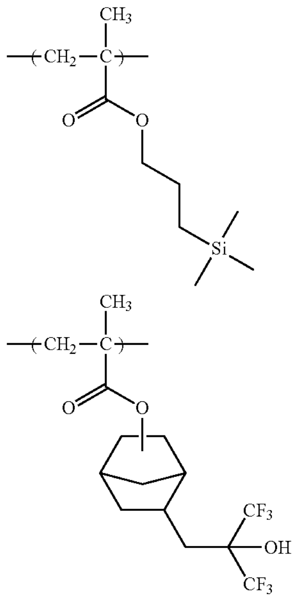
(HR-12)
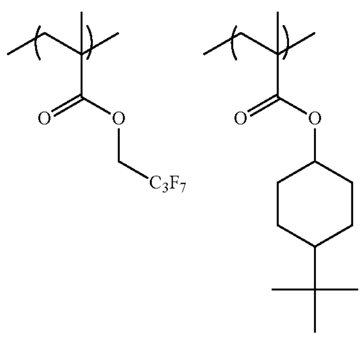
(HR-13)
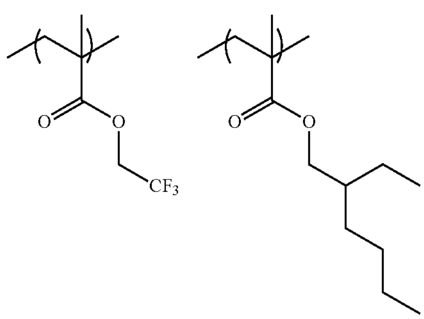
(HR-14)
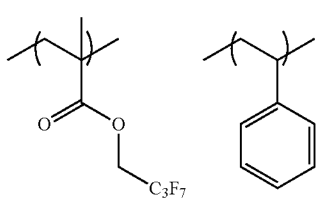
(HR-15)
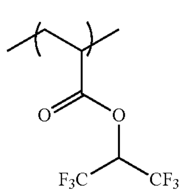
-continued
(HR-16)
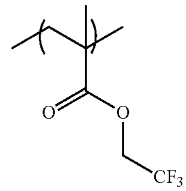
(HR-17)
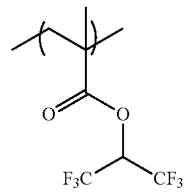
(HR-18)
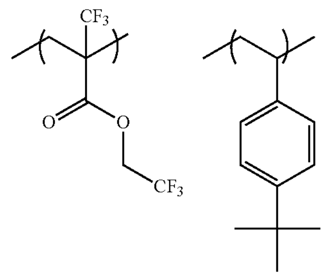
(HR-19)
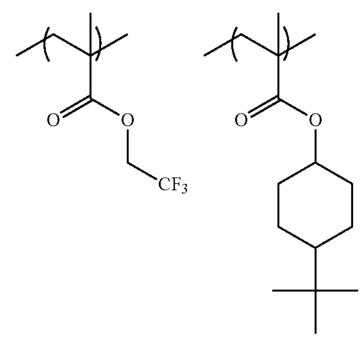
(HR-20)
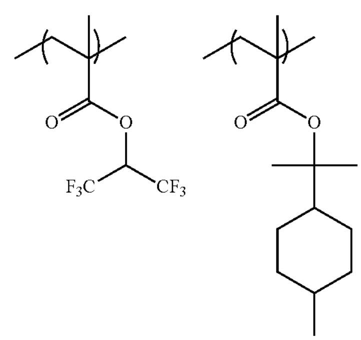
(HR-21)
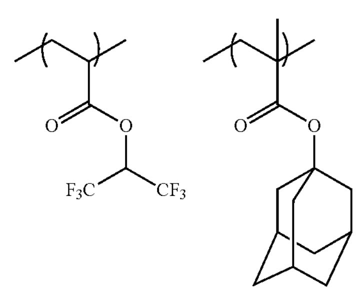

-continued (HR-22)

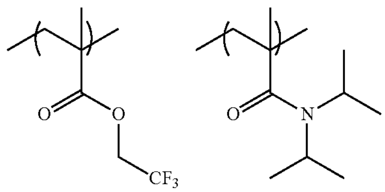

(HR-23)

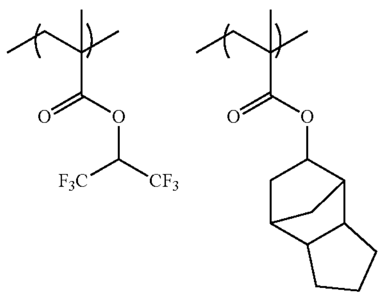

(HR-24)

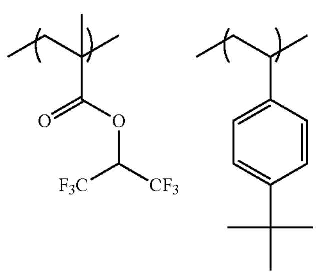

(HR-25)

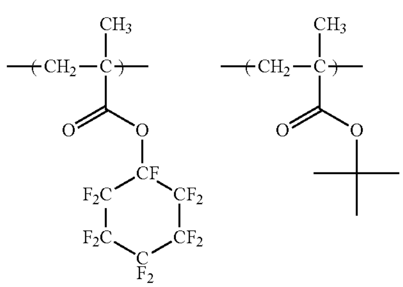

(HR-26)

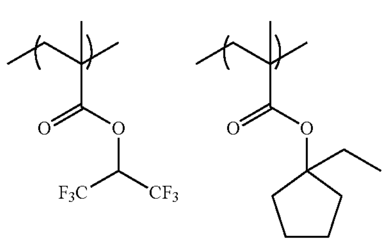

-continued (HR-27)

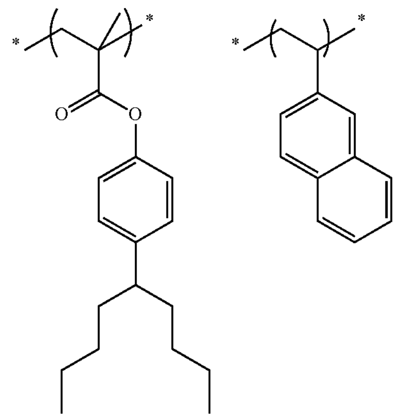

(HR-28)

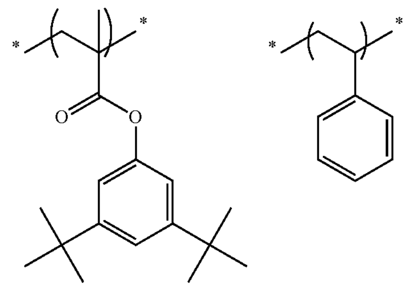

As the hydrophobic resin, in addition, those described in JP-A-2011-248019, JP-A-2010-175859 and JP-A-2012-032544 may be also preferably used.

[8] Surfactant

The composition of the present invention may further contain a surfactant. By virtue of containing a surfactant, when an exposure light source having a wavelength of 250 nm or less, particularly 220 nm or less, is used, a pattern with good sensitivity, resolution and adherence as well as less development defects can be formed.

As the surfactant, it is particularly preferred to use fluorine-containing and/or silicon-containing surfactants.

Examples of the fluorine-containing and/or silicon-containing surfactants include surfactants described in paragraph [0276] of U.S. Patent Application Publication 2008/0248425. There may be also used EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by DIC Corporation); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). Incidentally, Polysiloxane Polymer KP-341 (produced by Shin-Etsu Chemical Co., Ltd.) may be also used as the silicon-containing surfactant.

In addition to these known surfactants, the surfactant may be also synthesized by using a fluoro-aliphatic compound produced by a telomerization process (also called a telomer process) or an oligomerization process (also called an oligomer process). Specifically, a fluoro-aliphatic group-containing polymer derived from the fluoro-aliphatic compound may be used as the surfactant. The fluoro-aliphatic compound can be synthesized, for example, by the method described in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly (oxyethylene) group, a poly(oxypropylene) group, and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be also a ternary or higher copolymer obtained by simultaneously copolymerizing, for example, two or more different fluoro-aliphatic group-containing monomers and two or more different (poly(oxyalkylene)) acrylates or methacrylates.

Examples thereof include, as the commercially available surfactant, Megaface F178, F-470, F-473, F-475, F-476 and F-472 (produced by DIC Corporation) and further include a copolymer of a $C_6F_{13}$ group-containing acrylate or methacrylate with a (poly(oxyalkylene)) acrylate or methacrylate, a copolymer of a $C_6F_{13}$ group-containing acrylate or methacrylate with a (poly(oxyethylene)) acrylate or methacrylate and a (poly(oxypropylene))acrylate or methacrylate, a copolymer of a $C_8F_{17}$ group-containing acrylate or methacrylate with a (poly(oxyalkylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

Surfactants other than the fluorine-containing and/or silicon-containing surfactants, described in paragraph [0280] of U.S. Patent Application Publication No. 2008/0248425, may be also used.

As for these surfactants, one kind may be used alone, or two or more kinds may be used in combination.

In the case where the composition of the present invention contains a surfactant, the content of the surfactant is preferably from 0 to 2 mass %, more preferably from 0.0001 to 2 mass %, still more preferably from 0.0005 to 1 mass %, based on the total solid content of the composition.

[9] Other Additives

The composition of the present invention may appropriately contain, in addition to the components described above, a carboxylic acid, an onium carboxylate, a dissolution inhibiting compound having a molecular weight of 3,000 or less described, for example, in *Proceeding of SPIE,* 2724, 355 (1996), a dye, a plasticizer, a photosensitizer, a light absorber, an antioxidant and the like.

In particular, a carboxylic acid is suitably used for enhancing the performance. The carboxylic acid is preferably an aromatic carboxylic acid such as benzoic acid and naphthoic acid.

The content of the carboxylic acid is preferably from 0.01 to 10 mass %, more preferably from 0.01 to 5 mass %, still more preferably from 0.01 to 3 mass %, based on the total solid content concentration of the composition.

From the standpoint of enhancing the resolution, the actinic ray-sensitive or radiation-sensitive resin composition of the present invention is preferably used in a film thickness of 10 to 250 nm, more preferably from 20 to 200 nm, still more preferably from 30 to 100 nm. Such a film thickness can be achieved by setting the solid content concentration in the composition to an appropriate range, thereby imparting an appropriate viscosity and enhancing the coatability and film-forming property.

The solid content concentration in the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that probably thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution, and coating the filtrate on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[10] Pattern Forming Method

The present invention relates to an actinic ray-sensitive or radiation-sensitive film (hereinafter, sometimes referred to as "resist film") formed using the above-described composition of the present invention.

The pattern forming method of the present invention preferably includes at least:

(i) a step of forming a film (resist film) from the actinic ray-sensitive or radiation-sensitive resin composition, (ii) a step of exposing the film, and (iii) a step of performing development by using a developer.

The developer in the step (iii) may be an organic solvent-containing developer or an alkali developer.

Specifically, the pattern forming method of the present invention may include:

(i) a step of forming a film (resist film) from the actinic ray-sensitive or radiation-sensitive resin composition, (ii) a step of exposing the film, and (iii) a step of developing the exposed film by using an organic solvent-containing developer to form a negative pattern.

The exposure in the step (ii) may be immersion exposure.

The pattern forming method of the present invention preferably includes (iv) a heating step after the exposure step (ii).

The pattern forming method of the present invention may further include (v) a step of performing development by using an alkali developer when the developer in the step (iii) is an organic solvent-containing developer, and on the other hand, may further include (v) a step of performing development by using an organic solvent-containing developer when the developer in the step (iii) is an alkali developer.

In the present invention, a portion of low exposure intensity is removed in the organic solvent development step, and by further performing an alkali development step, a portion of high exposure intensity is also removed. By virtue of a multiple development process of performing development a plurality of times in this way, a pattern can be formed by keeping only the region of intermediate exposure intensity from being dissolved, so that a finer pattern than usual can be formed (the same mechanism as in [0077] of JP-A-2008-292975).

In the pattern forming method of the present invention, the order of the alkali development step and the organic solvent development step is not particularly limited, but the alkali development is preferably performed before the organic solvent development step.

In the pattern forming method of the present invention, the exposure step (ii) may be performed a plurality of times.

In the pattern forming method of the present invention, the heating step (v) may be performed a plurality of times.

The resist film is formed of the above-described actinic ray-sensitive or radiation-sensitive resin composition of the present invention and, more specifically, is preferably formed on a substrate. In the pattern forming method of the present invention, the step of forming a film on a substrate by using the actinic ray-sensitive or radiation-sensitive resin composition, the step of exposing the film, and the development step can be performed by generally known methods.

For example, the composition is coated on such a substrate (e.g., silicon/silicon dioxide-coated substrate, silicon nitride and chromium-deposited quartz substrate) as used in the production of a precision integrated circuit device, an imprint mold or the like, by using a spinner, a coater or the like. Thereafter, the coating is dried, whereby an actinic ray-sensitive or radiation-sensitive film can be formed.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. A commercially available organic antireflection film such as DUV30 Series and DUV-40 Series produced by Brewer Science, Inc. and AR-2, AR-3 and AR-5 produced by Shipley Co., Ltd. may be also used as the organic antireflection film.

The pattern forming method also preferably includes, after film formation, a pre-baking step (PB) before entering the exposure step. It is also preferred to include a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

The reaction in the exposed area is accelerated by the baking and in turn, the sensitivity or pattern profile is improved.

It is also preferred to include a heating step (post baking) after the rinsing step. By the baking, the developer and rinsing solution remaining between patterns as well as in the inside of the pattern are removed.

The actinic ray or radiation includes, for example, infrared light, visible light, ultraviolet light, far ultraviolet light, X-ray, and electron beam. An actinic ray or radiation having, for example, a wavelength of 250 nm or less, particularly 220 nm or less, is preferred. Examples of such an actinic ray or radiation include KrF excimer laser (248 nm), ArF excimer laser (193 nm), $F_2$ excimer laser (157 nm), X-ray, and electron beam. The actinic ray or radiation is preferably, for example, KrF excimer laser, ArF excimer laser, electron beam, X-ray or EUV light, more preferably electron beam, X-ray or EUV light.

In the present invention, the substrate on which the film is formed is not particularly limited, and a substrate generally used in the process of producing a semiconductor such as IC or producing a liquid crystal device or a circuit board such as thermal head or in the lithography of other photofabrication processes, for example, an inorganic substrate such as silicon, SiN, $SiO_2$ and SiN, or a coating-type inorganic substrate such as SOG, can be used. If desired, an organic antireflection film may be formed between the film and the substrate.

In the case where the pattern forming method of the present invention includes a step of performing development by using an alkali developer, the alkali developer which can be used includes, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, tetrapropylammonium hydroxide, tetrabutylammonium hydroxide and benzyltrimethylammonium hydroxide or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be also used after adding thereto a surfactant in an appropriate amount.

After the development or rinsing, a treatment of removing the developer or rinsing solution adhering on the pattern by a supercritical fluid may be performed.

In the case where the pattern forming method of the present invention includes a step of performing development by using an organic solvent-containing developer, as for the developer used in the step (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, 4-methyl-2-pentanol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, anisole, dioxane and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the percentage water content in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the total amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 2-heptanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

The organic developer may contain a basic compound. Specific examples and preferred examples of the basic compound that can be contained in the developer for use in the present invention are the same as those described above for the basic compound that can be contained in the actinic ray-sensitive or radiation-sensitive resin composition.

In the organic developer, a surfactant can be added in an appropriate amount, if desired.

The surfactant is not particularly limited but, for example, ionic or nonionic fluorine-containing and/or silicon-containing surfactants can be used. Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is preferably from 0 to 2 mass %, more preferably from 0.0001 to 2 mass %, still more preferably from 0.0005 to 1 mass %, based on the total amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning a developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

The pattern forming method may include a step of rinsing the film with a rinsing solution after the step of performing development by using an organic solvent-containing developer, but in view of, for example, throughput (productivity) and the amount of rinsing solution used, it does not have to include a step of rinsing the film with a rinsing solution.

The rinsing solution used in the rinsing step after the step of performing development by using an organic solvent-containing developer is not particularly limited as long as it does not dissolve the resist pattern, and a solution containing a general organic solvent may be used. As the rinsing solution, a rinsing solution containing at least one kind of an organic solvent selected from the group consisting of a hydrocarbon-based solvent (preferably decane), a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The percentage water content in the rinsing solution is preferably 10 mass % or less, more preferably 5 mass % or less, still more preferably 3 mass % or less. By setting the percentage water content to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto a surfactant in an appropriate amount.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotation speed of 2,000 to 4,000 rpm. It is also preferred to include a heating step (Post Bake) after the rinsing step. By the baking, the developer and rinsing solution remaining between patterns as well as in the inside of the pattern are removed. The heating step after the rinsing step is performed at usually from 40 to 160° C., preferably from 70 to 95° C., for usually from 10 seconds to 3 minutes, preferably from 30 to 90 seconds.

Also, an imprint mold may be produced using the composition of the present invention. For details, refer to, for example, Japanese Patent 4,109,085, JP-A-2008-162101, and Yoshihiko Hirai (compiler), *Nanoimprint no Kiso to Giiutsu Kaihatsu●Oyo Tenkai-Nanoimprint no Kiban Giiutsu to Saishin no Giiutsu Tenkai* (*Basic and Technology Expansion●Application Development of Nanoimprint-Substrate Technology of Nanoimprint and Latest Technology Expansion*), Frontier Shuppan.

[Usage]

The pattern forming method of the present invention is suitably used for the fabrication of a semiconductor microcircuit, for example, in the production of VLSI or a high-capacity microchip. Incidentally, at the fabrication of a semiconductor microcircuit, the resist film having formed therein a pattern is subjected to circuit formation or etching, and the remaining resist film part is finally removed with a solvent or the like. Therefore, unlike a so-called permanent resist used for a printed board and the like, the resist film derived from the actinic ray-sensitive or radiation-sensitive resin composition of the present invention does not remain in the final product such as microchip.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronics, OA●media equipment, optics and communication equipment).

EXAMPLES

The present invention is described in greater detail below by referring to Examples, but the present invention should not be construed as being limited to these Examples.

Synthesis Example 1

Synthesis of Resin (P-1)

20.0 g of poly(p-hydroxystyrene) (VP-2500, produced by Nippon Soda Co., Ltd.) was dissolved in 80.0 g of propylene glycol monomethyl ether acetate (PGMEA), and 10.3 g of 2-cyclohexylethyl vinyl ether and 20 mg of camphorsulfonic acid were added. The mixture was stirred at room temperature for 2 hours, and 84 mg of triethylamine was added thereto. After stirring for a while, the reaction solution was transferred to a separating funnel containing 100 mL of ethyl acetate, and the organic layer was washed with 50 mL of distilled water three times. The organic layer was then concentrated in an evaporator, and the obtained polymer was dissolved in 300 mL of acetone. This solution was added dropwise and reprecipitated in 3,000 g of hexane, and the precipitate was filtered to obtain 18.3 g of (P-1).

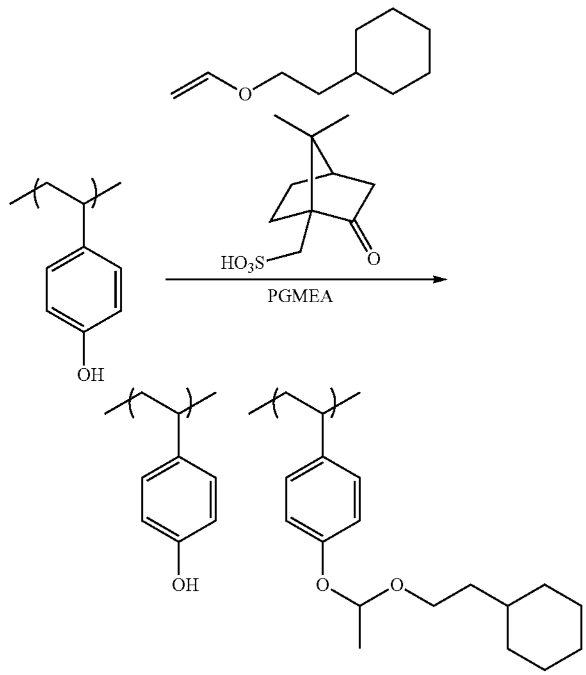

(P-1)

Synthesis Example 2

Synthesis of Resin (P-2)

10.0 g of p-acetoxystyrene was dissolved in 40.0 g of ethyl acetate, and the resulting solution was cooled to 0° C. Subsequently, 4.76 g of sodium methoxide (a 28 mass % methanol solution) was added dropwise over 30 minutes, and the resulting solution was stirred at room temperature for 5 hours. The organic layer was washed with distilled water three times and dried over anhydrous sodium sulfate, and the solvent was removed by distillation to obtain 13.2 g of p-hydroxystyrene (the compound represented by the following formula (1), a 54 mass % ethyl acetate solution). Thereafter, 11.0 g of a 54 mass % ethyl acetate solution of the obtained p-hydroxystyrene (1) (containing 5.9 g of p-hydroxystyrene (1)), 9.4 g of the compound represented by the following formula (2) (produced by KNC Laboratories Co., Ltd.), 2.2 g of the compound represented by the following formula (3) (produced by Daicel Corporation) and 2.3 g of polymerization initiator V-601 (produced by Wako Pure Chemical Industries, Ltd.) were dissolved in 14.2 g of propylene glycol monomethyl ether (PGME). After charging 3.6 g of PGME into a reaction vessel, the solution prepared above was added dropwise at 85° C. over 4 hours in a nitrogen gas atmosphere, and the reaction solution was heated with stirring for 2 hours and then allowed to cool to room temperature. The obtained reaction solution was added dropwise and reprecipitated in 889 g of a mixed solution of hexane/ethyl acetate (8/2 (by mass)), and the precipitate was filtered to obtain 15.5 g of (P-2).

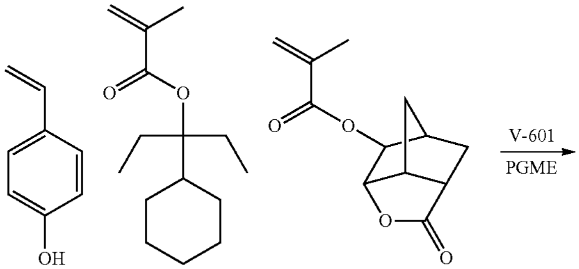

(1) (2) (3)

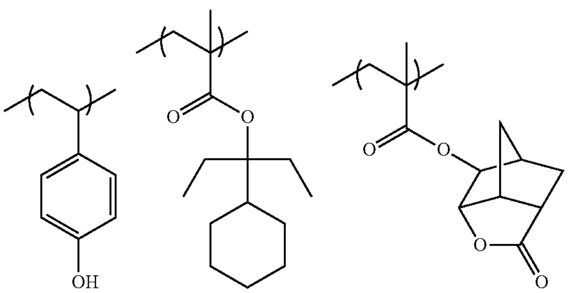

(P-2)

Resins (P-7), (P-8) and (P-11) were synthesized using the same method as that for Resin (P-1), and Resins (P-3) to (P-6), (P-9), (P-10) and (P-12) to (P-14) were synthesized by the same method as that for Resin (P-2). The structure, weight average molecular weight (Mw) and polydispersity (Mw/Mn) of each of the polymers synthesized are shown below. Also, the compositional ratio of respective repeating units in the polymer structure is shown by the molar ratio.

P-1

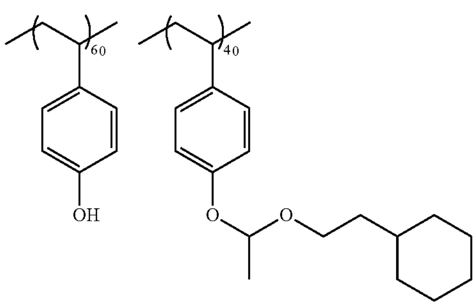

Mw 5500
Mw/Mn 1.20

P-2

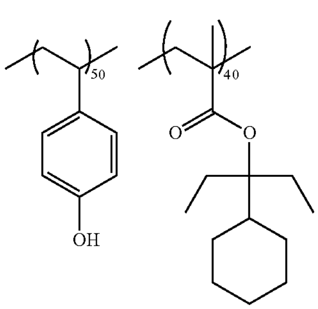

-continued

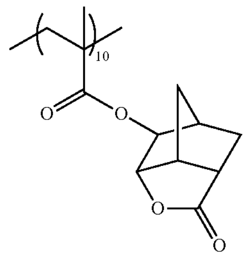

Mw 12400
Mw/Mn 1.62

P-3

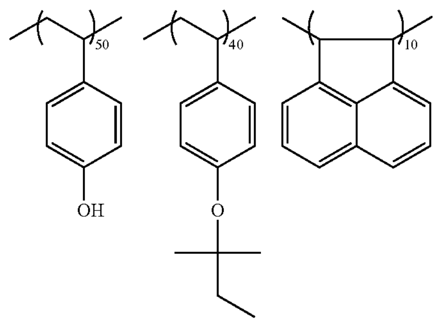

Mw 13500
Mw/Mn 1.61

P-4

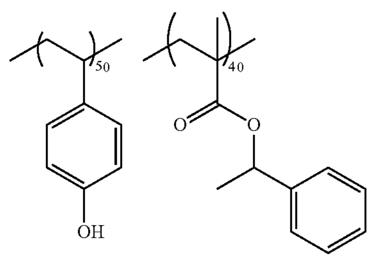

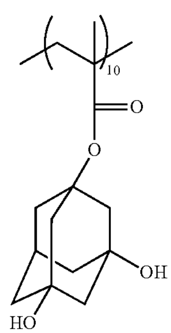

Mw 15400
Mw/Mn 1.72

P-5

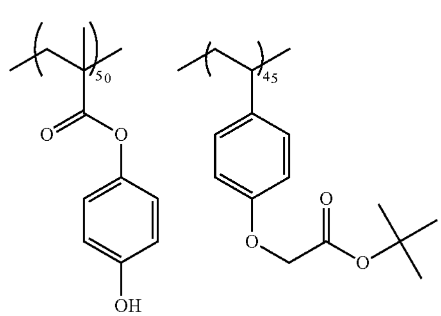

-continued
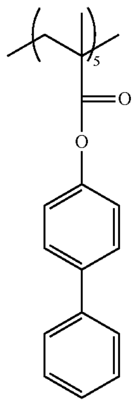
Mw 10500
Mw/Mn 1.81
P-6
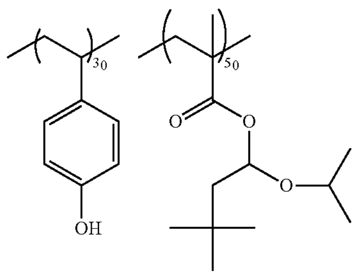
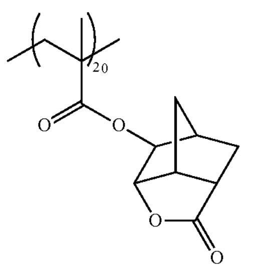
Mw 12000
Mw/Mn 1.52
P-7
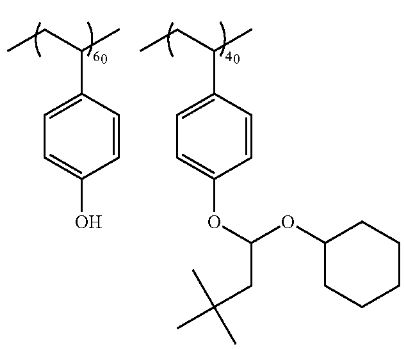
Mw 6100
Mw/Mn 1.18
-continued
P-8
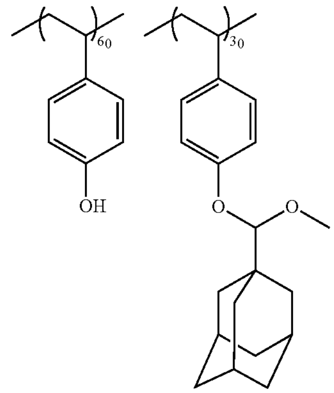
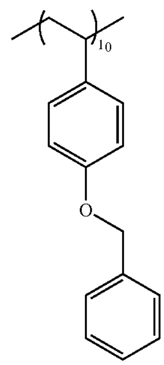
Mw 6900
Mw/Mn 1.21
P-9
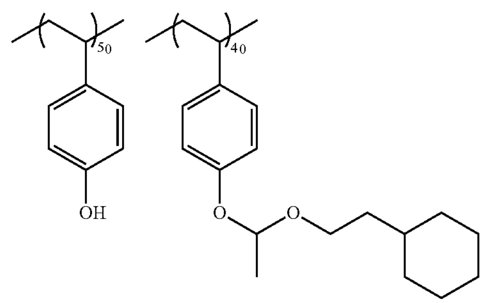
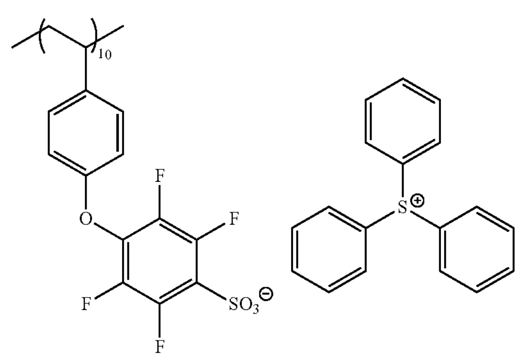
Mw 12200
Mw/Mn 1.79

-continued
P-10
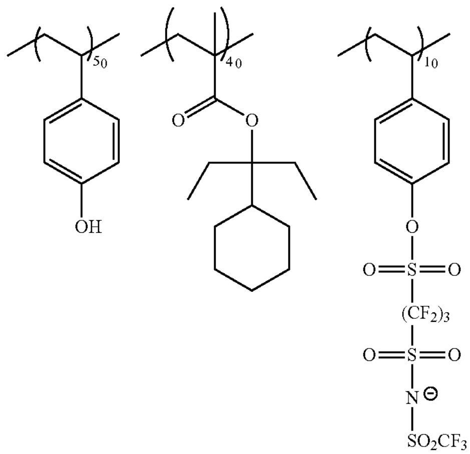
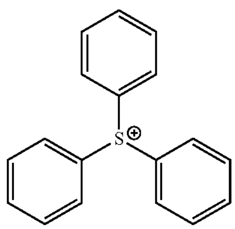
Mw 12200
Mw/Mn 1.79
P-11
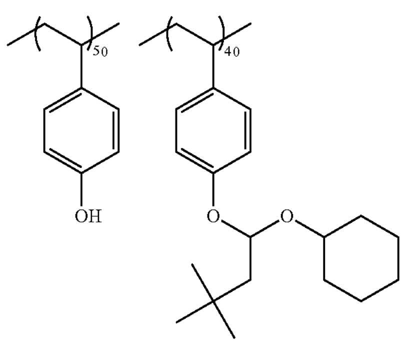
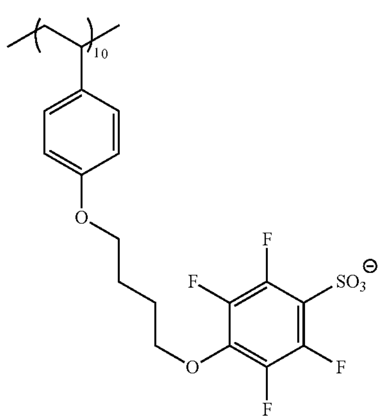
-continued
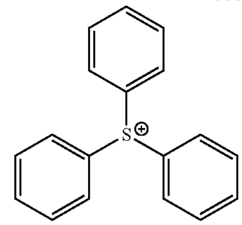
Mw 7200
Mw/Mn 1.21
P-12
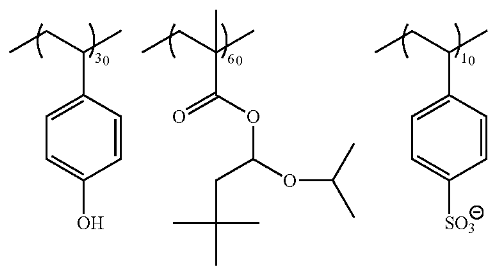
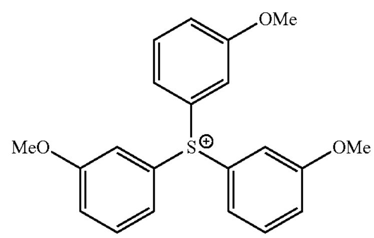
Mw 13000
Mw/Mn 1.82
P-13
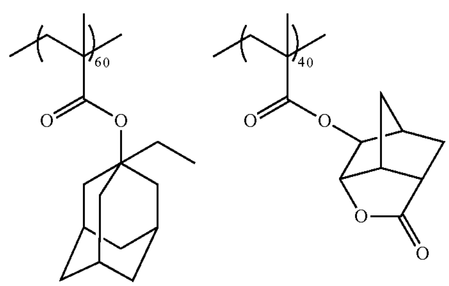
Mw 13200
Mw/Mn 1.71
P-14
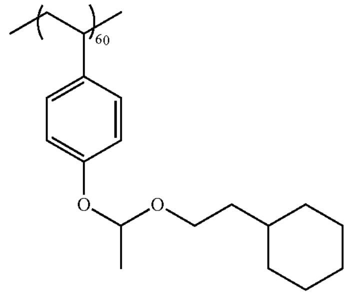

-continued

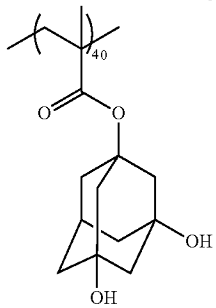

Mw 15000
Mw/Mn 1.78

Synthesis Example 3

Synthesis of Basic Compound (B-01)

To 14.9 g of tetramethylammonium hydroxide (a 25% methanol solution), 5.0 g of benzoic acid was added. The mixture was stirred at room temperature for 1 hour, and the reaction solution was concentrated in an evaporator to obtain 8.0 g of (B-01).

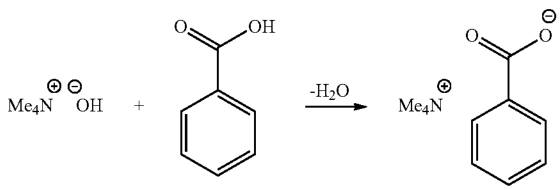

(B-01)

The following basic compounds were synthesized using the same method as that for Basic Compound (B-01).

B-05

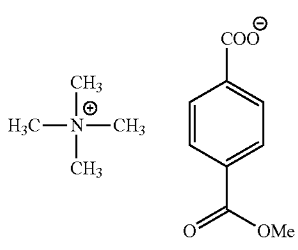

B-08

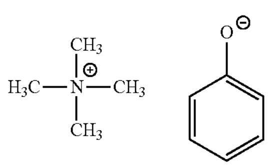

B-24

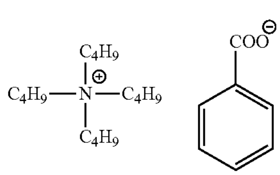

-continued

B-30

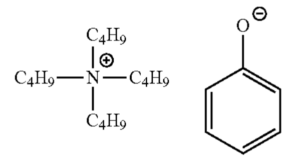

B-32

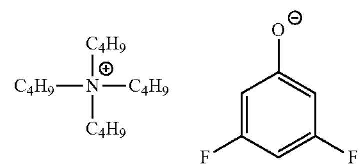

B-46

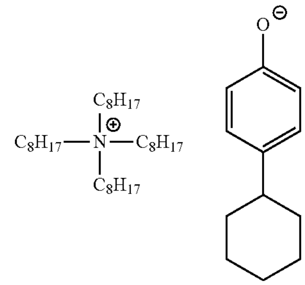

B-52

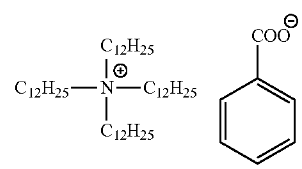

B-59

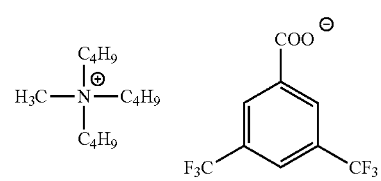

B-68

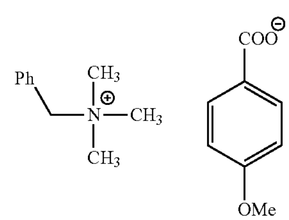

The structure and volume value of each of acid generators used in Examples are shown below. Incidentally, the computed value is a volume value of an acid in which a proton is bonded to the anion moiety.

(z1)

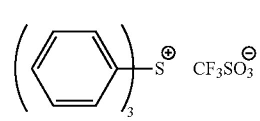

$131 Å^3$

-continued
(z5)
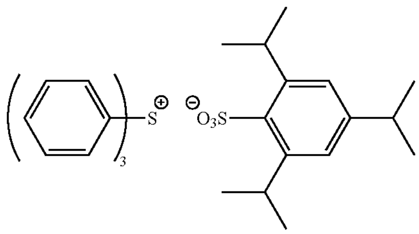
303Å³
(z22)
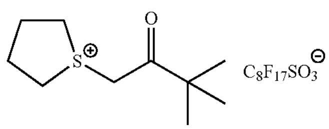
318Å³
(z121)
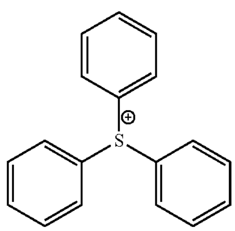
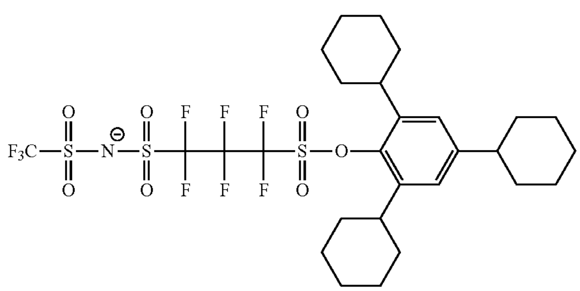
585Å³
(z4)
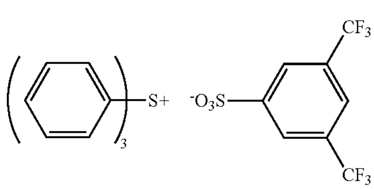
213Å³
(z112)
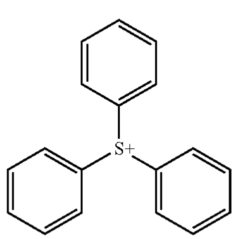
-continued
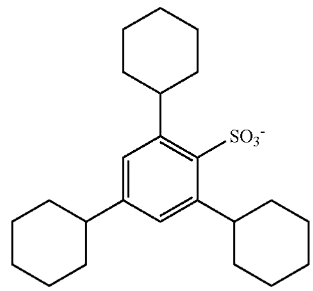
437Å³
(z113)
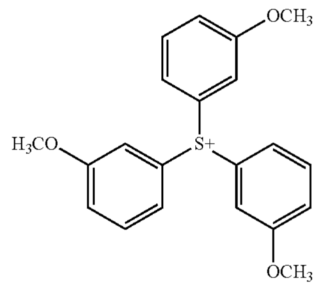
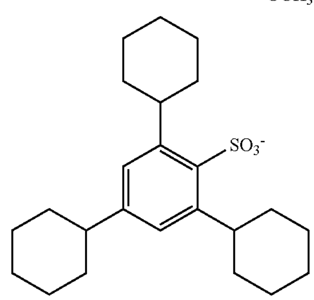
437Å³
(z117)
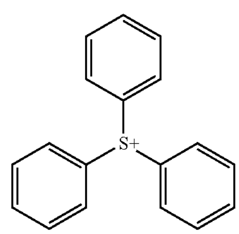
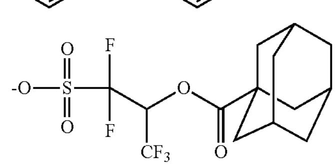
291Å³
(z123)
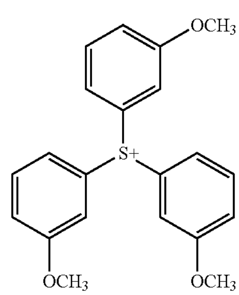

-continued

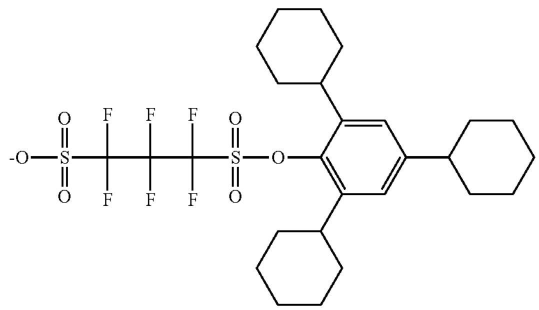

535Å3

(z126)

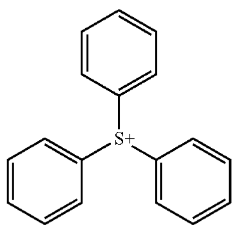

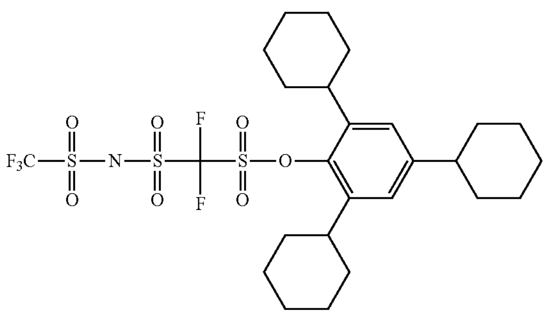

554Å3

(z128)

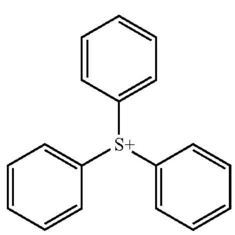

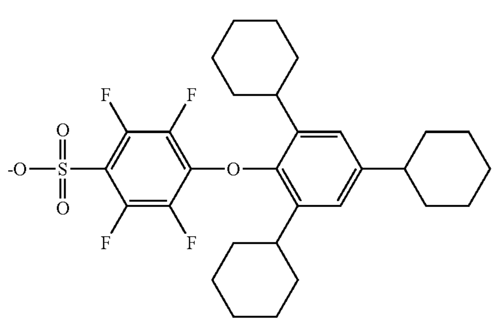

585Å3

-continued (z129)

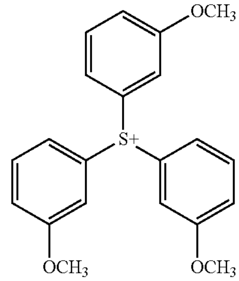

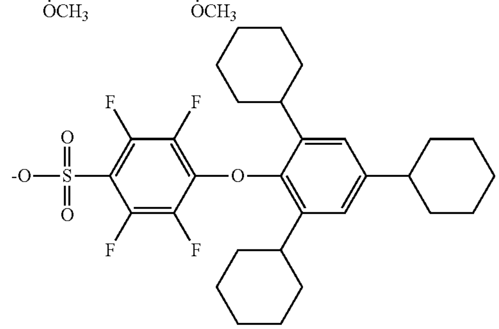

585Å3

Solvent:
S1: PGMEA (b.p.=146° C.)
S2: PGME (b.p.=120° C.)
S3: Cyclohexanone (b.p.=157° C.)
S4: γ-Butyrolactone
Surfactant:
W-1: Megaface R08 (produced by DIC Corporation; containing fluorine and silicon)
W-2: Polysiloxane Polymer KP-341 (produced by Shin-Etsu Chemical Co., Ltd.; silicon-containing)
W-3: Troysol S-366 (produced by Troy Chemical; fluorine-containing)
W-4: PF6320 (produced by OMNOVA; fluorine-containing)
Developer●Rinsing Solution:
G-1: Butyl acetate
G-2: 2-Heptanone
G-3: Anisole
G-4: 4-Methyl-2-pentanol
G-5: 1-Hexanol
G-6: Decane
Basic Compound of Comparative Example

B-91

$(C_4H_9)_4N^{\oplus}\ {}^{\ominus}OH$

B-92

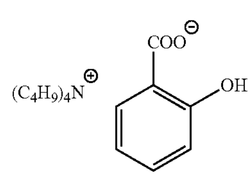

B-93

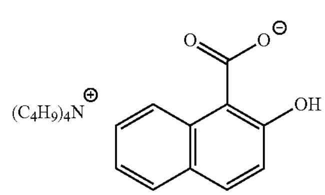

-continued

B-94

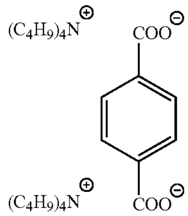

B-95

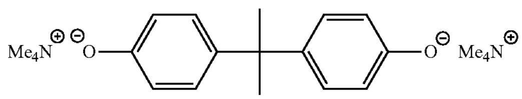

Examples 1-1 to 1-17 and Comparative Examples 101 to 106

Electron Beam EB Exposure (Alkali Development, Positive)

(1) Preparation and Coating of Coating Solution of Actinic Ray-Sensitive or Radiation-Sensitive Resin Composition A coating solution composition according to the formulation shown in the Table below was microfiltered through a membrane filter having a pore size of 0.1 μm to obtain an actinic ray-sensitive or radiation-sensitive resin composition (resist composition) solution (solid content concentration: 1.5 mass %).

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 100 nm.

(2) EB Exposure and Development

The resist film-coated wafer obtained in (1) above was patternwise irradiated by using an electron beam lithography apparatus (HL750, manufactured by Hitachi, Ltd., accelerating voltage: 50 KeV). At this time, the lithography was performed to form a 1:1 line-and-space pattern. After the electron beam lithography, the wafer was heated on a hot plate at 110° C. for 60 seconds, then immersed using an aqueous 2.38 mass % tetramethylammonium hydroxide (TMAH) solution for 60 seconds, rinsed with water for 30 seconds and dried.

(3) Evaluation of Resist Pattern

Using a scanning electron microscope (S-9220, manufacture by Hitachi Ltd.), the obtained resist pattern was evaluated for sensitivity, resolution, pattern profile and scum by the following methods. The results obtained are shown in the Table below.

(3-1) Sensitivity

The irradiation energy for resolving the 1:1 line-and-space pattern with a line width of 100 nm was taken as the sensitivity (Eop). A smaller value indicates higher performance.

(3-2) Resolution

The minimum line width below which a line and a space of the line-and-space pattern (1:1) are not separated at the Eop above was taken as the resolution. A smaller value indicates higher performance.

(3-3) Evaluation of Scum

The cross-section of the 1:1 line-and-space pattern with a line width of 100 nm at the irradiation dose giving the sensitivity above was observed using a scanning electron microscope (S-4300, manufacture by Hitachi Ltd.), and the presence or absence of scum was evaluated on a scale of two grades of A and B. The criteria for evaluation are as follows.

A: Scum was not observed with an eye.

B: Scum was observed with an eye.

(3-4) Evaluation of Pattern Profile

The cross-sectional profile of the 1:1 line-and-space pattern with a line width of 100 nm at the irradiation dose giving the above-described sensitivity was observed using a scanning electron microscope (S-4300, manufacture by Hitachi Ltd.) and evaluated on a scale of three grades of rectangular, tapered and reverse tapered.

The evaluation results are shown in Table 2 below.

TABLE 2

Evaluation Results in EB Exposure (alkali development, positive)

| | Resin | Concentration | Acid Generator | Concentration | Basic Compound | Concentration | Organic Solvent |
|---|---|---|---|---|---|---|---|
| Example 1-1 | P-1 | 77.95 | z4 | 20 | B-01 | 2 | S1/S2 |
| Example 1-2 | P-1 | 77.95 | z112 | 20 | B-01 | 2 | S1/S2 |
| Example 1-3 | P-2 | 77.95 | z128 | 20 | B-01 | 2 | S1/S2 |
| Example 1-4 | P-9 | 97.95 | none | | B-01 | 2 | S1/S3 |
| Example 1-5 | P-4 | 77.95 | z121 | 20 | B-05 | 2 | S1/S2 |
| Example 1-6 | P-8 | 78.40 | z112 | 20 | B-05 | 1.6 | S1/S2/S3 |
| Example 1-7 | P-1 | 77.95 | z112 | 20 | B-08 | 2 | S1/S2 |
| Example 1-8 | P-10 | 97.95 | none | | B-08 | 2 | S1/S2 |
| Example 1-9 | P-7 | 77.95 | z113 | 20 | B-24 | 2 | S1/S2 |
| Example 1-10 | P-11 | 97.95 | none | | B-24 | 2 | S1/S4 |
| Example 1-11 | P-2 | 66.95 | z126 | 30 | B-24 | 3 | S1/S2 |
| Example 1-12 | P-8 | 77.95 | z112 | 20 | B-30 | 2 | S1/S2 |
| Example 1-13 | P-2 | 65.95 | z129 | 30 | B-32 | 4 | S1/S2 |
| Example 1-14 | P-1 | 77.95 | z112 | 20 | B-46 | 2 | S1/S2 |
| Example 1-15 | P-1 | 77.95 | z113 | 20 | B-52 | 2 | S1/S2 |
| Example 1-16 | P-5 | 77.95 | z117 | 20 | B-59 | 2 | S1/S2 |
| Example 1-17 | P-3 | 77.95 | z123 | 20 | B-68 | 2 | S1/S2 |
| Comparative Example 101 | P-1 | 77.95 | z4 | 20 | B-91 | 2 | S1/S2 |
| Comparative Example 102 | P-13 | 77.95 | z22 | 20 | B-91 | 2 | S1/S2 |
| Comparative Example 103 | P-14 | 77.95 | z112 | 20 | B-01 | 2 | S1/S2 |

TABLE 2-continued

Evaluation Results in EB Exposure (alkali development, positive)

| | | | | | | | |
|---|---|---|---|---|---|---|---|
| Comparative Example 104 | P-1 | 77.95 | z1 | 20 | B-93 | 2 | S1/S2 |
| Comparative Example 105 | P-10 | 77.95 | z5 | 20 | B-94 | 2 | S1/S2 |
| Comparative Example 106 | P-8 | 77.95 | z123 | 20 | B-95 | 2 | S1/S2 |

| | Mass Ratio | Surfactant (mass ratio) | Concentration | Sensitivity (μC/cm$^2$) | Resolution (nm) | Pattern Profile | Scum |
|---|---|---|---|---|---|---|---|
| Example 1-1 | 40/60 | W-1 | 0.05 | 33.0 | 60 | rectangular | A |
| Example 1-2 | 40/60 | W-2 | 0.05 | 34.0 | 55 | rectangular | A |
| Example 1-3 | 40/60 | W-1 | 0.05 | 35.0 | 60 | rectangular | A |
| Example 1-4 | 40/60 | W-1 | 0.05 | 33.5 | 55 | rectangular | A |
| Example 1-5 | 40/60 | W-2 | 0.05 | 35.0 | 65 | rectangular | A |
| Example 1-6 | 30/60/10 | none | | 32.0 | 55 | rectangular | A |
| Example 1-7 | 40/60 | W-1 | 0.05 | 30.0 | 55 | rectangular | A |
| Example 1-8 | 40/60 | W-4 | 0.05 | 31.0 | 60 | rectangular | A |
| Example 1-9 | 40/60 | W-1 | 0.05 | 30.0 | 50 | rectangular | A |
| Example 1-10 | 40/60 | W-1 | 0.05 | 32.0 | 50 | rectangular | A |
| Example 1-11 | 40/60 | W-2 | 0.05 | 28.0 | 55 | rectangular | A |
| Example 1-12 | 40/60 | W-1/W-2 (1/1) | 0.05 | 34.5 | 55 | rectangular | A |
| Example 1-13 | 40/60 | W-3 | 0.05 | 35.0 | 60 | rectangular | A |
| Example 1-14 | 40/60 | W-1 | 0.05 | 33.5 | 65 | rectangular | A |
| Example 1-15 | 40/60 | W-1 | 0.05 | 33.0 | 70 | rectangular | A |
| Example 1-16 | 40/60 | W-1 | 0.05 | 34.5 | 60 | rectangular | A |
| Example 1-17 | 40/60 | W-1 | 0.05 | 33.0 | 65 | rectangular | A |
| Comparative Example 101 | 40/60 | W-1 | 0.05 | 35.5 | 75 | tapered | B |
| Comparative Example 102 | 40/60 | W-1 | 0.05 | 36.0 | 80 | tapered | B |
| Comparative Example 103 | 40/60 | W-1 | 0.05 | 35.5 | 90 | tapered | B |
| Comparative Example 104 | 40/60 | W-1 | 0.05 | 37.0 | not resolved | | |
| Comparative Example 105 | 40/60 | W-1 | 0.05 | 38.0 | 85 | tapered | B |
| Comparative Example 106 | 40/60 | W-1 | 0.05 | 42.0 | 85 | tapered | B |

The concentration of each component indicates the concentration (mass %) based on the total solid content concentration.

As seen from Table 2, in Examples 1-1 to 1-17, high sensitivity, high resolution, good pattern profile and scum reduction could be simultaneously satisfied, as compared with Comparative Examples 101 to 106 not using a compound represented by formula (2).

Examples 2-1 to 2-17 and Comparative Examples 201 to 206

Electron Beam EB Exposure (Organic Solvent Development, Negative)

Preparation of actinic ray-sensitive or radiation-sensitive resin compositions and Pattern formation were performed in the same manner as in Example 1-1 except for changing the formulation as shown in the Table below, replacing the aqueous alkali solution (TMAH; an aqueous 2.38 mass % tetramethylammonium hydroxide solution) in the development by the organic developer shown in the Table below, and replacing water in the rinsing by the rinsing solution shown in the Table below. Incidentally, in the Table below, "none" in the column of Rinsing Solution indicates that rinsing was not performed in those Examples.

Evaluation of Resist Pattern:

Using a scanning electron microscope (S-9220, manufacture by Hitachi Ltd.), the obtained resist pattern was evaluated for sensitivity, resolution, pattern profile and scum by the same methods as in Examples 1-1 to 1-17 and Comparative Examples 101 to 106. The results obtained are shown in Table 3 below.

TABLE 3

Evaluation Results in EB Exposure (solvent development, negative)

| | Resin | Concentration | Acid Generator | Concentration | Basic Compound | Concentration | Organic Solvent | Mass Ratio |
|---|---|---|---|---|---|---|---|---|
| Example 2-1 | P-1 | 77.95 | z4 | 20 | B-01 | 2 | S1/S2 | 40/60 |
| Example 2-2 | P-6 | 77.95 | z112 | 20 | B-01 | 2 | S1/S2 | 40/60 |
| Example 2-3 | P-2 | 77.95 | z128 | 20 | B-01 | 2 | S1/S2 | 40/60 |
| Example 2-4 | P-9 | 97.95 | none | | B-01 | 2 | S1/S3 | 40/60 |
| Example 2-5 | P-4 | 77.95 | z121 | 20 | B-05 | 2 | S1/S2 | 40/60 |
| Example 2-6 | P-8 | 78.40 | z112 | 20 | B-05 | 1.6 | S1/S2/S3 | 30/60/10 |

TABLE 3-continued

Evaluation Results in EB Exposure (solvent development, negative)

| | | | | | | | | |
|---|---|---|---|---|---|---|---|---|
| Example 2-7 | P-6 | 77.95 | z112 | 20 | B-08 | 2 | S1/S2 | 40/60 |
| Example 2-8 | P-10 | 97.95 | none | | B-08 | 2 | S1/S2 | 40/60 |
| Example 2-9 | P-6 | 77.95 | z113 | 20 | B-24 | 2 | S1/S2 | 40/60 |
| Example 2-10 | P-12 | 97.95 | none | | B-24 | 2 | S1/S3 | 40/60 |
| Example 2-11 | P-2 | 66.95 | z126 | 30 | B-24 | 3 | S1/S2 | 40/60 |
| Example 2-12 | P-8 | 78.00 | z112 | 20 | B-30 | 2 | S1/S2 | 40/60 |
| Example 2-13 | P-2 | 65.95 | z129 | 30 | B-32 | 4 | S1/S2 | 40/60 |
| Example 2-14 | P-1 | 77.95 | z112 | 20 | B-46 | 2 | S1/S2 | 40/60 |
| Example 2-15 | P-1 | 77.95 | z113 | 20 | B-52 | 2 | S1/S2 | 40/60 |
| Example 2-16 | P-5 | 77.95 | z117 | 20 | B-59 | 2 | S1/S2 | 40/60 |
| Example 2-17 | P-3 | 77.95 | z123 | 20 | B-68 | 2 | S1/S2 | 40/60 |
| Comparative Example 201 | P-1 | 77.95 | z4 | 20 | B-91 | 2 | S1/S2 | 40/60 |
| Comparative Example 202 | P-13 | 77.95 | z22 | 20 | B-91 | 2 | S1/S2 | 40/60 |
| Comparative Example 203 | P-14 | 77.95 | z112 | 20 | B-92 | 2 | S1/S2 | 40/60 |
| Comparative Example 204 | P-1 | 77.95 | z1 | 20 | B-93 | 2 | S1/S2 | 40/60 |
| Comparative Example 205 | P-10 | 77.95 | z5 | 20 | B-94 | 2 | S1/S2 | 40/60 |
| Comparative Example 206 | P-8 | 77.95 | z123 | 20 | B-95 | 2 | S1/S2 | 40/60 |

| | Surfactant | Concentration | Developer | Rinsing Solution | Sensitivity ($\mu C/cm^2$) | Resolution (nm) | Pattern Profile | Scum |
|---|---|---|---|---|---|---|---|---|
| Example 2-1 | W-1 | 0.05 | G-1 | none | 32.0 | 70 | rectangular | A |
| Example 2-2 | W-2 | 0.05 | G-1 | G-5 | 34.0 | 65 | rectangular | A |
| Example 2-3 | W-1 | 0.05 | G-1 | G-5 | 35.0 | 70 | rectangular | A |
| Example 2-4 | W-1 | 0.05 | G-1 | none | 34.0 | 65 | rectangular | A |
| Example 2-5 | W-2 | 0.05 | G-1 | G-6 | 35.0 | 75 | rectangular | A |
| Example 2-6 | none | | G-3 | none | 32.0 | 65 | rectangular | A |
| Example 2-7 | W-1 | 0.05 | G-1 | none | 31.0 | 65 | rectangular | A |
| Example 2-8 | W-4 | 0.05 | G-1 | G-5 | 30.0 | 70 | rectangular | A |
| Example 2-9 | W-1 | 0.05 | G-1 | none | 30.0 | 60 | rectangular | A |
| Example 2-10 | W-1 | 0.05 | G-1 | none | 32.0 | 60 | rectangular | A |
| Example 2-11 | W-2 | 0.05 | G-1 | none | 28.0 | 65 | rectangular | A |
| Example 2-12 | none | | G-2 | G-5 | 35.0 | 65 | rectangular | A |
| Example 2-13 | W-3 | 0.05 | G-1 | G-5 | 35.0 | 70 | rectangular | A |
| Example 2-14 | W-1 | 0.05 | G-4 | G-5 | 35.0 | 75 | rectangular | A |
| Example 2-15 | W-1 | 0.05 | G-1 | none | 33.0 | 80 | rectangular | A |
| Example 2-16 | W-1 | 0.05 | G-1 | none | 34.0 | 70 | rectangular | A |
| Example 2-17 | W-1 | 0.05 | G-1 | G-6 | 33.0 | 75 | rectangular | A |
| Comparative Example 201 | W-1 | 0.05 | G-1 | none | 36.0 | 90 | reverse tapered | B |
| Comparative Example 202 | W-1 | 0.05 | G-1 | none | 36.0 | 100 | reverse tapered | B |
| Comparative Example 203 | W-1 | 0.05 | G-1 | G-5 | 36.0 | 95 | reverse tapered | B |
| Comparative Example 204 | W-1 | 0.05 | G-1 | none | 37.0 | not resolved | | |
| Comparative Example 205 | W-1 | 0.05 | G-1 | G-5 | 38.0 | not resolved | | |
| Comparative Example 206 | W-1 | 0.05 | G-1 | none | 42.0 | 90 | reverse tapered | B |

The concentration of each component indicates the concentration (mass %) based on the total solid content concentration.

As seen from Table 3, in Examples 2-1 to 2-17, high sensitivity, high resolution, good pattern profile and scum reduction could be simultaneously satisfied, as compared with Comparative Examples 201 to 206 not containing an ionic compound represented by formula (2).

Examples 3-1 to 3-13 and Comparative Examples 301 to 303

EUV Exposure (Alkali Development, Positive)

(1) Preparation and Coating of Coating Solution of Actinic Ray-Sensitive or Radiation-Sensitive Resin Composition A coating solution composition according to the formulation shown in the Table below was microfiltered through a membrane filter having a pore size of 0.05 μm to obtain an actinic ray-sensitive or radiation-sensitive resin composition (resist composition) solution (solid content concentration: 1.5 mass %).

This actinic ray-sensitive or radiation-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(2) EUV Exposure and Development

The resist film-coated wafer obtained in (1) above was patternwise exposed by using an EUV exposure apparatus (Micro Exposure Tool, manufactured by Exitech, NA: 0.3, Quadrupole, outer sigma: 0.68, inner sigma: 0.36) through an exposure mask (line/space=1/1). After the irradiation, the resist film was heated on a hot plate at 110° C. for 60 seconds, then immersed using an aqueous 2.38 mass % tetramethylammonium hydroxide (TMAH) solution for 60 seconds, rinsed with water for 30 seconds and dried to obtain a resist pattern that is a 1:1 line-and-space pattern with a line width of 50 nm.

(3) Evaluation of Resist Pattern

Using a scanning electron microscope (S-9380II, manufacture by Hitachi Ltd.), the obtained resist pattern was evaluated for sensitivity, resolution, pattern profile and scum by the following methods. The results obtained are shown in the Table below.

(3-1) Sensitivity

The irradiation energy for resolving the 1:1 line-and-space pattern with a line width of 50 nm was taken as the sensitivity (Eop). A smaller value indicates higher performance.

(3-2) Resolution

The minimum line width below which a line and a space of the line-and-space pattern (1:1) are not separated at the Eop above was taken as the resolution. A smaller value indicates higher performance.

(3-3) Evaluation of Scum

The cross-section of the 1:1 line-and-space pattern with a line width of 50 nm at the irradiation dose giving the sensitivity above was observed using a scanning electron microscope (S-4300, manufacture by Hitachi Ltd.), and the presence or absence of scum was evaluated on a scale of two grades of A and B.

A: Scum was not observed with an eye.

B: Scum was observed with an eye.

(3-4) Evaluation of Pattern Profile

The cross-sectional profile of the 1:1 line-and-space pattern with a line width of 50 nm at the irradiation dose giving the above-described sensitivity was observed using a scanning electron microscope (S-4300, manufacture by Hitachi Ltd.) and evaluated on a scale of three grades of rectangular, tapered and reverse tapered.

The evaluation results are shown in Table 4 below.

TABLE 4

Evaluation Results in EUV Exposure (alkali development, positive)

| | Resin | Concentration | Acid Generator | Concentration | Basic Compound | Concentration | Organic Solvent |
|---|---|---|---|---|---|---|---|
| Example 3-1 | P-1 | 77.95 | z4 | 20 | B-01 | 2 | S1/S2 |
| Example 3-2 | P-1 | 77.95 | z112 | 20 | B-01 | 2 | S1/S2 |
| Example 3-3 | P-9 | 97.95 | none | | B-01 | 2 | S1/S3 |
| Example 3-4 | P-4 | 77.95 | z121 | 20 | B-05 | 2 | S1/S2 |
| Example 3-5 | P-8 | 78.40 | z112 | 20 | B-05 | 1.6 | S1/S2/S3 |
| Example 3-6 | P-1 | 77.95 | z112 | 20 | B-08 | 2 | S1/S2 |
| Example 3-7 | P-10 | 97.95 | none | | B-08 | 2 | S1/S2 |
| Example 3-8 | P-7 | 77.95 | z113 | 20 | B-24 | 2 | S1/S2 |
| Example 3-9 | P-11 | 97.95 | none | | B-24 | 2 | S1/S3 |
| Example 3-10 | P-2 | 66.95 | z126 | 30 | B-24 | 3 | S1/S2 |
| Example 3-11 | P-8 | 77.95 | z112 | 20 | B-30 | 2 | S1/S2 |
| Example 3-12 | P-2 | 65.95 | z129 | 30 | B-32 | 4 | S1/S2 |
| Example 3-13 | P-1 | 77.95 | z113 | 20 | B-52 | 2 | S1/S2 |
| Comparative Example 301 | P-1 | 77.95 | z5 | 20 | B-91 | 2 | S1/S2 |
| Comparative Example 302 | P-13 | 77.95 | z1 | 20 | B-91 | 2 | S1/S2 |
| Comparative Example 303 | P-14 | 77.95 | z123 | 20 | B-92 | 2 | S1/S2 |

| | Mass Ratio | Surfactant (mass ratio) | Concentration | Sensitivity ($mJ/cm^2$) | Resolution (nm) | Pattern Profile | Scum |
|---|---|---|---|---|---|---|---|
| Example 3-1 | 40/60 | W-1 | 0.05 | 25.0 | 25 | rectangular | A |
| Example 3-2 | 40/60 | W-2 | 0.05 | 24.0 | 22 | rectangular | A |
| Example 3-3 | 40/60 | W-1 | 0.05 | 23.5 | 23 | rectangular | A |
| Example 3-4 | 40/60 | W-2 | 0.05 | 25.5 | 30 | rectangular | A |
| Example 3-5 | 30/60/10 | none | | 21.0 | 23 | rectangular | A |
| Example 3-6 | 40/60 | W-1 | 0.05 | 20.5 | 24 | rectangular | A |
| Example 3-7 | 40/60 | W-4 | 0.05 | 23.5 | 25 | rectangular | A |
| Example 3-8 | 40/60 | W-1 | 0.05 | 20.0 | 20 | rectangular | A |
| Example 3-9 | 40/60 | W-1 | 0.05 | 20.0 | 20 | rectangular | A |
| Example 3-10 | 40/60 | W-2 | 0.05 | 15.0 | 23 | rectangular | A |
| Example 3-11 | 40/60 | W-1/W-2 (1/1) | 0.05 | 20.0 | 23 | rectangular | A |
| Example 3-12 | 40/60 | W-3 | 0.05 | 18.5 | 25 | rectangular | A |
| Example 3-13 | 40/60 | W-1 | 0.05 | 25.0 | 30 | rectangular | A |
| Comparative Example 301 | 40/60 | W-1 | 0.05 | 28.5 | 40 | tapered | B |
| Comparative Example 302 | 40/60 | W-1 | 0.05 | 28.0 | 50 | tapered | B |
| Comparative Example 303 | 40/60 | W-1 | 0.05 | 27.0 | 50 | tapered | B |

The concentration of each component indicates the concentration (mass %) based on the total solid content concentration.

As seen from Table 4, in Examples 3-1 to 3-13, high sensitivity, high resolution, good pattern profile and scum reduction could be simultaneously satisfied, as compared with Comparative Examples 301 to 303 not containing an ionic compound represented by formula (2).

Examples 4-1 to 4-14 and Comparative Examples 401 to 406

EUV Exposure (Organic Solvent Development, Negative)

Preparation of actinic ray-sensitive or radiation-sensitive resin compositions and Pattern formation were performed in the same manner as in Example 3-1 except for changing the formulation as shown in the Table below, replacing the aqueous alkali solution (TMAH; an aqueous 2.38 mass % tetramethylammonium hydroxide solution) in the development by the organic developer shown in the Table below, and replacing water in the rinsing by the rinsing solution shown in the Table below. Incidentally, in the Table below, "none" in the column of Rinsing Solution indicates that rinsing was not performed in those Examples.

Evaluation of Resist Pattern:

Using a scanning electron microscope (S-9380II, manufacture by Hitachi Ltd.), the obtained resist pattern was evaluated for sensitivity, resolution, pattern profile and scum by the same methods as in Examples 3-1 to 1-13. The results obtained are shown in Table 5 below.

TABLE 5

Evaluation Results in EUV Exposure (solvent development, negative)

| | Resin | Concentration | Acid Generator | Concentration | Basic Compound | Concentration | Organic Solvent | Mass Ratio |
|---|---|---|---|---|---|---|---|---|
| Example 4-1 | P-1 | 77.95 | z4 | 20 | B-01 | 2 | S1/S2 | 40/60 |
| Example 4-2 | P-6 | 77.95 | z112 | 20 | B-01 | 2 | S1/S2 | 40/60 |
| Example 4-3 | P-2 | 77.95 | z128 | 20 | B-01 | 2 | S1/S2 | 40/60 |
| Example 4-4 | P-9 | 97.95 | none | | B-01 | 2 | S1/S3 | 40/60 |
| Example 4-5 | P-4 | 77.95 | z121 | 20 | B-05 | 2 | S1/S2 | 40/60 |
| Example 4-6 | P-8 | 78.40 | z112 | 20 | B-05 | 1.6 | S1/S2/S3 | 30/60/10 |
| Example 4-7 | P-6 | 77.95 | z112 | 20 | B-08 | 2 | S1/S2 | 40/60 |
| Example 4-8 | P-10 | 97.95 | none | | B-08 | 2 | S1/S2 | 40/60 |
| Example 4-9 | P-6 | 77.95 | z113 | 20 | B-24 | 2 | S1/S2 | 40/60 |
| Example 4-10 | P-12 | 97.95 | none | | B-24 | 2 | S1/S4 | 40/60 |
| Example 4-11 | P-2 | 66.95 | z126 | 30 | B-24 | 3 | S1/S2 | 40/60 |
| Example 4-12 | P-8 | 78.00 | z112 | 20 | B-30 | 2 | S1/S2 | 40/60 |
| Example 4-13 | P-2 | 65.95 | z129 | 30 | B-32 | 4 | S1/S2 | 40/60 |
| Example 4-14 | P-1 | 77.95 | z112 | 20 | B-46 | 2 | S1/S2 | 40/60 |
| Comparative Example 401 | P-1 | 77.95 | z4 | 20 | B-91 | 2 | S1/S2 | 40/60 |
| Comparative Example 402 | P-13 | 77.95 | z22 | 20 | B-91 | 2 | S1/S2 | 40/60 |
| Comparative Example 403 | P-14 | 77.95 | z112 | 20 | B-92 | 2 | S1/S2 | 40/60 |
| Comparative Example 404 | P-1 | 77.95 | z1 | 20 | B-93 | 2 | S1/S2 | 40/60 |
| Comparative Example 405 | P-10 | 77.95 | z5 | 20 | B-94 | 2 | S1/S2 | 40/60 |
| Comparative Example 406 | P-8 | 77.95 | z123 | 20 | B-95 | 2 | S1/S2 | 40/60 |

| | Surfactant | Concentration | Developer | Rinsing Solution | Sensitivity (μC/cm$^2$) | Resolution (nm) | Pattern Profile | Scum |
|---|---|---|---|---|---|---|---|---|
| Example 4-1 | W-1 | 0.05 | G-1 | none | 25.0 | 30 | rectangular | A |
| Example 4-2 | W-2 | 0.05 | G-1 | G-5 | 26.0 | 28 | rectangular | A |
| Example 4-3 | W-1 | 0.05 | G-1 | G-5 | 24.0 | 30 | rectangular | A |
| Example 4-4 | W-1 | 0.05 | G-1 | none | 25.0 | 28 | rectangular | A |
| Example 4-5 | W-2 | 0.05 | G-1 | G-6 | 27.0 | 35 | rectangular | A |
| Example 4-6 | none | | G-3 | none | 22.0 | 27 | rectangular | A |
| Example 4-7 | W-1 | 0.05 | G-1 | none | 26.0 | 28 | rectangular | A |
| Example 4-8 | W-4 | 0.05 | G-1 | G-5 | 23.0 | 30 | rectangular | A |
| Example 4-9 | W-1 | 0.05 | G-1 | none | 22.0 | 26 | rectangular | A |
| Example 4-10 | W-1 | 0.05 | G-1 | none | 20.0 | 26 | rectangular | A |
| Example 4-11 | W-2 | 0.05 | G-1 | none | 28.0 | 27 | rectangular | A |
| Example 4-12 | none | | G-2 | G-5 | 23.0 | 28 | rectangular | A |
| Example 4-13 | W-3 | 0.05 | G-1 | G-5 | 26.0 | 30 | rectangular | A |
| Example 4-14 | W-1 | 0.05 | G-4 | G-5 | 27.0 | 35 | rectangular | A |
| Comparative Example 401 | W-1 | 0.05 | G-1 | none | 29.0 | 40 | reverse tapered | B |
| Comparative Example 402 | W-1 | 0.05 | G-1 | none | 30.0 | 45 | reverse tapered | B |
| Comparative Example 403 | W-1 | 0.05 | G-1 | G-5 | 32.0 | 50 | reverse tapered | B |
| Comparative Example 404 | W-1 | 0.05 | G-1 | none | 35.0 | | not resolved | |
| Comparative Example 405 | W-1 | 0.05 | G-1 | G-5 | 35.0 | | not resolved | |

TABLE 5-continued

Evaluation Results in EUV Exposure (solvent development, negative)

| | | | | | | | | |
|---|---|---|---|---|---|---|---|---|
| Comparative Example 406 | W-1 | 0.05 | G-1 | none | 29.0 | 50 | reverse tapered | B |

The concentration of each component indicates the concentration (mass %) based on the total solid content concentration.

As seen from Table 5, in Examples 4-1 to 4-14, high sensitivity, high resolution, good pattern profile and scum reduction could be simultaneously satisfied, as compared with Comparative Examples 401 to 406 not containing an ionic compound represented by formula (2).

INDUSTRIAL APPLICABILITY

According to the present invention, a pattern forming method, an actinic ray-sensitive or radiation-sensitive resin composition, a resist film, each simultaneously satisfying high sensitivity, high resolution (such as high resolving power), good pattern profile and scum reduction at a high level, a manufacturing method of an electronic device using the same, and an electronic device, can be provided.

This application is based on a Japanese patent application filed on Sep. 13, 2012 (Japanese Patent Application No. 2012-202082), Japanese patent application filed on May 14, 2013 (Japanese Patent Application No. 2013-102603), and Japanese patent application filed on Aug. 19, 2013 (Japanese Patent Application No. 2013-169955), and the contents thereof are incorporated herein by reference.

The invention claimed is:

1. An actinic ray-sensitive or radiation-sensitive resin composition comprising:

(A) a resin having a repeating unit represented by the following formula (1), a repeating unit represented by the following formula (4), and a group capable of decomposing by an action of an acid to produce a polar group, and an ionic compound represented by the following formula (2):

(1)

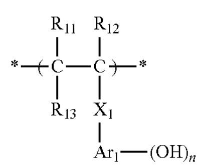

(2)

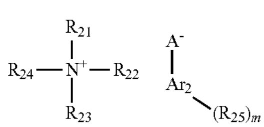

(4)

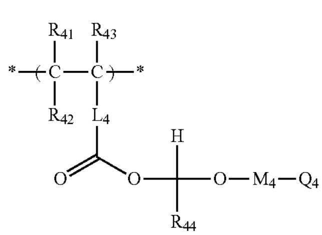

wherein in formula (1), each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may combine with $Ar_1$ to form a ring and in this case, $R_{13}$ represents an alkylene group, $X_1$ represents a single bond or a divalent linking group, $Ar_1$ represents an (n+1)-valent aromatic ring group and in the case of combining with $R_{13}$ to form a ring, represents an (n+2)-valent aromatic ring group, and n represents an integer of 1 to 4;

in formula (2), each of $R_{21}$, $R_{22}$, $R_{23}$ and $R_{24}$ independently represents a methyl group, an ethyl group or a propyl group, $A^-$ represents $COO^-$ or $O^-$, $Ar_2$ represents an (m+1)-valent aromatic ring group having no substituent other than $A^-$and $R_{25}$, $R_{25}$ represents an alkyl group, a cycloalkyl group, a thioalkyl group, an aryl group, a halogen atom, a cyano group, a nitro group, an alkoxy group, a thioalkoxy group, a carbonyloxy group, a carbonylamino group, an alkoxycarbonyl group or an alkylaminocarbonyl group, and when m is 2 or more, each $R_{25}$ of a plurality of $R_{25}$ may be the same as or different from every other $R_{25}$ or may combine with another $R_{25}$ to form a ring, and m represents an integer of 0 or more;

and in formula (4), each of $R_{41}$ $R_{42}$ and $R_{43}$ independently represents a hydrogen atom, an alkyl group, a cycloalkyl group, a halogen atom, a cyano group or an alkoxycarbonyl group, $R_{42}$ may combine with $L_4$ to form a ring and in this case, $R_{42}$ represents an alkylene group, $L_4$ represents a single bond or a divalent linking group and in the case of forming a ring together with $R_{42}$, represents a trivalent linking group, $R_{44}$ represents an alkyl group, a cycloalkyl group, an aryl group, an aralkyl group, an alkoxy group, an acyl group or a heterocyclic group, $M_4$ represents a single bond or a divalent linking group, $Q_4$ represents an alkyl group, a cycloalkyl group, an aryl group or a heterocyclic group, and at least two members of $Q_4$, $M_4$ and $R_{44}$ may combine to form a ring.

2. The actinic ray-sensitive or radiation-sensitive resin composition as claimed in claim 1, wherein the resin (A) has a repeating unit represented by the following formula (3):

(3)

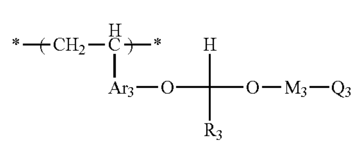

wherein $Ar_3$ represents an aromatic ring group, $R_3$ represents an alkyl group, a cycloalkyl group, an aryl group, an aralkyl group, an alkoxy group, an acyl group or a heterocyclic group, $M_3$ represents a single bond or a divalent linking group, $Q_3$ represents an alkyl group, a cycloalkyl group, an aryl group or a heterocyclic group, and at least two members of $Q_3$, $M_3$ and $R_3$ may combine to form a ring.

3. The actinic ray-sensitive or radiation-sensitive resin composition as claimed in claim 1, wherein in formula (2), $A^-$ is $COO^-$.

4. The actinic ray-sensitive or radiation-sensitive resin composition as claimed in claim 1, wherein in formula (2), $Ar_2$ represents an (m+1)-valent benzene ring.

5. The actinic ray-sensitive or radiation-sensitive resin composition as claimed in claim 1, further comprising a compound capable of generating an acid having a volume of 240 Å$^3$ or more upon irradiation with an actinic ray or radiation.

6. A resist film comprising the actinic ray-sensitive or radiation-sensitive resin composition claimed in claim 1.

7. A pattern forming method comprising:

(i)a step of forming the resist film claimed in claim 6, (ii) a step of exposing the film, and (iii) a step of developing the exposed film by using a developer to form a pattern.

8. The pattern forming method as claimed in claim 7, wherein the step (iii) is (iii') a step of developing the exposed film by using an organic solvent-containing developer to form a negative pattern.

9. The pattern forming method as claimed in claim 7, wherein the exposure is performed using an X-ray, an electron beam or EUV light.

10. A method for manufacturing an electronic device, comprising the pattern forming method claimed in claim 7.

11. The actinic ray-sensitive or radiation-sensitive resin composition as claimed in claim 1, wherein m represents an integer of 1 or more.

12. The actinic ray-sensitive or radiation-sensitive resin composition as claimed in claim 1, wherein m represents an integer of 2 or more.

13. The actinic ray-sensitive or radiation-sensitive resin composition as claimed in claim 1, wherein $A^-$ represents $O^-$.

14. An actinic ray-sensitive or radiation-sensitive resin composition comprising:

(A) a resin having a repeating unit represented by the following formula (1), a repeating unit represented by the following formula (4), and a group capable of decomposing by an action of an acid to produce a polar group, and an ionic compound represented by the following formula (2):

(1)

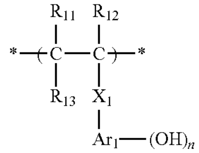

(2)

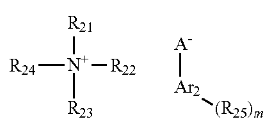

-continued (4)

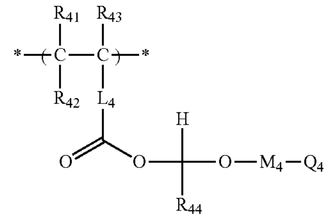

wherein in formula (1), each of $R_{11}$, $R_{12}$ and $R_{13}$ independently represents a hydrogen atom, an alkyl group, a cycloalkyl group, a halogen atom, a cyano group or an alkoxycarbonyl group, $R_{13}$ may combine with $Ar_1$ to form a ring and in this case, $R_{13}$ represents an alkylene group, $X_1$ represents a single bond or a divalent linking group, $Ar_1$ represents an (n+1)-valent aromatic ring group and in the case of combining with $R_{13}$ to form a ring, represents an (n+2)-valent aromatic ring group, and n represents an integer of 1 to 4;

in formula (2), each of $R_{21}$, $R_{22}$, $R_{23}$ and $R_{24}$ independently represents a primary or secondary alkyl group or an aryl group, $A^-$ represents $COO^-$ or $O^-$, $Ar_2$ represents an (m+1)-valent aromatic ring group having no substituent other than $A^-$and $R_{25}$, $R_{25}$ represents an alkyl group, a cycloalkyl group, a thioalkyl group, an aryl group, a halogen atom, a cyano group, a nitro group, an alkoxy group, a thioalkoxy group, a carbonyloxy group, a carbonylamino group, an alkoxycarbonyl group or an alkylaminocarbonyl group, and when m is 2 or more, each $R_{25}$ of a plurality of $R_{25}$ may be the same as or different from every other $R_{25}$ or may combine with another $R_{25}$ to form a ring, and m represents an integer of 1 or more;

and in formula (4), each of $R_{41}$ $R_{42}$ and $R_{43}$ independently represents a hydrogen atom, an alkyl group, a cycloalkyl group, a halogen atom, a cyano group or an alkoxycarbonyl group, $R_{42}$ may combine with $L_4$ to form a ring and in this case, $R_{42}$ represents an alkylene group, $L_4$ represents a single bond or a divalent linking group and in the case of forming a ring together with $R_{42}$, represents a trivalent linking group, $R_{44}$ represents an alkyl group, a cycloalkyl group, an aryl group, an aralkyl group, an alkoxy group, an acyl group or a heterocyclic group, $M_4$ represents a single bond or a divalent linking group, $Q_4$ represents an alkyl group, a cycloalkyl group, an aryl group or a heterocyclic group, and at least two members of $Q_4$ $M_4$ and $R_{44}$ may combine to form a ring.

15. The actinic ray-sensitive or radiation-sensitive resin composition as claimed in claim 14, wherein m represents an integer of 2 or more.

16. The actinic ray-sensitive or radiation-sensitive resin composition as claimed in claim 14, wherein $A^-$ represents $O^-$.

17. The actinic ray-sensitive or radiation-sensitive resin composition as claimed in claim 14, wherein the resin (A) has a repeating unit represented by the following formula (3):

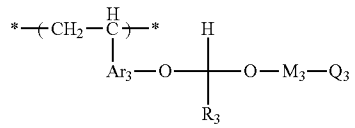

(3)

wherein $Ar_3$ represents an aromatic ring group, $R_3$ represents an alkyl group, a cycloalkyl group, an aryl group, an aralkyl group, an alkoxy group, an acyl group or a heterocyclic group, $M_3$ represents a single bond or a divalent linking group, $Q_3$ represents an alkyl group, a cycloalkyl group, an aryl group or a heterocyclic group, and at least two members of $Q_3$, $M_3$ and $R_3$ may combine to form a ring.

18. The actinic ray-sensitive or radiation-sensitive resin composition as claimed in claim 14, wherein in formula (2), $A^-$ is $COO^-$.

19. The actinic ray-sensitive or radiation-sensitive resin composition as claimed in claim 14, wherein in formula (2), $Ar_2$ represents an (m+1)-valent benzene ring.

20. The actinic ray-sensitive or radiation-sensitive resin composition as claimed in claim 14, further comprising a compound capable of generating an acid having a volume of 240 $Å^3$ or more upon irradiation with an actinic ray or radiation.

21. A resist film comprising the actinic ray-sensitive or radiation-sensitive resin composition claimed in claim 14.

22. A pattern forming method comprising:

(i) a step of forming the resist film claimed in claim 21, (ii) a step of exposing the film, and (iii) a step of developing the exposed film by using a developer to form a pattern.

23. The pattern forming method as claimed in claim 22, wherein the step (iii) is (iii') a step of developing the exposed film by using an organic solvent-containing developer to form a negative pattern.

24. The pattern forming method as claimed in claim 22, wherein the exposure is performed using an X-ray, an electron beam or EUV light.

25. A method for manufacturing an electronic device, comprising the pattern forming method claimed in claim 22.

* * * * *